US012781121B2

(12) United States Patent
Danz et al.

(10) Patent No.: US 12,781,121 B2
(45) Date of Patent: Nov. 3, 2026

(54) ORGANIC MOLECULES FOR OPTOELECTRONIC DEVICES

(71) Applicant: Samsung Display Co., Ltd., Yongin-si (KR)

(72) Inventors: Michael Danz, Eggenstein-Leopoldshafen (DE); Sebastian Dück, Heidelberg (DE); Damien Thirion, Karlsdorf-Neuthard (DE)

(73) Assignee: Samsung Display Co., Ltd., Yongin-si (KR)

(*) Notice: Subject to any disclaimer, the term of this patent is extended or adjusted under 35 U.S.C. 154(b) by 1019 days.

(21) Appl. No.: 17/995,841

(22) PCT Filed: Apr. 7, 2021

(86) PCT No.: PCT/EP2021/059049
§ 371 (c)(1),
(2) Date: Oct. 7, 2022

(87) PCT Pub. No.: WO2021/204868
PCT Pub. Date: Oct. 14, 2021

(65) Prior Publication Data

US 2023/0159567 A1 May 25, 2023

(30) Foreign Application Priority Data

Apr. 8, 2020 (EP) .................................... 20168705

(51) Int. Cl.
*H01L 51/54* (2006.01)
*C07F 5/02* (2006.01)
(Continued)

(52) U.S. Cl.
CPC .............. *C09K 11/06* (2013.01); *C07F 5/027* (2013.01); *H10K 85/657* (2023.02); *H10K 85/6572* (2023.02); *H10K 85/658* (2023.02); *C09K 2211/1014* (2013.01); *C09K 2211/1029* (2013.01); *C09K 2211/1033* (2013.01); *C09K 2211/1037* (2013.01);
(Continued)

(58) Field of Classification Search
None
See application file for complete search history.

(56) References Cited

U.S. PATENT DOCUMENTS 11,411,186 B2 8/2022 Pan et al.
11,476,428 B2 10/2022 Zhang et al.
(Continued)

FOREIGN PATENT DOCUMENTS

CN 109438446 A 3/2019
CN 110003260 A 7/2019
(Continued)

OTHER PUBLICATIONS

Machine translation of CN109438446. (Year: 2020).*
Wong, et al., "Purely Organic Thermally Activated Delayed Fluorescence Materials for Organic Light-Emitting Diodes," Advanced Science News, Advanced Materials, 2017, pp. 1-54, vol. 29, No. 1605444, WILEY-VCH Verlag Gmbh & Co. KGaA, Weinheim.
International Search Report and Written Opinion of PCT/EP2021/059049, Jul. 1, 2021, 14 pages.
Narula, C. et.al., "Competition between Adduct and Cation Formation in Reactions between Diorganylborane Derivatives and Pyridine or Lutidines", Institute of Inorganic Chemistry, 1985, pp. 1-8.

*Primary Examiner* — Andrew K Bohaty
(74) *Attorney, Agent, or Firm* — Womble Bond Dickinson (US) LLP

(57) ABSTRACT

The disclosure pertains to an organic molecule for use in optoelectronic devices. The organic molecule has a structure of Formula I:

Formula I

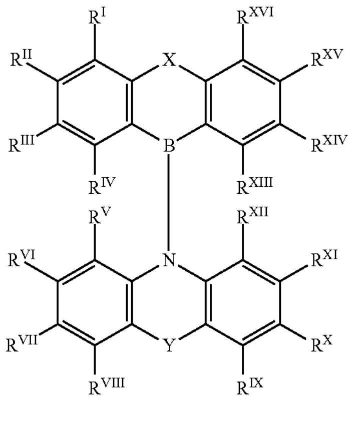

wherein

X is selected from the group consisting of a direct bond, $NR^1$, O, S, $SiR^1R^2$ and $CR^1R^2$;

Y is selected from the group consisting of a direct bond, $NR^3$, O, S, $SiR^3R^4$ and $CR^3R^4$; and $R^1$, $R^2$, $R^3$, and $R^4$ are each independently selected from the group consisting of: hydrogen, deuterium, $N(R^5)_2$, $OR^5$, $SR^5$, $Si(R^5)_3$, $B(OR^5)_2$, $OSO_2R^5$, $CF_3$, CN, halogen, $C_1$-$C_{40}$-alkyl, $C_1$-$C_{40}$-alkoxy, $C_1$-$C_{40}$-thioalkoxy, $C_2$-$C_{40}$-alkenyl, $C_2$-$C_{40}$-alkynyl, $C_6$-$C_{60}$-aryl, and $C_3$-$C_{57}$-heteroaryl.

17 Claims, 1 Drawing Sheet

(51) Int. Cl.
*C09K 11/06* (2006.01)
*H10K 85/60* (2023.01)
*H10K 101/20* (2023.01)

(52) U.S. Cl.
CPC .................. *C09K 2211/104* (2013.01); *C09K 2211/1044* (2013.01); *C09K 2211/1048* (2013.01); *C09K 2211/1051* (2013.01); *C09K 2211/1088* (2013.01); *H10K 2101/20* (2023.02)

(56) References Cited

U.S. PATENT DOCUMENTS

| | | | |
|---|---|---|---|
| 2020/0223873 A1 | 7/2020 | Thobes et al. | |
| 2020/0411763 A1* | 12/2020 | Zhang | H10K 85/658 |

FOREIGN PATENT DOCUMENTS

| | | | |
|---|---|---|---|
| CN | 110204565 A | 9/2019 | |
| CN | 110218221 A | 9/2019 | |
| WO | WO 2019/052939 A1 | 3/2019 | |

* cited by examiner

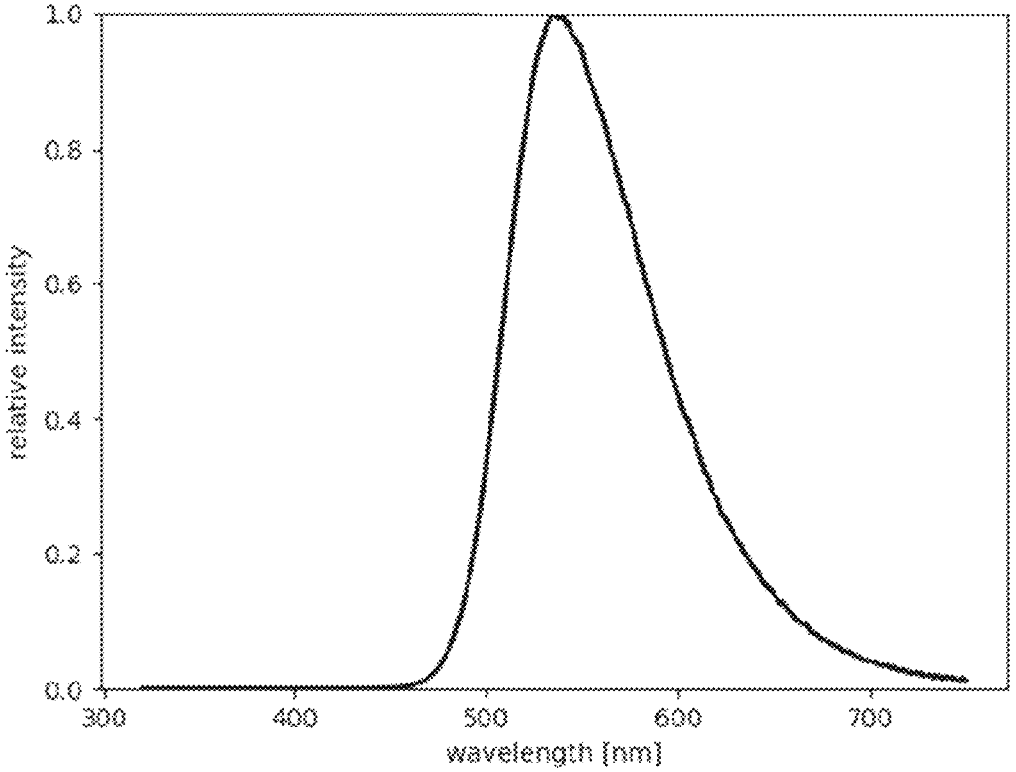
1.0
0.8
0.6
0.4
0.2
0.0
relative intensity
300
400
500
600
700
wavelength [nm]

ORGANIC MOLECULES FOR OPTOELECTRONIC DEVICES

CROSS-REFERENCE TO RELATED APPLICATIONS

This application is a U.S. National Phase Patent Application of International Patent Application Number PCT/EP2021/059049, filed on Apr. 7, 2021, which claims priority to European Patent Application Number 20168705.0, filed on Apr. 8, 2020, the entire contents of all of which are incorporated herein by reference.

The disclosure relates to light-emitting organic molecules and their use in organic light-emitting diodes (OLEDs) and in other optoelectronic devices. Similar compounds are related to CN 109 438 446 A and CN 110 204 565 A.

BRIEF DESCRIPTION OF THE DRAWING

The drawing is an emission spectrum of example 1.

DESCRIPTION

The object of the present disclosure is to provide molecules which are suitable for use in optoelectronic devices.

This object is achieved by the disclosure which provides a new class of organic molecules.

The organic molecules of the disclosure are preferably purely organic molecules, i.e. they do not contain any metal ions, which is in contrast to metal complexes known for use in optoelectronic devices. Therefore, according to the present disclosure, it is preferred that the organic molecules are free of metal atoms or metal ions. The organic molecules may, however, include metalloids, for example, B, Si, Sn, Se, and/or Ge.

The organic molecules exhibit emission maxima in the sky blue, green or yellow spectral range. The photoluminescence quantum yields of the organic molecules according to the disclosure are, for example, 10% or more. The molecules of the disclosure exhibit for example, thermally activated delayed fluorescence (TADF). The use of the molecules according to the disclosure in an optoelectronic device, for example, an organic light-emitting diode (OLED), leads to higher efficiencies of the optoelectronic device. Corresponding OLEDs have a higher stability than OLEDs with known emitter materials and comparable color, and/or by employing the molecules according to the disclosure in an OLED display, a more accurate reproduction of visible colors in nature, i.e. a higher resolution in the displayed image, is achieved. For example, the molecules can be used in combination with a fluorescence emitter to enable so-called hyper-fluorescence.

The organic molecules according to the disclosure include or consist of a structure of Formula I.

Formula I

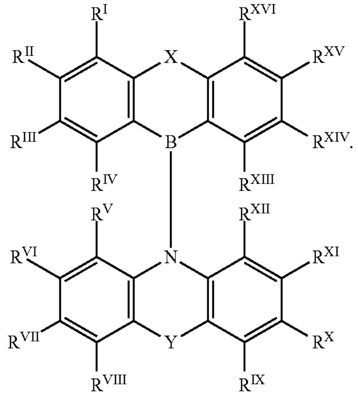

Wherein in Formula I,

X is selected from the group consisting of a direct bond, $NR^1$, O, S, $SiR^1R^2$ and $CR^1R^2$;

Y is selected from the group consisting of a direct bond, $NR^3$, O, S, $SiR^3R^4$ and $CR^3R^4$;

$R^1$, $R^2$, $R^3$, and $R^4$ are at each occurrence independently selected from the group consisting of:

hydrogen, deuterium, $N(R^5)_2$, $OR^5$, $SR^5$, $Si(R^5)_3$, $B(OR^5)_2$, $OSO_2R^5$, $CF_3$,

CN, halogen, $C_1$-$C_{40}$-alkyl, which is optionally substituted with one or more substituents $R^5$ and wherein one or more non-adjacent $CH_2$-groups are optionally substituted by $R^5C{=}CR^5$, $C{\equiv}C$, $Si(R^5)_2$, $Ge(R^5)_2$, $Sn(R^5)_2$, $C{=}O$, $C{=}S$, $C{=}Se$, $C{=}NR^5$, $P({=}O)(R^5)$, SO, $SO_2$, $NR_5$, O, S or $CONR^5$;

$C_1$-$C_{40}$-alkoxy, which is optionally substituted with one or more substituents $R^5$ and wherein one or more non-adjacent $CH_2$-groups are optionally substituted by $R^5C{=}CR^5$, $C{\equiv}C$, $Si(R^5)_2$, $Ge(R^5)_2$, $Sn(R^5)_2$, $C{=}O$, $C{=}S$, $C{=}Se$, $C{=}NR^5$, $P({=}O)(R^5)$, SO, $SO_2$, $NR_5$, O, S or $CONR^5$;

$C_1$-$C_{40}$-thioalkoxy, which is optionally substituted with one or more substituents $R^5$ and wherein one or more non-adjacent $CH_2$-groups are optionally substituted by $R^5C{=}CR^5$, $C{\equiv}C$, $Si(R^5)_2$, $Ge(R^5)_2$, $Sn(R^5)_2$, $C{=}O$, $C{=}S$, $C{=}Se$, $C{=}NR^5$, $P({=}O)(R^5)$, SO, $SO_2$, $NR_5$, O, S or $CONR^5$;

$C_2$-$C_{40}$-alkenyl, which is optionally substituted with one or more substituents $R^5$ and wherein one or more non-adjacent $CH_2$-groups are optionally substituted by $R^5C{=}CR^5$, $C{\equiv}C$, $Si(R^5)_2$, $Ge(R^5)_2$, $Sn(R^5)_2$, $C{=}O$, $C{=}S$, $C{=}Se$, $C{=}NR^5$, $P({=}O)(R^5)$, SO, $SO_2$, $NR_5$, O, S or $CONR^5$;

$C_2$-$C_{40}$-alkynyl, which is optionally substituted with one or more substituents $R^5$ and wherein one or more non-adjacent $CH_2$-groups are optionally substituted by $R^5C{=}CR^5$, C≡C, $Si(R^5)_2$, $Ge(R^5)_2$, $Sn(R^5)_2$, C═O, C═S, C═Se, C═$NR^5$, P(═O)($R^5$), SO, $SO_2$, $NR_5$, O, S or $CONR^5$;

$C_6$-$C_{60}$-aryl, which is optionally substituted with one or more substituents $R^5$; and $C_3$-$C_{57}$-heteroaryl, which is optionally substituted with one or more substituents $R^5$;

wherein groups $R^5$ positioned adjacent to each other are optionally bonded to each other and form an aryl or heteroaryl ring, which is optionally substituted with one or more $C_1$-$C_5$-alkyl substituents, deuterium, halogen, CN or $CF_3$;

wherein X and Y do not both represent a direct bond;

$R^5$ is at each occurrence independently from one another selected from the group consisting of:

hydrogen, deuterium, $N(R^6)_2$, $OR^6$,

SRO, $Si(R^6)_3$, $B(OR^6)_2$, $OSO_2R^6$, $CF_3$,

CN, halogen, $C_1$-$C_{40}$-alkyl, which is optionally substituted with one or more substituents $R^6$ and wherein one or more non-adjacent $CH_2$-groups are optionally substituted by $R^6C{=}CR^6$, C≡C, $Si(R^6)_2$, $Ge(R^6)_2$, $Sn(R^6)_2$, C═O, C═S, C═Se, C═$NR^6$, P(═O)($R^6$), SO, $SO_2$, $NR^6$, O, S or $CONR^6$;

$C_1$-$C_{40}$-alkoxy, which is optionally substituted with one or more substituents $R^6$ and wherein one or more non-adjacent $CH_2$-groups are optionally substituted by $R^6C{=}CR^6$, C≡C, $Si(R^6)_2$, $Ge(R^6)_2$, $Sn(R^6)_2$, C═O, C═S, C═Se, C═$NR^6$, P(═O)($R^6$), SO, $SO_2$, $NR^6$, O, S or $CONR^6$;

$C_1$-$C_{40}$-thioalkoxy, which is optionally substituted with one or more substituents $R^6$ and wherein one or more non-adjacent $CH_2$-groups are optionally substituted by $R^6C{=}CR^6$, C≡C, $Si(R^6)_2$, $Ge(R^6)_2$, $Sn(R^6)_2$, C═O, C═S, C═Se, C═$NR^6$, P(═O)($R^6$), SO, $SO_2$, $NR^6$, O, S or $CONR^6$;

$C_2$-$C_{40}$-alkenyl, which is optionally substituted with one or more substituents $R^6$ and wherein one or more non-adjacent $CH_2$-groups are optionally substituted by $R^6C{=}CR^6$, C≡C, $Si(R^6)_2$, $Ge(R^6)_2$, $Sn(R^6)_2$, C═O, C═S, C═Se, C═$NR^6$, P(═O)($R^6$), SO, $SO_2$, $NR^6$, O, S or $CONR^6$;

$C_2$-$C_{40}$-alkynyl, which is optionally substituted with one or more substituents $R^6$ and wherein one or more non-adjacent $CH_2$-groups are optionally substituted by $R^6C{=}CR^6$, C≡C, $Si(R^6)_2$, $Ge(R^6)_2$, $Sn(R^6)_2$, C═O, C═S, C═Se, C═$NR^6$, P(═O)($R^6$), SO, $SO_2$, $NR^6$, O, S or $CONR^6$;

$C_6$-$C_{60}$-aryl, which is optionally substituted with one or more substituents $R^6$; and $C_3$-$C_{57}$-heteroaryl, which is optionally substituted with one or more substituents $R^6$;

wherein groups $R^6$ positioned adjacent to each other are optionally bonded to each other and form an aryl or heteroaryl ring, which is optionally substituted with one or more $C_1$-$C_5$-alkyl substituents, deuterium, halogen, CN or $CF_3$.

$R^6$ is at each occurrence independently from one another selected from the group consisting of:

hydrogen, deuterium, halogen, OPh, SPh, $CF_3$, CN, $Si(C_1$-$C_5$-alkyl$)_3$, $Si(Ph)_3$, $C_1$-$C_5$-alkyl, wherein optionally one or more hydrogen atoms are each independently substituted by deuterium, halogen, CN, or $CF_3$;

$C_1$-$C_5$-alkoxy, wherein optionally one or more hydrogen atoms are each independently substituted by deuterium, halogen, CN, or $CF_3$;

$C_1$-$C_5$-thioalkoxy, wherein optionally one or more hydrogen atoms are each independently substituted by deuterium, halogen, CN, or $CF_3$;

$C_2$-$C_5$-alkenyl, wherein optionally one or more hydrogen atoms are each independently substituted by deuterium, halogen, CN, or $CF_3$;

$C_2$-$C_5$-alkynyl, wherein optionally one or more hydrogen atoms are each independently substituted by deuterium, halogen, CN, or $CF_3$;

$C_6$-$C_{18}$-aryl, which is optionally substituted with one or more $C_1$-$C_5$-alkyl substituents;

$C_3$-$C_{17}$-heteroaryl, which is optionally substituted with one or more $C_1$-$C_5$-alkyl substituents;

$N(C_6$-$C_{18}$-aryl$)_2$, $N(C_3$-$C_{17}$-heteroaryl$)_2$; and $N(C_3$-$C_{17}$-heteroaryl$)(C_6$-$C_{18}$-aryl), $R^I$, $R^{II}$, $R^{III}$, $R^{IV}$, $R^V$, $R^{VI}$, $R^{VII}$, $R^{VIII}$, $R^{IX}$, $R^X$, $R^{XI}$, $R^{XII}$, $R^{XIII}$, $R^{XIV}$, $R^{XV}$, and $R^{XVI}$ are each independently selected from the group consisting of:

hydrogen, deuterium, $N(R^7)_2$, $OR^7$, $SR^7$, $Si(R^7)_3$, $B(OR^7)_2$, $OSO_2R^7$, $CF_3$,

CN, halogen, $C_1$-$C_{40}$-alkyl, which is optionally substituted with one or more substituents $R^7$ and wherein one or more non-adjacent $CH_2$-groups are optionally substituted by $R^7C{=}CR^7$, C≡C, $Si(R^7)_2$, $Ge(R^7)_2$, $Sn(R^7)_2$, C═O, C═S, C═Se, C═$NR^7$, P(═O)($R^7$), SO, $SO_2$, $NR^7$, O, S or $CONR^7$;

$C_1$-$C_{40}$-alkoxy, which is optionally substituted with one or more substituents $R^7$ and wherein one or more non-adjacent $CH_2$-groups are optionally substituted by $R^7C{=}CR^7$, C≡C, $Si(R^7)_2$, $Ge(R^7)_2$, $Sn(R^7)_2$, C═O, C═S, C═Se, $C{=}NR^7$, $P({=}O)(R^7)$, SO, $SO_2$, $NR^7$, O, S or $CONR^7$;

$C_1$-$C_{40}$-thioalkoxy, which is optionally substituted with one or more substituents $R^7$ and wherein one or more non-adjacent $CH_2$-groups are optionally substituted by $R^7C{=}CR^7$, C≡C, $Si(R^7)_2$, $Ge(R^7)_2$, $Sn(R^7)_2$, C═O, C═S, C═Se, $C{=}NR^7$, $P({=}O)(R^7)$, SO, $SO_2$, $NR^1$, O, S or $CONR^7$;

$C_2$-$C_{40}$-alkenyl, which is optionally substituted with one or more substituents $R^7$ and wherein one or more non-adjacent $CH_2$-groups are optionally substituted by $R^7C{=}CR^7$, C≡C, $Si(R^7)_2$, $Ge(R^7)_2$, $Sn(R^7)_2$, C═O, C═S, C═Se, $C{=}NR^7$, $P({=}O)(R^7)$, SO, $SO_2$, $NR^7$, O, S or $CONR^7$;

$C_2$-$C_{40}$-alkynyl, which is optionally substituted with one or more substituents $R^7$ and wherein one or more non-adjacent $CH_2$-groups are optionally substituted by $R^7C{=}CR^7$, C≡C, $Si(R^7)_2$, $Ge(R^7)_2$, $Sn(R^7)_2$, C═O, C═S, C═Se, $C{=}NR^7$, $P({=}O)(R^7)$, SO, $SO_2$, $NR^1$, O, S or $CONR^7$;

$C_6$-$C_{60}$-aryl, which is optionally substituted with one or more substituents $R^7$; and $C_3$-$C_{57}$-heteroaryl, which is optionally substituted with one or more substituents $R^7$;

wherein groups $R^I$ to $R^{IV}$ positioned adjacent to each other are optionally bonded to each other and form an aryl or heteroaryl ring, which is optionally substituted with one or more $C_1$-$C_5$-alkyl substituents, deuterium, halogen, CN or $CF_3$;

wherein groups $R^V$ to $R^{VII}$ positioned adjacent to each other are optionally bonded to each other and form an aryl or heteroaryl ring, which is optionally substituted with one or more $C_1$-$C_5$-alkyl substituents, deuterium, halogen, CN or $CF_3$;

wherein groups $R^{IX}$ to $R^{XII}$ positioned adjacent to each other are optionally bonded to each other and form an aryl or heteroaryl ring, which is optionally substituted with one or more $C_1$-$C_5$-alkyl substituents, deuterium, halogen, CN or $CF_3$;

wherein groups $R^{XIII}$ to $R^{XVI}$ positioned adjacent to each other are optionally bonded to each other and form an aryl or heteroaryl ring, which is optionally substituted with one or more $C_1$-$C_5$-alkyl substituents, deuterium, halogen, CN or $CF_3$.

$R^7$ is selected from the group consisting of:

hydrogen, deuterium, $N(R^8)_2$, $OR^8$, $SR^8$, $Si(R^8)_3$, $B(OR^8)_2$, $OSO_2R^8$, $CF_3$,

CN, halogen, $C_1$-$C_{40}$-alkyl, which is optionally substituted with one or more substituents $R^8$ and wherein one or more non-adjacent $CH_2$-groups are optionally substituted by $R^8C{=}CR^8$, C≡C, $Si(R^8)_2$, $Ge(R^8)_2$, $Sn(R^8)_2$, C═O, C═S, C═Se, $C{=}NR^8$, $P({=}O)(R^8)$, SO, $SO_2$, $NR^8$, O, S or $CONR^8$;

$C_1$-$C_{40}$-alkoxy, which is optionally substituted with one or more substituents $R^8$ and wherein one or more non-adjacent $CH_2$-groups are optionally substituted by $R^8C{=}CR^8$, C≡C, $Si(R^8)_2$, $Ge(R^8)_2$, $Sn(R^8)_2$, C═O, C═S, C═Se, $C{=}NR^8$, $P({=}O)(R^8)$, SO, $SO_2$, $NR^8$, O, S or $CONR^6$;

$C_1$-$C_{40}$-thioalkoxy, which is optionally substituted with one or more substituents $R^8$ and wherein one or more non-adjacent $CH_2$-groups are optionally substituted by $R^8C{=}CR^8$, C≡C, $Si(R^8)_2$, $Ge(R^8)_2$, $Sn(R^8)_2$, C═O, C═S, C═Se, $C{=}NR^8$, $P({=}O)(R^8)$, SO, $SO_2$, $NR^8$, O, S or $CONR^8$;

$C_2$-$C_{40}$-alkenyl, which is optionally substituted with one or more substituents $R^8$ and wherein one or more non-adjacent $CH_2$-groups are optionally substituted by $R^8C{=}CR^8$, C≡C, $Si(R^8)_2$, $Ge(R^8)_2$, $Sn(R^8)_2$, C═O, C═S, C═Se, $C{=}NR^8$, $P({=}O)(R^8)$, SO, $SO_2$, $NR^8$, O, S or $CONR^6$;

$C_2$-$C_{40}$-alkynyl, which is optionally substituted with one or more substituents $R^8$ and wherein one or more non-adjacent $CH_2$-groups are optionally substituted by $R^8C{=}CR^8$, C≡C, $Si(R^8)_2$, $Ge(R^8)_2$, $Sn(R^8)_2$, C═O, C═S, C═Se, $C{=}NR^8$, $P({=}O)(R^8)$, SO, $SO_2$, $NR^8$, O, S or $CONR^8$;

$C_6$-$C_{60}$-aryl, which is optionally substituted with one or more substituents $R^8$; and $C_3$-$C_{57}$-heteroaryl, which is optionally substituted with one or more substituents $R^8$;

$R^8$ is at each occurrence independently selected from the group consisting of:

hydrogen, deuterium, halogen, OPh, SPh, $CF_3$, CN, $Si(C_1$-$C_5$-alkyl$)_3$, or $Si(Ph)_3$, $C_1$-$C_5$-alkyl, wherein optionally one or more hydrogen atoms are each independently substituted by deuterium, halogen, CN, or $CF_3$;

$C_1$-$C_5$-alkoxy, wherein optionally one or more hydrogen atoms are each independently substituted by deuterium, halogen, CN, or $CF_3$;

$C_1$-$C_5$-thioalkoxy, wherein optionally one or more hydrogen atoms are each independently substituted by deuterium, halogen, CN or $CF_3$;

$C_2$-$C_5$-alkenyl, wherein optionally one or more hydrogen atoms are each independently substituted by deuterium, halogen, CN, or $CF_3$;

$C_2$-$C_5$-alkynyl, wherein optionally one or more hydrogen atoms are each independently substituted by deuterium, halogen, CN, or $CF_3$;

$C_5$-$C_{18}$-aryl, which is optionally substituted with one or more $C_1$-$C_5$-alkyl substituents;

$C_3$-$C_{17}$-heteroaryl, which is optionally substituted with one or more $C_1$-$C_5$-alkyl substituents;

$N(C_6$-$C_1$-aryl$)_2$, $N(C_3$-$C_{17}$-heteroaryl$)_2$; and $N(C_3$-$C_{17}$-heteroaryl$)(C_6$-$C_{18}$-aryl);

wherein the substituents $R^1$, $R^2$, $R^{XIII}$, $R^{XIV}$, $R^{XV}$, and/or $R^{XVI}$ independently from each other optionally form a mono- or polycyclic, aliphatic, aromatic and/or benzo-fused ring system with one or more other substituents selected from the group consisting of $R^1$, $R^2$, $R^{XIII}$, $R^{XIV}$, $R^{XV}$, and $R^{XV}$; and wherein the substituents $R^3$, $R^4$, $R^{IX}$, $R^X$, $R^{XI}$, and/or $R^{XII}$ independently from each other optionally form a mono- or polycyclic, aliphatic, aromatic and/or benzo-fused ring system with one or more other substituents selected from the group consisting of $R^3$, $R^4$, $R^{IX}$, $R^X$, $R^{XI}$, and $R^{XII}$.

In one embodiment, Y is selected from the group consisting of a direct bond, $NR^3$, O, S, $SiR^3R^4$ and $CR^3R^4$; with the proviso that when Y is $CR^3R^4$, the substituents $R^3$ and $R^4$ do not form a mono- or polycyclic, aliphatic, aromatic and/or benzo-fused ring system with one or more other substituents selected from the group consisting of $R^3$, $R^4$, $R^{IX}$, $R^X$, $R^{XI}$, and $R^{XII}$.

In one embodiment, Y is selected from the group consisting of a direct bond, $NR^3$, O, and S.

In a preferred embodiment, Y is a direct bond.

In one embodiment, X is selected from the group consisting of a direct bond, $NR^1$, O, S, $SiR^1R^2$ and $CR^1R^2$; with the proviso that when Y is $CR^1R^2$, the substituents $R^1$ and $R^2$ do not form a mono- or polycyclic, aliphatic, aromatic and/or benzo-fused ring system with one or more other substituents selected from the group consisting of $R^1$, $R^2$, $R^{XIII}$, $R^{XIV}$, $R^{XV}$, and $R^{XVI}$.

In one embodiment, X is selected from the group consisting of a direct bond, $NR^1$, and $SiR^1R^2$.

In a preferred embodiment, X is selected from the group consisting of a direct bond, and $NR^1$.

The substituents $R^1$, $R^2$, $R^{XIII}$, $R^{XIV}$, $R^{XV}$, or $R^{XVI}$ independently from each other are optionally bonded to each other via a single bond or by fusing to form a mono- or polycyclic, aliphatic, aromatic and/or benzo-fused ring system with one or more substituents $R^1$, $R^2$, $R^{XIII}$, $R^{XIV}$, $R^{XV}$, or $R^{XVI}$ via a linking group or a single bond or by fusing. The substituents $R^3$, $R^4$, $R^{IX}$, $R^X$, $R^{XI}$, or $R^{XII}$ independently from each other are optionally bonded to each other via a single bond or by fusing to form a mono- or polycyclic, aliphatic, aromatic and/or benzo-fused ring system with one or more substituents $R^3$, $R^4$, $R^{IX}$, $R^X$, $R^{XI}$, or $R^{XII}$ via a linking group or a single bond or by fusing. Examples are listed below:

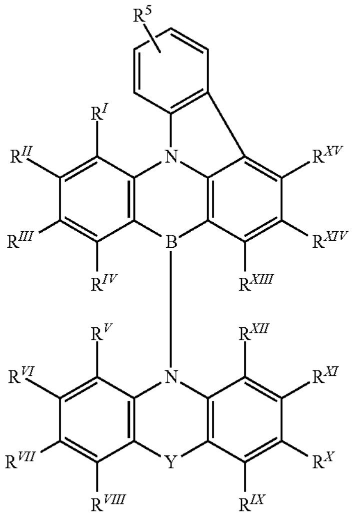

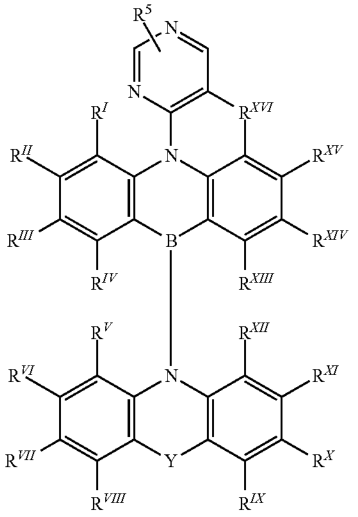

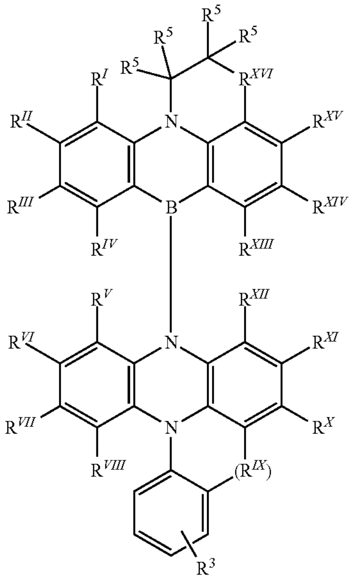

-continued
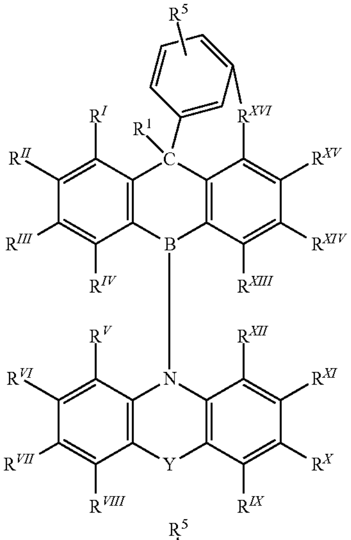
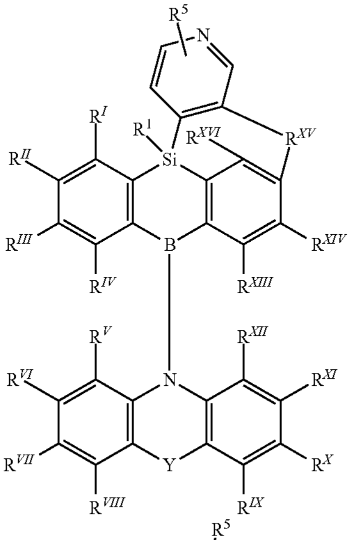
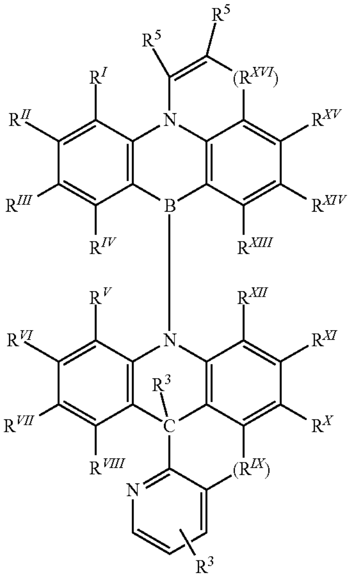
In one embodiment of the disclosure, the organic molecule includes or consists of a structure selected from the group consisting of Formula I-1a, Formula I-1a-1, Formula I-1a-2, Formula I-1a-3, Formula I-1a-4, and Formula I-1a-5:
Formula I-1a
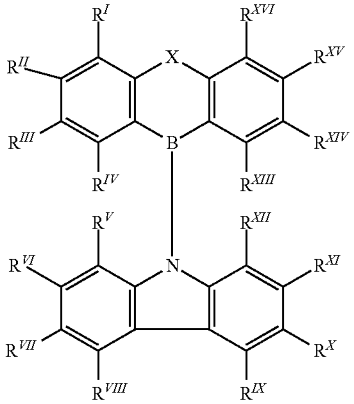
Formula I-1a-1
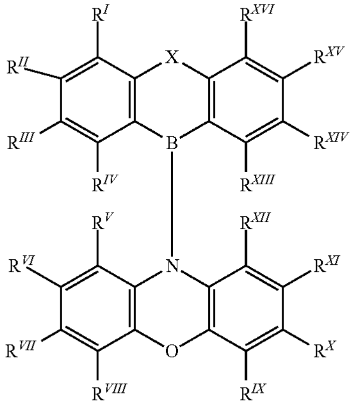
Formula I-1a-2
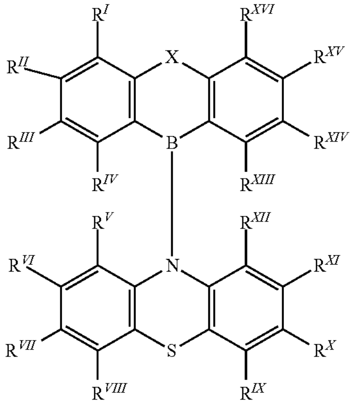
Formula I-1a-3
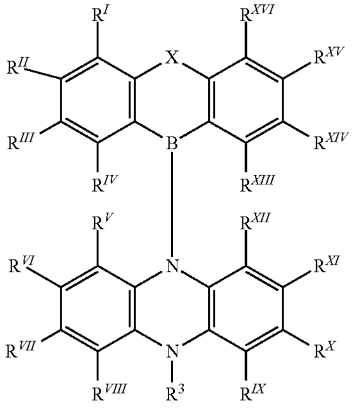

-continued

Formula I-1a-4

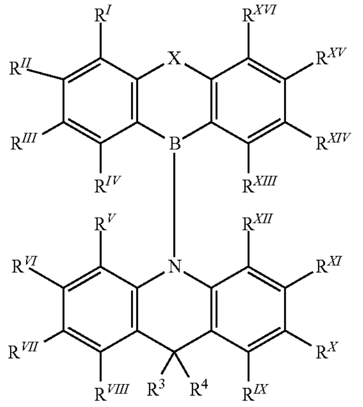

Formula I-1a-5

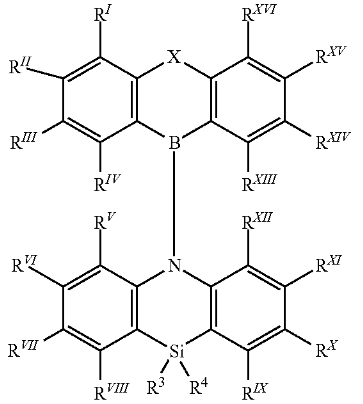

In a further embodiment of the disclosure, $R^I$, $R^{II}$, $R^{III}$, $R^{IV}$, $R^{XIII}$, $R^{XIV}$, $R^{XV}$, and $R^{XVI}$ are each independently selected from the group consisting of:

hydrogen,

Me, $^i$Pr, $^t$Bu, CN, $CF_3$,

Ph, which is optionally substituted with one or more substituents independently from each other selected from the group consisting of Me, $^i$Pr, $^t$Bu, CN, $CF_3$, and Ph, pyridinyl, which is optionally substituted with one or more substituents independently from each other selected from the group consisting of Me, $^i$Pr, $^t$Bu, CN, $CF_3$, and Ph, carbazolyl, which is optionally substituted with one or more substituents independently from each other selected from the group consisting of Me, $^i$Pr, $^t$Bu, CN, $CF_3$, and Ph, triazinyl, which is optionally substituted with one or more substituents independently from each other selected from the group consisting of Me, $^i$Pr, $^t$Bu, CN, $CF_3$, and Ph, and $N(Ph)_2$.

In a further embodiment of the disclosure, wherein $R^I$, $R^{II}$, $R^{III}$, $R^{IV}$, $R^{XII}$, $R^{XIV}R^{XV}$, and $R^{XVI}$ are each independently selected from the group consisting of:

hydrogen,

Me, $^i$Pr, $^t$Bu,

CN, $CF_3$,

Ph, which is optionally substituted with one or more substituents independently from each other selected from the group consisting of Me, $^i$Pr, $^t$Bu, CN, $CF_3$, and Ph, pyridinyl, which is optionally substituted with one or more substituents independently from each other selected from the group consisting of Me, $^i$Pr, $^t$Bu, CN, $CF_3$, and Ph, pyrimidinyl, which is optionally substituted with one or more substituents independently from each other selected from the group consisting of Me, $^i$Pr, $^t$Bu, CN, $CF_3$, and Ph, and triazinyl, which is optionally substituted with one or more substituents independently from each other selected from the group consisting of Me, $^i$Pr, $^t$Bu, CN, $CF_3$, and Ph.

In a further embodiment of the disclosure, wherein $R^V$, $R^{VI}$, $R^{VII}$, $R^{VIII}$, $R^{IX}$, $R^X$, $R^{XI}$, and $R^{XII}$ are each independently selected from the group consisting of:

hydrogen,

Me, $^i$Pr, $^t$Bu, CN, $CF_3$,

Ph, which is optionally substituted with one or more substituents independently from each other selected from the group consisting of Me, $^i$Pr, $^t$Bu, CN, $CF_3$, and Ph, pyridinyl, which is optionally substituted with one or more substituents independently from each other selected from the group consisting of Me, $^i$Pr, $^t$Bu, CN, $CF_3$, and Ph, carbazolyl, which is optionally substituted with one or more substituents independently from each other selected from the group consisting of Me, $^i$Pr, $^t$Bu, CN, $CF_3$, and Ph, triazinyl, which is optionally substituted with one or more substituents independently from each other selected from the group consisting of Me, $^i$Pr, $^t$Bu, CN, $CF_3$, and Ph, and $N(Ph)_2$.

In a further embodiment of the disclosure, wherein $R^V$, $R^{VI}$, $R^{VII}$, $R^{VIII}$, $R^{IX}$, $R^X$, $R^{XI}$, and $R^{XII}$ are each independently selected from the group consisting of:

hydrogen,

Me, $^i$Pr, $^t$Bu,

CN, $CF_3$,

Ph, which is optionally substituted with one or more substituents independently from each other selected from the group consisting of Me, $^i$Pr, $^t$Bu, CN, $CF_3$, and Ph, pyridinyl, which is optionally substituted with one or more substituents independently from each other selected from the group consisting of Me, $^i$Pr, $^t$Bu, CN, $CF_3$, and Ph, pyrimidinyl, which is optionally substituted with one or more substituents independently from each other selected from the group consisting of Me, $^i$Pr, $^t$Bu, CN, $CF_3$, and Ph, and triazinyl, which is optionally substituted with one or more substituents independently from each other selected from the group consisting of Me, $^i$Pr, $^t$Bu, CN, $CF_3$, and Ph.

In a preferred embodiment of the disclosure, the organic molecule includes or consists of a structure of Formula I-1a:

Formula I-1a

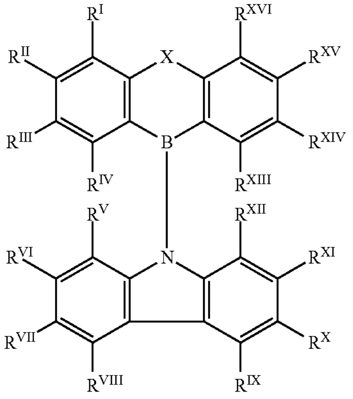

In another embodiment of the disclosure, the organic molecule includes or consists of a structure of Formula I-1b:

Formula I-1b

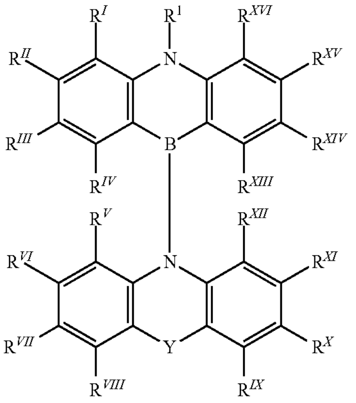

In certain embodiments of the disclosure, the organic molecule includes or consists of a structure of Formula I-2:

Formula I-2

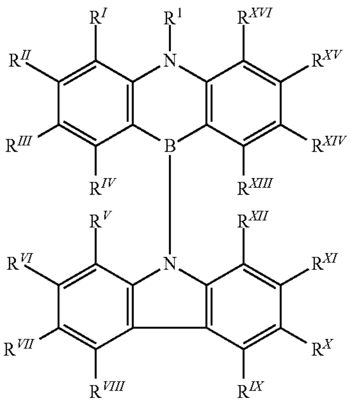

In a preferred embodiment of the disclosure the organic molecules according to the disclosure include or consist of a structure of Formula I or I-1a, wherein $R^{V}$, $R^{VI}$, $R^{VII}$, $R^{VIII}$, $R^{IX}$, $R^{X}$, $R^{XI}$ and $R^{XII}$ are each independently selected from the group consisting of:

hydrogen, deuterium, halogen, Me, $^{i}$Pr, $^{t}$Bu, CN, $CF_3$, $SiMe_3$, $SiPh_3$, OPh, $CMe_2Ph$, $N(Ph)_2$, and Ph, which is optionally substituted with one or more substituents independently selected from the group consisting of Me, $^{i}$Pr, $^{t}$Bu, CN, $CF_3$, and Ph;

wherein the Ph in $N(Ph)_2$, OPh and $CMe_2Ph$ is optionally bonded to adjacent groups $R^{V}$ to $R^{XII}$ and form an aryl or heteroaryl ring.

In certain embodiments of the disclosure, the organic molecule includes or consists of a structure selected from the group consisting of Formula I-2b-1 to I-2b-19:

I-2b-1

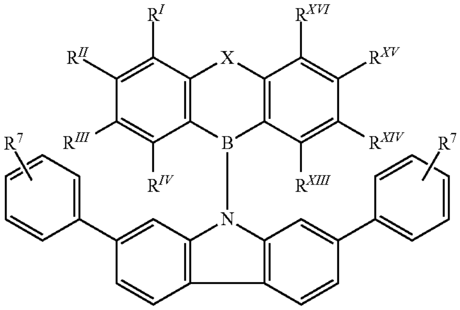

I-2b-2

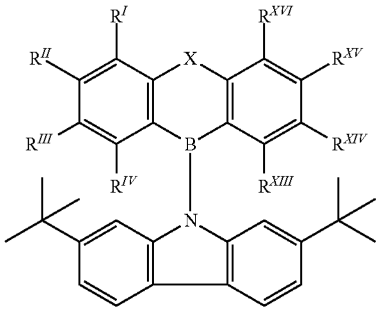

I-2b-3

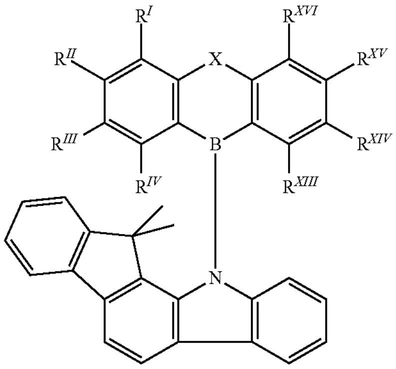

I-2b-4

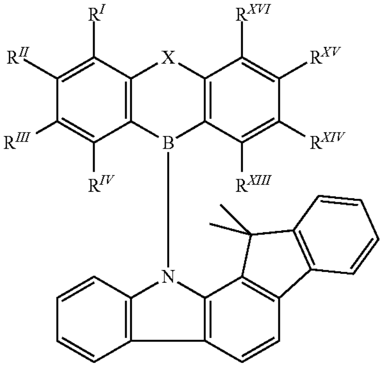

-continued
I-2b-5
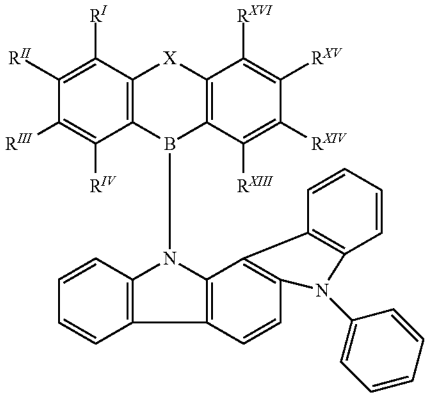
I-2b-6
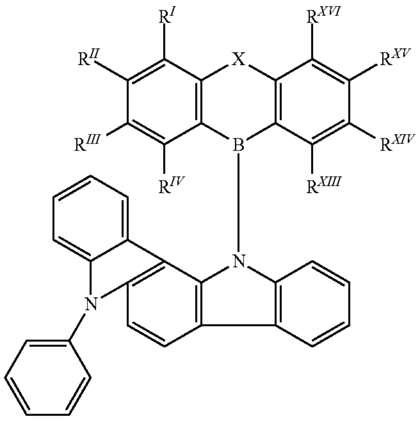
I-2b-7
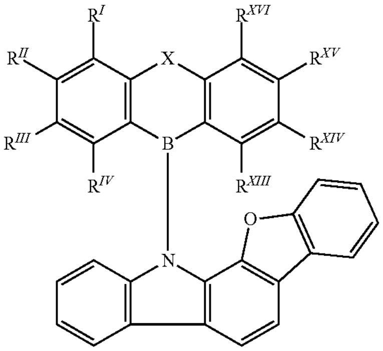
I-2b-8
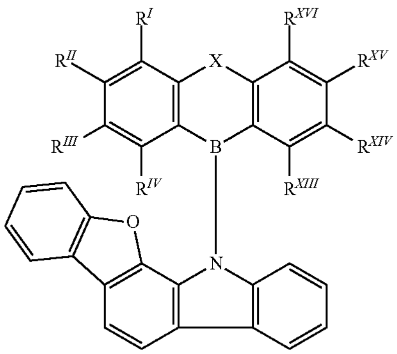
-continued
I-2b-9
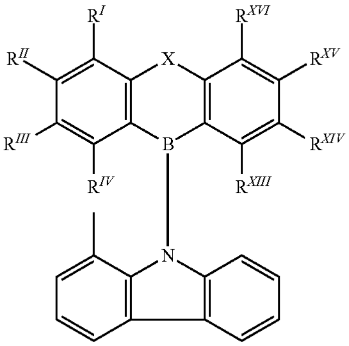
I-2b-10
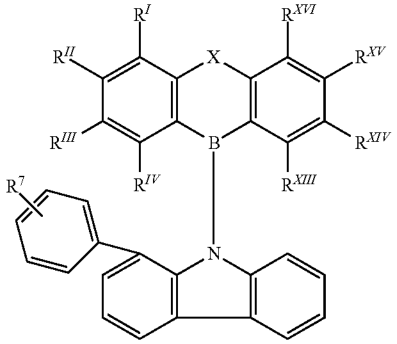
I-2b-11
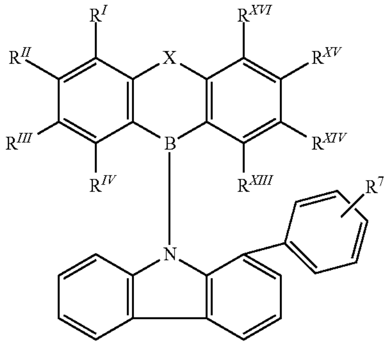
I-2b-12
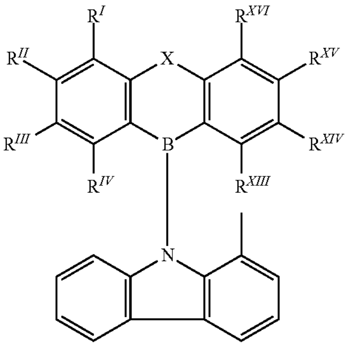

-continued

I-2b-13

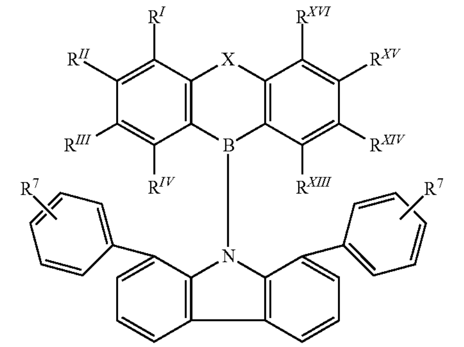

I-2b-14

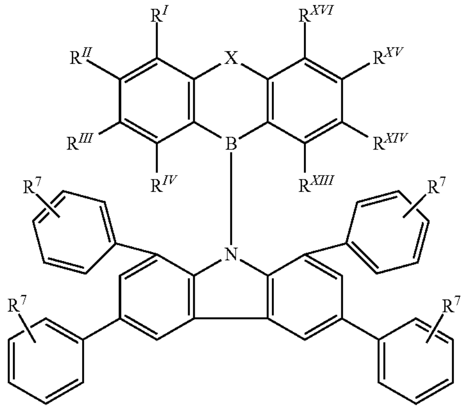

I-2b-15

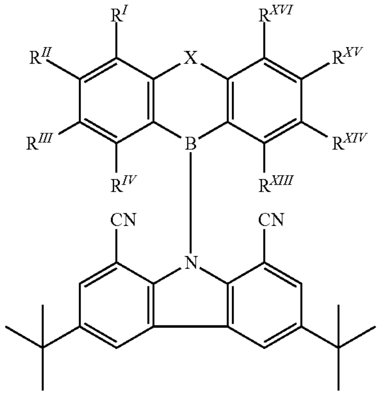

I-2b-16

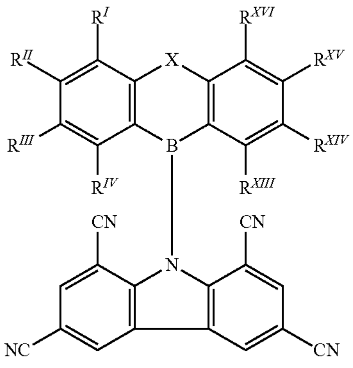

-continued

I-2b-17

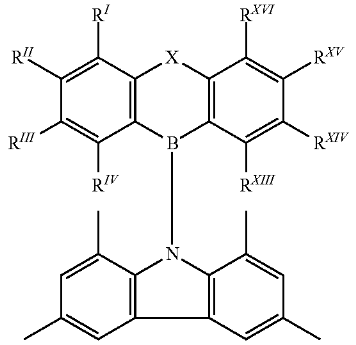

I-2b-18

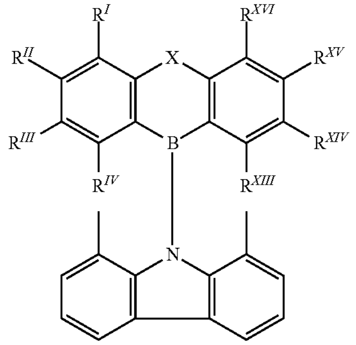

I-2b-19

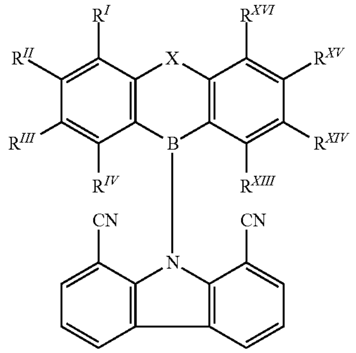

In a preferred embodiment of the disclosure, the organic molecules according to the disclosure include or consist of a structure of Formula I or I-1a, wherein $R^{V}$ and $R^{XII}$ do not both represent hydrogen.

In certain embodiments of the disclosure the organic molecules according to the disclosure include or consist of a structure of Formula I or I-1a, wherein $R^{V}$ and $R^{XII}$ are each different from hydrogen.

In another embodiment of the disclosure the organic molecules according to the disclosure include or consist of a structure of Formula I or I-1a, wherein $R^{V}=R^{XII}$ and/or $R^{X}=R^{VII}$.

In certain embodiments of the disclosure the organic molecules according to the disclosure include or consist of a structure of Formula I or I-1a, wherein $R^{V}=R^{XII}$ and $R^{X}=R^{V}$.

In another embodiment of the disclosure the organic molecules according to the disclosure include or consist of a structure of Formula I or I-1a, wherein $R^1$, $R^2$, $R^3$, and $R^4$ are at each occurrence independently selected from the group consisting of:

hydrogen, $C_1$-$C_5$-alkyl, which is optionally substituted with one or more substituents $R^5$;

$C_6$-$C_{60}$-aryl, which is optionally substituted with one or more substituents $R^5$; and $C_3$-$C_{57}$-heteroaryl, which is optionally substituted with one or more substituents $R^5$.

In a preferred embodiment of the disclosure, the organic molecule includes or consists of a structure of Formula Ia:

Formula Ia

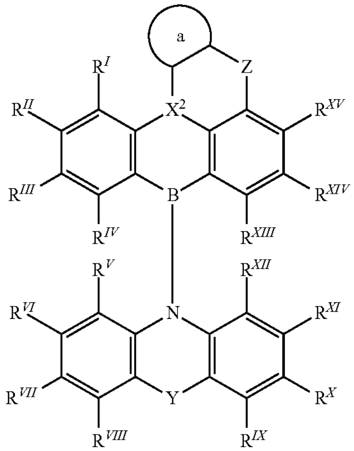

wherein $X^2$ is selected from the group consisting of N, $SiR^2$ and C—$R^2$;

ring a represents a $C_6$-$C_{18}$-aryl ring, wherein optionally one or more hydrogen atoms are each independently substituted by $R^5$; or $C_3$-$C_7$-heteroaryl ring, wherein optionally one or more hydrogen atoms are each independently substituted by $R^5$.

Z is selected from the group consisting of a direct bond, $NR^7$, O, S, $Si(R^7)_2$ and $C(R^7)_2$.

In one embodiment of the disclosure, the organic molecule includes or consists of a structure of Formula Ia-1a:

Formula Ia-1a

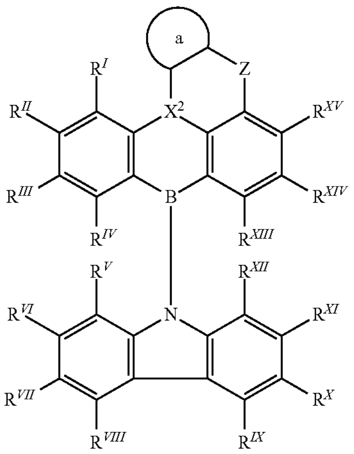

In a preferred embodiment of the disclosure the organic molecules according to the disclosure include or consist of a structure of Formula Ia or Ia-1a, wherein $R^{V}$, $R^{VI}$, $R^{VII}$, $R^{VIII}$, $R^{IX}$, $R^{X}$, $R^{XI}$ and $R^{XII}$ are each independently selected from the group consisting of:

hydrogen, deuterium, halogen, Me, $^{i}$Pr, $^{t}$Bu, CN, $CF_3$, $SiMe_3$, $SiPh_3$, OPh, $CMe_2Ph$, $N(Ph)_2$, and Ph, which is optionally substituted with one or more substituents independently selected from the group consisting of Me, $^{i}$Pr, $^{t}$Bu, CN, $CF_3$, and Ph;

wherein the Ph in $N(Ph)_2$, OPh and $CMe_2Ph$ is optionally bonded to adjacent groups $R^{V}$ to $R^{XII}$ and form an aryl or heteroaryl ring.

In certain embodiments of the disclosure, the organic molecule includes or consists of a structure selected from the group consisting of Formulae Ia-1a-1 to Ia-1a-19:

Ia-1a-1

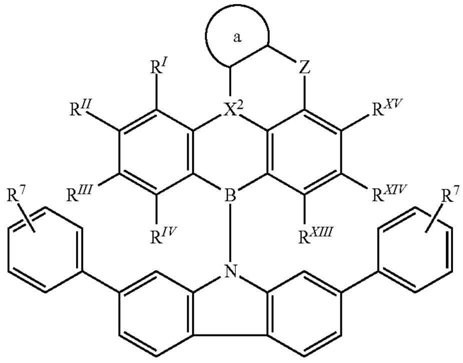

Ia-1a-2

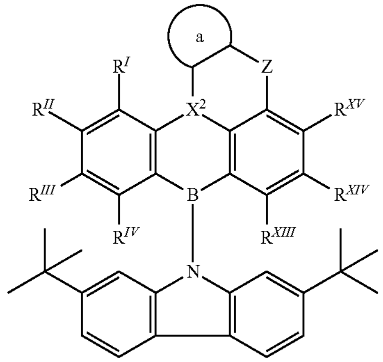

Ia-1a-3

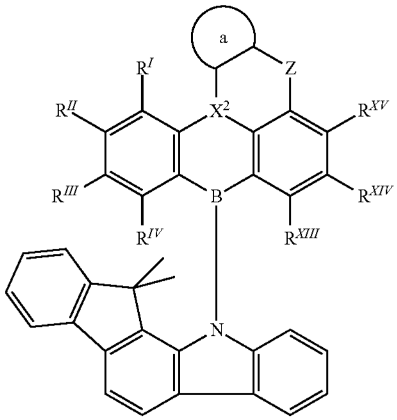

-continued
Ia-1a-4
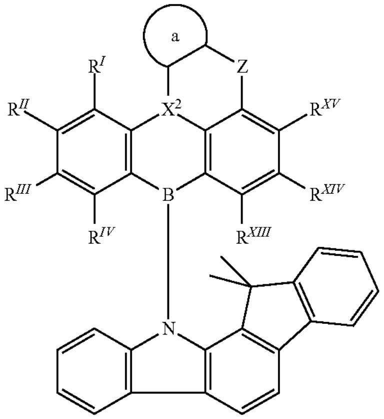
Ia-1a-5
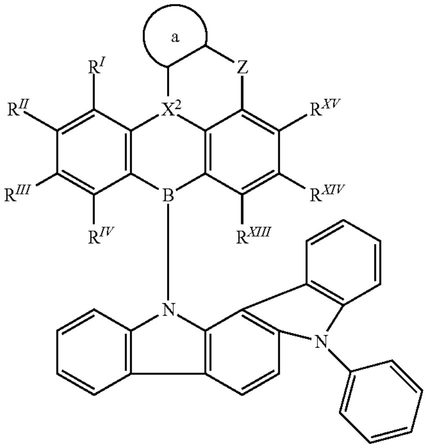
Ia-1a-6
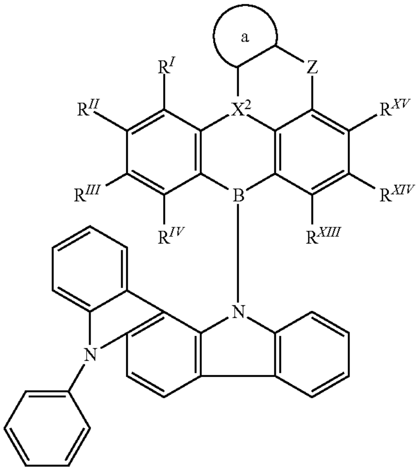
-continued
Ia-1a-7
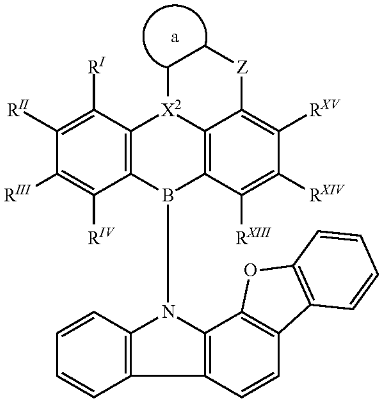
Ia-1a-8
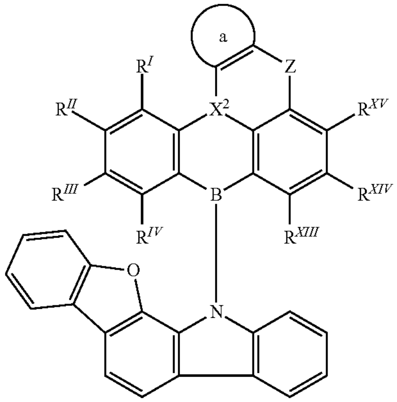
Ia-1a-9
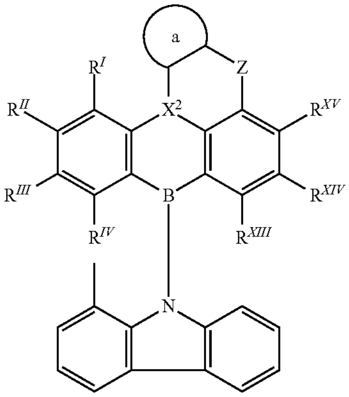
Ia-1a-10
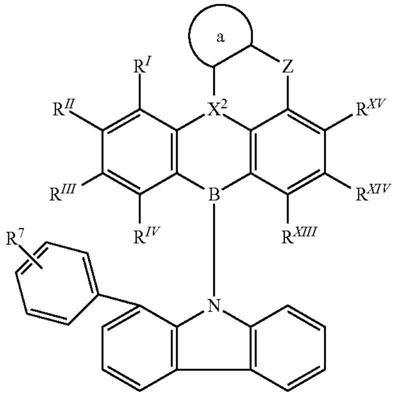

-continued
Ia-1a-11
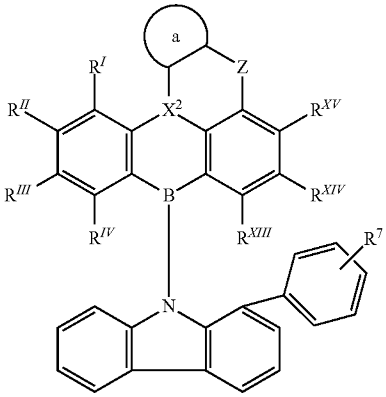
Ia-1a-12
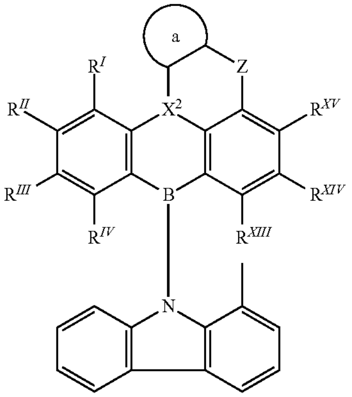
Ia-1a-13
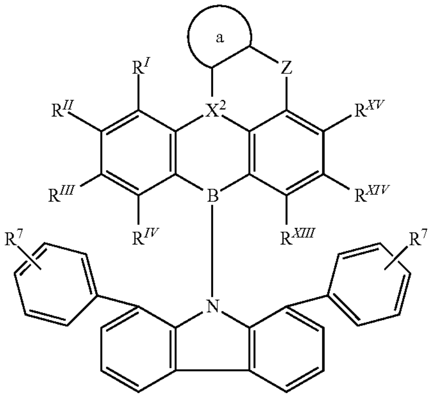
Ia-1a-14
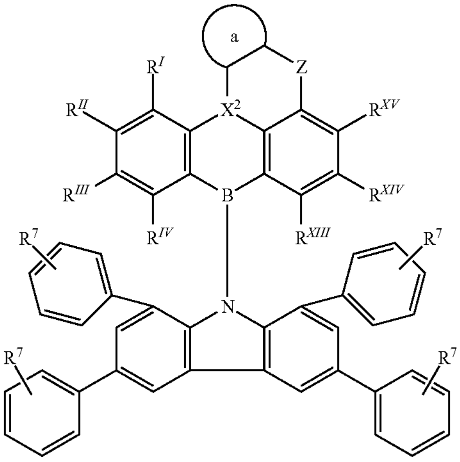
-continued
Ia-1a-15
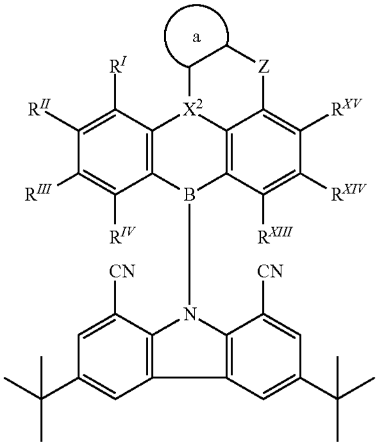
Ia-1a-16
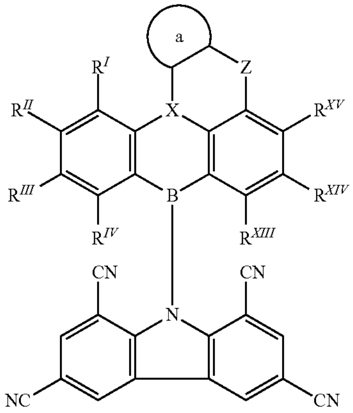
Ia-1a-17
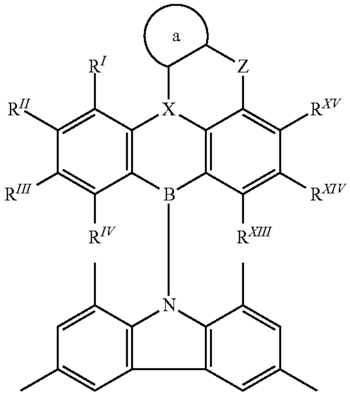

-continued

Ia-1a-18

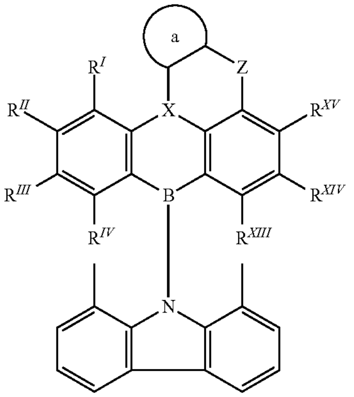

Ia-1a-19

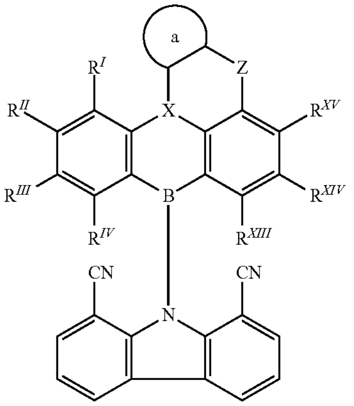

In a preferred embodiment of the disclosure, the organic molecules according to the disclosure include or consist of a structure of Formula Ia or Ia-1a, wherein $R^{V}$ and $R^{XII}$ do not both represent hydrogen.

In certain embodiments of the disclosure the organic molecules according to the disclosure include or consist of a structure of Formula Ia or Ia-1a, wherein $R^{V}$ and $R^{XII}$ are each different from hydrogen.

In another embodiment of the disclosure the organic molecules according to the disclosure include or consist of a structure of Formula Ia or Ia-1a, wherein $R^{V}$=$R^{XII}$ and/or $R^{X}$=$R^{VI}$.

In certain embodiments of the disclosure the organic molecules according to the disclosure include or consist of a structure of Formula Ia or Ia-1a, wherein $R^{V}$=$R^{XII}$ and $R^{X}$=$R^{VII}$.

In another embodiment of the disclosure the organic molecules according to the disclosure include or consist of a structure of Formula Ia or Ia-1a, wherein $R^1$, $R^2$, $R^3$, and $R^4$ are at each occurrence independently selected from the group consisting of:

hydrogen, $C_1$-$C_5$-alkyl, which is optionally substituted with one or more substituents $R^5$;

$C_6$-$C_{60}$-aryl, which is optionally substituted with one or more substituents $R^5$; and $C_3$-$C_{57}$-heteroaryl, which is optionally substituted with one or more substituents $R^5$.

In one embodiment of the disclosure, the organic molecule includes or consists of a structure selected from the group consisting of Formulae Ia-1b to Ia-1b-3:

Formula Ia-1b

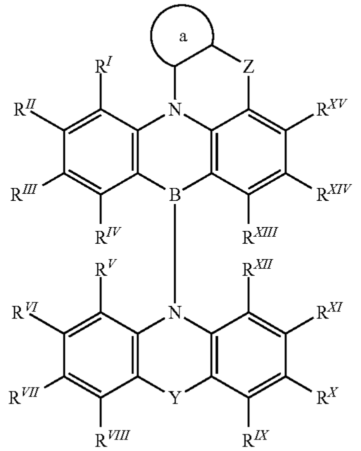

Formula I4-1b-2

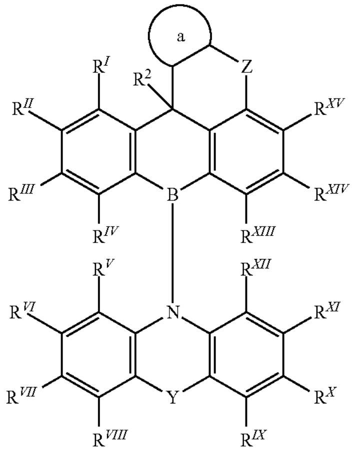

Formula Ia-1b-3

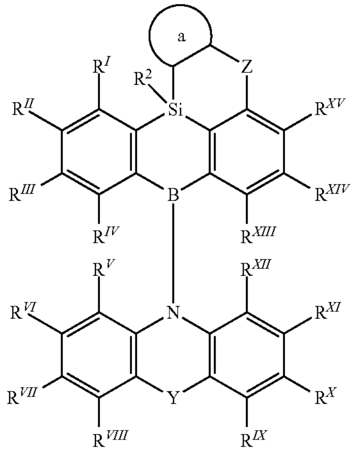

In a preferred embodiment of the disclosure, the organic molecule includes or consists of a structure of Formula Ia-1b:

Formula Ia-1b

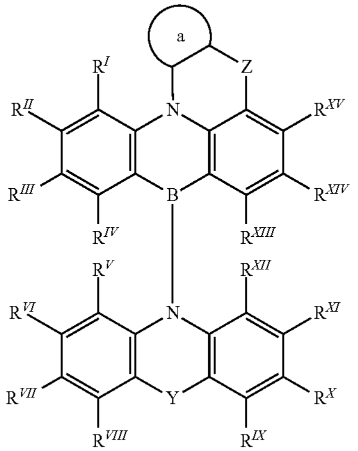

In one embodiment of the disclosure, the organic molecule includes or consists of a structure of Formula Ia-1c:

Formula Ia-1c

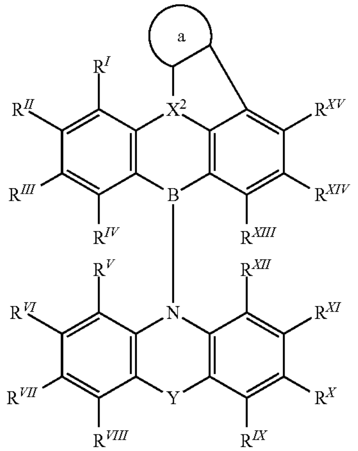

In one embodiment of the disclosure, the organic molecule includes or consists of a structure of Formula Ia-2a:

Formula Ia-2a

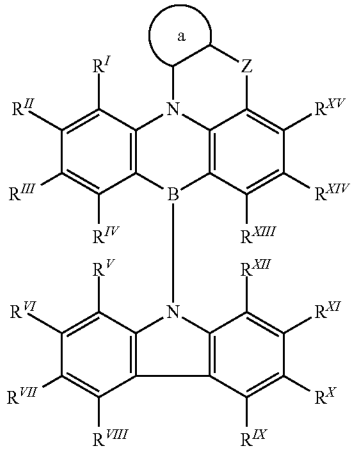

In one embodiment of the disclosure, the organic molecule includes or consists of a structure of Formula Ia-2b:

Formula Ia-2b

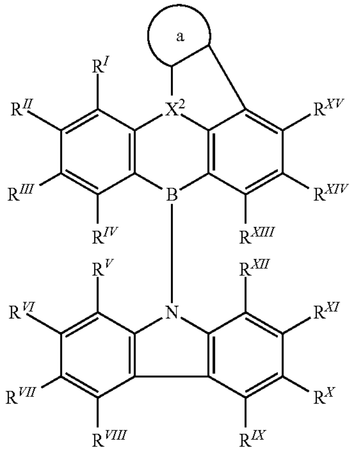

In one embodiment of the disclosure, the organic molecule includes or consists of a structure of Formula Ia-2c:

Formula Ia-2c

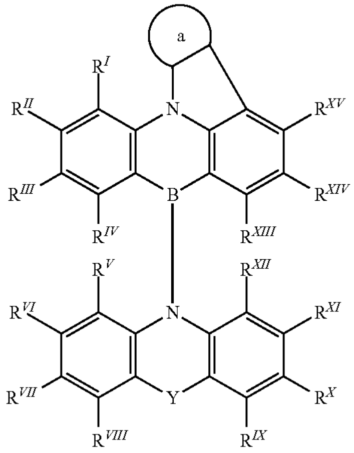

In certain embodiments of the disclosure, the organic molecule includes or consists of a structure of Formula Ia-3:

Formula Ia-3

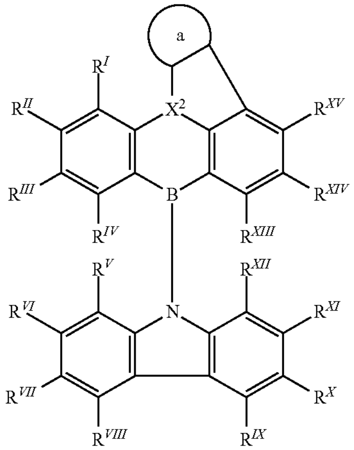

In one embodiment of the disclosure, the organic molecule includes or consists of a structure selected from the group consisting of Formulae Ib to Ib-8:
Ib
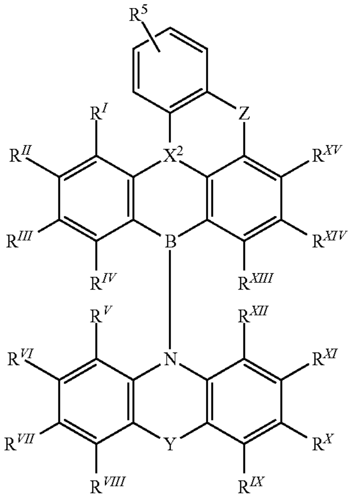
Ib-1
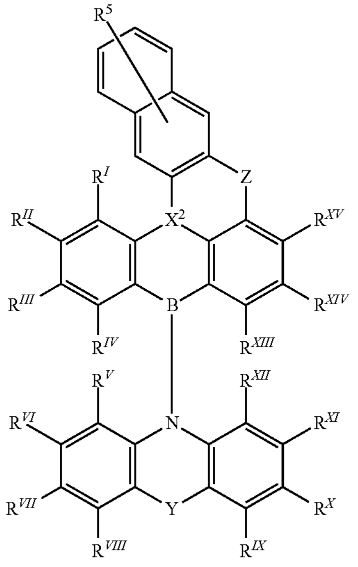
-continued
Ib-2
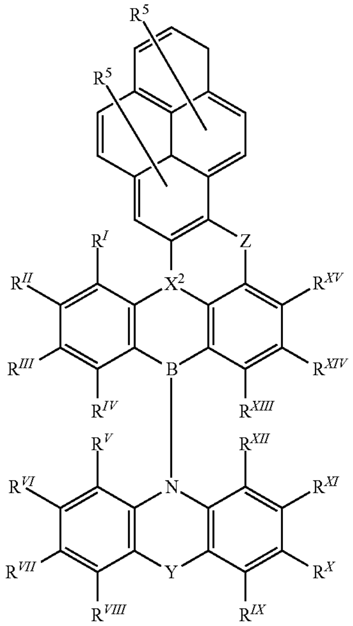
IB-3
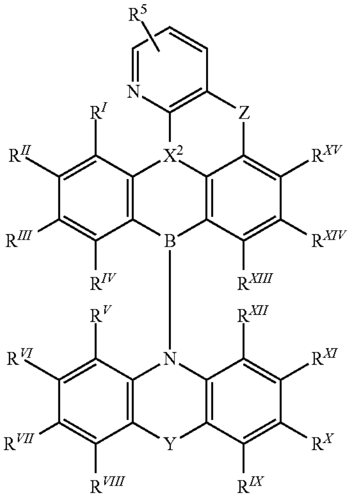
Ib-4
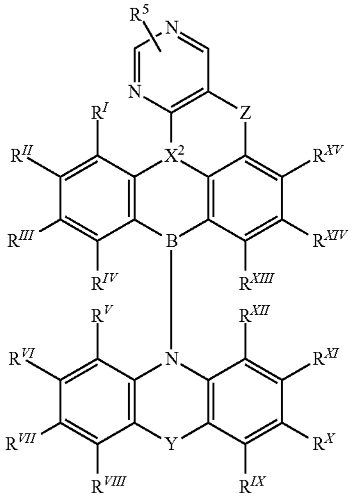

-continued

Ib-5

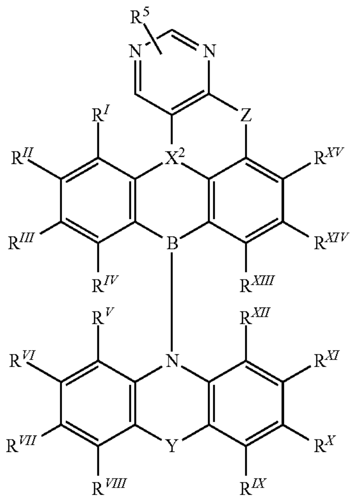

Ib-6

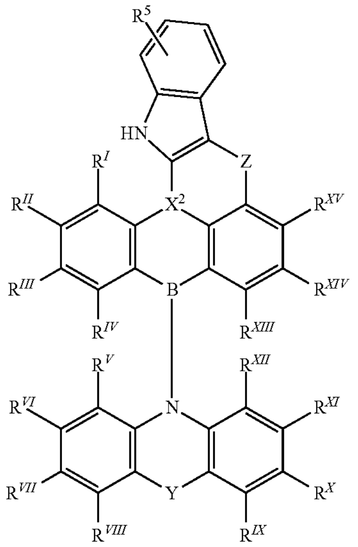

Ib-7

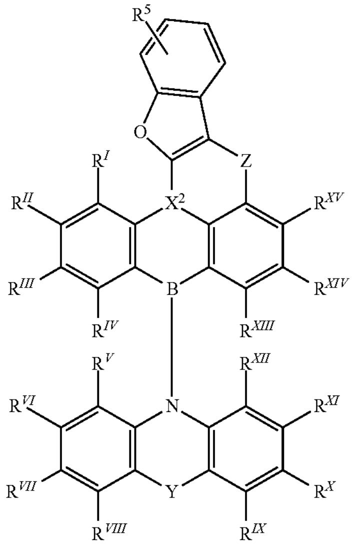

-continued

Ib-8

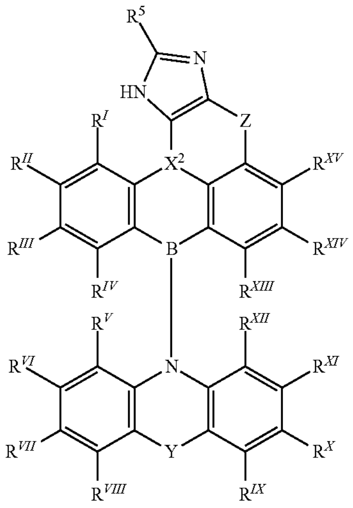

In a preferred embodiment of the disclosure, the organic molecule includes or consists of a structure of Formula Ib:

Formula Ib

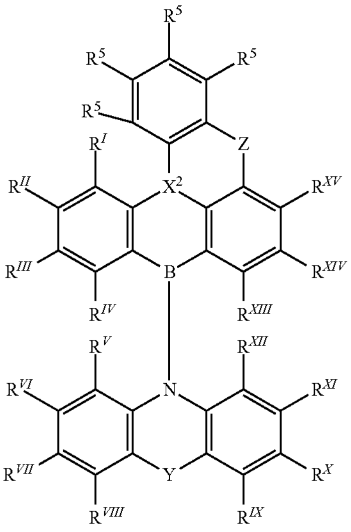

In certain embodiments of the disclosure, the organic molecule includes or consists of a structure of Formula Ib, wherein $R^5$, $R^{XIII}$, $R^{XIV}$ and $R^{XV}$ are each independently selected from the group consisting of:

hydrogen, deuterium, halogen, Me, $^i$Pr, $^t$Bu, CN, $CF_3$, $SiMe_3$, $SiPh_3$, SPh, OPh, $CMe_2Ph$, $N(Ph)_2$, carbazole and Ph, which is optionally substituted with one or more substituents independently selected from the group consisting of Me, $^i$Pr, $^t$Bu, CN, $CF_3$, and Ph;

wherein the Ph in $N(Ph)_2$, OPh and $CMe_2Ph$ is optionally bonded to adjacent groups $R^5$, $R^{XIII}$, $R^{XIV}$ and/or $R^{XV}$ and forms an aryl or heteroaryl ring; and wherein adjacent groups $R^5$, $R^{XIII}$, $R^{XIV}$ and/or $R^{XV}$ are optionally bonded to each other and form an aryl ring.

In one embodiment of the disclosure, the organic molecule includes or consists of a structure of Formula Ib-1a:

Formula Ib-1a

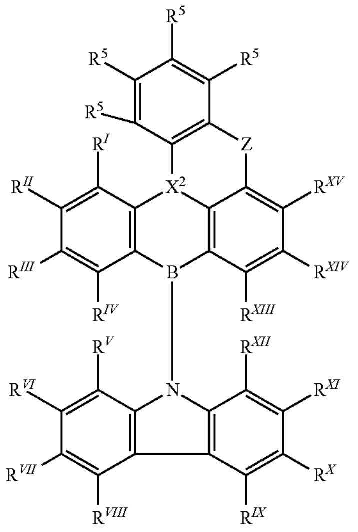

In a preferred embodiment of the disclosure the organic molecules according to the disclosure include or consist of a structure of Formula Ib or Ib-1a, wherein $R^{V}$, $R^{VI}$, $R^{VII}$, $R^{VIII}$, $R^{IX}$, $R^{X}$, $R^{XI}$ and $R^{XII}$ are each independently selected from the group consisting of:

hydrogen, deuterium, halogen, Me, $^{i}$Pr, $^{t}$Bu, CN, $CF_3$, $SiMe_3$, $SiPh_3$, OPh, $CMe_2Ph$, $N(Ph)_2$, and Ph, which is optionally substituted with one or more substituents independently selected from the group consisting of Me, $^{i}$Pr, $^{t}$Bu, CN, CFs, and Ph;

wherein the Ph in $N(Ph)_2$, OPh and $CMe_2Ph$ is optionally bonded to adjacent groups $R^{V}$ to $R^{XII}$ and form an aryl or heteroaryl ring.

In certain embodiments of the disclosure, the organic molecule includes or consists of a structure selected from the group consisting of Formulae Ib-1a-1 to Ib-1a-19:

Ib-1a-1

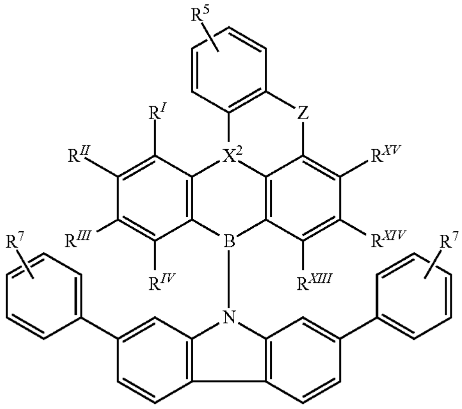

-continued

Ib-1a-2

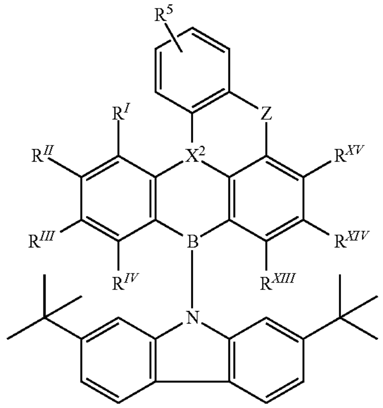

Ib-1a-3

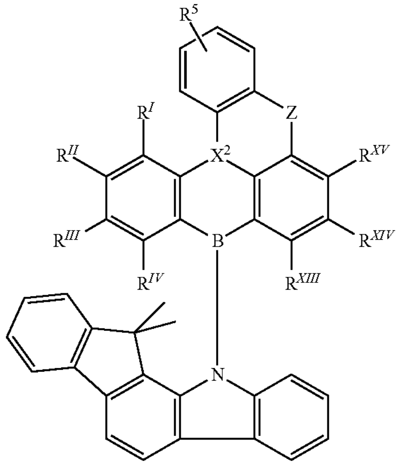

Ib-1a-4

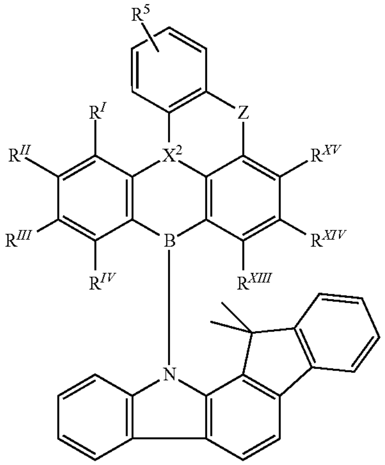

-continued
Ib-1a-5
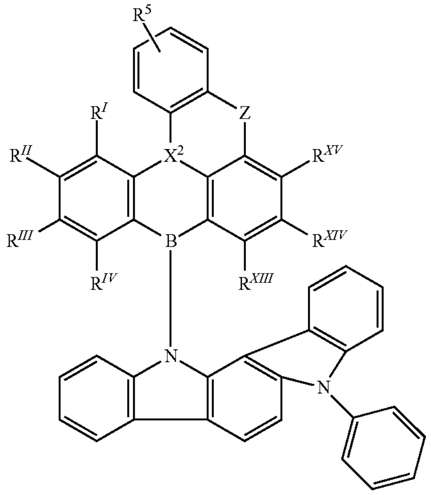
Ib-1a-6
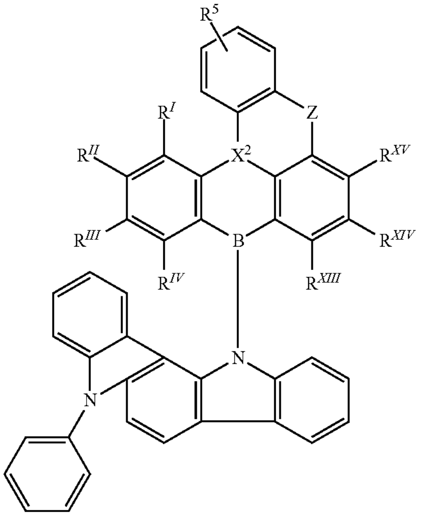
Ib-1a-7
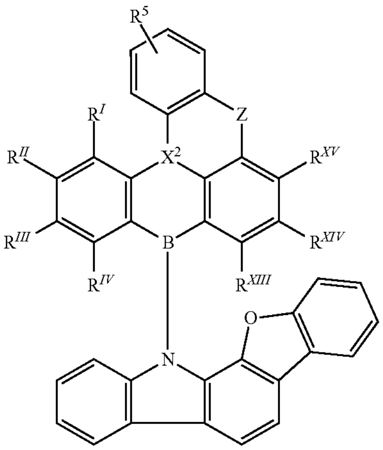
-continued
Ib-1a -8
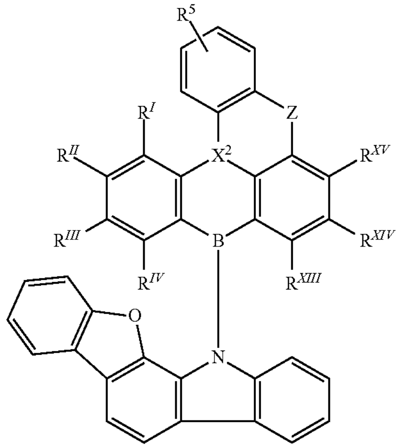
Ib-1a -9
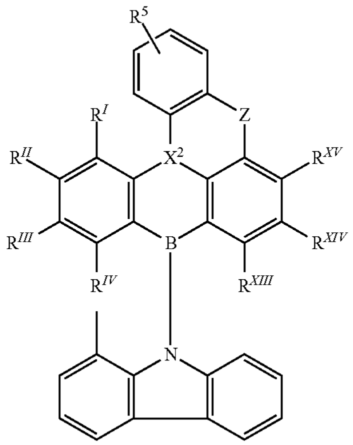
Ib-1a-10
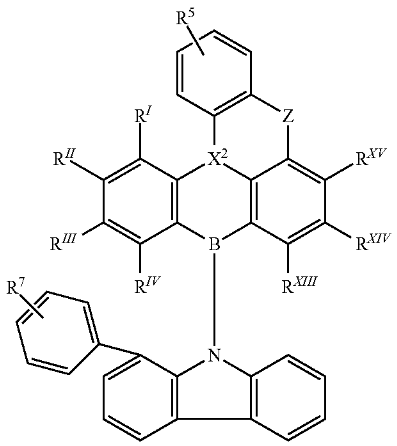

-continued
Ib-1a-11
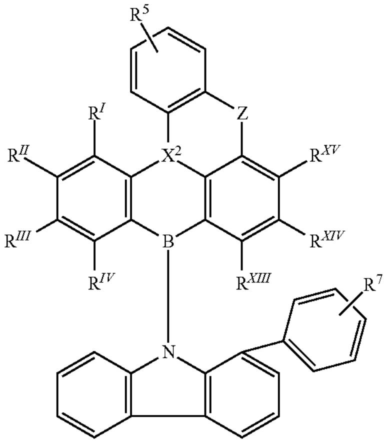
Ib-1a-12
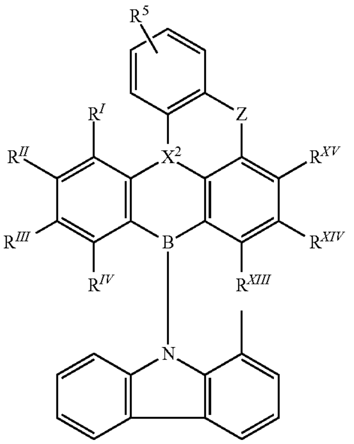
Ib-1a-13
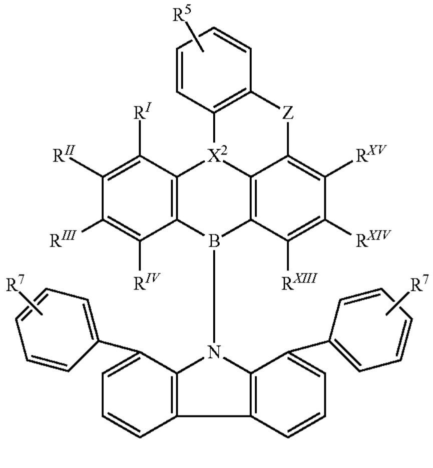
-continued
Ib-1a-14
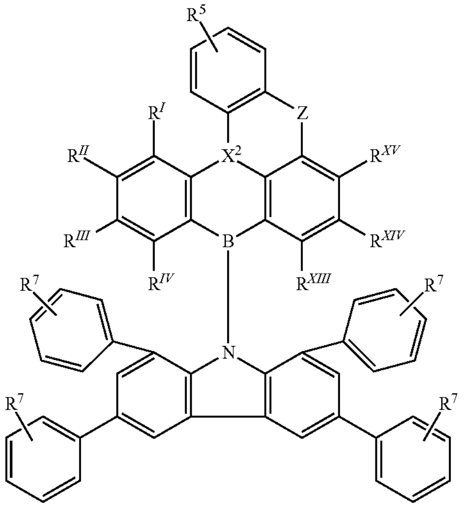
Ib-1a-15
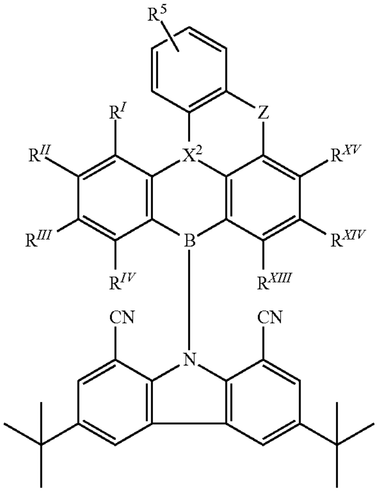
Ib-1a-16
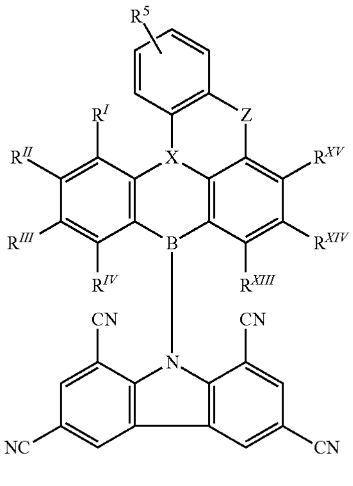

-continued

Ib-1a-17

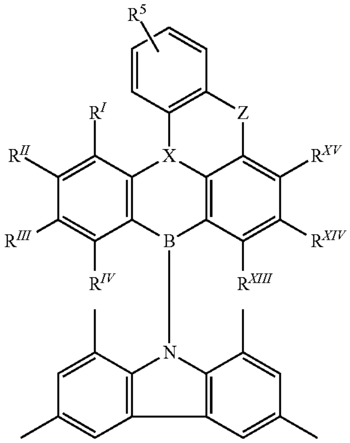

Ib-1a-18

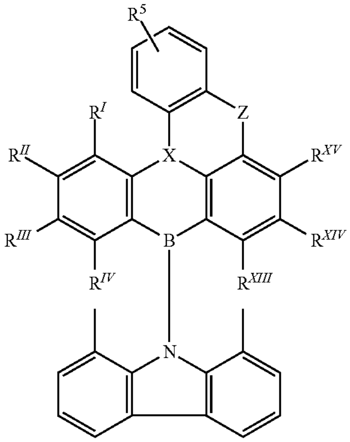

Ib-1a-19

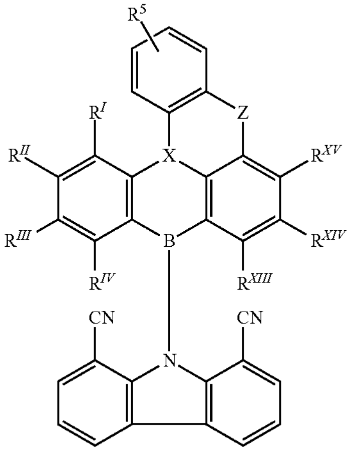

In a preferred embodiment of the disclosure, the organic molecules according to the disclosure include or consist of a structure of Formula Ib or Ib-1a, wherein $R^{V}$ and $R^{XII}$ do not both represent hydrogen.

In certain embodiments of the disclosure the organic molecules according to the disclosure include or consist of a structure of Formula Ib or Ib-1a, wherein $R^{V}$ and $R^{XII}$ are each different from hydrogen.

In another embodiment of the disclosure the organic molecules according to the disclosure include or consist of a structure of Formula Ib or Ib-1a, wherein $R^{V}=R^{XII}$ and/or $R^{X}=R^{VII}$.

In certain embodiments of the disclosure the organic molecules according to the disclosure include or consist of a structure of Formula Ib or Ib-1a, wherein $R^{V}=R^{XII}$ and $R^{X}=R^{VII}$.

In another embodiment of the disclosure the organic molecules according to the disclosure include or consist of a structure of Formula Ib or Ib-1a, wherein $R^1$, $R^2$, $R^3$, and $R^4$ are at each occurrence independently selected from the group consisting of:

hydrogen, $C_1$-$C_5$-alkyl, which is optionally substituted with one or more substituents $R^5$;

$C_6$-$C_{60}$-aryl, which is optionally substituted with one or more substituents $R^5$; and $C_3$-$C_{57}$-heteroaryl, which is optionally substituted with one or more substituents $R^5$.

In one embodiment of the disclosure, the organic molecule includes or consists of a structure of Formula Ib-1b:

Formula Ib-1b

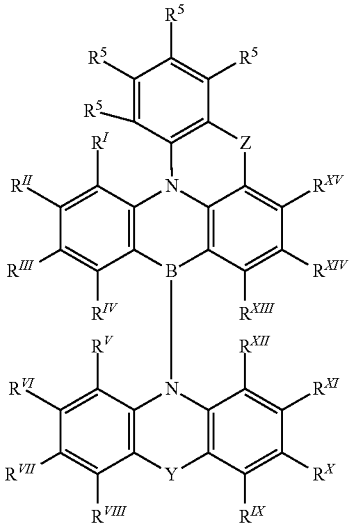

In a further embodiment of the disclosure, $R^5$, $R^{I}$, $R^{II}$, $R^{III}$, $R^{IV}$, $R^{V}$, $R^{VI}$, $R^{VII}$, $R^{VIII}$, $R^{IX}$, $R^{X}$, $R^{XI}$, $R^{XII}$, $R^{XIII}$, $R^{XIV}$, and $R^{XV}$ are each independently selected from the group consisting of:

hydrogen,

Me, $^{i}$Pr, $^{t}$Bu, CN, $CF_3$,

Ph, which is optionally substituted with one or more substituents independently from each other selected from the group consisting of Me, $^{i}$Pr, $^{t}$Bu, CN, $CF_3$, and Ph, pyridinyl, which is optionally substituted with one or more substituents independently from each other selected from the group consisting of Me, $^{i}$Pr, $^{t}$Bu, CN, $CF_3$, and Ph, carbazolyl, which is optionally substituted with one or more substituents independently from each other selected from the group consisting of Me, $^{i}$Pr, $^{t}$Bu, CN, $CF_3$, and Ph, triazinyl, which is optionally substituted with one or more substituents independently from each other selected from the group consisting of Me, $^{i}$Pr, $^{t}$Bu, CN, $CF_3$, and Ph, and $N(Ph)_2$.

In a further embodiment of the disclosure, $R^5$, $R^I$, $R^{II}$, $R^{III}$, $R^{IV}$, $R^V$, $R^{VI}$, $R^{VII}$, $R^{VIII}$, $R^{IX}$, $R^X$, $R^{XI}$, $R^{XII}$, $R^{XIII}$, $R^{XIV}$, and $R^{XV}$ are each independently selected from the group consisting of:

hydrogen,

Me, $^{i}$Pr, $^{t}$Bu,

CN, $CF_3$,

Ph, which is optionally substituted with one or more substituents independently from each other selected from the group consisting of Me, $^{i}$Pr, $^{t}$Bu, CN, $CF_3$, and Ph, pyridinyl, which is optionally substituted with one or more substituents independently from each other selected from the group consisting of Me, $^{i}$Pr, $^{t}$Bu, CN, $CF_3$, and Ph, pyrimidinyl, which is optionally substituted with one or more substituents independently from each other selected from the group consisting of Me, $^{i}$Pr, $^{t}$Bu, CN, $CF_3$, and Ph, and triazinyl, which is optionally substituted with one or more substituents independently from each other selected from the group consisting of Me, $^{i}$Pr, $^{t}$Bu, CN, $CF_3$, and Ph.

In one embodiment of the disclosure, the organic molecule includes or consists of a structure of Formula Ib-1c:

Formula Ib-1c

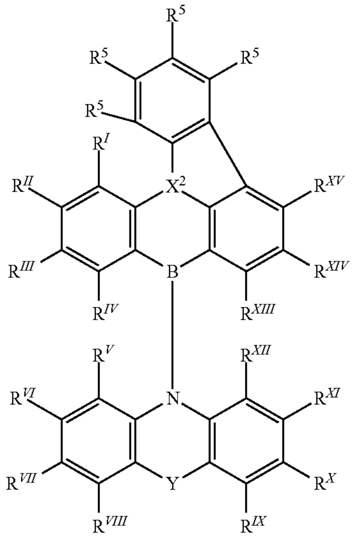

In one embodiment of the disclosure, the organic molecule includes or consists of a structure of Formula Ib-2a:

Formula Ib-2a

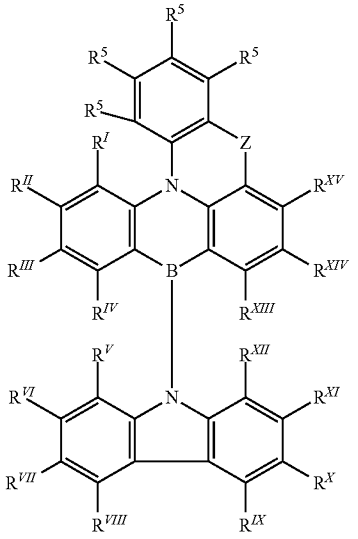

In certain embodiments of the disclosure, the organic molecule includes or consists of a structure selected from the group consisting of Formula Ib-2a1, Formula Ib-2a2, and Formula Ib-2a3:

Formula Ib-2a1

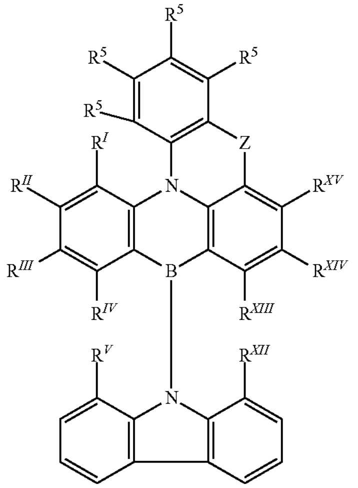

Formula Ib-2a2

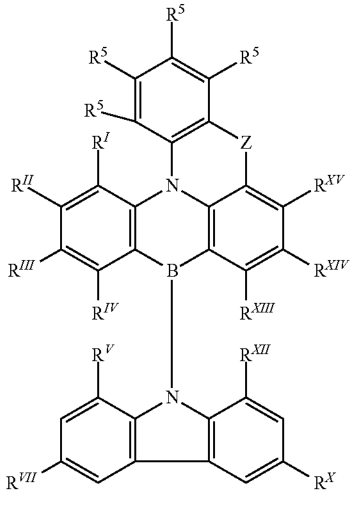

-continued

Formula Ib-2a3

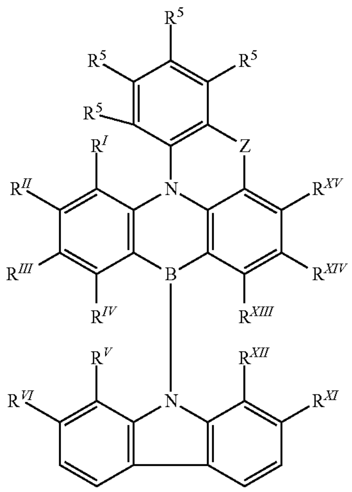

wherein the aforementioned definitions apply.

In certain embodiments of the disclosure, the organic molecule includes or consists of a structure selected from the group consisting of Formula Ib-2a4, Formula Ib-2a5, and Formula Ib-2a6:

Formula Ib-2a4

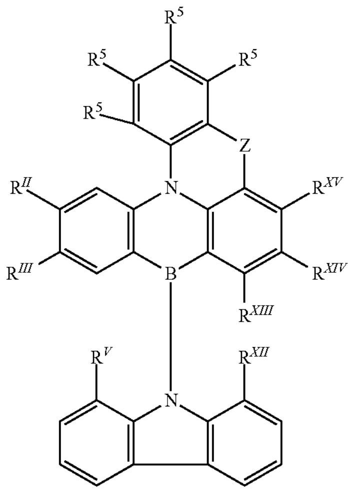

-continued

Formula Ib-2a5

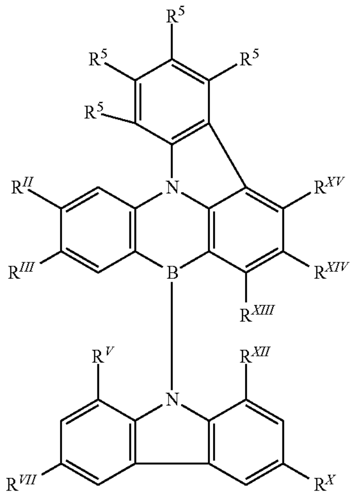

Formula Ib-2a6

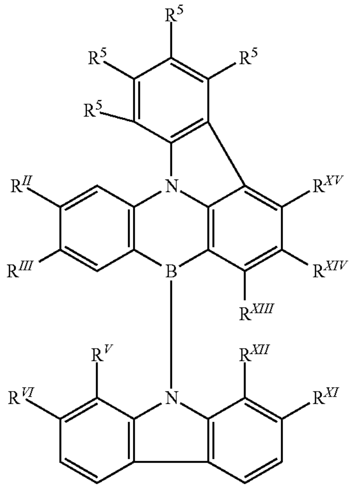

wherein the aforementioned definitions apply.

In certain embodiments of the disclosure, the organic molecule includes or consists of a structure selected from the group consisting of Formula Ib-2a7, Formula Ib-2a8, and Formula Ib-2a9:

Formula Ib-2a7

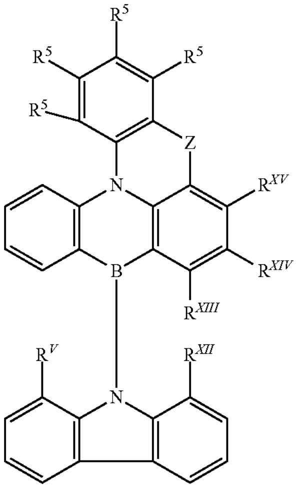

Formula Ib-2a8

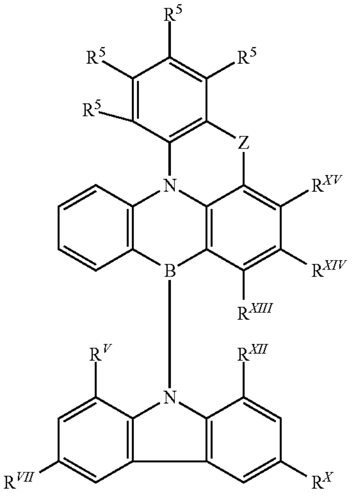

Formula Ib-2a9

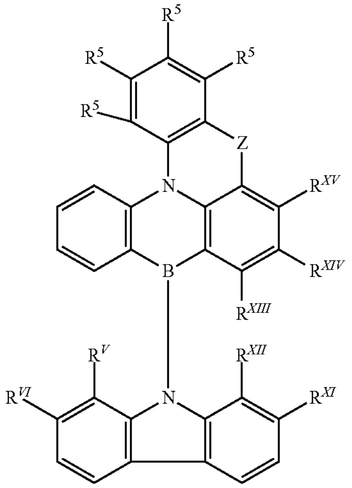

wherein the aforementioned definitions apply.

In one embodiment of the disclosure, the organic molecule includes or consists of a structure of Formula Ib-2b:

Formula Ib-2b

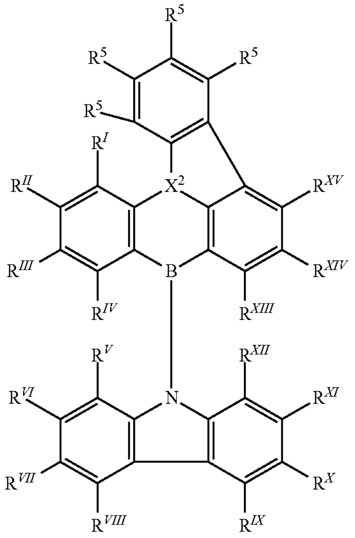

In one embodiment of the disclosure, the organic molecule includes or consists of a structure of Formula Ib-2c:

Formula Ib-2c

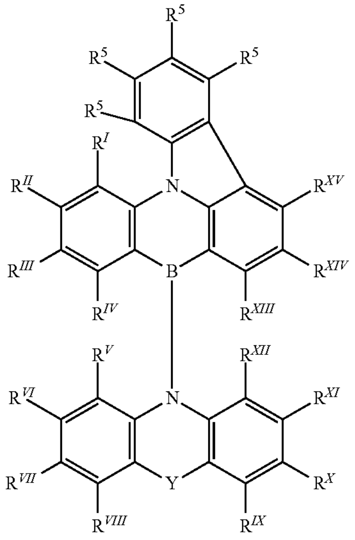

In a preferred embodiment of the disclosure the organic molecules according to the disclosure include or consist of a structure of Formula Ib-2a, Ib-2b or Ib-2c, wherein $R^V$, $R^{VI}$, $R^{VII}$, $R^{VIII}$, $R^{IX}$, $R^X$, $R^{XI}$ and $R^{XII}$ are each independently selected from the group consisting of:

hydrogen, deuterium, halogen, Me, $^i$Pr, $^t$Bu, CN, $CF_3$, $SiMe_3$, $SiPh_3$, OPh, $CMe_2Ph$, $N(Ph)_2$, and Ph, which is optionally substituted with one or more substituents independently selected from the group consisting of Me, $^i$Pr, $^t$Bu, CN, $CF_3$, and Ph;

wherein the Ph in $N(Ph)_2$, OPh and $CMe_2Ph$ is optionally bonded to adjacent groups $R^V$ to $R^{XII}$ and form an aryl or heteroaryl ring.

In a preferred embodiment of the disclosure, the organic molecules according to the disclosure include or consist of a structure of Formula Ib-2a, Ib-2b or Ib-2c, wherein $R^V$ and $R^{XII}$ do not both represent hydrogen.

In certain embodiments of the disclosure the organic molecules according to the disclosure include or consist of a structure of Formula Ib-2a, Ib-2b or Ib-2c, wherein $R^V$ and $R^{XII}$ are each different from hydrogen.

In another embodiment of the disclosure the organic molecules according to the disclosure include or consist of a structure of Formula Ib-2a, Ib-2b or Ib-2c, wherein $R^V$=$R^{XI}$ and/or $R^X$=$R^{VII}$.

In certain embodiments of the disclosure the organic molecules according to the disclosure include or consist of a structure of Formula Ib-2a, Ib-2b or Ib-2c, wherein $R^V$=$R^{XI}$ and $R^X$=$R^{VII}$.

In another embodiment of the disclosure the organic molecules according to the disclosure include or consist of a structure of Formula Ib-2a, Ib-2b or Ib-2c, wherein $R^1$, $R^2$, $R^3$, and $R^4$ are at each occurrence independently selected from the group consisting of:

hydrogen, $C_1$-$C_5$-alkyl, which is optionally substituted with one or more substituents $R^5$;

$C_6$-$C_{60}$-aryl, which is optionally substituted with one or more substituents $R^5$; and $C_3$-$C_{57}$-heteroaryl, which is optionally substituted with one or more substituents $R^5$.

In certain embodiments of the disclosure, the organic molecule includes or consists of a structure of Formula Ib-2a, Ib-2b or Ib-2c, wherein $R^5$, $R^{XIII}$, $R^{XIV}$ and $R^{XV}$ are each independently selected from the group consisting of:

hydrogen, deuterium, halogen, Me, $^i$Pr, $^t$Bu, CN, $CF_3$, $SiMe_3$, $SiPh_3$, SPh, OPh, $CMe_2Ph$, $N(Ph)_2$, carbazole and Ph, which is optionally substituted with one or more substituents independently selected from the group consisting of Me, $^i$Pr, $^t$Bu, CN, $CF_3$, and Ph;

wherein the Ph in $N(Ph)_2$, OPh and $CMe_2Ph$ is optionally bonded to adjacent groups $R^5$, $R^{XIII}$, $R^{XIV}$ and/or $R^{XV}$ and forms an aryl or heteroaryl ring; and wherein adjacent groups $R^5$, $R^{XIII}$, $R^{XIV}$ and/or $R^{XV}$ are optionally bonded to each other and form an aryl ring.

In certain embodiments of the disclosure, the organic molecule includes or consists of a structure of Formula Ib-3:

Formula Ib-3

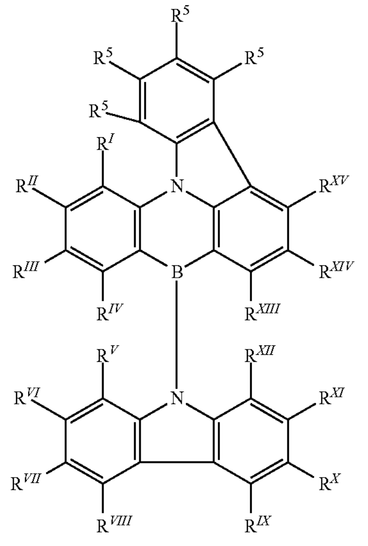

In a preferred embodiment of the disclosure, the organic molecules according to the disclosure include or consist of a structure of Formula Ib-3, wherein $R^V$, $R^{VI}$, $R^{VII}$, $R^{VIII}$, $R^{IX}$, $R^X$, $R^{XI}$ and $R^{XII}$ are each independently selected from the group consisting of:

hydrogen, deuterium, halogen, Me, $^i$Pr, $^t$Bu, CN, $CF_3$, $SiMe_3$, $SiPh_3$, OPh, $CMe_2Ph$, $N(Ph)_2$, and Ph, which is optionally substituted with one or more substituents independently selected from the group consisting of Me, $^i$Pr, $^t$Bu, CN, CFs, and Ph;

wherein the Ph in $N(Ph)_2$, OPh and $CMe_2Ph$ is optionally bonded to adjacent groups $R^V$ to $R^{XII}$ and form an aryl or heteroaryl ring.

In a preferred embodiment of the disclosure, the organic molecules according to the disclosure include or consist of a structure of Formula Ib-3, wherein $R^V$ and $R^{XII}$ do not both represent hydrogen.

In certain embodiments of the disclosure the organic molecules according to the disclosure include or consist of a structure of Formula Ib-3, wherein $R^V$ and $R^{XII}$ are each different from hydrogen.

In another embodiment of the disclosure the organic molecules according to the disclosure include or consist of a structure of Formula Ib-3, wherein $R^V$=$R^{XII}$ and/or $R^X$=$R^{VII}$.

In certain embodiments of the disclosure the organic molecules according to the disclosure include or consist of a structure of Formula Ib-3, wherein $R^V$=$R^{XII}$ and $R^X$=$R^V$.

In another embodiment of the disclosure the organic molecules according to the disclosure include or consist of a structure of Formula Ib-3, wherein $R^1$, $R^2$, $R^3$, and $R^4$ are at each occurrence independently selected from the group consisting of:

hydrogen, $C_1$-$C_5$-alkyl, which is optionally substituted with one or more substituents $R^5$;

$C_6$-$C_{60}$-aryl, which is optionally substituted with one or more substituents $R^5$; and $C_3$-$C_{57}$-heteroaryl, which is optionally substituted with one or more substituents $R^5$.

In certain embodiments of the disclosure, the organic molecule includes or consists of a structure of Formula Ib-3, wherein $R^5$, $R^{XIII}$, $R^{XIV}$ and $R^{XV}$ are each independently selected from the group consisting of:

hydrogen, deuterium, halogen, Me, $^i$Pr, $^t$Bu, CN, $CF_3$, $SiMe_3$, $SiPh_3$, SPh, OPh, $CMe_2Ph$, $N(Ph)_2$, carbazole and Ph, which is optionally substituted with one or more substituents independently selected from the group consisting of Me, $^i$Pr, $^t$Bu, CN, $CF_3$, and Ph;

wherein the Ph in $N(Ph)_2$, OPh and $CMe_2Ph$ is optionally banded to adjacent groups $R^5$, $R^{XIII}$, $R^{XIV}$ and/or $R^{XV}$ and forms an aryl or heteroaryl ring; and wherein adjacent groups $R^5$, $R^{XII}$, $R^{XIV}$ and/or $R^{XV}$ are optionally bonded to each other and form an aryl ring.

In certain embodiments of the disclosure, the organic molecule includes or consists of a structure selected from the group consisting of Formula Ib-31, Formula Ib-32 and Formula Ib-33:

Formula Ib-31

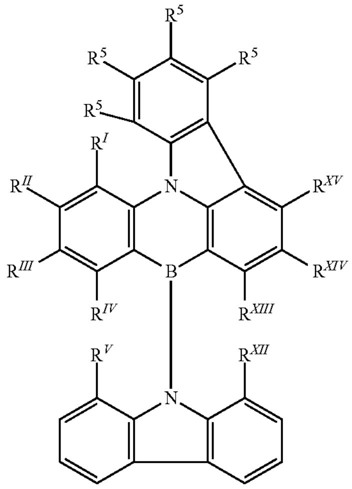

Formula Ib-32

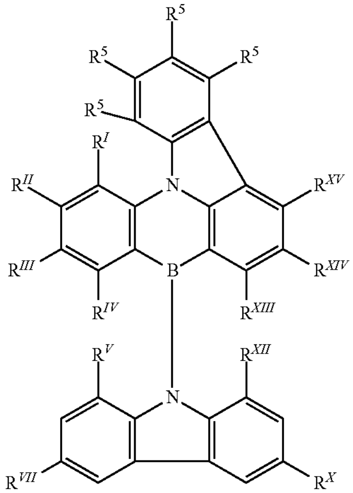

Formula Ib-33

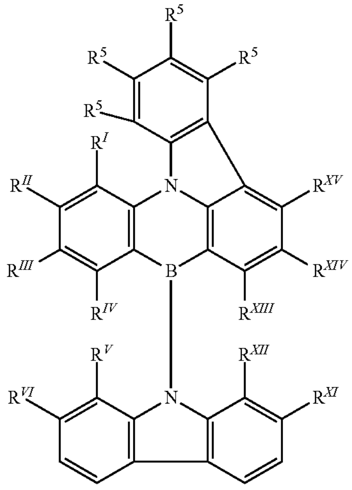

wherein the aforementioned definitions apply.

In certain embodiments of the disclosure, the organic molecule includes or consists of a structure selected from the group consisting of Formula Ib-34, Formula Ib-35, and Formula Ib-36:

Formula Ib-34

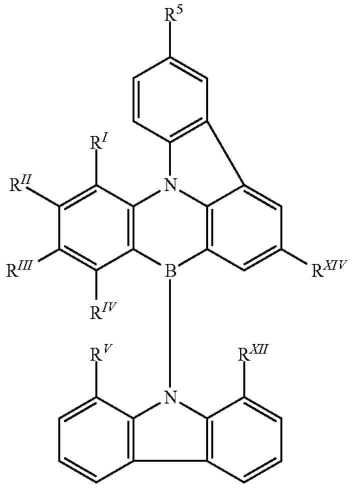

Formula Ib-35

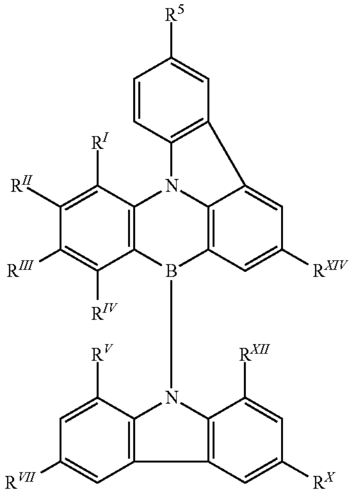

Formula Ib-36

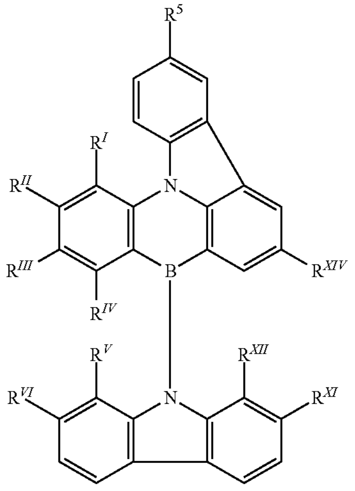

wherein the aforementioned definitions apply.

In certain embodiments of the disclosure, the organic molecule includes or consists of a structure selected from the group consisting of Formula Ib-37, Formula Ib-38, and Formula Ib-39:

Formula Ib-37

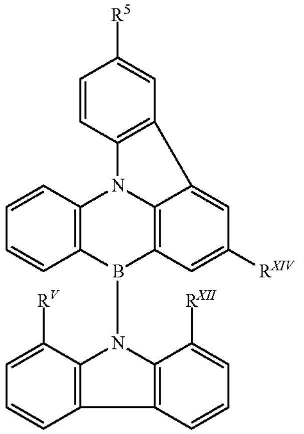

Formula Ib-38

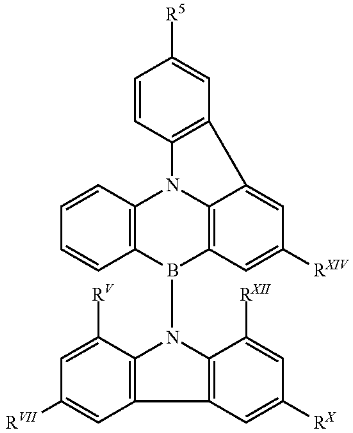

Formula Ib-39

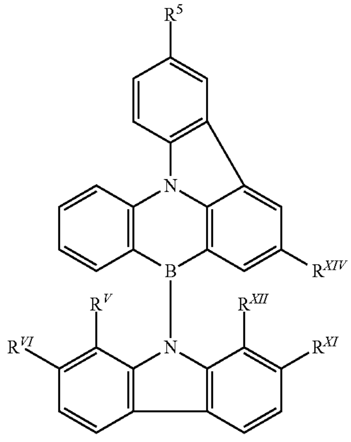

wherein the aforementioned definitions apply.

In a further embodiment of the disclosure, $R^5$, $R^{I}$, $R^{II}$, $R^{III}$, $R^{IV}$, $R^{V}$, $R^{VI}$, $R^{VII}$, $R^{X}$, $R^{XI}$, $R^{XII}$, $R^{XIII}$, $R^{XIV}$, and $R^{XV}$ are each independently selected from the group consisting of:

hydrogen,

Me, $^{i}$Pr, $^{t}$Bu, CN, $CF_3$,

Ph, which is optionally substituted with one or more substituents independently from each other selected from the group consisting of Me, $^{i}$Pr, $^{t}$Bu, CN, $CF_3$, and Ph, pyridinyl, which is optionally substituted with one or more substituents independently from each other selected from the group consisting of Me, $^{i}$Pr, $^{t}$Bu, CN, $CF_3$, and Ph, carbazolyl, which is optionally substituted with one or more substituents independently from each other selected from the group consisting of Me, $^{i}$Pr, $^{t}$Bu, CN, $CF_3$, and Ph, triazinyl, which is optionally substituted with one or more substituents independently from each other selected from the group consisting of Me, $^{i}$Pr, $^{t}$Bu, CN, $CF_3$, and Ph, and $N(Ph)_2$.

In a further embodiment of the disclosure, $R^5$, $R^{I}$, $R^{II}$, $R^{III}$, $R^{IV}$, $R^{V}$, $R^{VI}$, $R^{VII}$, $R^{X}$, $R^{XI}$, $R^{XII}$, $R^{XIII}$, $R^{XIV}$, and $R^{XV}$ are each independently selected from the group consisting of:

hydrogen,

Me, $^{i}$Pr, $^{t}$Bu,

CN, $CF_3$,

Ph, which is optionally substituted with one or more substituents independently from each other selected from the group consisting of Me, $^{i}$Pr, $^{t}$Bu, CN, $CF_3$, and Ph, pyridinyl, which is optionally substituted with one or more substituents independently from each other selected from the group consisting of Me, $^{i}$Pr, $^{t}$Bu, CN, $CF_3$, and Ph, pyrimidinyl, which is optionally substituted with one or more substituents independently from each other selected from the group consisting of Me, $^{i}$Pr, $^{t}$Bu, CN, $CF_3$, and Ph, and triazinyl, which is optionally substituted with one or more substituents independently from each other selected from the group consisting of Me, $^{i}$Pr, $^{t}$Bu, CN, $CF_3$, and Ph.

As used throughout the present application, the terms "aryl" and "aromatic" may be understood in the broadest sense as any mono-, bi- or polycyclic aromatic moieties. Accordingly, an aryl group contains 6 to 60 aromatic ring atoms, and a heteroaryl group contains 5 to 60 aromatic ring atoms, of which at least one is a heteroatom. Notwithstanding, throughout the application the number of aromatic ring atoms may be given as subscripted number in the definition of certain substituents. For example, the heteroaromatic ring includes one to three heteroatoms. Again, the terms "heteroaryl" and "heteroaromatic" may be understood in the broadest sense as any mono-, bi- or polycyclic heteroaromatic moieties that include at least one heteroatom. The heteroatoms may at each occurrence be the same or different and be individually selected from the group consisting of N, O and S. Accordingly, the term "arylene" refers to a divalent substituent that bears two binding sites to other molecular structures and thereby serving as a linker structure. In case, a group in the exemplary embodiments is defined differently from the definitions given here, for example, the number of aromatic ring atoms or number of heteroatoms differs from the given definition, the definition in the exemplary embodiments is to be applied. According to the disclosure, a condensed (annulated) aromatic or heteroaromatic polycycle is built of two or more single aromatic or heteroaromatic cycles, which formed the polycycle via a condensation reaction.

For example, as used throughout the present application the term aryl group or heteroaryl group includes groups which can be bound via any position of the aromatic or heteroaromatic group, derived from benzene, naphthalene, anthracene, phenanthrene, pyrene, dihydropyrene, chrysene, perylene, fluoranthene, benzanthracene, benzophenanthrene, tetracene, pentacene, benzopyrene, furan, benzofuran, isobenzofuran, dibenzofuran, thiophene, benzothiophene, isobenzothiophene, dibenzothiophene; pyrrole, indole, isoindole, carbazole, pyridine, quinoline, isoquinoline, acridine, phenanthridine, benzo-5,6-quinoline, benzo-6,7-quinoline, benzo-7,8-quinoline, phenothiazine, phenoxazine, pyrazole, indazole, imidazole, benzimidazole, naphthoimidazole, phenanthroimidazole, pyridoimidazole, pyrazinoimidazole, quinoxalinoimidazole, oxazole, benzoxazole, naphthooxazole, anthroxazol, phenanthroxazol, isoxazole, 1,2-thiazole, 1,3-thiazole, benzothiazole, pyridazine, benzopyridazine, pyrimidine, benzopyrimidine, 1,3,5-triazine, quinoxaline, pyrazine, phenazine, naphthyridine, carboline, benzocarboline, phenanthroline, 1,2,3-triazole, 1,2,4-triazole, benzotriazole, 1,2,3-oxadiazole, 1,2,4-oxadiazole, 1,2,5-oxadiazole, 1,2,3,4-tetrazine, purine, pteridine, indolizine and benzothiadiazole or combinations of the abovementioned groups.

As used throughout the present application, the term cyclic group may be understood in the broadest sense as any mono-, bi- or polycyclic moieties.

As used throughout, the term "biphenyl" as a substituent may be understood in the broadest sense as ortho-biphenyl, meta-biphenyl, or para-biphenyl, wherein ortho, meta and para is defined in regard to the binding site to another chemical moiety.

As used above and herein, the term alkyl group may be understood in the broadest sense as any linear, branched, or cyclic alkyl substituent. For example, the term alkyl includes the substituents methyl (Me), ethyl (Et), n-propyl ($^n$Pr), i-propyl ($^i$Pr), cyclopropyl, n-butyl ($^n$Bu), i-butyl ($^i$Bu), s-butyl ($^s$Bu), t-butyl ($^t$Bu), cyclobutyl, 2-methylbutyl, n-pentyl, s-pentyl, t-pentyl, 2-pentyl, neo-pentyl, cyclopentyl, n-hexyl, s-hexyl, t-hexyl, 2-hexyl, 3-hexyl, neo-hexyl, cyclohexyl, 1-methylcyclopentyl, 2-methylpentyl, n-heptyl, 2-heptyl, 3-heptyl, 4-heptyl, cycloheptyl, 1-methylcyclohexyl, n-octyl, 2-ethylhexyl, cyclooctyl, 1-bicyclo[2,2,2]octyl, 2-bicyclo[2,2,2]-octyl, 2-(2,6-dimethyl)octyl, 3-(3,7-dimethyl)octyl, adamantyl, 2,2,2-trifluorethyl, 1,1-dimethyl-n-hex-1-yl, 1,1-dimethyl-n-hept-1-yl, 1,1-dimethyl-n-oct-1-yl, 1,1-dimethyl-n-dec-1-yl, 1,1-dimethyl-n-dodec-1-yl, 1,1-dimethyl-n-tetradec-1-yl, 1,1-dimethyl-n-hexadec-1-yl, 1,1-dimethyl-n-octadec-1-yl, 1,1-diethyl-n-hex-1-yl, 1,1-diethyl-n-hept-1-yl, 1,1-diethyl-n-oct-1-yl, 1,1-diethyl-n-dec-1-yl, 1,1-diethyl-n-dodec-1-yl, 1,1-diethyl-n-tetradec-1-yl, 1,1-diethyl-n-hexadec-1-yl, 1,1-diethyl-n-octadec-1-yl, 1-(n-propyl)-cyclohex-1-yl, 1-(n-butyl)-cyclohex-1-yl, 1-(n-hexyl)-cyclohex-1-yl, 1-(n-octyl)-cyclohex-1-yl and 1-(n-decyl)-cyclohex-1-yl.

As used above and herein, the term alkenyl includes linear, branched, and cyclic alkenyl substituents. The term alkenyl group, for example, includes the substituents ethenyl, propenyl, butenyl, pentenyl, cyclopentenyl, hexenyl, cyclohexenyl, heptenyl, cycloheptenyl, octenyl, cyclooctenyl or cyclooctadienyl.

As used above and herein, the term alkynyl includes linear, branched, and cyclic alkynyl substituents. The term alkynyl group, for example, includes ethynyl, propynyl, butynyl, pentynyl, hexynyl, heptynyl or octynyl.

As used above and herein, the term alkoxy includes linear, branched, and cyclic alkoxy substituents. The term alkoxy group, for example, includes methoxy, ethoxy, n-propoxy, i-propoxy, n-butoxy, i-butoxy, s-butoxy, t-butoxy and 2-methylbutoxy.

As used above and herein, the term thioalkoxy includes linear, branched, and cyclic thioalkoxy substituents, in which the O of the example alkoxy groups is replaced by S.

As used above and herein, the terms "halogen" and "halo" may be understood in the broadest sense as being preferably fluorine, chlorine, bromine or iodine.

Whenever hydrogen (H) is mentioned herein, it could also be replaced by deuterium at each occurrence.

It is understood that when a molecular fragment is described as being a substituent or otherwise attached to another moiety, its name may be written as if it were a fragment (e.g. naphthyl, dibenzofuryl) or as if it were the whole molecule (e.g. naphthalene, dibenzofuran). As used herein, these different ways of designating a substituent or attached fragment are considered to be equivalent.

In one embodiment, the organic molecules according to the disclosure have an excited state lifetime of not more than 25 μs, of not more than 15 μs, for example, of not more than 10 μs, more preferably of not more than 8 μs or not more than 6 μs, even more preferably of not more than 4 μs in a film of poly(methyl methacrylate) (PMMA) with 10% by weight of the organic molecule at room temperature.

In one embodiment of the disclosure, the organic molecules according to the disclosure represent thermally-activated delayed fluorescence (TADF) emitters, which exhibit a $\Delta_{EST}$ value, which corresponds to the energy difference between the first excited singlet state (S1) and the first excited triplet state (T1), of less than 5000 $cm^{-1}$, preferably less than 3000 $cm^{-1}$, more preferably less than 1500 $cm^{-1}$, even more preferably less than 1000 $cm^{-1}$ or even less than 500 $cm^{-1}$.

In a further embodiment of the disclosure, the organic molecules according to the disclosure have an emission peak in the visible or nearest ultraviolet range, i.e., in the range of a wavelength of from 480 to 580 nm, with a full width at half maximum of less than 0.50 eV, preferably less than 0.48 eV, more preferably less than 0.45 eV, even more preferably less than 0.43 eV or even less than 0.40 eV in a film of poly(methyl methacrylate) (PMMA) with 10% by weight of the organic molecule at room temperature.

In a further embodiment of the disclosure, the organic molecules according to the disclosure have an emission peak in the visible or nearest ultraviolet range, i.e., in the range of a wavelength of from 480 to 580 nm, with a full width at half maximum of less than 0.40 eV in a film of poly(methyl methacrylate) (PMMA) with 10% by weight of the organic molecule at room temperature.

Orbital and excited state energies can be determined either by means of experimental methods or by calculations employing quantum-chemical methods, for example, density functional theory calculations. The energy of the highest occupied molecular orbital $E^{HOMO}$ is determined by methods known to the person skilled in the art from cyclic voltammetry measurements with an accuracy of 0.1 eV. The energy of the lowest unoccupied molecular orbital $E^{LUMO}$ is determined as the onset of the absorption spectrum.

The onset of an absorption spectrum is determined by computing the intersection of the tangent to the absorption spectrum with the x-axis. The tangent to the absorption spectrum is set at the low-energy side of the absorption band and at the point at half maximum of the maximum intensity of the absorption spectrum.

The energy of the first excited triplet state T1 is determined from the onset of the emission spectrum at low temperature, typically at 77 K. For host compounds, where the first excited singlet state and the lowest triplet state are energetically separated by >0.4 eV, the phosphorescence is usually visible in a steady-state spectrum in 2-Me-THF. The triplet energy can thus be determined as the onset of the phosphorescence spectrum. For TADF emitter molecules, the energy of the first excited triplet state T1 is determined from the onset of the delayed emission spectrum at 77 K, if not otherwise stated measured in a film of PMMA with 10% by weight of the emitter. For both host and emitter compounds, the energy of the first excited singlet state S1 is determined from the onset of the emission spectrum at room temperature, if not otherwise stated measured in a film of PMMA with 10% by weight of the host or emitter compound.

The onset of an emission spectrum is determined by computing the intersection of the tangent to the emission spectrum with the x-axis. The tangent to the emission spectrum is set at the high-energy side of the emission band and at the point at half maximum of the maximum intensity of the emission spectrum.

A further aspect of the disclosure relates to the use of an organic molecule according to the disclosure as a luminescent emitter or as an absorber, and/or as host material and/or as electron transport material, and/or as hole injection material, and/or as hole blocking material in an optoelectronic device.

The optoelectronic device may be understood in the broadest sense as any device based on organic materials that is suitable for emitting light in the visible or nearest ultraviolet (UV) range, i.e., in the range of a wavelength of from 380 to 800 nm.

More preferably, the optoelectronic device may be able to emit light in the visible range, i.e., of from 400 to 800 nm.

In the context of such use, the optoelectronic device is, for example, selected from the group consisting of:

- organic light-emitting diodes (OLEDs),
- light-emitting electrochemical cells,
- OLED sensors, for example, in gas and vapor sensors not hermetically shielded to the outside,
- organic diodes,
- organic solar cells,
- organic transistors,
- organic field-effect transistors,
- organic lasers, and
- down-conversion elements.

A light-emitting electrochemical cell includes three layers, namely a cathode, an anode, and an active layer, which contains the organic molecule according to the disclosure.

In a preferred embodiment in the context of such use, the optoelectronic device is a device selected from the group consisting of an organic light emitting diode (OLED), a light emitting electrochemical cell (LEC), an organic laser, and a light-emitting transistor.

In one embodiment, the light-emitting layer (or referred to "emitting layer") of an organic light-emitting diode includes the organic molecules according to the disclosure.

In one embodiment, the light-emitting layer of an organic light-emitting diode includes not only the organic molecules according to the disclosure but also a host material whose triplet (T1) and singlet (S1) energy levels are energetically higher than the triplet (T1) and singlet (S1) energy levels of the organic molecule.

A further aspect of the disclosure relates to a composition including or consisting of:

(a) the organic molecule of the disclosure, for example, in the form of an emitter and/or a host, and (b) one or more emitter and/or host materials, which differ from the organic molecule of the disclosure, and (c) optionally, one or more dyes and/or one or more solvents.

In a further embodiment of the disclosure, the composition has a photoluminescence quantum yield (PLQY) of more than 10%, preferably more than 20%, more preferably more than 40%, even more preferably more than 60% or even more than 70% at room temperature.

Compositions with at Least One Further Emitter

One embodiment of the disclosure relates to a composition including or consisting of:

(i) 1-50% by weight, preferably 5-40% by weight, for example, 10-30% by weight, of the organic molecule according to the disclosure;

(ii) 5-98% by weight, preferably 30-93.9% by weight, for example, 40-88% by weight, of one host compound H;

(iii) 1-30% by weight, for example, 1-20% by weight, preferably 1-5% by weight, of at least one further emitter molecule F with a structure differing from the structure of the molecules according to the disclosure; and (iv) optionally 0-94% by weight, preferably 0.1-65% by weight, for example, 1-50% by weight, of at least one further host compound D with a structure differing from the structure of the organic molecules according to the disclosure; and (v) optionally 0-94% by weight, preferably 0-65% by weight, for example, 0-50% by weight, of a solvent.

The components or the compositions are chosen such that the sum of the weight of the components add up to 100%.

In a further embodiment of the disclosure, the composition has an emission peak in the visible or nearest ultraviolet range, i.e., in the range of a wavelength of from 380 to 800 nm.

In one embodiment of the disclosure, the at least one further emitter molecule F is a purely organic emitter.

In one embodiment of the disclosure, at least one further emitter molecule F is a purely organic TADF emitter. Purely organic TADF emitters are known from the state of the art, e.g. Wong and Zysman-Colman ("Purely Organic Thermally Activated Delayed Fluorescence Materials for Organic Light-Emitting Diodes.", Adv. Mater. 2017 June; 29(22)).

In one embodiment of the disclosure, the at least one further emitter molecule F is a fluorescence emitter, for example, a red, a yellow or a green fluorescence emitter.

In a further embodiment of the disclosure, the composition, containing at least one further emitter molecule F shows an emission peak in the visible or nearest ultraviolet range, i.e., in the range of a wavelength of from 380 to 800 nm, with a full width at half maximum of less than 0.30 eV, for example, less than 0.25 eV, preferably less than 0.22 eV, more preferably less than 0.19 eV or even less than 0.17 eV at room temperature, with a lower limit of 0.05 eV.

Composition Wherein the at Least One Further Emitter Molecule F is a Green Fluorescence Emitter In a further embodiment of the disclosure, the at least one further emitter molecule F is a fluorescence emitter, for example, a green fluorescence emitter.

In one embodiment, the at least one further emitter molecule F is a fluorescence emitter selected from the following groups:

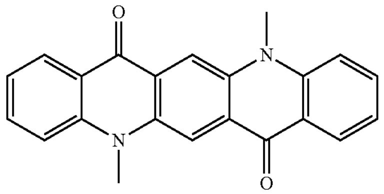

-continued
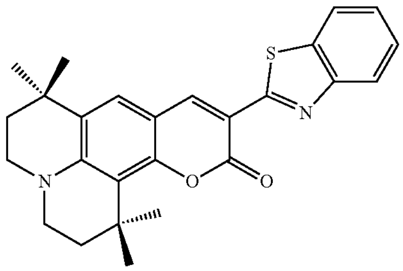
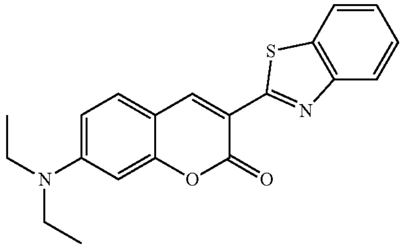
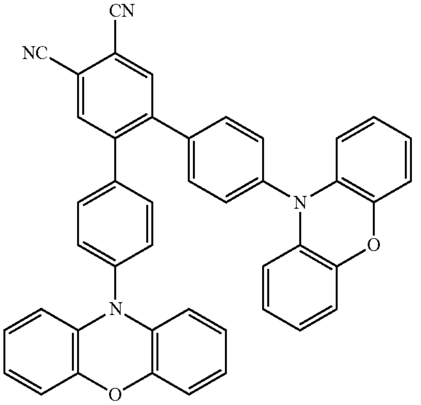
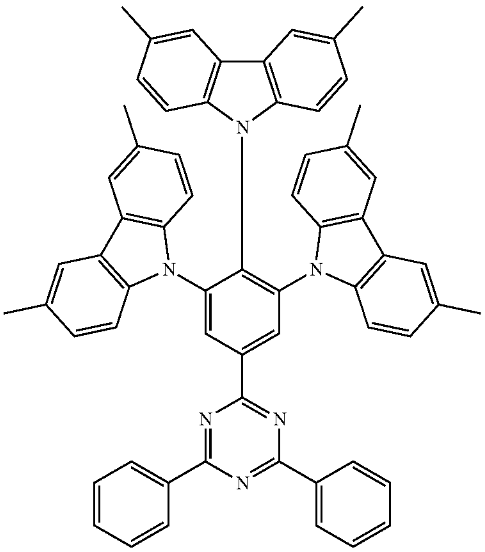
-continued
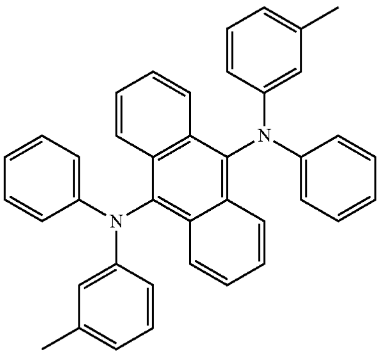
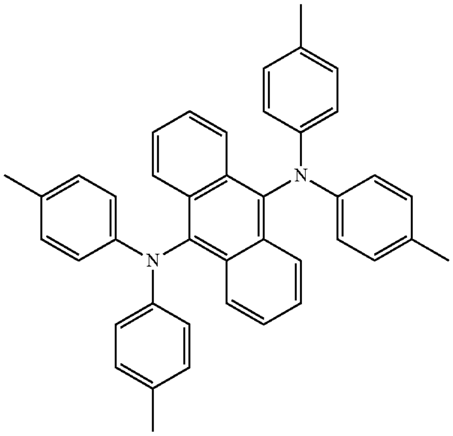
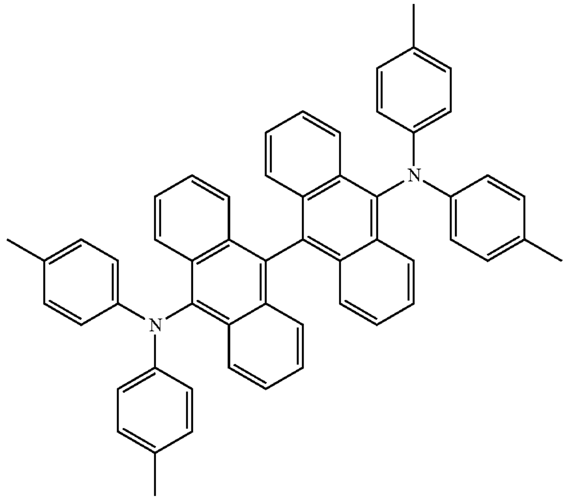
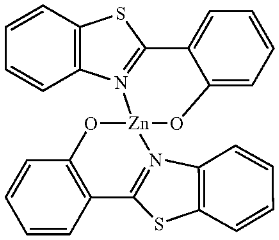

-continued
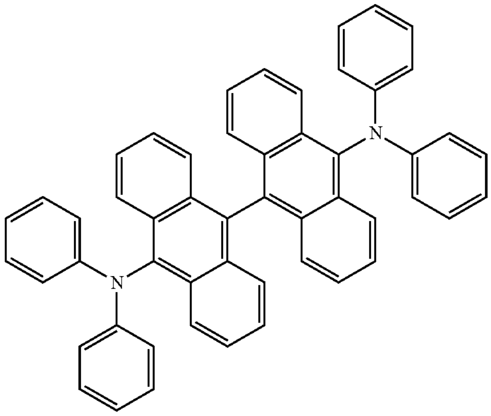
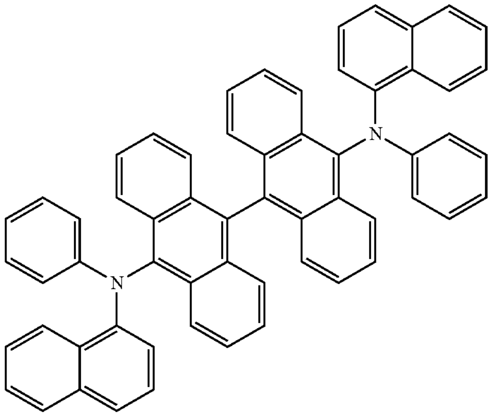
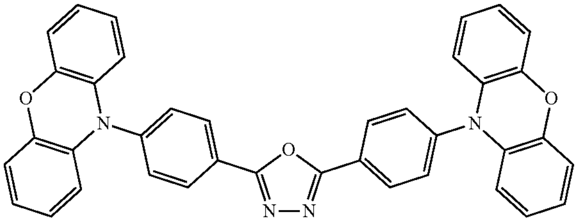
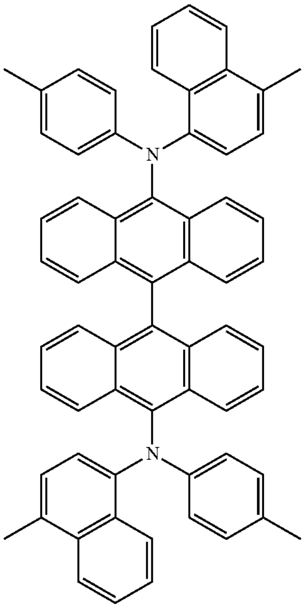
-continued
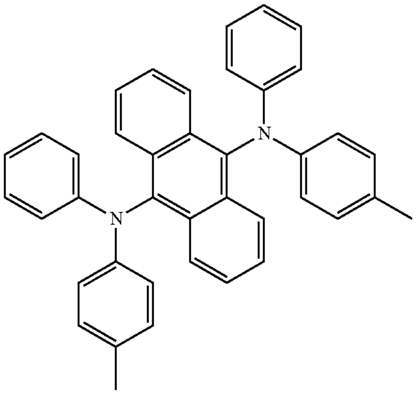
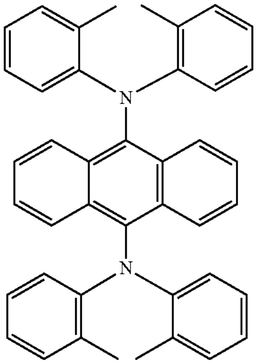
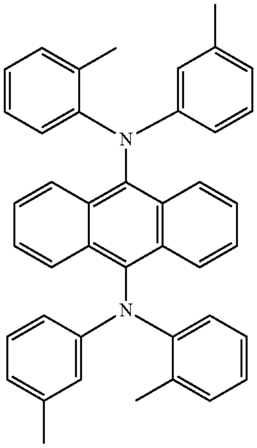
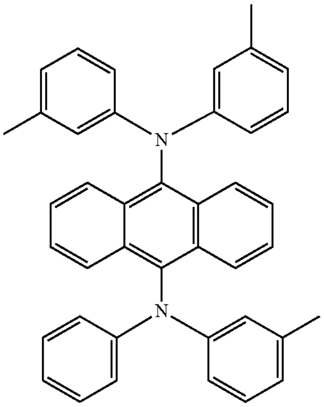

-continued
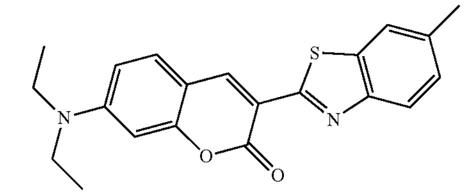
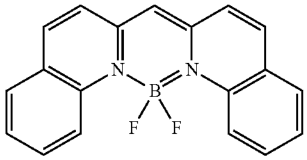
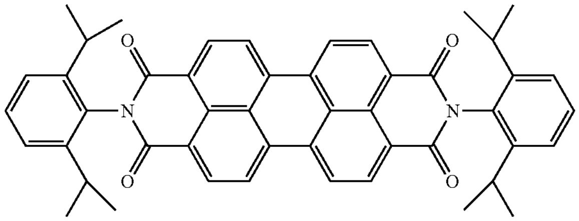
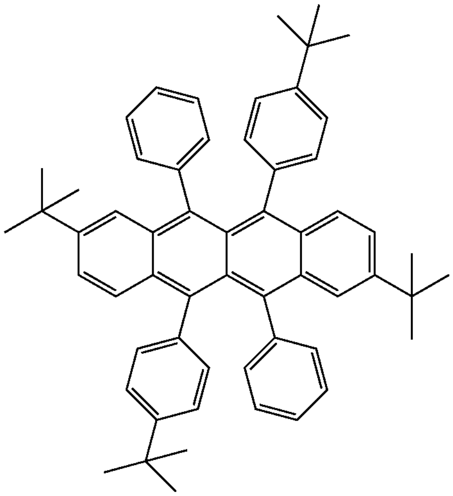
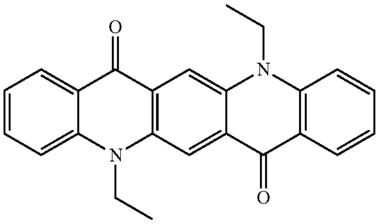
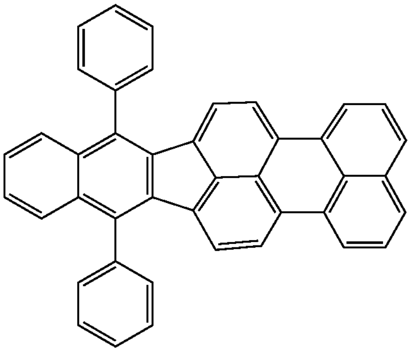
-continued
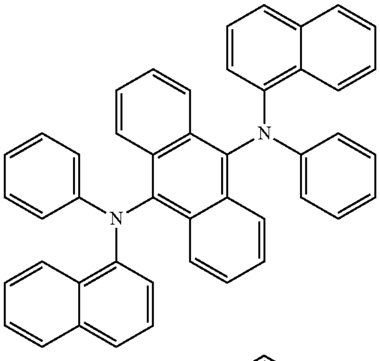
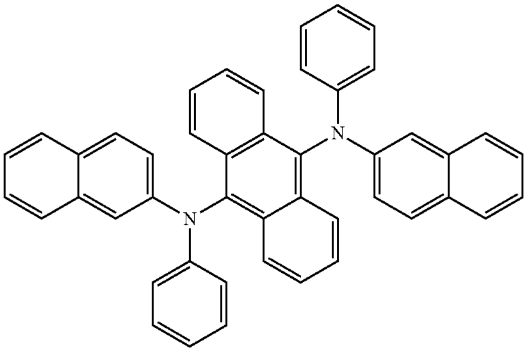
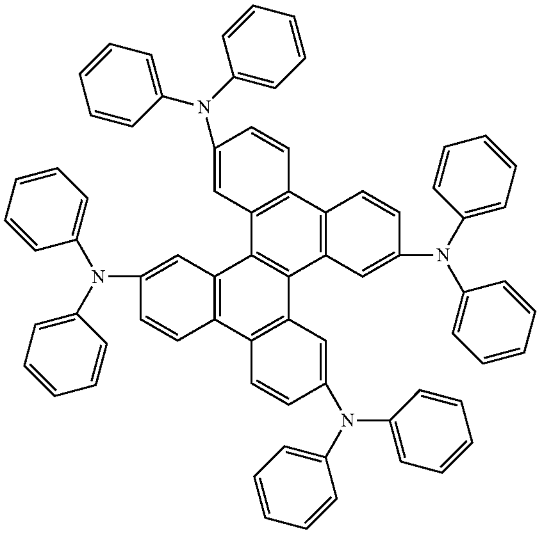
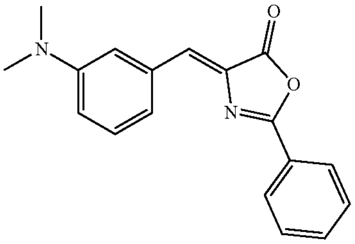
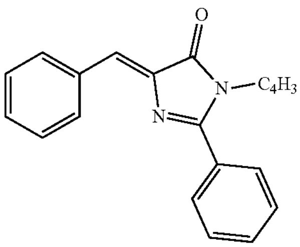

-continued
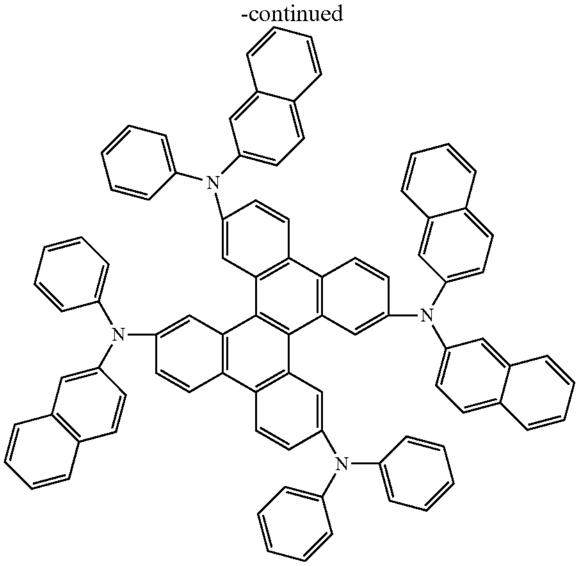
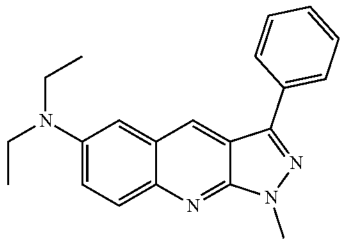
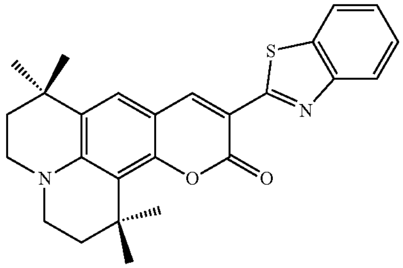
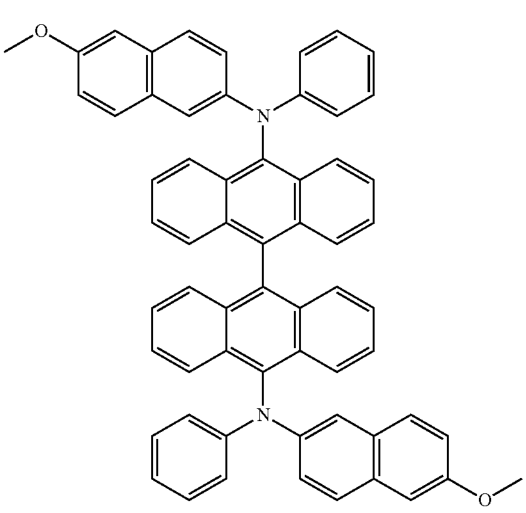
-continued
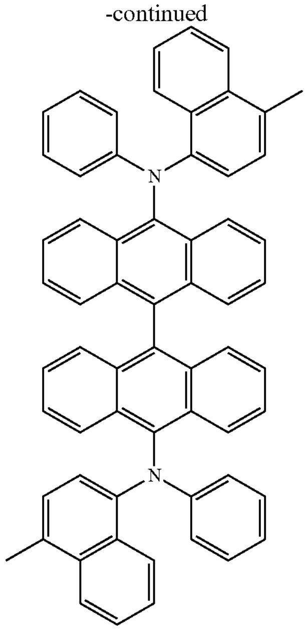
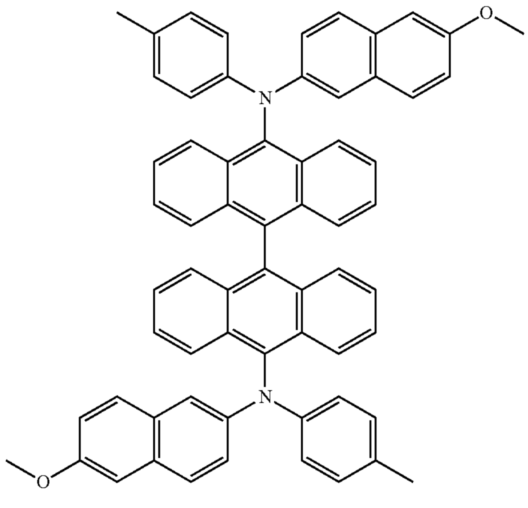
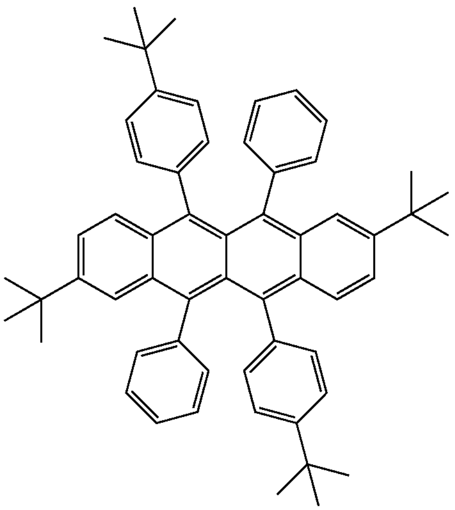

-continued

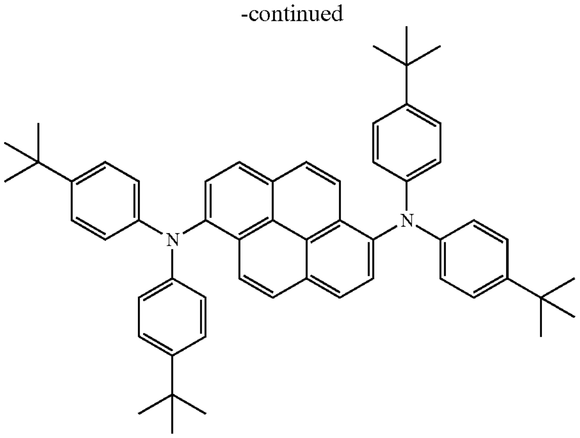

In a further embodiment of the disclosure, the composition has an emission peak in the visible or nearest ultraviolet range, i.e., in the range of a wavelength of from 380 to 800 nm, for example, between 485 nm and 590 nm, preferably between 505 nm and 565 nm, even more preferably between 515 nm and 545 nm.

Composition Wherein the at Least One Further Emitter Molecule F is a Red Fluorescence Emitter In a further embodiment of the disclosure, at least one further emitter molecule F is a fluorescence emitter, for example, a red fluorescence emitter.

In one embodiment, at least one further emitter molecule F is a fluorescence emitter selected from the following groups:

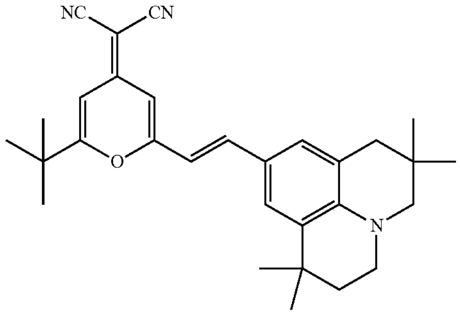

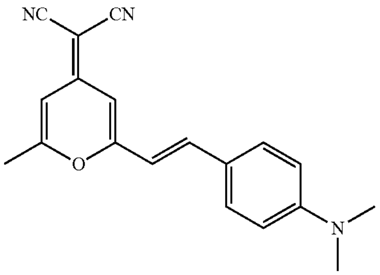

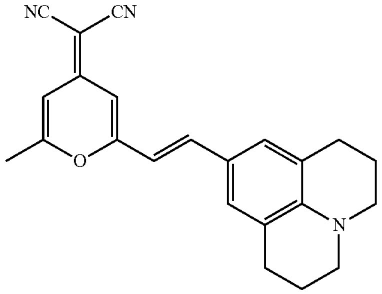

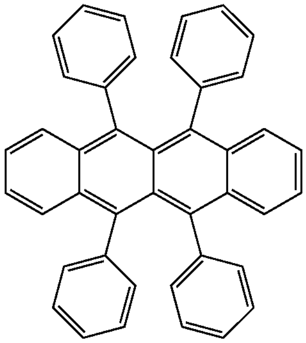

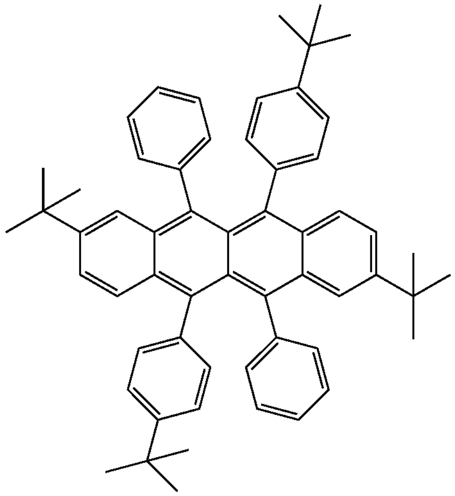

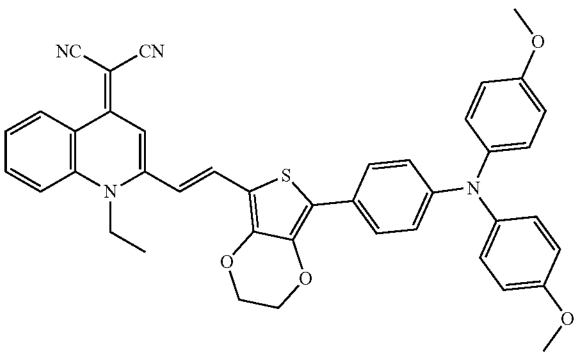

-continued
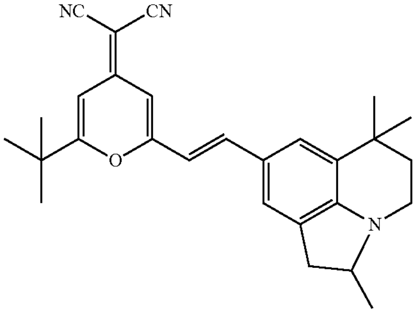
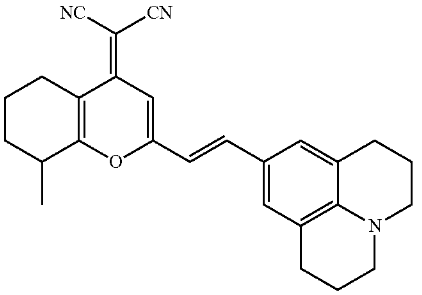
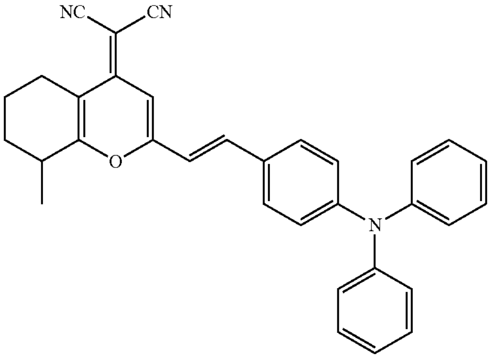
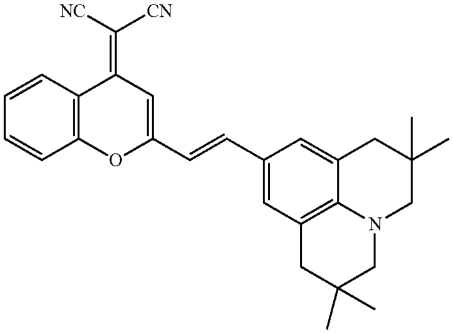
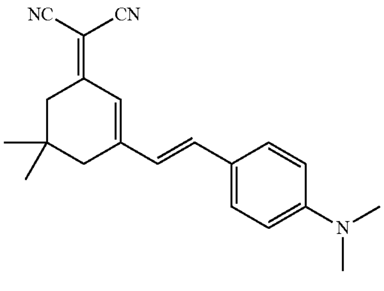
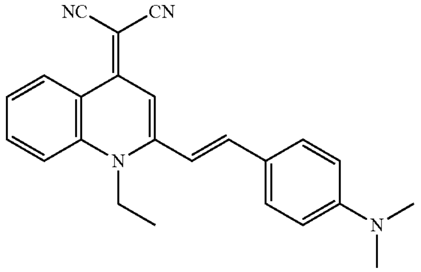
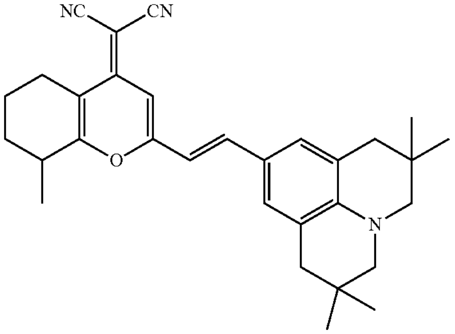
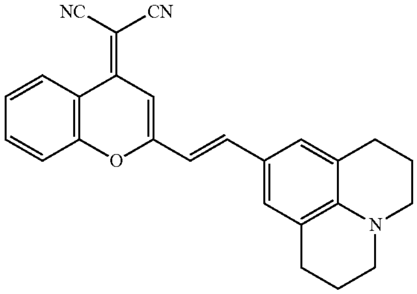
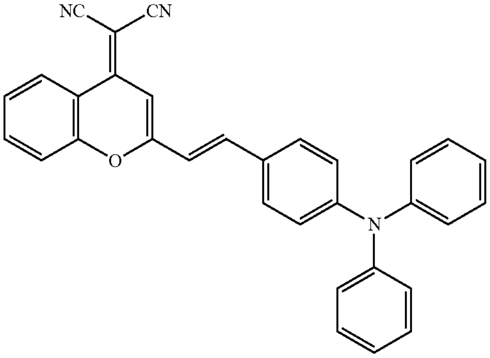
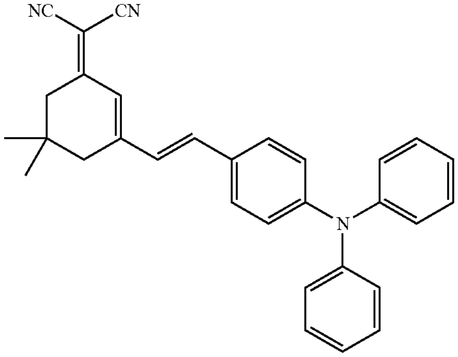

-continued
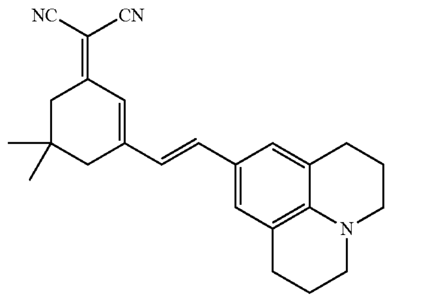
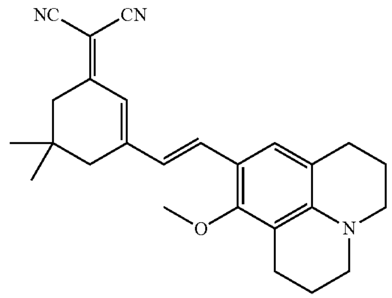
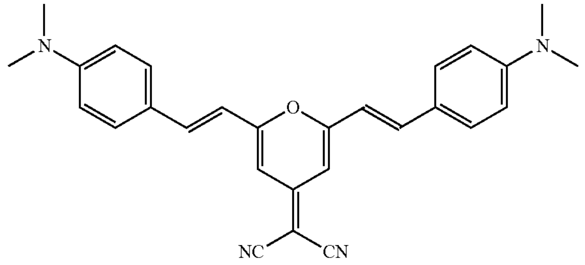
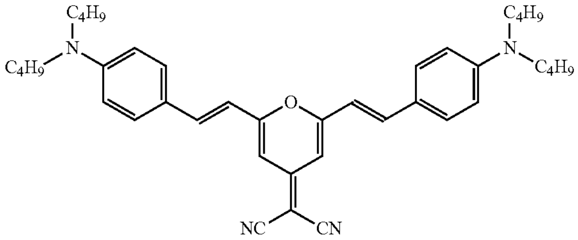
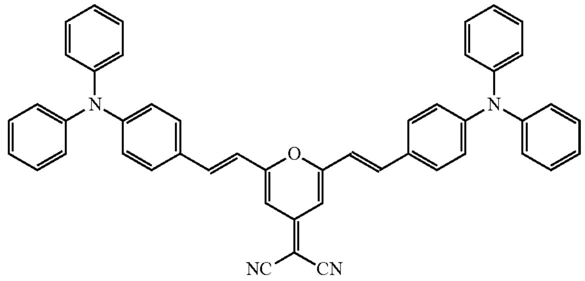
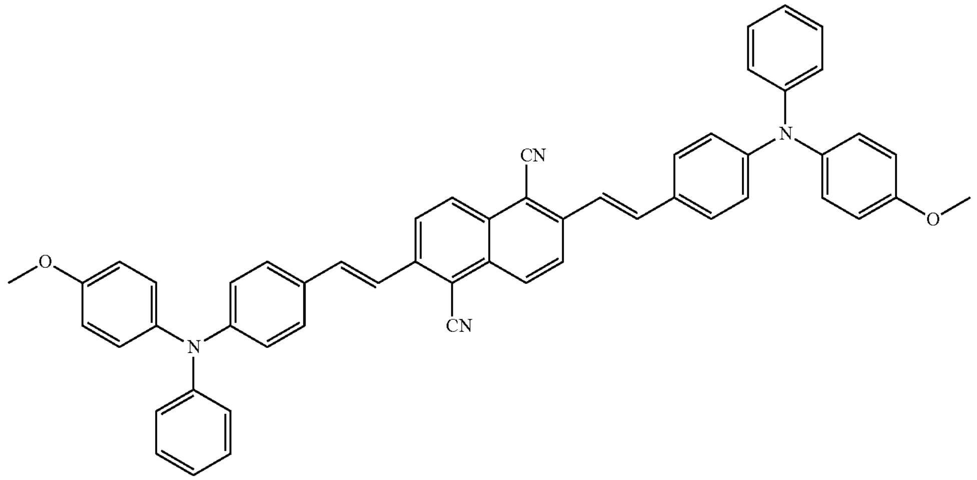

-continued
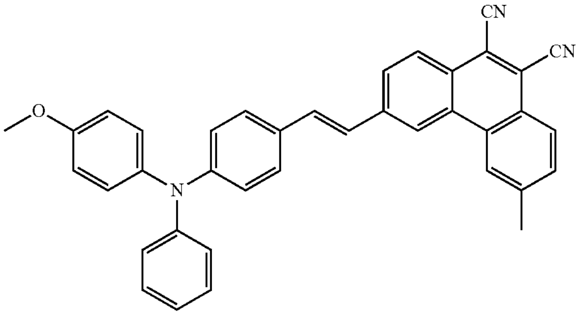
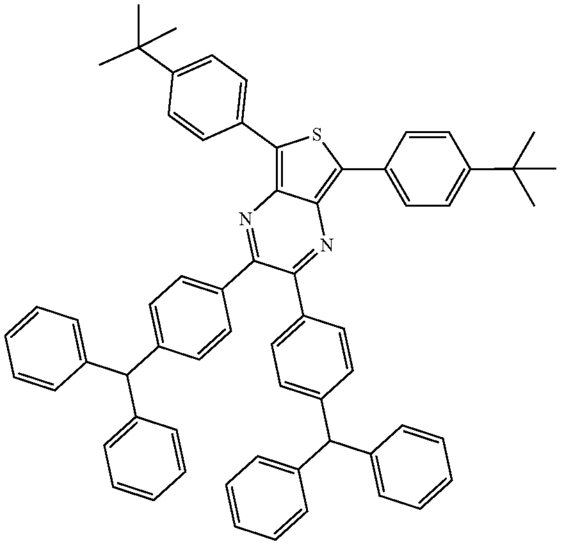
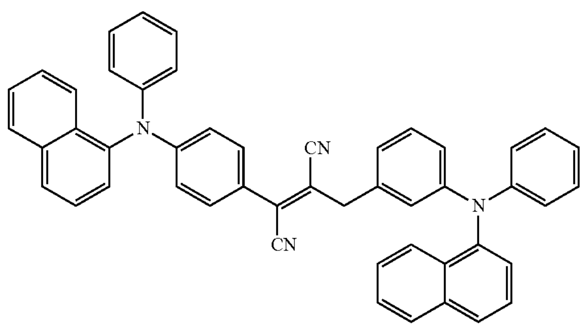
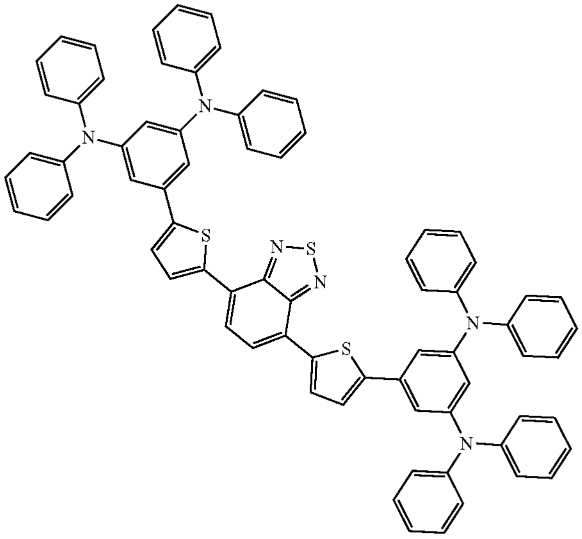
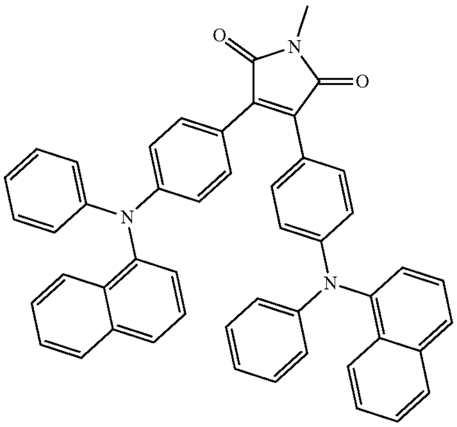
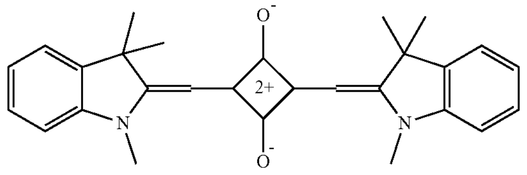

-continued
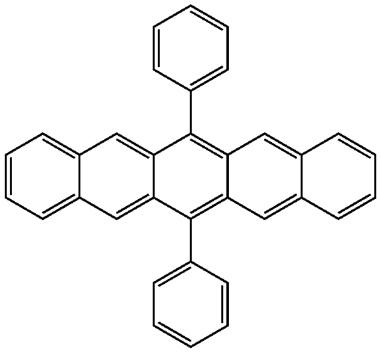
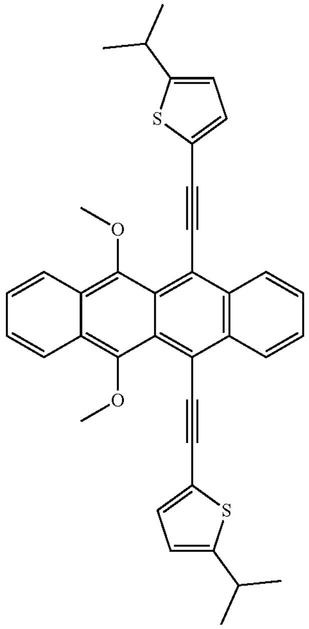
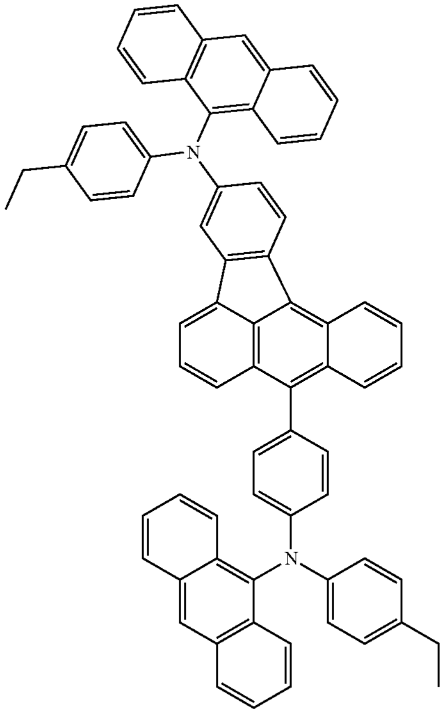
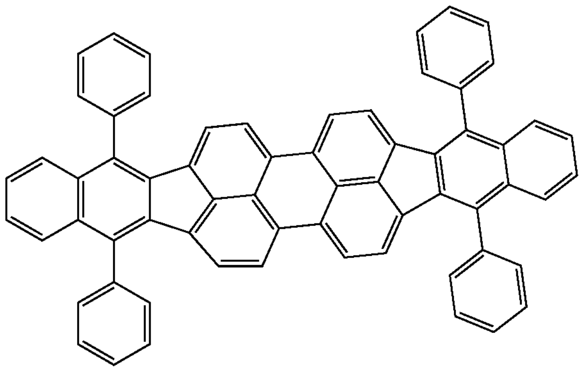
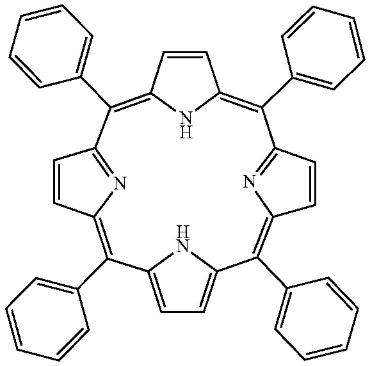
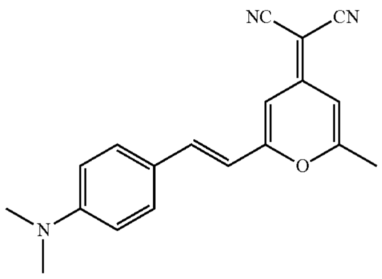

-continued
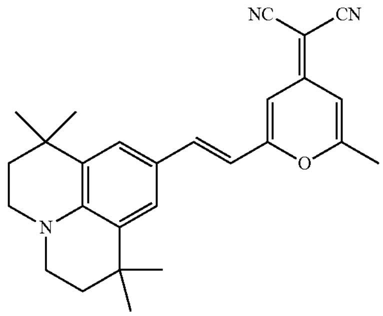
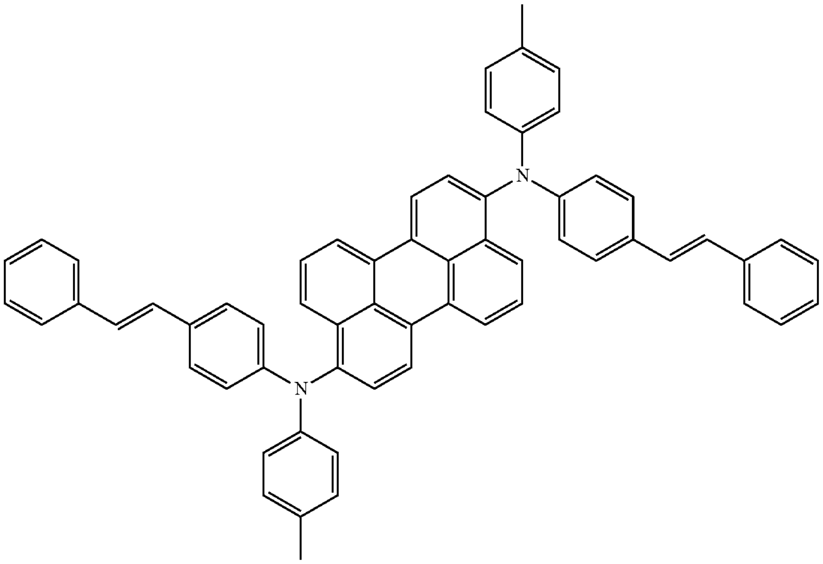
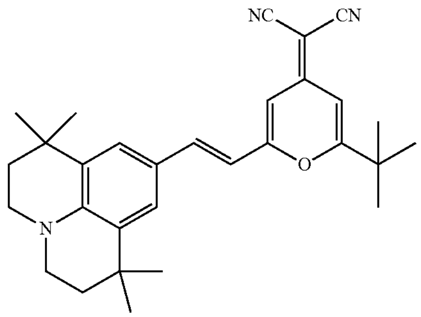
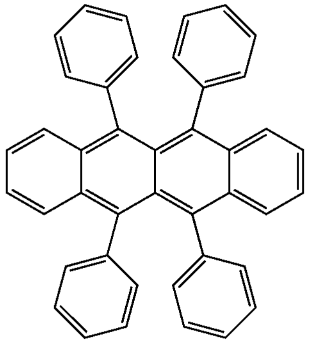
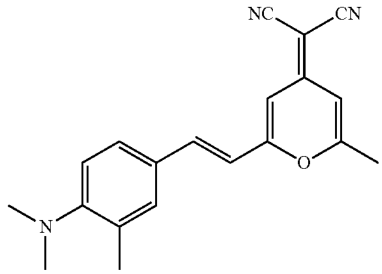
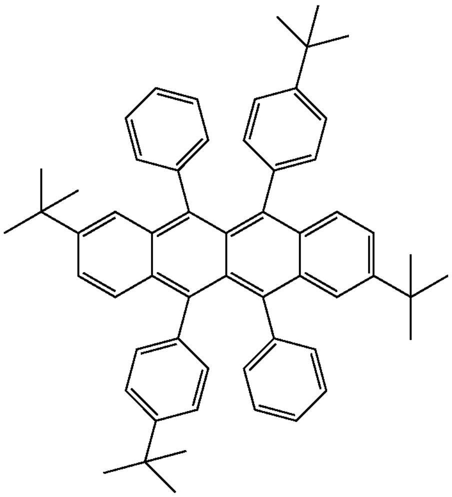

-continued

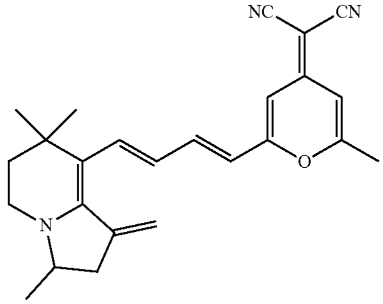

In a further embodiment of the disclosure, the composition has an emission peak in the visible or nearest ultraviolet range, i.e., in the range of a wavelength of from 380 to 800 nm, for example, between 590 nm and 690 nm, preferably between 610 nm and 665 nm, even more preferably between 620 nm and 640 nm.

Light-Emitting Layer EML

In one embodiment, the light-emitting layer EML of an organic light-emitting diode of the disclosure includes (or essentially consists of) a composition including or consisting of:

(i) 1-50% by weight, preferably 5-40% by weight, for example, 10-30% by weight, of one or more organic molecules according to the disclosure;
(ii) 5-99% by weight, preferably 30-94.9% by weight, for example, 40-89% by weight, of at least one host compound H; and
(iii) optionally 0-94% by weight, preferably 0.1-65% by weight, for example, 1-50% by weight, of at least one further host compound D with a structure differing from the structure of the organic molecules according to the disclosure; and
(iv) optionally 0-94% by weight, preferably 0-65% by weight, for example, 0-50% by weight, of a solvent; and
(v) optionally 0-30% by weight, for example, 0-20% by weight, preferably 0-5% by weight, of at least one further emitter molecule F with a structure differing from the structure of the molecules according to the disclosure.

Preferably, energy can be transferred from the host compound H to the one or more organic molecules of the disclosure, for example, transferred from the first excited triplet state T1(H) of the host compound H to the first excited triplet state T1(E) of the one or more organic molecules according to the disclosure and/or from the first excited singlet state S1(H) of the host compound H to the first excited singlet state S1(E) of the one or more organic molecules according to the disclosure.

In one embodiment, the host compound H has a highest occupied molecular orbital HOMO(H) having an energy $E^{HOMO}(H)$ in the range of from −5 eV to −6.5 eV and one organic molecule E according to the disclosure has a highest occupied molecular orbital HOMO(E) having an energy $E^{HOMO}(E)$, wherein $E^{HOMO}(H)>E^{HOMO}(E)$.

In a further embodiment, the host compound H has a lowest unoccupied molecular orbital LUMO(H) having an energy $E^{LUMO}(H)$ and the one organic molecule E according to the disclosure has a lowest unoccupied molecular orbital LUMO(E) having an energy $E^{LUMO}(E)$, wherein $E^{LUMO}(H)>E^{LUMO}(E)$.

Light-Emitting Layer EML Including at Least One Further Host Compound D

In a further embodiment, the light-emitting layer EML of an organic light-emitting diode of the disclosure includes (or essentially consists of) a composition including or consisting of:

(i) 1-50% by weight, preferably 5-40% by weight, for example, 10-30% by weight, of one organic molecule according to the disclosure;
(ii) 5-99% by weight, preferably 30-94.9% by weight, for example, 40-89% by weight, of one host compound H; and
(iii) 0-94% by weight, preferably 0.1-65% by weight, for example, 1-50% by weight, of at least one further host compound D with a structure differing from the structure of the organic molecules according to the disclosure; and
(iv) optionally 0-94% by weight, preferably 0-65% by weight, for example, 0-50% by weight, of a solvent; and
(v) optionally 0-30% by weight, for example, 0-20% by weight, preferably 0-5% by weight, of at least one further emitter molecule F with a structure differing from the structure of the organic molecules according to the disclosure.

In one embodiment of the organic light-emitting diode of the disclosure, the host compound H has a highest occupied molecular orbital HOMO(H) having an energy $E^{HOMO}(H)$ in the range of from −5 eV to −6.5 eV and the at least one further host compound D has a highest occupied molecular orbital HOMO(D) having an energy $E^{HOMO}(D)$, wherein $E^{HOMO}(H)>E^{HOMO}(D)$. The relation $E^{HOMO}(H)>E^{HOMO}(D)$ favors an efficient hole transport.

In a further embodiment, the host compound H has a lowest unoccupied molecular orbital LUMO(H) having an energy $E^{LUMO}(H)$ and the at least one further host compound D has a lowest unoccupied molecular orbital LUMO(D) having an energy $E^{LUMO}(D)$, wherein $E^{LUMO}(H)>E^{LUMO}(D)$. The relation $E^{LUMO}(H)>E^{LUMO}(D)$ favors an efficient electron transport.

In one embodiment of the organic light-emitting diode of the disclosure, the host compound H has a highest occupied molecular orbital HOMO(H) having an energy $E^{HOMO}(H)$ and a lowest unoccupied molecular orbital LUMO(H) having an energy $E^{LUMO}(H)$, and the at least one further host compound D has a highest occupied molecular orbital HOMO(D) having an energy $E^{HOMO}(D)$ and a lowest unoccupied molecular orbital LUMO(D) having an energy $E^{LUMO}(D)$, the organic molecule E of the disclosure has a highest occupied molecular orbital HOMO(E) having an energy $E^{HOMO}(E)$ and a lowest unoccupied molecular orbital LUMO(E) having an energy $E^{LUMO}(E)$, wherein $E^{HOMO}(H)>E^{HOMO}(D)$ and the difference between the energy level of the highest occupied molecular orbital HOMO(E) of organic molecule according to the disclosure ($E^{HOMO}(E)$) and the energy level of the highest occupied molecular orbital HOMO(H) of the host compound H ($E^{HOMO}(H)$) is between −0.5 eV and 0.5 eV, more preferably between −0.3 eV and 0.3 eV, even more preferably between −0.2 eV and 0.2 eV or even between −0.1 eV and 0.1 eV; and $E^{LUMO}(H)>E^{LUMO}(D)$ and the difference between the energy level of the lowest unoccupied molecular orbital LUMO(E) of organic molecule according to the disclosure ($E^{LUMO}(E)$) and the energy level of the lowest unoccupied molecular orbital LUMO(D) of the at least one further host compound D ($E^{LUMO}(D)$) is between −0.5 eV and 0.5 eV, more preferably between −0.3 eV and 0.3 eV, even more preferably between −0.2 eV and 0.2 eV or even between −0.1 eV and 0.1 eV.

Light-Emitting Layer EML Including at Least One Further Emitter Molecule F

In a further embodiment, the light-emitting layer EML includes (or (essentially) consists of) a composition including or consisting of:

(i) 1-50% by weight, preferably 5-40% by weight, for example, 10-30% by weight, of one organic molecule according to the disclosure;

(ii) 5-98% by weight, preferably 30-93.9% by weight, for example, 40-88% by weight, of one host compound H;

(iii) 1-30% by weight, for example, 1-20% by weight, preferably 1-5% by weight, of at least one further emitter molecule F with a structure differing from the structure of the organic molecules according to the disclosure; and (iv) optionally 0-94% by weight, preferably 0.1-65% by weight, for example, 1-50% by weight, of at least one further host compound D with a structure differing from the structure of the organic molecules according to the disclosure; and (v) optionally 0-94% by weight, preferably 0-65% by weight, for example, 0-50% by weight, of a solvent.

In a further embodiment, the light-emitting layer EML includes (or (essentially) consists of) a composition as described in Compositions with at least one further emitter, with the at least one further emitter molecule F as defined in Composition wherein the at least one further emitter molecule F is a green fluorescence emitter.

In a further embodiment, the light-emitting layer EML includes (or (essentially) consists of) a composition as described in Compositions with at least one further emitter, with the at least one further emitter molecule F as defined in Composition wherein the at least one further emitter molecule F is a red fluorescence emitter.

In one embodiment of the light-emitting layer EML comprising at least one further emitter molecule F, energy can be transferred from the one or more organic molecules E of the disclosure to the at least one further emitter molecule F, for example, transferred from the first excited singlet state S1(E) of one or more organic molecules E of the disclosure to the first excited singlet state S1(F) of the at least one further emitter molecule F.

In one embodiment, the first excited singlet state S1(H) of one host compound H of the light-emitting layer is higher in energy than the first excited singlet state S1(E) of the one or more organic molecules E of the disclosure: S1(H)>S1(E), and the first excited singlet state S1(H) of one host compound H is higher in energy than the first excited singlet state S1(F) of the at least one emitter molecule F: S1(H)>S1(F).

In one embodiment, the first excited triplet state T1(H) of one host compound H is higher in energy than the first excited triplet state T1(E) of the one or more organic molecules E of the disclosure: T1(H)>T1(E), and the first excited triplet state T1(H) of one host compound H is higher in energy than the first excited triplet state T1(F) of the at least one emitter molecule F: T1(H)>T1(F).

In one embodiment, the first excited singlet state S1(E) of the one or more organic molecules E of the disclosure is higher in energy than the first excited singlet state S1(F) of the at least one emitter molecule F: S1(E)>S1(F).

In one embodiment, the first excited triplet state T1(E) of the one or more organic molecules E of the disclosure is higher in energy than the first excited singlet state T1(F) of the at least one emitter molecule F: T1(E)>T1(F).

In one embodiment, the first excited triplet state T1(E) of the one or more organic molecules E of the disclosure is higher in energy than the first excited singlet state T1(F) of the at least one emitter molecule F: T1(E)>T1(F), wherein the absolute value of the energy difference between T1(E) and T1(F) is larger than 0.3 eV, preferably larger than 0.4 eV, or even larger than 0.5 eV.

In one embodiment, the host compound H has a highest occupied molecular orbital HOMO(H) having an energy $E^{HOMO}(H)$ and a lowest unoccupied molecular orbital LUMO(H) having an energy $E^{LUMO}(H)$, and the one organic molecule E according to the disclosure has a highest occupied molecular orbital HOMO(E) having an energy $E^{HOMO}(E)$ and a lowest unoccupied molecular orbital LUMO(E) having an energy $E^{LUMO}(E)$, the at least one further emitter molecule F has a highest occupied molecular orbital HOMO(F) having an energy $E^{HOMO}(F)$ and a lowest unoccupied molecular orbital LUMO(F) having an energy $E^{LUMO}(F)$, wherein $E^{HOMO}(H)>E^{HOMO}(E)$ and the difference between the energy level of the highest occupied molecular orbital HOMO(F) of the at least one further emitter molecule ($E^{HOMO}(F)$) and the energy level of the highest occupied molecular orbital HOMO(H) of the host compound H ($E^{HOMO}(H)$) is between 0.5 eV and 0.5 eV, more preferably between −0.3 eV and 0.3 eV, even more preferably between −0.2 eV and 0.2 eV or even between −0.1 eV and 0.1 eV; and $E^{LUMO}(H)>E^{LUMO}(E)$ and the difference between the energy level of the lowest unoccupied molecular orbital LUMO(F) of the at least one further emitter molecule ($E^{LUMO}(F)$) and the lowest unoccupied molecular orbital LUMO(E) of the one organic molecule according to the disclosure ($E^{LUMO}(E)$) is between −0.5 eV and 0.5 eV, more preferably between −0.3 eV and 0.3 eV, even more preferably between −0.2 eV and 0.2 eV or even between −0.1 eV and 0.1 eV.

Optoelectronic Devices

In a further aspect, the disclosure relates to an optoelectronic device including an organic molecule or a composition as described herein, for example, in the form of a device selected from the group consisting of organic light-emitting diode (OLED), light-emitting electrochemical cell, OLED sensor (for example, gas and vapor sensors not hermetically externally shielded), organic diode, organic solar cell, organic transistor, organic field-effect transistor, organic laser and down-conversion element.

In a preferred embodiment, the optoelectronic device is a device selected from the group consisting of an organic light emitting diode (OLED), a light emitting electrochemical cell (LEC), and a light-emitting transistor.

In one embodiment of the optoelectronic device of the disclosure, the organic molecule according to the disclosure is used as emission material in a light-emitting layer EML.

In one embodiment of the optoelectronic device of the disclosure, the light-emitting layer EML consists of the composition according to the disclosure described herein.

When the optoelectronic device is an OLED, it may, for example, exhibit the following layer structure:

1. substrate
2. anode layer, A
3. hole injection layer, HIL
4. hole transport layer, HTL
5. electron blocking layer, EBL
6. emitting layer, EML
7. hole blocking layer, HBL
8. electron transport layer, ETL
9. electron injection layer, EIL and
10. cathode layer, C, wherein the OLED includes each layer only optionally, different layers may be merged and the OLED may include more than one layer of each layer type defined above.

Furthermore, the optoelectronic device may optionally include one or more protective layers protecting the device from damaging exposure to harmful species in the environment including, for example, moisture, vapor and/or gases.

In one embodiment of the disclosure, the optoelectronic device is an OLED, which exhibits the following inverted layer structure:

1. substrate
2. cathode layer, C
3. electron injection layer, EIL
4. electron transport layer, ETL
5. hole blocking layer, HBL
6. emitting layer, EML
7. electron blocking layer, EBL
8. hole transport layer, HTL
9. hole injection layer, HIL and
10. anode layer A, wherein the OLED with an inverted layer structure includes each layer only optionally, different layers may be merged and the OLED may include more than one layer of each layer types defined above.

In one embodiment of the disclosure, the optoelectronic device is an OLED, which may exhibit a stacked architecture. In this architecture, contrary to the typical arrangement, where the OLEDs are placed side by side, the individual units are stacked on top of each other. Blended light may be generated with OLEDs exhibiting a stacked architecture, for example, white light may be generated by stacking blue, green and red OLEDs. Furthermore, the OLED exhibiting a stacked architecture may optionally include a charge generation layer (CGL), which is typically located between two OLED subunits and typically consists of a n-doped and p-doped layer with the n-doped layer of one CGL being typically located closer to the anode layer.

In one embodiment of the disclosure, the optoelectronic device is an OLED, which includes two or more emission layers between an anode and a cathode. For example, this so-called tandem OLED includes three emission layers, wherein one emission layer emits red light, one emission layer emits green light and one emission layer emits blue light, and optionally may include further layers such as charge generation layers, blocking or transporting layers between the individual emission layers. In a further embodiment, the emission layers are adjacently stacked. In a further embodiment, the tandem OLED includes a charge generation layer between each two emission layers. In addition, adjacent emission layers or emission layers separated by a charge generation layer may be merged.

The substrate may be formed by any material or composition of materials. Most frequently, glass slides are used as substrates. Alternatively, thin metal layers (e.g., copper, gold, silver or aluminum films) or plastic films or slides may be used. This may allow a higher degree of flexibility. The anode layer A is mostly composed of materials allowing to obtain an (essentially) transparent film. As at least one of both electrodes should be (essentially) transparent in order to allow light emission from the OLED, either the anode layer A or the cathode layer C is transparent. Preferably, the anode layer A includes a large content or even consists of transparent conductive oxides (TCOs). Such anode layer A may, for example, include indium tin oxide, aluminum zinc oxide, fluorine doped tin oxide, indium zinc oxide, PbO, SnO, zirconium oxide, molybdenum oxide, vanadium oxide, wolfram oxide, graphite, doped Si, doped Ge, doped GaAs, doped polyaniline, doped polypyrrol and/or doped polythiophene.

Preferably, the anode layer A (essentially) consists of indium tin oxide (ITO) (e.g., $(InO_3)_{0.9}(SnO_2)_{0.1}$). The roughness of the anode layer A caused by the transparent conductive oxides (TCOs) may be compensated by using a hole injection layer (HIL). Further, the HIL may facilitate the injection of quasi charge carriers (i.e., holes) in that the transport of the quasi charge carriers from the TCO to the hole transport layer (HTL) is facilitated. The hole injection layer (HIL) may include poly-(3,4-ethylendioxy thiophene) (PEDOT), polystyrene sulfonate (PSS), $MoO_2$, $V_2O_5$, CuPC or CuI, for example, a mixture of PEDOT and PSS. The hole injection layer (HIL) may also prevent the diffusion of metals from the anode layer A into the hole transport layer (HTL). The HIL may, for example, include PEDOT:PSS (poly-3,4-ethylendioxy thiophene: polystyrene sulfonate), PEDOT (poly-3,4-ethylendioxy thiophene), mMTDATA (4,4',4"-tris[phenyl(m-tolyl)amino]triphenylamine), Spiro-TAD (2,2',7,7'-tetrakis(n,n-diphenylamino)-9,9'-spirobifluorene), DNTPD (N1,N1'-(biphenyl-4,4'-diyl)bis(N1-phenyl-N4,N4-di-m-tolylbenzene-1,4-diamine), NPB (N,N'-nis-(1-naphthalenyl)-N,N'-bis-phenyl-(1,1'-biphenyl)-4,4'-diamine), NPNPB (N,N'-diphenyl-N,N'-di-[4-(N,N-diphenyl-amino)phenyl]benzidine), MeO-TPD (N,N,N',N'-tetrakis(4-methoxyphenyl)benzidine), HAT-CN (1,4,5,8,9,11-hexaazatriphenylen-hexacarbonitrile) and/or Spiro-NPD (N,N'-diphenyl-N,N'-bis(1-naphthyl)-9,9'-spirobifluorene-2,7-diamine).

Adjacent to the anode layer A or hole injection layer (HIL) typically a hole transport layer (HTL) is located. Herein, any hole transport compound may be used. For example, electron-rich heteroaromatic compounds such as triarylamines and/or carbazoles may be used as hole transport compound. The HTL may decrease the energy barrier between the anode layer A and the light-emitting layer EML. The hole transport layer (HTL) may also be an electron blocking layer (EBL). Preferably, hole transport compounds bear comparably high energy levels of their triplet states T1. For example, the hole transport layer (HTL) may include a star-shaped heterocycle such as tris(4-carbazole-9-ylphenyl)amine (TCTA), poly-TPD (poly(4-butylphenyl-diphenyl-amine)), alpha-NPD (2,2'-dimethyl-N,N'-di-[(1-naphthyl)-N,N'-diphenyl]-1,1'-biphenyl-4-4'-diamine), TAPC (4,4'-cyclohexyliden-bis[N,N-bis(4-methylphenyl)benzenamine]), 2-TNATA (4,4',4"-tris[2-naphthyl(phenyl)amino]trphenylamine), Spiro-TAD, DNTPD, NPB, NPNPB, MeO-TPD, HAT-CN and/or Tris-Pcz (9,9'-diphenyl-6-(9-phenyl-9H-carbazol-3-yl)-9H,9'H-3,3'-bicarbazole). In addition, the HTL may include a p-doped layer, which may be composed of an inorganic or organic dopant in an organic hole-transporting matrix. Transition metal oxides such as vanadium oxide, molybdenum oxide or tungsten oxide may, for example, be used as the inorganic dopant. Tetrafluorotetracyanoquinodimethane (F4-TCNQ), copper-pentafluorobenzoate (Cu(I)pFBz) or transition metal complexes may, for example, be used as the organic dopant.

The EBL may, for example, include mCP (1,3-bis(carbazol-9-yl)benzene), TCTA, 2-TNATA, mCBP (3,3-di(9H-carbazol-9-yl)biphenyl), tris-Pcz, CzSi (9-(4-tert-butylphenyl)-3,6-bis(triphenylsilyl)-9H-carbazole), and/or DCB (N,N'-dicarbazolyl-1,4-dimethylbenzene).

Adjacent to the hole transport layer (HTL), typically, the light-emitting layer EML is located. The light-emitting layer EML includes at least one light emitting molecule. For example, the EML includes at least one light emitting molecule according to the disclosure. Typically, the EML additionally includes one or more host material. For example, the host material is selected from CBP (4,4'-Bis-(N-carbazolyl)-biphenyl), mCP, mCBP Sif87 (dibenzo[b,d]thiophen-2-yltriphenylsilane), CzSi, Sif88 (dibenzo[b,d]thiophen-2-yl)diphenylsilane), DPEPO (bis[2-(diphenylphosphino)phenyl]ether oxide), 9-[3-(dibenzofuran-2-yl)phenyl]-9H-carbazole, 9-[3-(dibenzothiophen-2-yl)phenyl]-9H-carbazole, 9-[3,5-bis(2-dibenzofuranyl)phenyl]-9H-carbazole, 9-[3,5-bis(2-dibenzothiophenyl)phenyl]-9H-carbazole, T2T (2,4,6-tris(biphenyl-3-yl)-1,3,5-triazine), T3T (2,4,6-tris(triphenyl-3-yl)-1,3,5-triazine) and/or TST (2,4,6-tris(9,9'-spirobifluorene-2-yl)-1,3,5-triazine). The host material typically should be selected to exhibit first triplet (T1) and first singlet (S1) energy levels, which are energetically higher than the first triplet (T1) and first singlet (S1) energy levels of the organic molecule.

In one embodiment of the disclosure, the EML includes a so-called mixed-host system with at least one hole-dominant host and one electron-dominant host. In a particular embodiment, the EML includes exactly one light emitting molecule species according to the disclosure and a mixed-host system including T2T as electron-dominant host and a host selected from CBP, mCP, mCBP, 9-[3-(dibenzofuran-2-yl)phenyl]-9H-carbazole, 9-[3-(dibenzofuran-2-yl)phenyl]-9H-carbazole, 9-[3-(dibenzothiophen-2-yl)phenyl]-9H-carbazole, 9-[3,5-bis(2-dibenzofuranyl)phenyl]-9H-carbazole and 9-[3,5-bis(2-dibenzothiophenyl)phenyl]-9H-carbazole as hole-dominant host. In a further embodiment the EML includes 50-80% by weight, preferably 60-75% by weight of a host selected from CBP, mCP, mCBP, 9-[3-(dibenzofuran-2-yl)phenyl]-9H-carbazole, 9-[3-(dibenzofuran-2-yl)phenyl]-9H-carbazole, 9-[3-(dibenzothiophen-2-yl)phenyl]-9H-carbazole, 9-[3,5-bis(2-dibenzofuranyl)phenyl]-9H-carbazole and 9-[3,5-bis(2-dibenzothiophenyl)phenyl]-9H-carbazole; 10-45% by weight, preferably 15-30% by weight of T2T and 5-40% by weight, preferably 10-30% by weight of light emitting molecule according to the disclosure.

Adjacent to the light-emitting layer EML, an electron transport layer (ETL) may be located. Herein, any electron transporter may be used. For example, compounds poor of electrons such as, e.g., benzimidazoles, pyridines, triazoles, oxadiazoles (e.g., 1,3,4-oxadiazole), phosphine oxides and sulfone, may be used. An electron transporter may also be a star-shaped heterocycle such as 1,3,5-tri(1-phenyl-1H-benzo[d]imidazol-2-yl)benzene (TPBi). The ETL may include NBphen (2,9-bis(naphthalen-2-yl)-4,7-diphenyl-1,10-phenanthroline), Alq3 (Aluminum-tris(8-hydroxyquinoline)), TSPO1 (diphenyl-4-triphenylsilylphenyl-phosphinoxide), BPyTP2 (2,7-di(2,2'-bipyridin-5-yl)triphenyle), Sif87 (dibenzo[b,d]thiophen-2-yltriphenylsilane), Sif88 (dibenzo[b,d]thiophen-2-yl)diphenylsilane), BmPyPhB (1,3-bis[3,5-di(pyridin-3-yl)phenyl]benzene) and/or BTB (4,4'-bis[2-(4,6-diphenyl-1,3,5-triazinyl)]-1,1'-biphenyl). Optionally, the ETL may be doped with materials such as Liq. The electron transport layer (ETL) may also block holes or a hole blocking layer (HBL) is introduced.

The HBL may, for example, include BCP (2,9-dimethyl-4,7-diphenyl-1,10-phenanthroline=Bathocuproine), BAlq (bis(8-hydroxy-2-methylquinoline)-(4-phenylphenoxy)aluminum), NBphen (2,9-bis(naphthalen-2-yl)-4,7-diphenyl-1,10-phenanthroline), Alq3 (Aluminum-tris(8-hydroxyquinoline)), TSPO1 (diphenyl-4-triphenylsilylphenyl-phosphinoxide), T2T (2,4,6-tris(biphenyl-3-yl)-1,3,5-triazine), T3T (2,4,6-tris(triphenyl-3-yl)-1,3,5-triazine), TST (2,4,6-tris(9,9'-spirobifluorene-2-yl)-1,3,5-triazine), and/or TCB/TCP (1,3,5-tris(N-carbazolyl)benzol/1,3,5-tris(carbazol)-9-yl) benzene).

A cathode layer C may be located adjacent to the electron transport layer (ETL). For example, the cathode layer C may include or may consist of a metal (e.g., Al, Au, Ag, Pt, Cu, Zn, Ni, Fe, Pb, LiF, Ca, Ba, Mg, In, W, or Pd) or a metal alloy. For practical reasons, the cathode layer C may also consist of (essentially) non-transparent metals such as Mg, Ca or Al. Alternatively or additionally, the cathode layer C may also include graphite and/or carbon nanotubes (CNTs). Alternatively, the cathode layer C may also consist of nanoscalic silver wires.

An OLED may further, optionally, include a protection layer between the electron transport layer (ETL) and the cathode layer C (which may be designated as electron injection layer (EIL)). This layer may include lithium fluoride, cesium fluoride, silver, Liq (8-hydroxyquinolinolatolithium), $Li_2O$, $BaF_2$, MgO and/or NaF.

Optionally, also the electron transport layer (ETL) and/or a hole blocking layer (HBL) may include one or more host compounds.

In order to modify the emission spectrum and/or the absorption spectrum of the light-emitting layer EML further, the light-emitting layer EML may further include one or more further emitter molecule F. Such an emitter molecule F may be any emitter molecule known in the art. Preferably such an emitter molecule F is a molecule with a structure differing from the structure of the molecules according to the disclosure. The emitter molecule F may optionally be a TADF emitter. Alternatively, the emitter molecule F may optionally be a fluorescent and/or phosphorescent emitter molecule which is able to shift the emission spectrum and/or the absorption spectrum of the light-emitting layer EML. For example, the triplet and/or singlet excitons may be transferred from the emitter molecule according to the disclosure to the emitter molecule F before relaxing to the ground state S0 by emitting light typically red-shifted in comparison to the light emitted by emitter molecule E. Optionally, the emitter molecule F may also provoke two-photon effects (i.e., the absorption of two photons of half the energy of the absorption maximum).

Optionally, an optoelectronic device (e.g., an OLED) may, for example, be an essentially white optoelectronic device. For example such white optoelectronic device may include at least one (deep) blue emitter molecule and one or more emitter molecules emitting green and/or red light. Then, there may also optionally be energy transmittance between two or more molecules as described above.

As used herein, if not defined more specifically in the particular context, the designation of the colors of emitted and/or absorbed light is as follows:

violet: wavelength range of >380-420 nm;
deep blue: wavelength range of >420-480 nm;
sky blue: wavelength range of >480-500 nm;
green: wavelength range of >500-560 nm;
yellow: wavelength range of >560-580 nm;
orange: wavelength range of >580-620 nm;
red: wavelength range of >620-800 nm.

With respect to emitter molecules, such colors refer to the emission maximum. Therefore, for example, a deep blue emitter has an emission maximum in the range of from >420 to 480 nm, a sky-blue emitter has an emission maximum in the range of from >480 to 500 nm, a green emitter has an emission maximum in a range of from >500 to 560 nm, and a red emitter has an emission maximum in a range of from >620 to 800 nm.

A further embodiment of the present disclosure relates to an OLED, which emits light with CIEx and CIEy color coordinates close to the CIEx (=0.170) and CIEy (=0.797) color coordinates of the primary color green (CIEx=0.170 and CIEy=0.797) as defined by ITU-R Recommendation BT.2020 (Rec. 2020) and thus is suited for the use in Ultra High Definition (UHD) displays, e.g. UHD-TVs. In this context, the term "close to" refers to the ranges of CIEx and CIEy coordinates provided at the end of this paragraph. In commercial applications, typically top-emitting (top-electrode is transparent) devices are used, whereas test devices as used throughout the present application represent bottom-emitting devices (bottom-electrode and substrate are transparent). Accordingly, a further aspect of the present disclosure relates to an OLED, whose emission exhibits a CIEx color coordinate of between 0.15 and 0.45, preferably between 0.15 and 0.35, more preferably between 0.15 and 0.30 or even more preferably between 0.15 and 0.25 or even between 0.15 and 0.20 and/or a CIEy color coordinate of between 0.60 and 0.92, preferably between 0.65 and 0.90, more preferably between 0.70 and 0.88 or even more preferably between 0.75 and 0.86 or even between 0.79 and 0.84.

A further embodiment of the present disclosure relates to an OLED, which emits light with CIEx and CIEy color coordinates close to the CIEx (=0.708) and CIEy (=0.292) color coordinates of the primary color red (CIEx=0.708 and CIEy=0.292) as defined by ITU-R Recommendation BT.2020 (Rec. 2020) and thus is suited for the use in Ultra High Definition (UHD) displays, e.g. UHD-TVs. In this context, the term "close to" refers to the ranges of CIEx and CIEy coordinates provided at the end of this paragraph. In commercial applications, typically top-emitting (top-electrode is transparent) devices are used, whereas test devices as used throughout the present application represent bottom-emitting devices (bottom-electrode and substrate are transparent). Accordingly, a further aspect of the present disclosure relates to an OLED, whose emission exhibits a CIEx color coordinate of between 0.60 and 0.88, preferably between 0.61 and 0.83, more preferably between 0.63 and 0.78 or even more preferably between 0.66 and 0.76 or even between 0.68 and 0.73 and/or a CIEy color coordinate of between 0.25 and 0.70, preferably between 0.26 and 0.55, more preferably between 0.27 and 0.45 or even more preferably between 0.28 and 0.40 or even between 0.29 and 0.35.

Accordingly, a further aspect of the present disclosure relates to an OLED, which exhibits an external quantum efficiency at 14500 cd/m$^2$ of more than 10%, more preferably of more than 13%, more preferably of more than 15%, even more preferably of more than 17% or even more than 20% and/or exhibits an emission maximum between 495 nm and 580 nm, preferably between 500 nm and 560 nm, more preferably between 510 nm and 550 nm, even more preferably between 515 nm and 540 nm and/or exhibits a LT97 value at 14500 cd/m$^2$ of more than 100 h, preferably more than 250 h, more preferably more than 500 h, even more preferably more than 750 h or even more than 1000 h.

The optoelectronic device, for example, the OLED according to the present disclosure can be manufactured by any means of vapor deposition and/or liquid processing. Accordingly, at least one layer is prepared by means of a sublimation process,
prepared by means of an organic vapor phase deposition process,
prepared by means of a carrier gas sublimation process,
solution processed or
printed.

The methods used to manufacture the optoelectronic device, for example, the OLED according to the present disclosure are known in the art. The different layers are individually and successively deposited on a suitable substrate by means of subsequent deposition processes. The individual layers may be deposited using the same or differing deposition methods.

Vapor deposition processes, for example, include thermal (co)evaporation, chemical vapor deposition and physical vapor deposition. For active matrix OLED display, an AMOLED backplane is used as substrate. The individual layer may be processed from solutions or dispersions employing adequate solvents. Solution deposition process, for example, include spin coating, dip coating and jet printing. Liquid processing may optionally be carried out in an inert atmosphere (e.g., in a nitrogen atmosphere) and the solvent may optionally be completely or partially removed by means known in the state of the art.

EXAMPLES

General synthesis scheme I

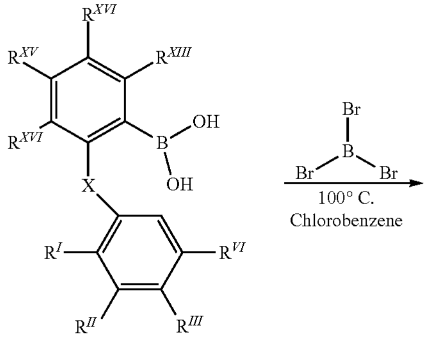

E1

-continued
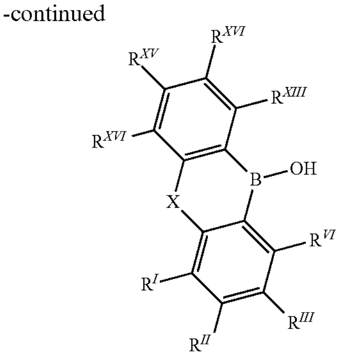
P1
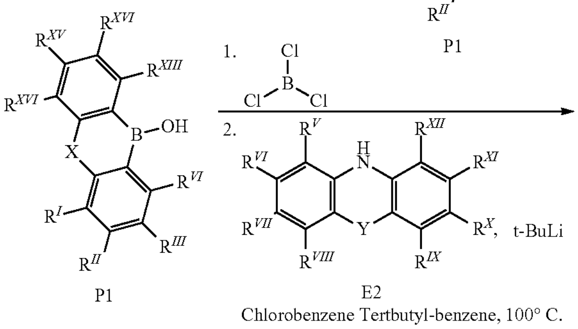
P1
E2
-continued
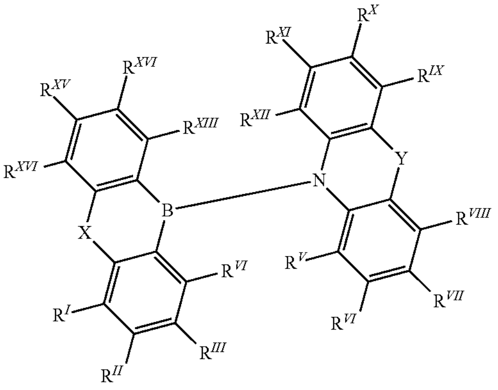
P2
General synthesis scheme II
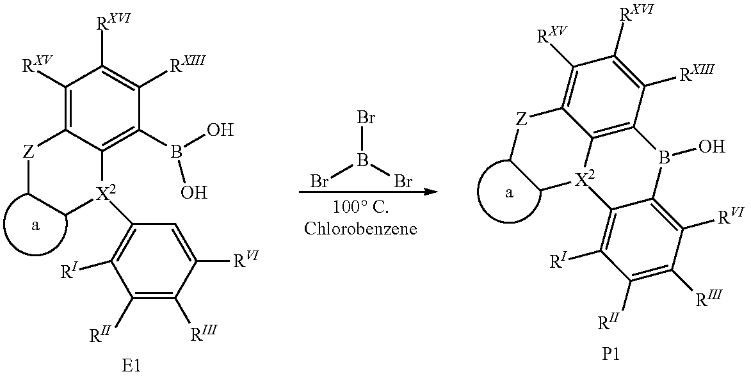
E1
P1
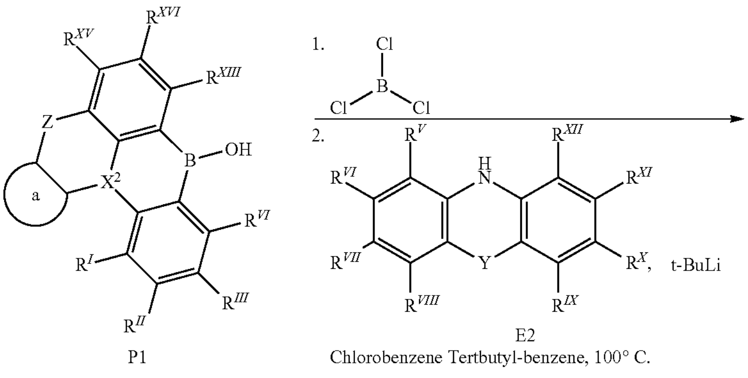
P1
E2

-continued
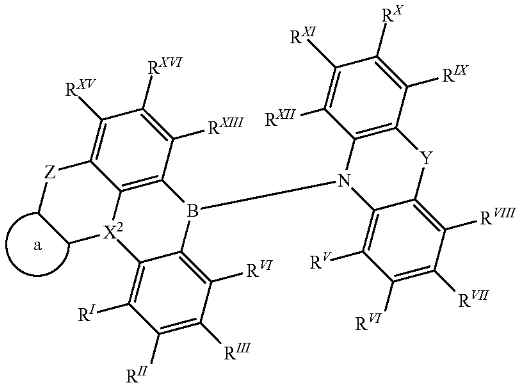
P2
General synthesis scheme III
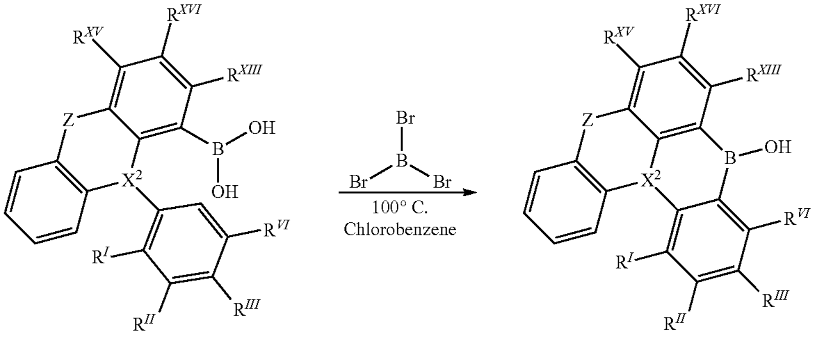
E1 P1
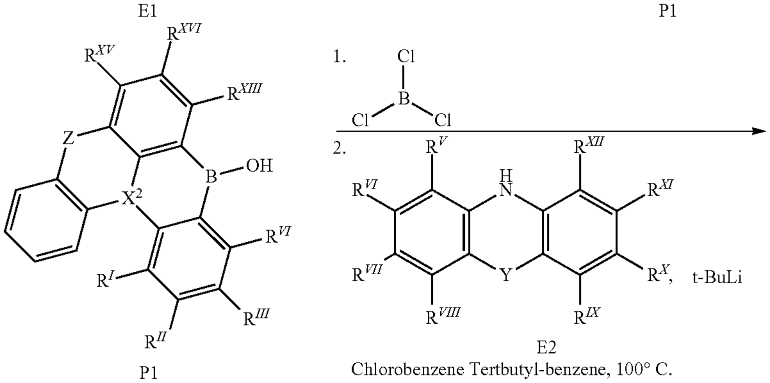
P1 E2
Chlorobenzene Tertbutyl-benzene, 100° C.
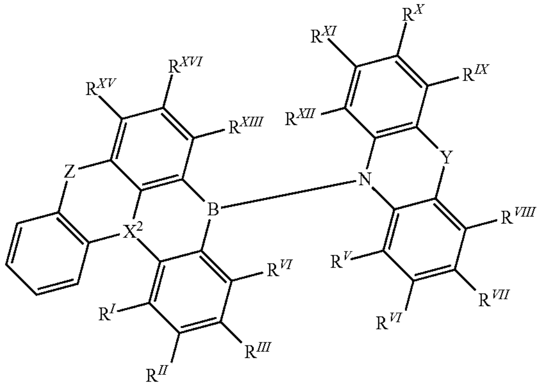
P2

General Procedure for Synthesis AAV1:

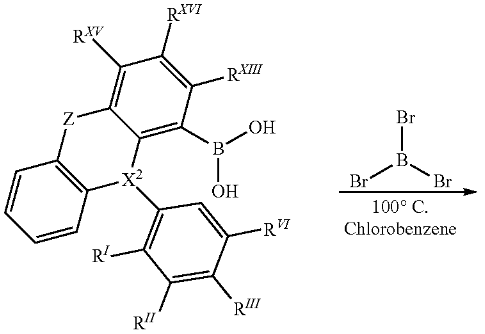

E1

-continued

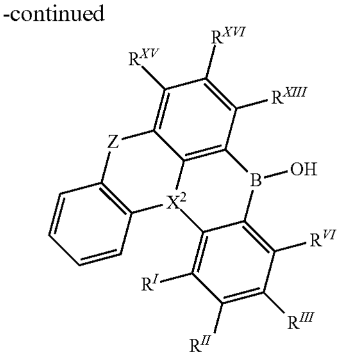

P1

Under N2 atmosphere, a 2-necked flask equipped with a reflux condenser is charged with E1 (1.0 equiv.), chlorobenzene (100 mL) and subsequently boron tribromide [10294-33-4] (3.5 equiv.). After the mixture was stirred at 100° C. for 2 hours, the reaction was quenched by adding water (50 mL) at 0° C. The precipitate was filtered and dried to obtain the corresponding product P1 as a solid that is further used without further purification.

General procedure for synthesis AAV2:

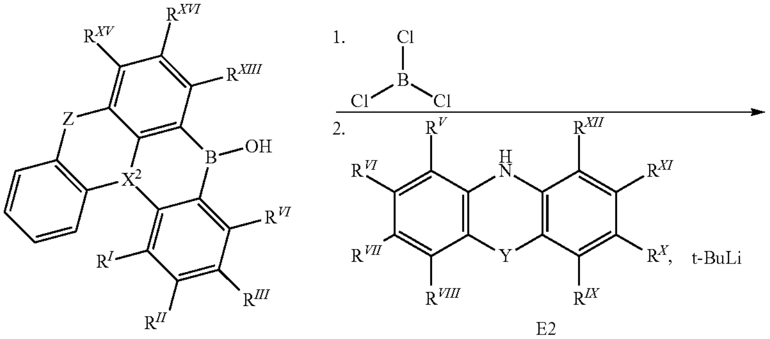

P1 E2

Chlorobenzene Tertbutyl-benzene, 100° C.

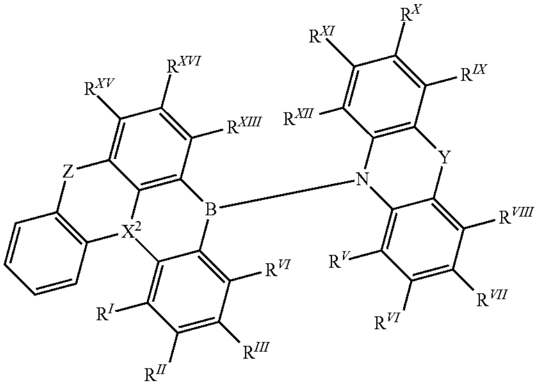

P2

Under N2 atmosphere, a two-neck flask is charged with P1 (1.0 equiv.) and chlorobenzene (100 mL) and the mixture was degassed for 10 min. Boron trichloride [10294-34-5] (0.5 equiv.) was added at 0° C. and the mixture was allowed to warm up to room temperature and stirred for 2 hours. Under N2 atmosphere, a second two-neck flask was charged with E2 (3.0 equiv.) and dry tert-butyl benzene (50 mL) and the mixture was degassed for 10 min. A tert-butyllithium solution [54-19-4] (2.8 equiv.) was added at 0° C. to the $2^{nd}$ flask and this reaction mixture was allowed to warm up at room temperature and stirred for 30 min. After slowly adding the reaction mixture of the second flask to the reaction mixture of the first flask at 0° C., the yellow mixture was stirred at room temperature overnight. After evaporating the solvent, the crude mixture was purified by column chromatography (eluent: cyclohexane/dichloromethane) to obtain the corresponding product P2 as a solid.

Cyclic Voltammetry

Cyclic voltammograms are measured from solutions having concentration of $10^{-3}$ mol/L of the organic molecules in dichloromethane or a suitable solvent and a suitable supporting electrolyte (e.g. 0.1 mol/L of tetrabutylammonium hexafluorophosphate). The measurements are conducted at room temperature under nitrogen atmosphere with a three-electrode assembly (Working and counter electrodes: Pt wire, reference electrode: Pt wire) and calibrated using $FeCp_2/FeCp_2^+$ as internal standard. The HOMO data was corrected using ferrocene as internal standard against a saturated calomel electrode (SCE).

Density Functional Theory Calculation

Molecular structures are optimized employing the BP86 functional and the resolution of identity approach (RI). Excitation energies are calculated using the (BP86) optimized structures employing Time-Dependent DFT (TD-DFT) methods. Orbital and excited state energies are calculated with the B3LYP functional. Def2-SVP basis sets (and an m4-grid for numerical integration are used). The Turbomole program package is used for all calculations.

Photophysical Measurements

Sample Pretreatment: Spin-Coating

Apparatus: Spin150, SPS euro.

The sample concentration is 10 mg/ml, dissolved in a suitable solvent.

Program: 1) 3 s at 400 U/min; 2) 20 s at 1000 U/min at 1000 Upm/s. 3) 10 s at 4000 U/min at 1000 Upm/s. After coating, the films are tried at 70° C. for 1 min.

Photoluminescence Spectroscopy and Time-Correlated Single-Photon Counting (TCSPC)

Steady-state emission spectroscopy is measured by a Horiba Scientific, Modell FluoroMax-4 equipped with a 150 W Xenon-Arc lamp, excitation- and emissions monochromators and a Hamamatsu R928 photomultiplier and a time-correlated single-photon counting option. Emissions and excitation spectra are corrected using standard correction fits.

Excited state lifetimes are determined employing the same system using the TCSPC method with FM-2013 equipment and a Horiba Yvon TCSPC hub.

Excitation Sources:

NanoLED 370 (wavelength: 371 nm, puls duration: 1.1 ns)

NanoLED 290 (wavelength: 294 nm, puls duration: <1 ns)

SpectraLED 310 (wavelength: 314 nm)

SpectraLED 355 (wavelength: 355 nm).

Data analysis (exponential fit) is done using the software suite DataStation and DAS6 analysis software. The fit is specified using the chi-squared-test.

Photoluminescence Quantum Yield Measurements

For photoluminescence quantum yield (PLQY) measurements an Absolute PL Quantum Yield Measurement C9920-03G system (Hamamatsu Photonics) is used. Quantum yields and CIE coordinates are determined using the software U6039-05 version 3.6.0.

Emission maxima are given in nm, quantum yields ϕ in % and CIE coordinates as x,y values.

PLOY is determined using the following protocol:

Quality assurance: Anthracene in ethanol (known concentration) is used as reference Excitation wavelength: the absorption maximum of the organic molecule is determined and the molecule is excited using this wavelength Measurement Quantum yields are measured for sample of solutions or films under nitrogen atmosphere. The yield is calculated using the equation:

$$\Phi_{PL} = \frac{n_{photon}, \text{emited}}{n_{photon}, \text{absorbed}} = \frac{\int \frac{\lambda}{hc}\left[\text{Int}_{emitted}^{sample}(\lambda) - \text{Int}_{absorbed}^{sample}(\lambda)\right]d\lambda}{\int \frac{\lambda}{hc}\left[\text{Int}_{emitted}^{reference}(\lambda) - \text{Int}_{absorbed}^{reference}(\lambda)\right]d\lambda}$$

wherein $n_{photon}$ denotes the photon count and Int. denotes the intensity.

HPLC-MS

HPLC-MS analysis is performed on an HPLC by Agilent (1100 series) with MS-detector (Thermo LTQ XL).

A typical HPLC method is as follows: a reverse phase column 4.6 mm×150 mm, particle size 3.5 μm from Agilent (ZORBAX Eclipse Plus 95 Å C18, 4.6×150 mm, 3.5 μm HPLC column) is used in the HPLC. The HPLC-MS measurements are performed at room temperature (rt) with the following gradients

| Flow rate [ml/min] | Time [min] | A [%] | B [%] | C [%] |
|---|---|---|---|---|
| 2.5 | 0 | 40 | 50 | 10 |
| 2.5 | 5 | 40 | 50 | 10 |
| 2.5 | 25 | 10 | 20 | 70 |
| 2.5 | 35 | 10 | 20 | 70 |
| 2.5 | 35.01 | 40 | 50 | 10 |
| 2.5 | 40.01 | 40 | 50 | 10 |
| 2.5 | 41.01 | 40 | 50 | 10 |

using the following solvent mixtures:

| | | |
|---|---|---|
| Solvent A: | H2O (90%) | MeCN (10%) |
| Solvent B: | H2O (10%) | MeCN (90%) |
| Solvent C: | THF (50%) | MeCN (50%) |

An injection volume of 5 μL from a solution with a concentration of 0.5 mg/mL of the analyte is taken for the measurements.

Ionization of the probe is performed using an atmospheric pressure chemical ionization (APCI) source either in positive (APCI+) or negative (APCI−) ionization mode.

Production and Characterization of Optoelectronic Devices

Optoelectronic devices, such as OLED devices, including organic molecules according to the disclosure can be produced via vacuum-deposition methods. If a layer contains more than one compound, the weight-percentage of one or more compounds is given in %. The total weight-percentage values amount to 100%, thus if a value is not given, the fraction of this compound equals to the difference between the given values and 100%.

The (not fully optimized) OLEDs are characterized using standard methods and measuring electroluminescence spectra, the external quantum efficiency (in %) in dependency on the intensity, calculated using the light detected by the photodiode, and the current. The OLED device lifetime is extracted from the change of the luminance during operation at constant current density. The LT50 value corresponds to the time, where the measured luminance decreased to 50% of the initial luminance, analogously LT80 corresponds to the time point, at which the measured luminance decreased to 80% of the initial luminance, LT 95 to the time point, at which the measured luminance decreased to 95% of the initial luminance etc.

Accelerated lifetime measurements are performed (e.g. applying increased current densities). For example, LT80 values at 500 cd/m$^2$ are determined using the following equation:

$$LT80\left(500\ \frac{\text{cd}}{\text{m}^2}\right) = LT80(L_0)\left(\frac{L_0}{500\ \frac{\text{cd}}{\text{m}^2}}\right)^{1.6}$$

wherein $L^0$ denotes the initial luminance at the applied current density.

The values correspond to the average of several pixels (typically two to eight), and the standard deviation between these pixels is given.

EXAMPLES

Example 1

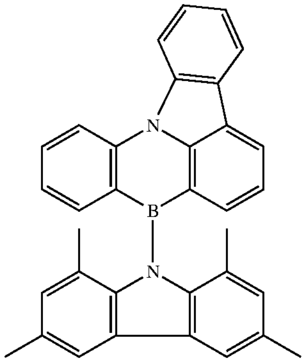

Example 1 was synthesized according to AAV1 (yield 91%) and AAV2 (yield 31%) with E1=(2-(9H-carbazol-9-yl)phenyl)boronic acid [1189047-28-6] and E2=1,3,6,8-tetramethyl-9H-carbazole [6558-85-6].

The drawing depicts the emission spectrum of example 1 (10% by weight in PMMA). The emission maximum (λmax) is at 535 nm. The photoluminescence quantum yield (PLQY) is 56%, the full width at half maximum (FWHM) is 0.36 eV and the emission lifetime is 1.33 μs. The resulting CIEx coordinate is 0.38 and the CIEy coordinate is 0.58.

$^1$H NMR (300 MHz, methylene chloride-d$_2$) δ 8.78 (d, J=8.8 Hz, 1H), 8.59 (d, J=8.6 Hz, 1H), 8.51 (dd, J=7.4, 1.2 Hz, 1H), 8.33 (ddd, J=7.7, 1.5, 0.6 Hz, 1H), 7.95 (ddd, J=8.8, 7.1, 1.8 Hz, 1H), 7.89-7.82 (m, 3H), 7.79 (dd, J=7.6, 1.8 Hz, 1H), 7.72 (ddd, J=8.6, 7.3, 1.4 Hz, 1H), 7.57-7.49 (m, 2H), 7.26 (ddd, J=7.8, 7.1, 0.8 Hz, 1H), 6.88 (s, 2H), 2.50 (s, 6H), 1.81 (s, 6H).

Example D1

Example 1 was tested in the OLED D1, which was fabricated with the following layer structure;

| Layer # | Thickness | D1 |
|---|---|---|
| 10 | 100 nm | Al |
| 9 | 2 nm | Liq |
| 8 | 20 nm | nBPhen |
| 7 | 10 nm | MAT1 |
| 6 | 50 nm | MAT2 (80%): Example 1 (20%) |
| 5 | 10 nm | MAT2 |
| 4 | 10 nm | TCTA |
| 3 | 50 nm | NPB |
| 2 | 5 nm | HAT-CN |
| 1 | 50 nm | ITO |
| Substrate | | Glass |

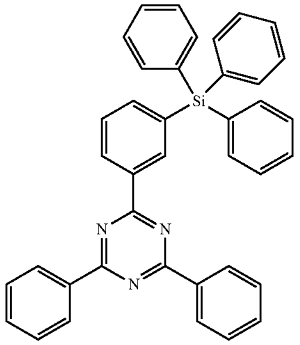

MAT1

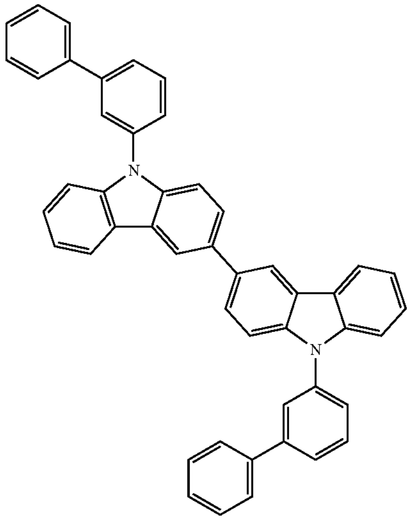

MAT2

OLED D1 yielded an external quantum efficiency (EQE) at 1000 cd/m$^2$ of 16.7%. The emission maximum is at 542 nm with a FWHM of 75 nm at 5.2 V. The corresponding CIEx value is 0.387 and the corresponding CIEy value is 0.588.

Additional Examples of Organic Molecules of the Disclosure
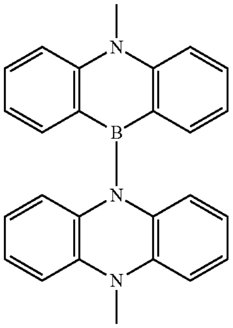
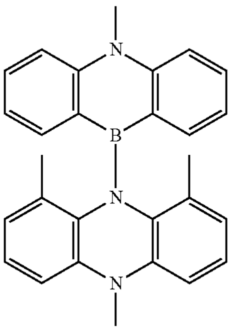
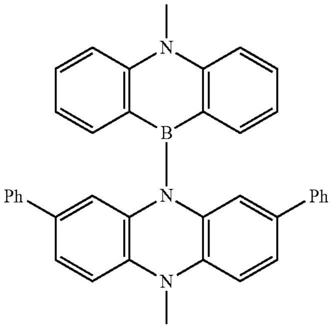
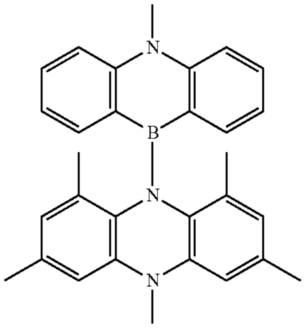
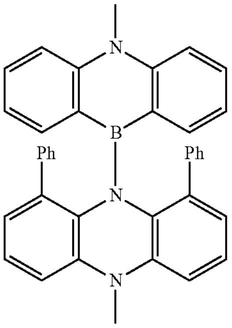
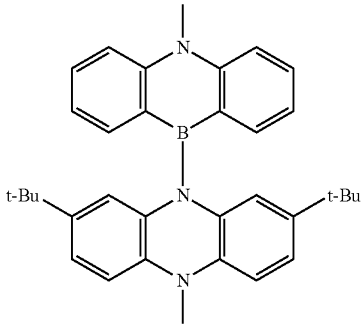
-continued
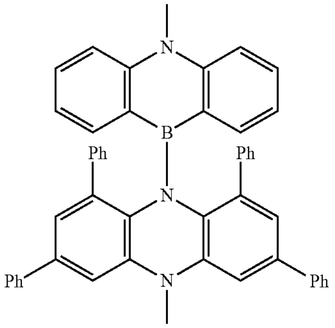
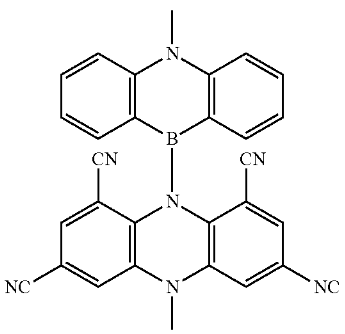
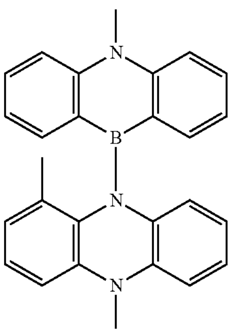
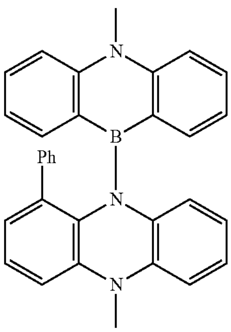
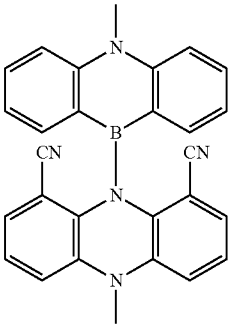

-continued
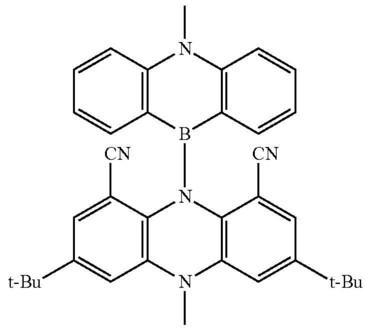
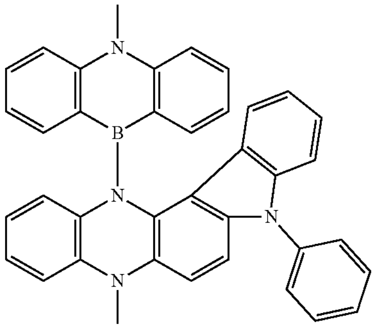
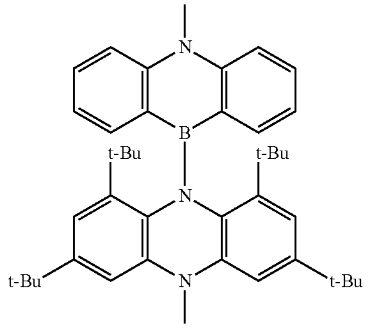
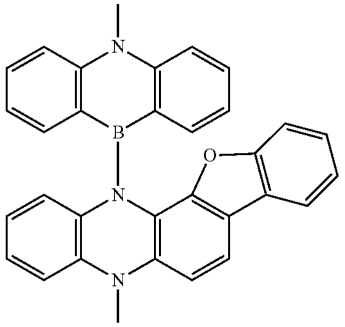
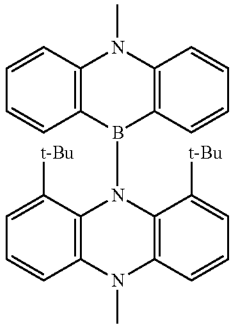
-continued
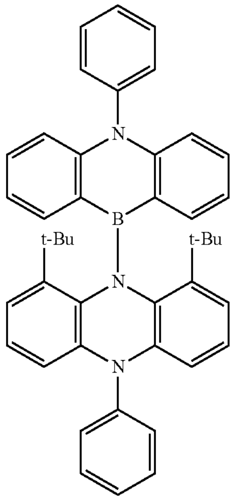
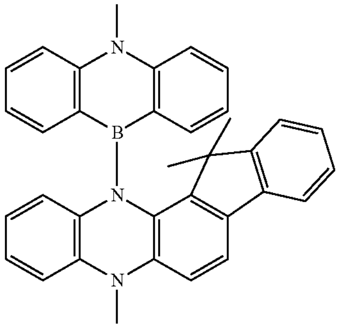
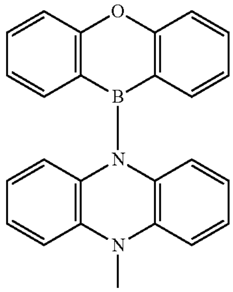
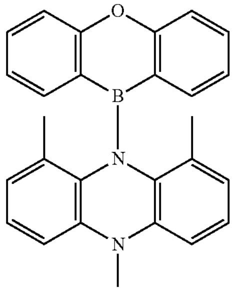
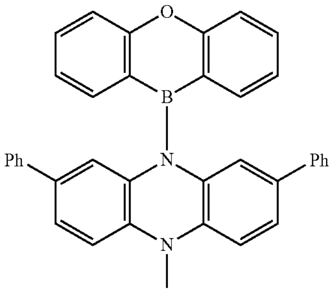

-continued
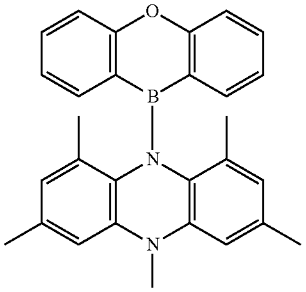
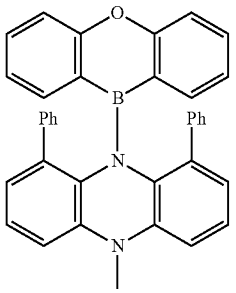
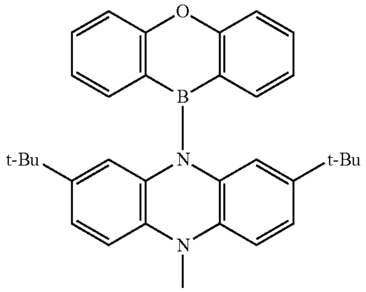
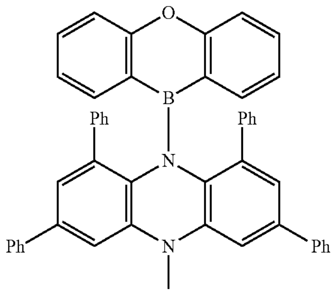
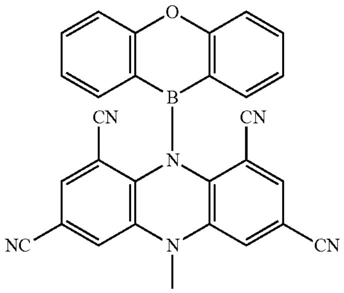
-continued
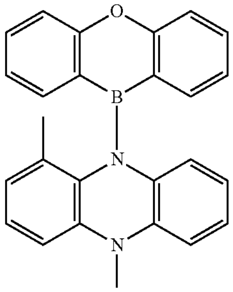
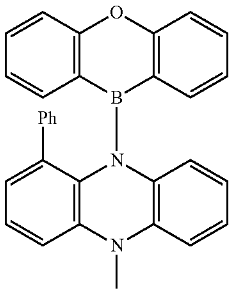
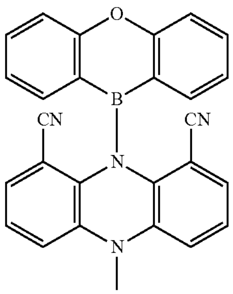
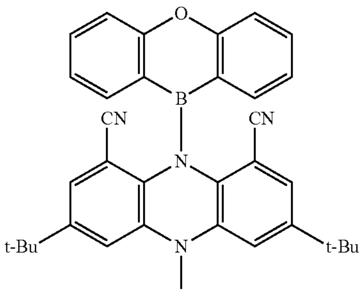
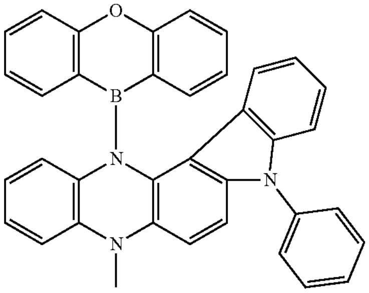

-continued
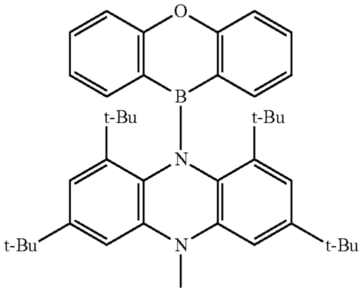
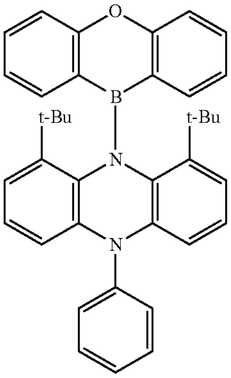
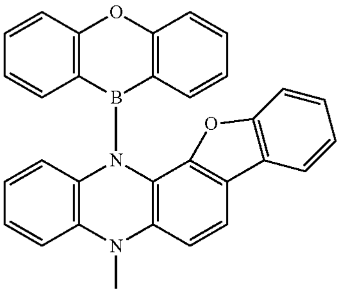
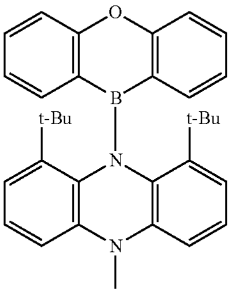
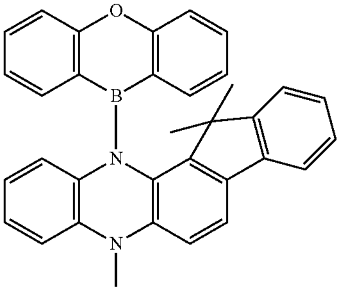
-continued
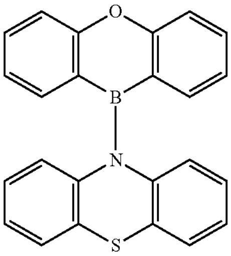
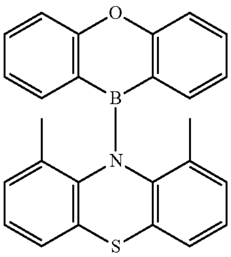
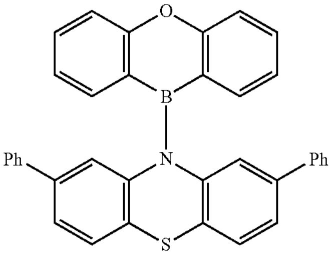
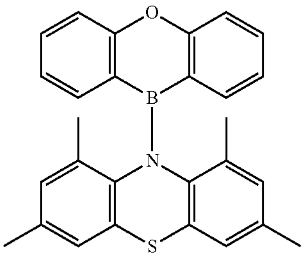
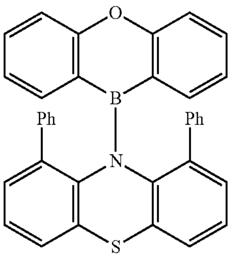
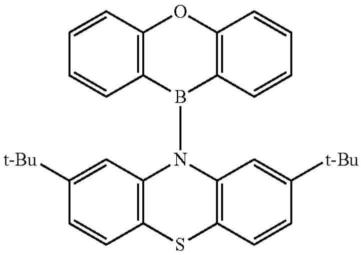

-continued
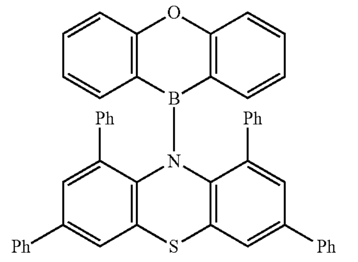
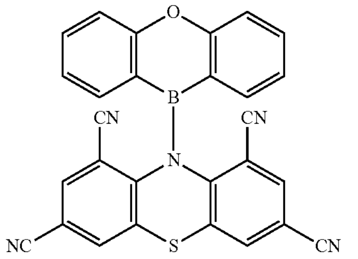
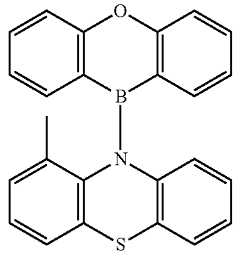
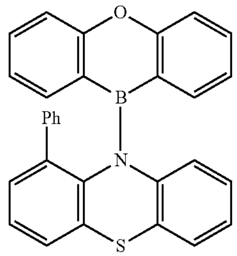
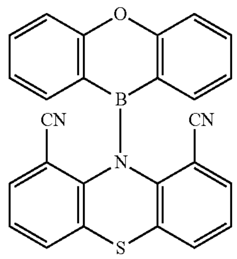
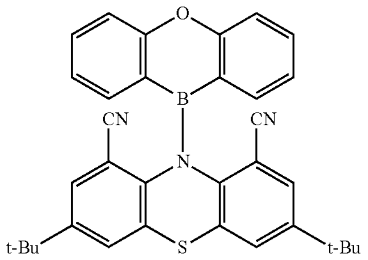
-continued
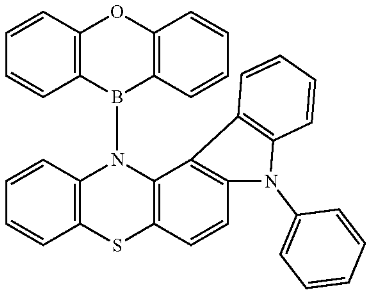
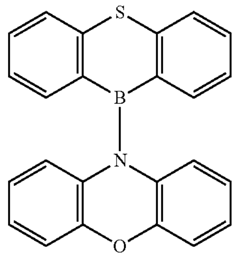
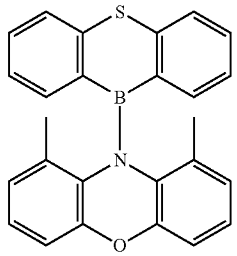
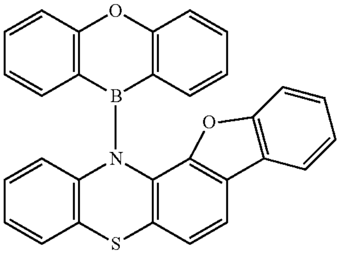
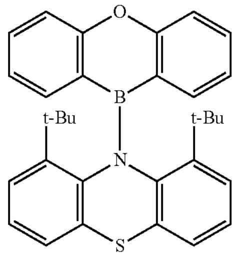
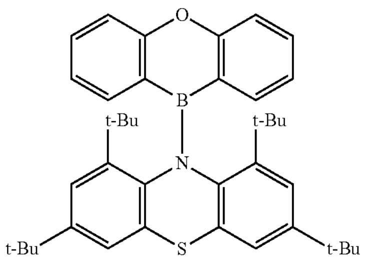

-continued
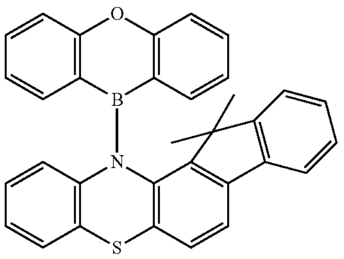
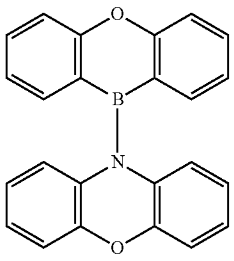
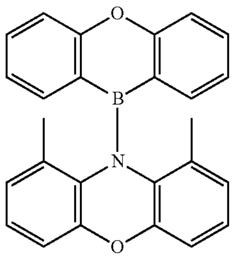
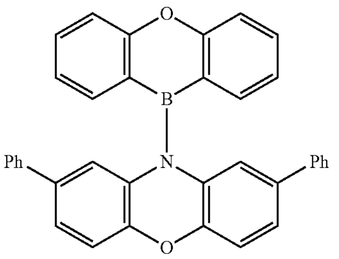
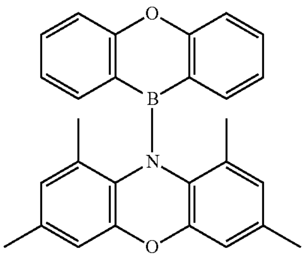
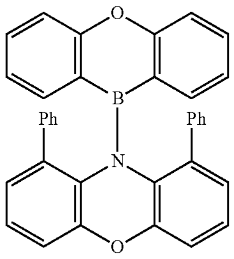
-continued
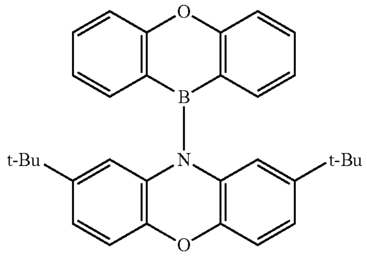
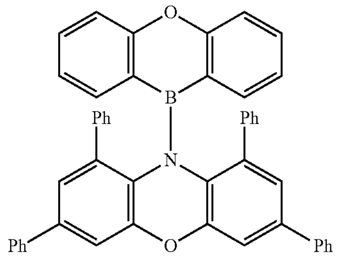
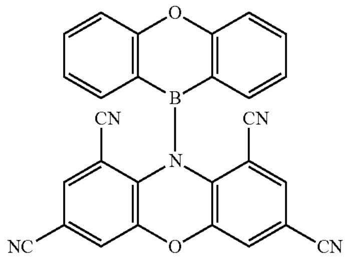
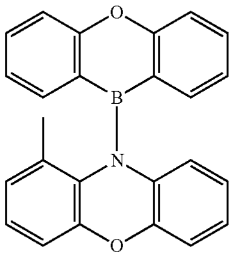
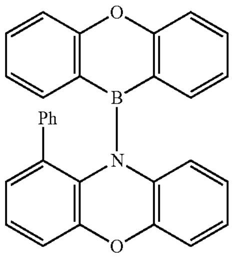
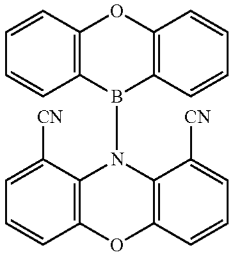

-continued
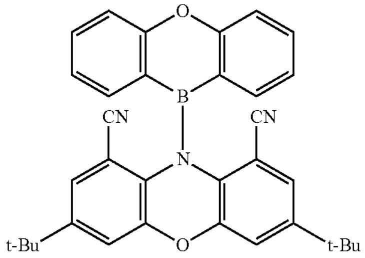
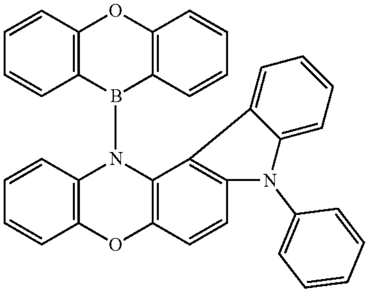
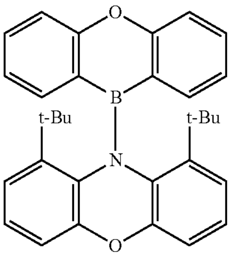
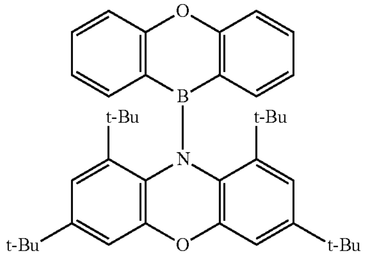
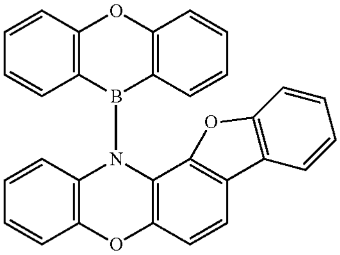
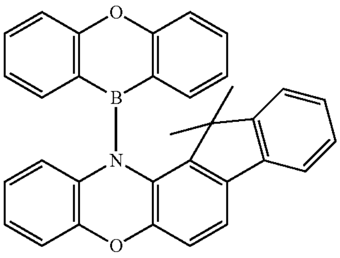
-continued
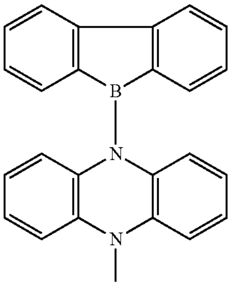
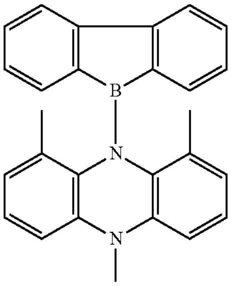
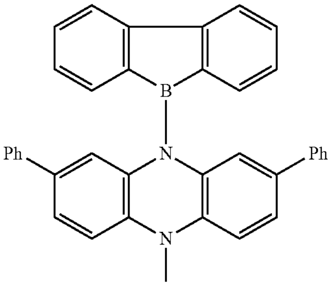
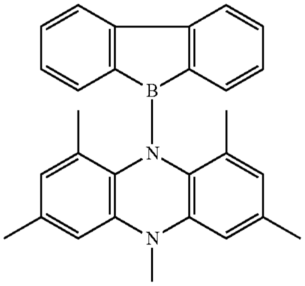
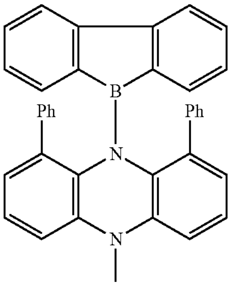
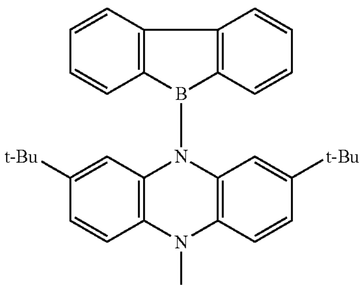

-continued
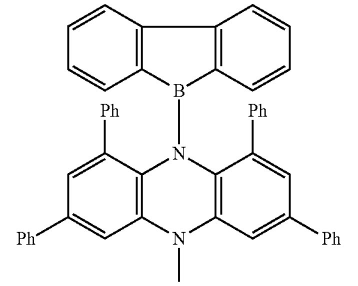
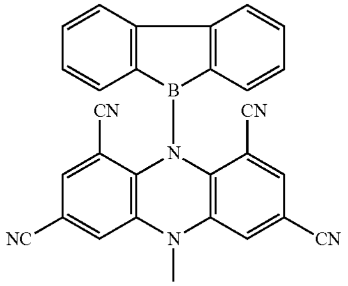
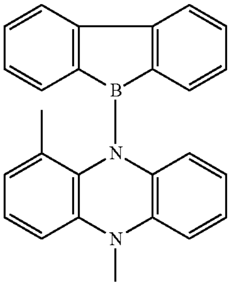
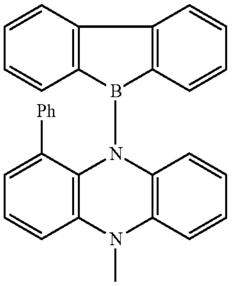
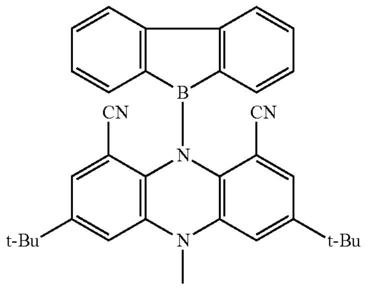
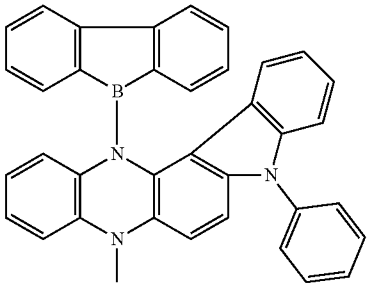
-continued
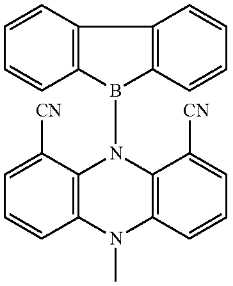
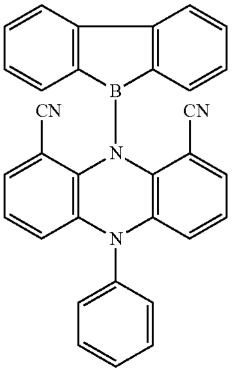
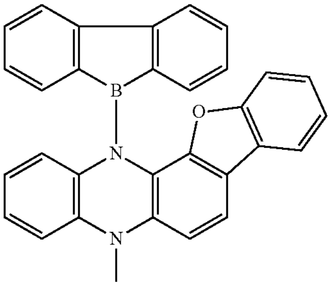
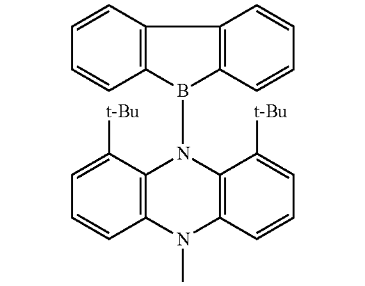
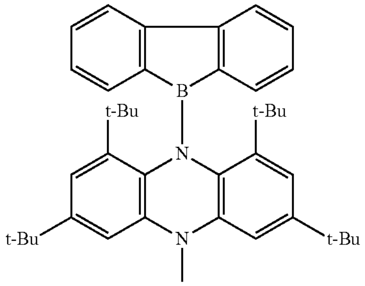

-continued
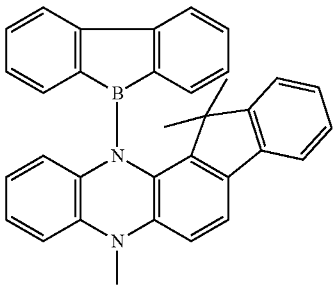
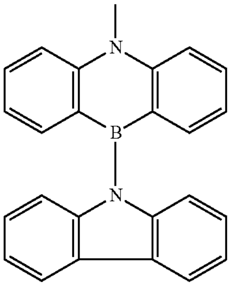
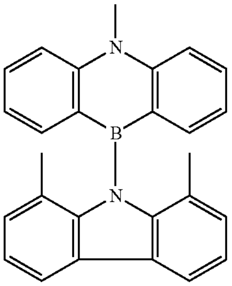
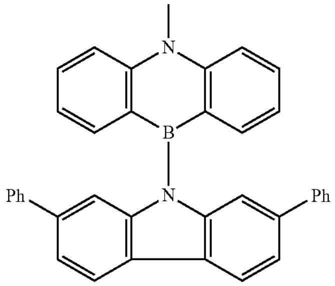
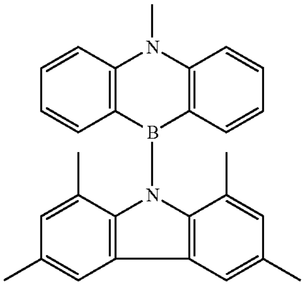
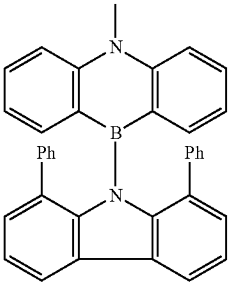
-continued
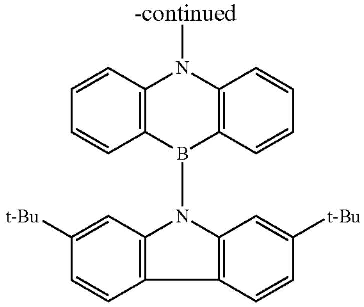
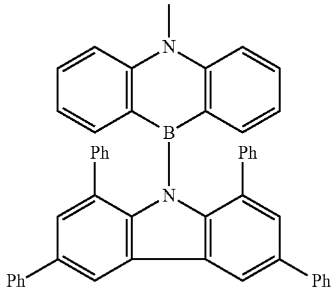
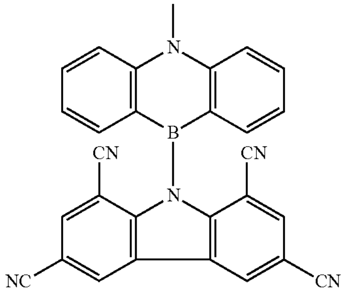
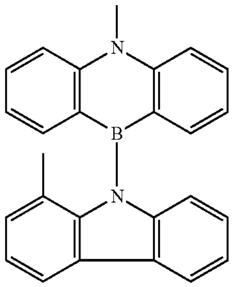
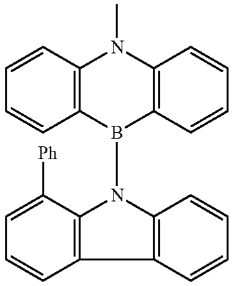
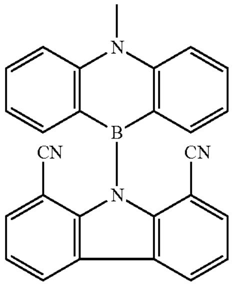

-continued
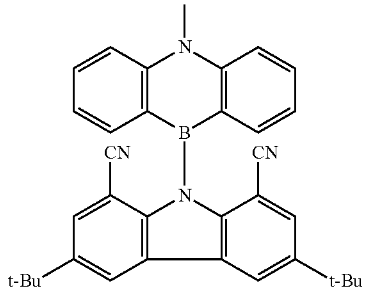
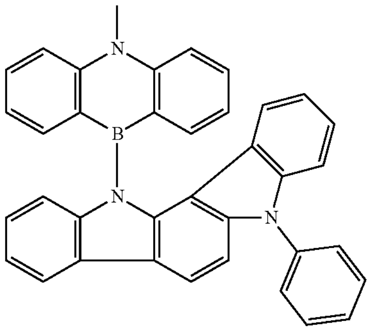
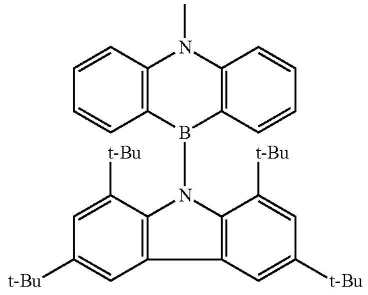
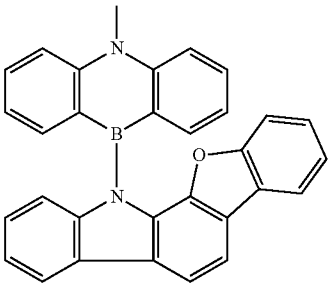
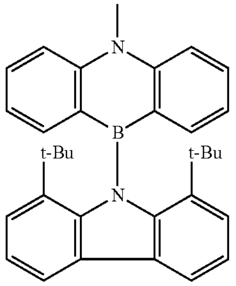
-continued
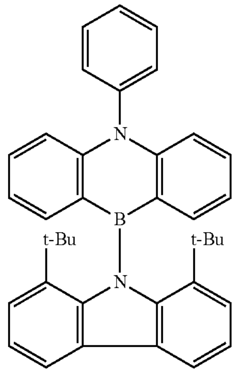
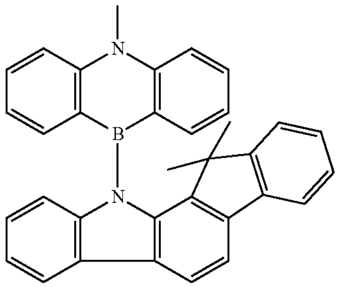
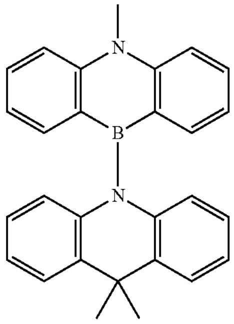
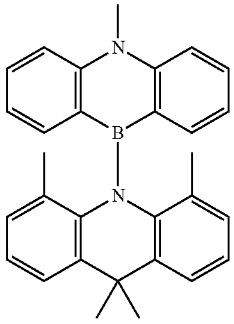
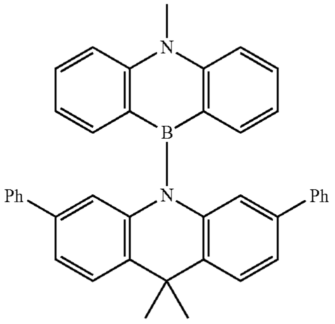

-continued
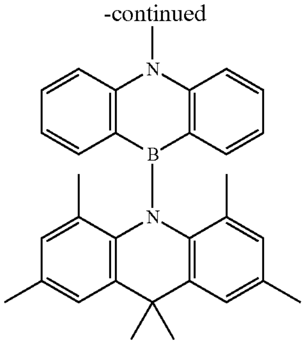
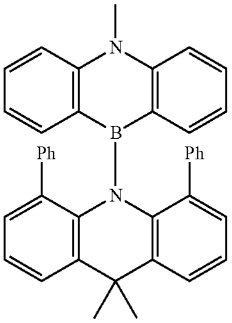
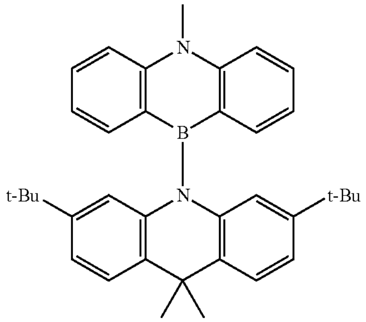
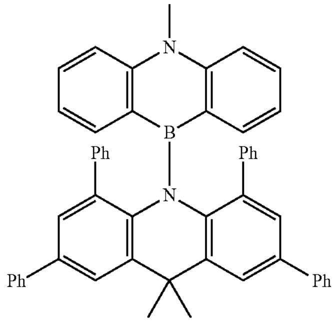
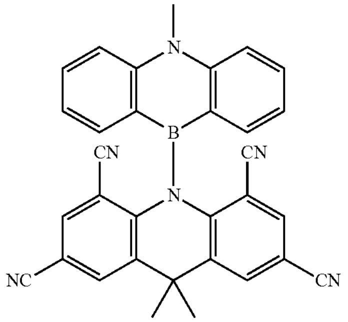
-continued
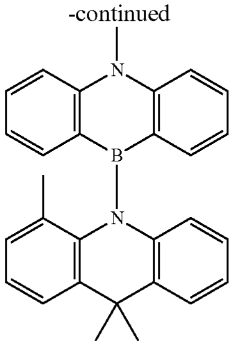
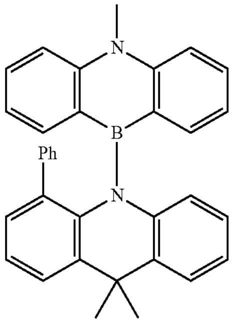
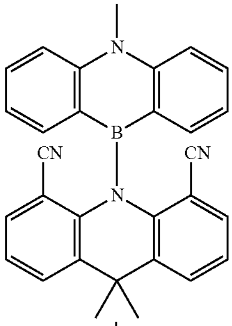
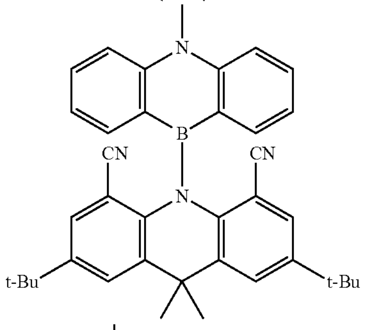
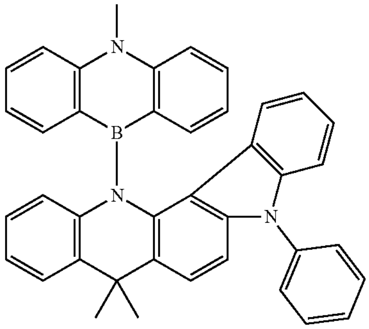

-continued
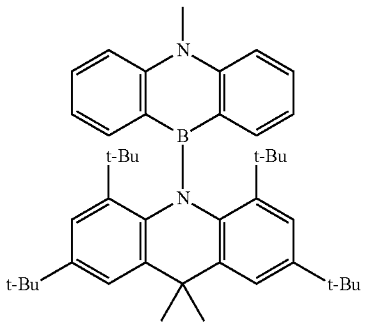
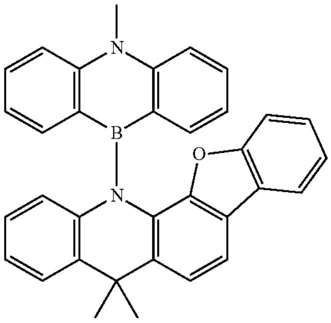
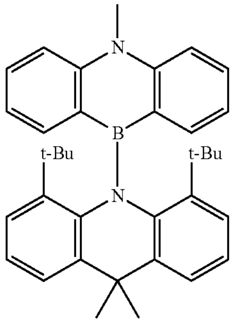
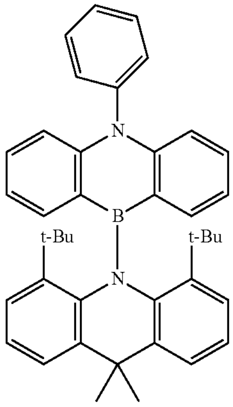
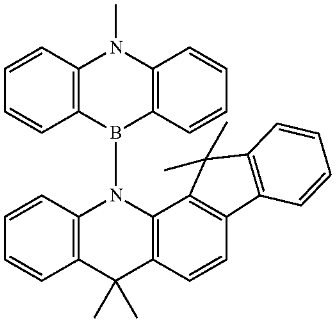
-continued
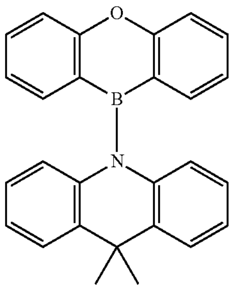
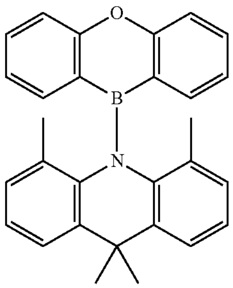
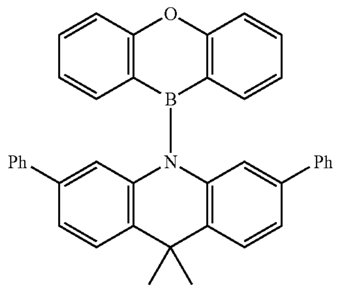
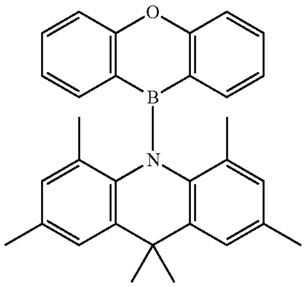
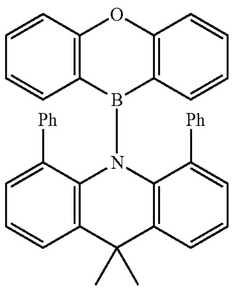
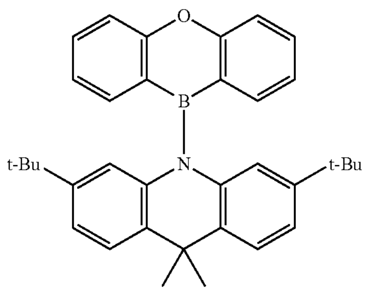

-continued
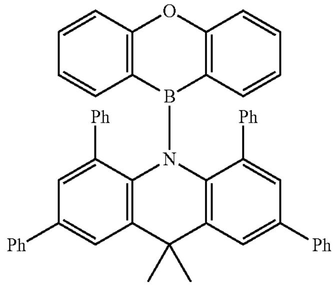
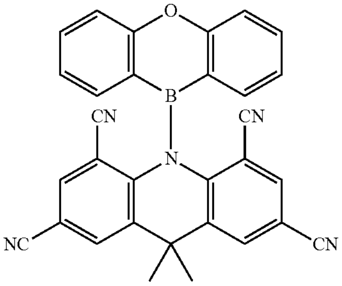
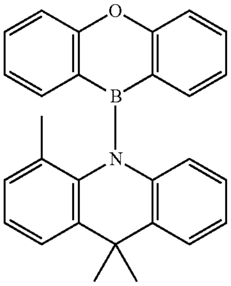
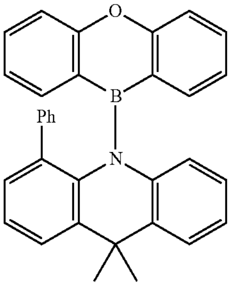
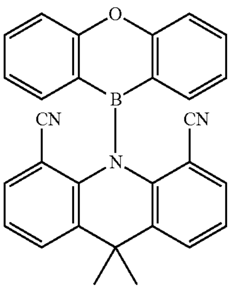
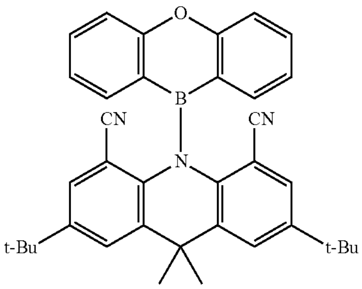
-continued
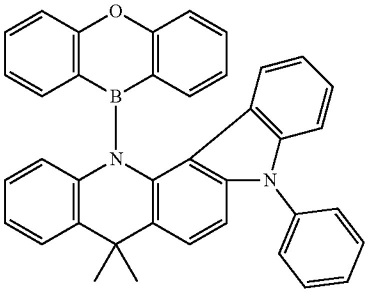
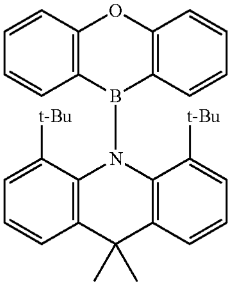
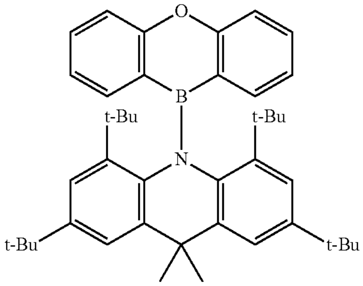
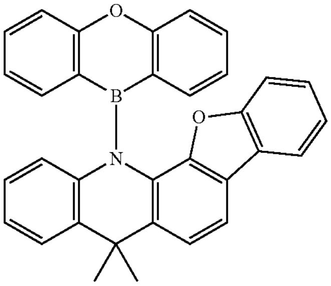
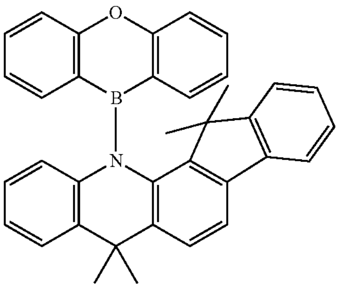

-continued
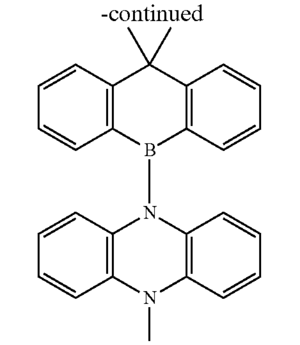
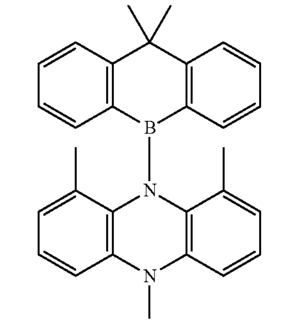
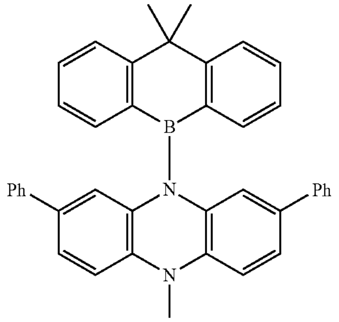
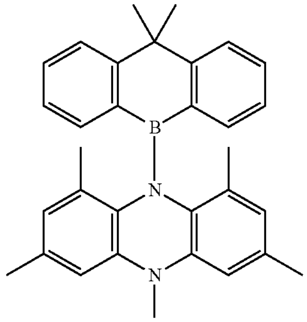
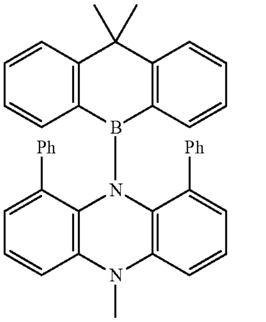
-continued
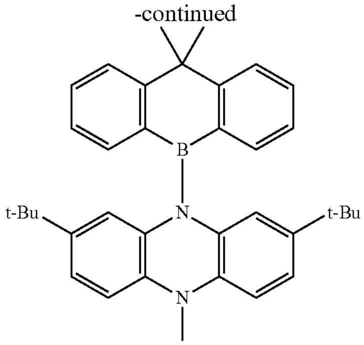
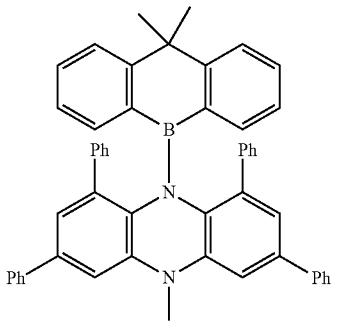
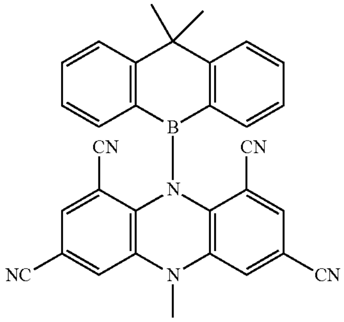
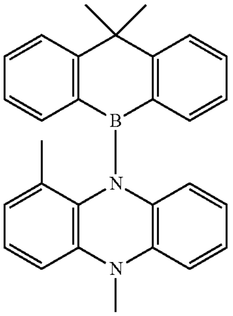
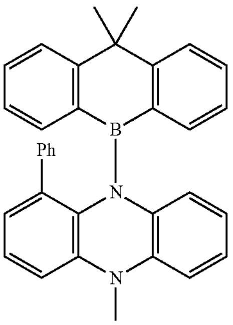

-continued
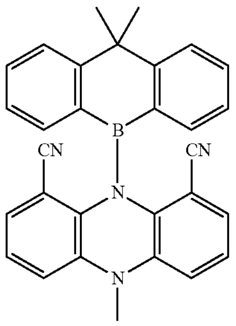
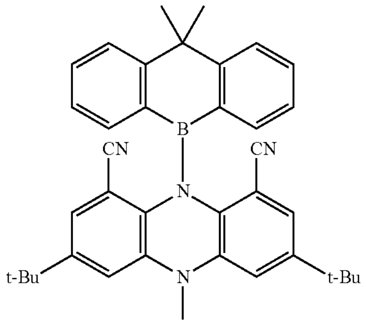
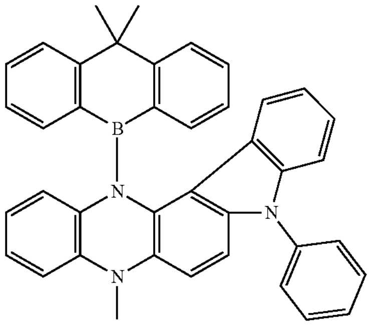
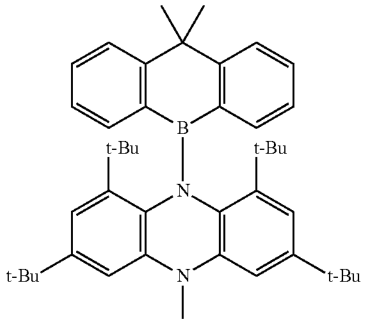
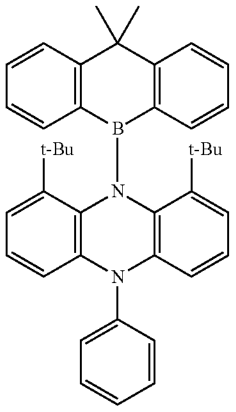
-continued
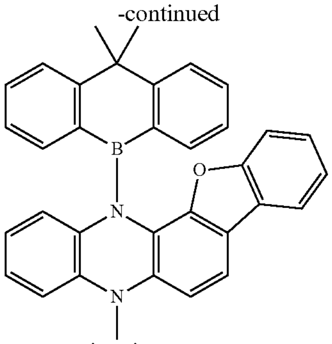
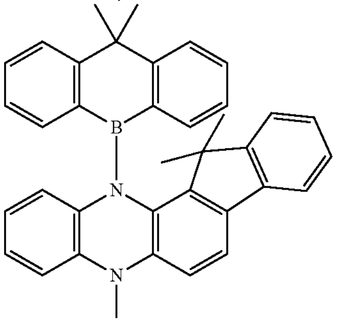
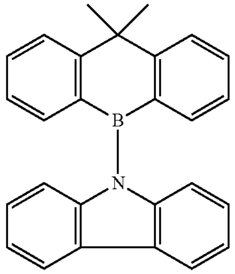
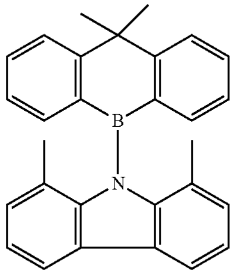
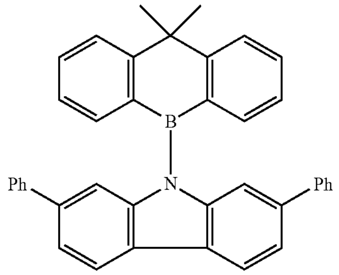
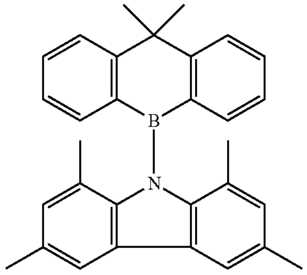

-continued
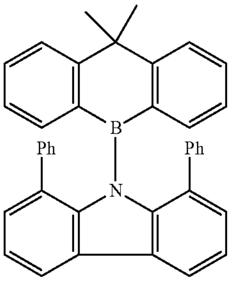
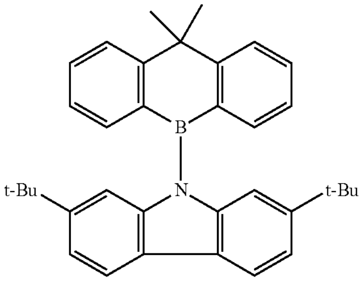
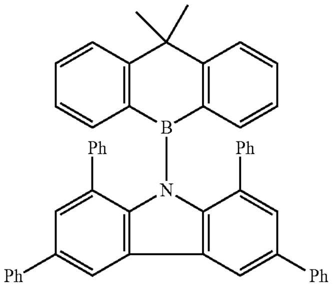
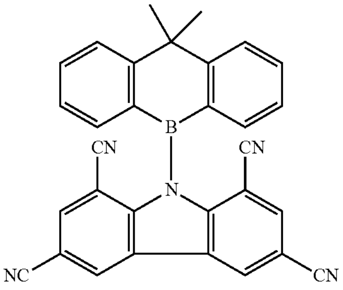
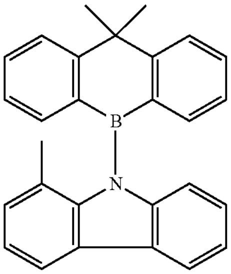
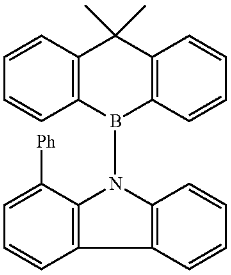
-continued
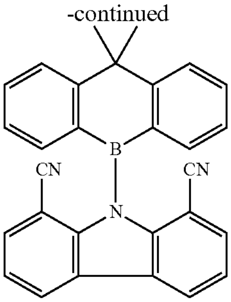
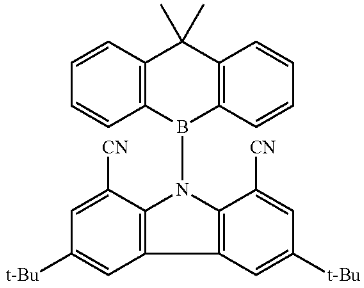
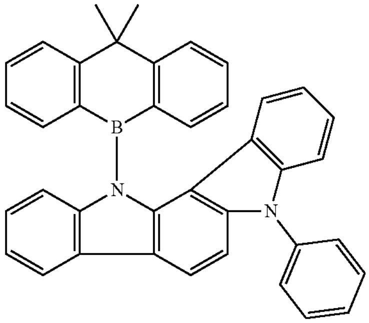
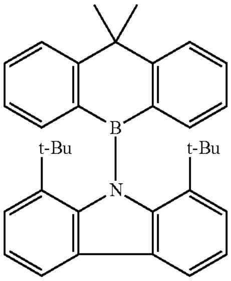
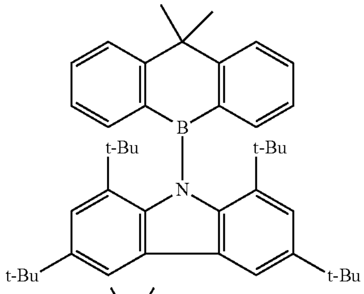
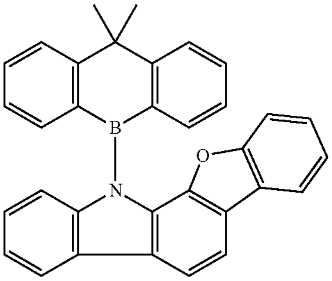

-continued
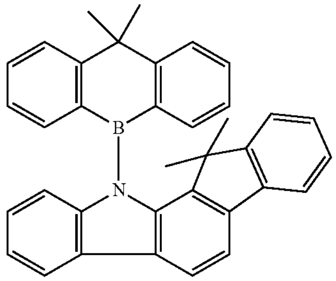
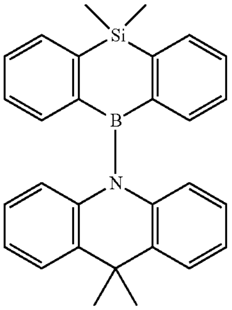
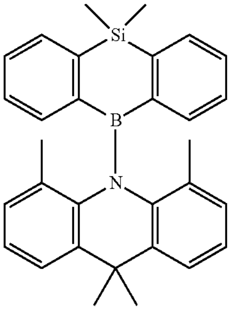
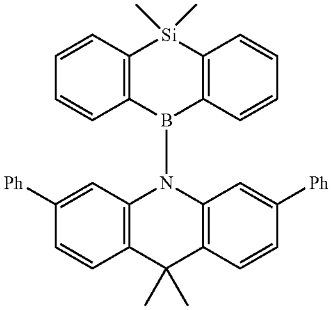
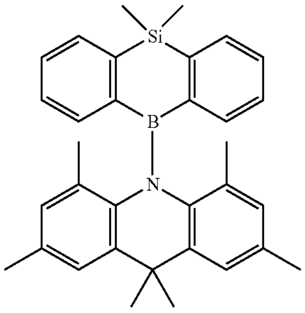
-continued
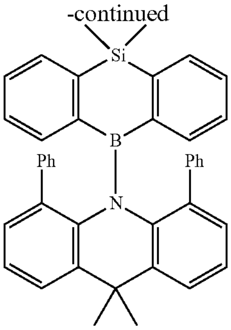
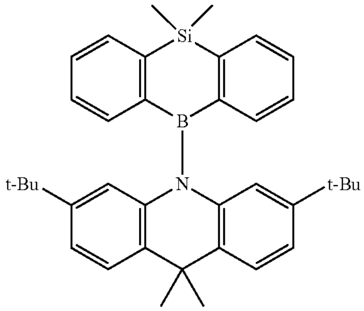
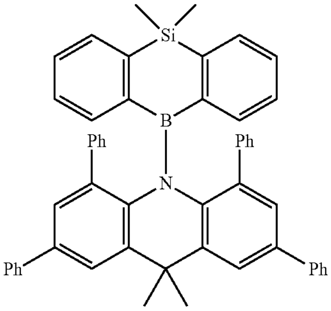
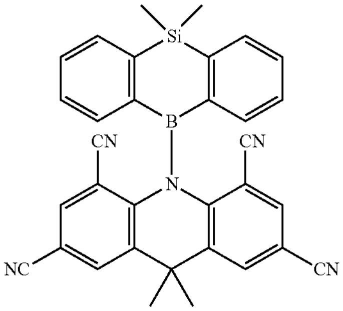
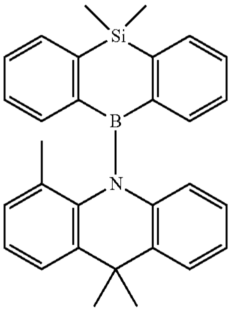

-continued
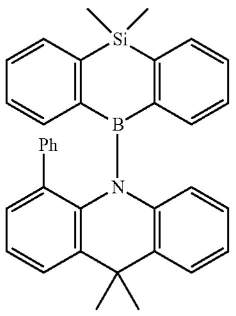
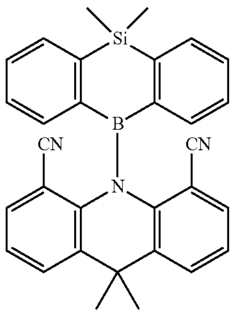
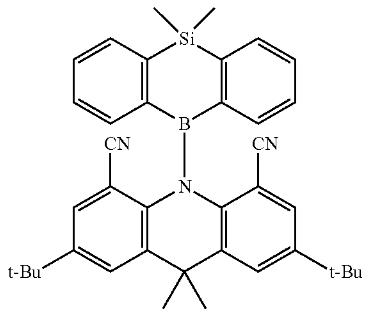
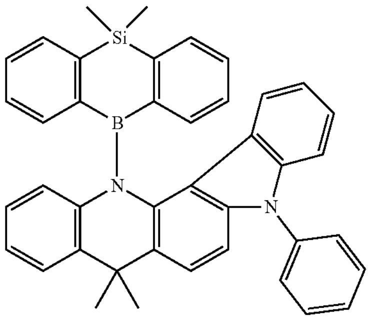
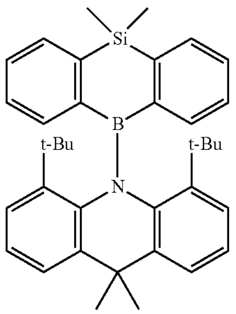
-continued
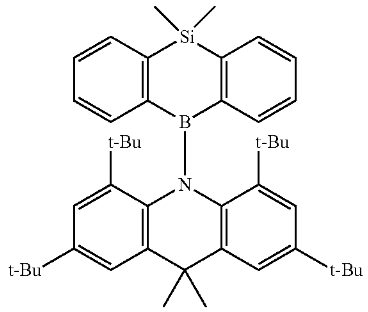
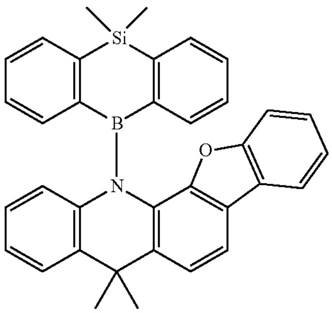
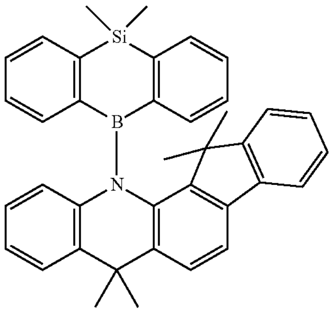
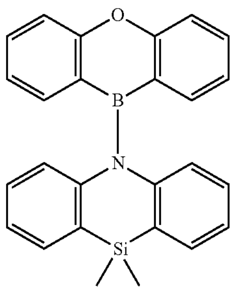
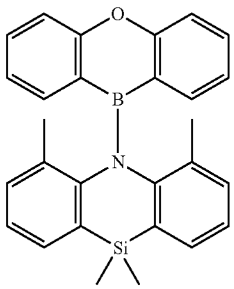

-continued
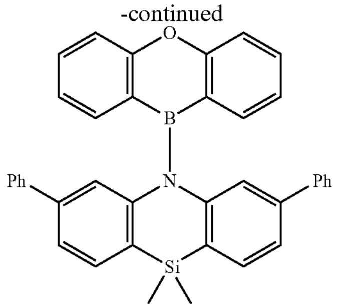
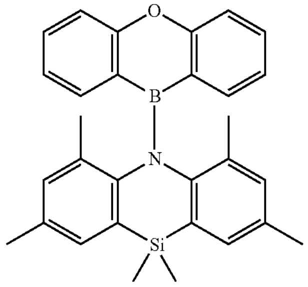
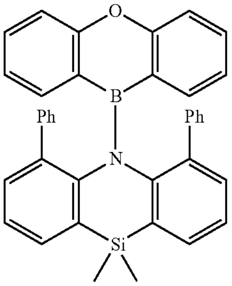
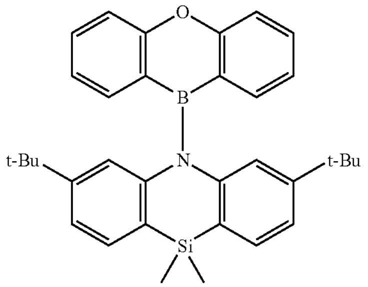
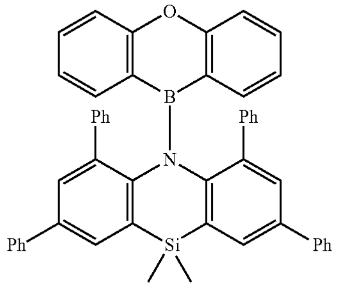
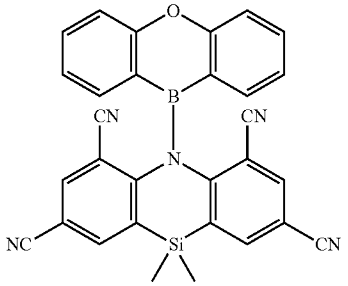
-continued
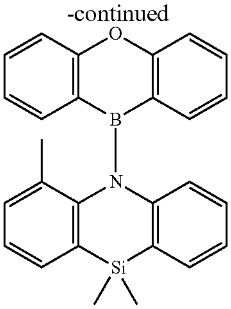
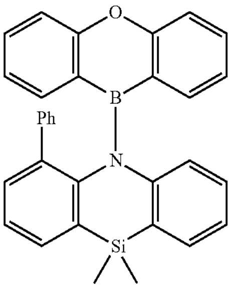
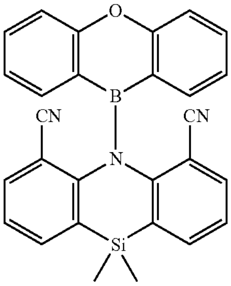
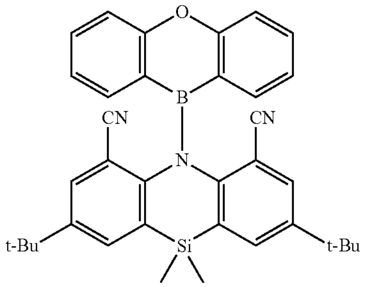
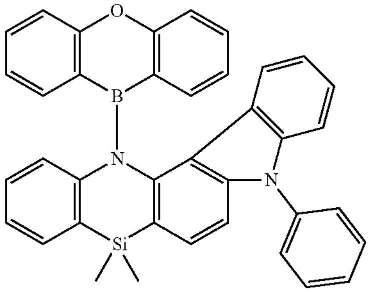
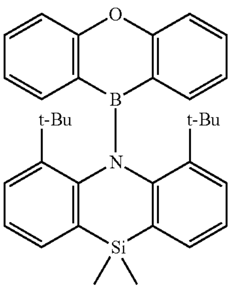

-continued
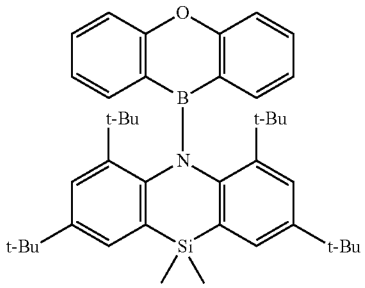
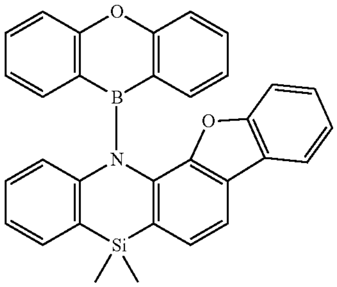
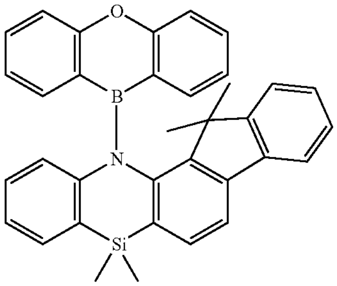
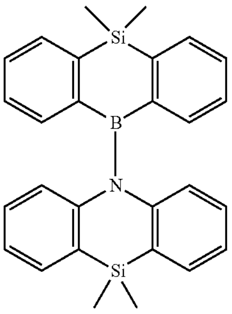
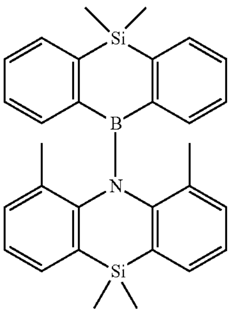
-continued
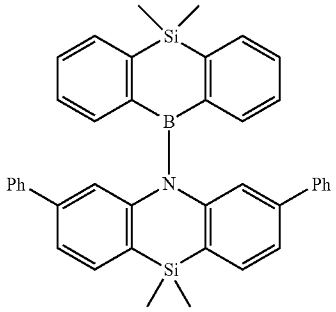
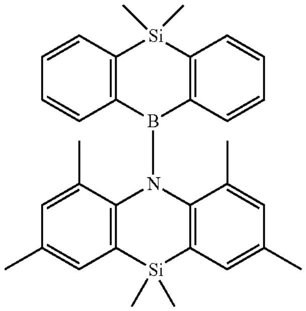
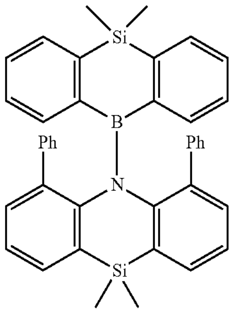
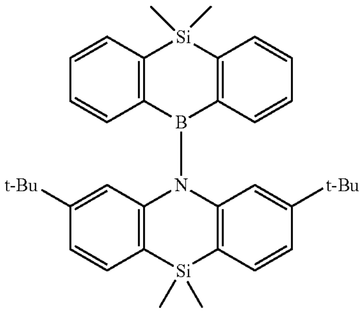
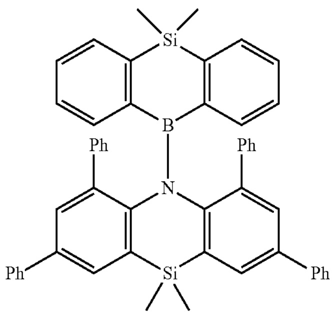

-continued
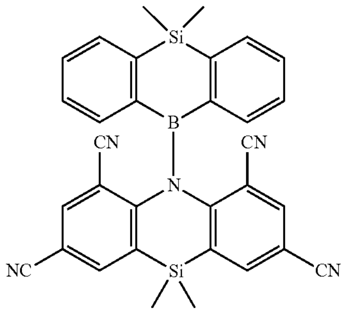
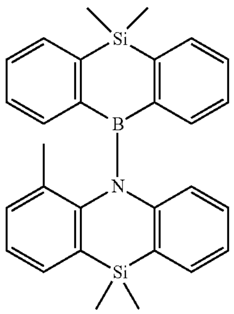
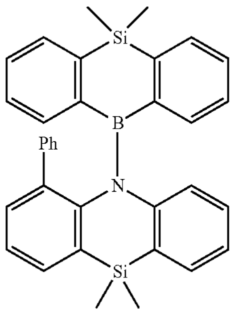
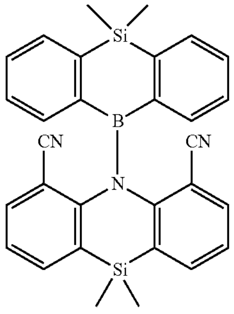
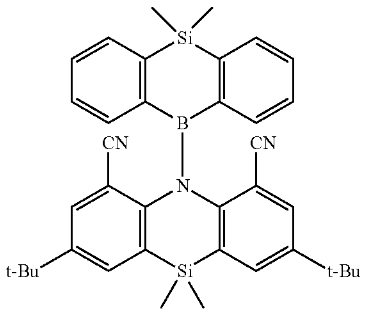
-continued
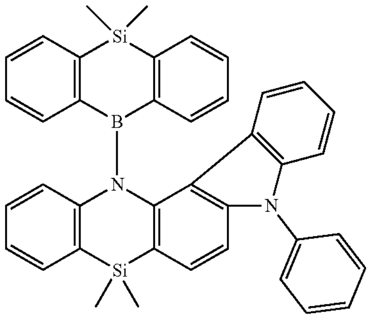
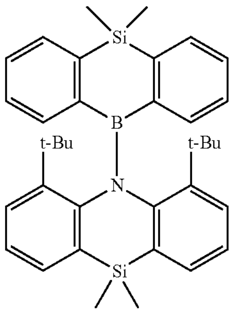
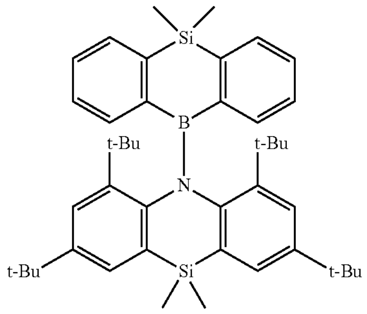
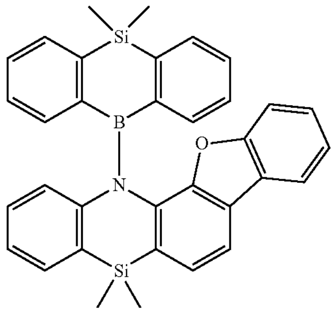
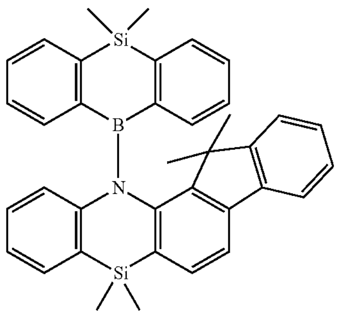

-continued
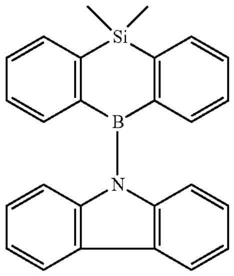
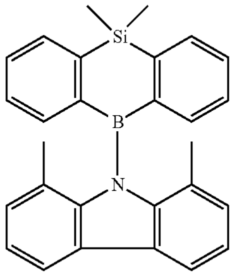
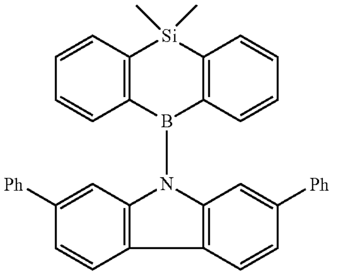
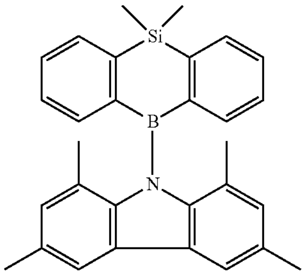
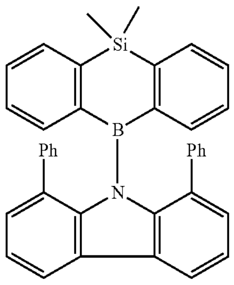
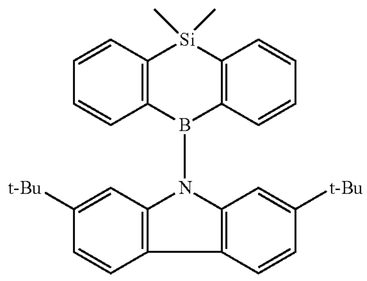
-continued
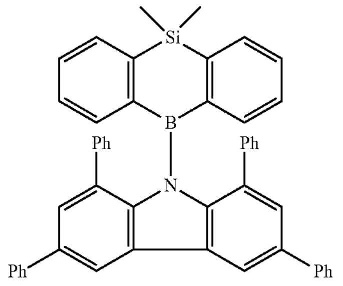
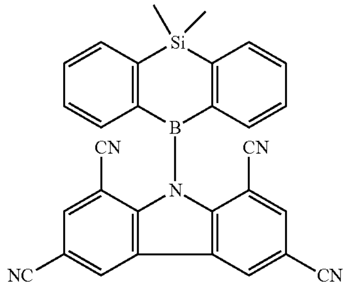
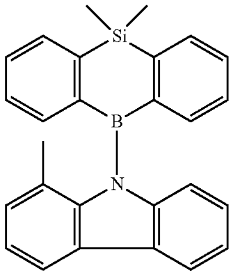
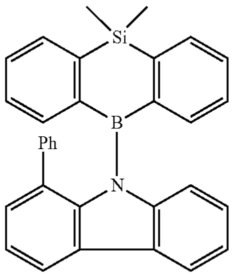
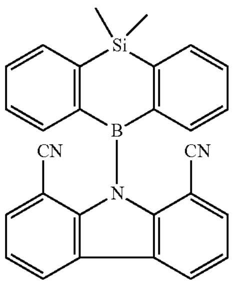
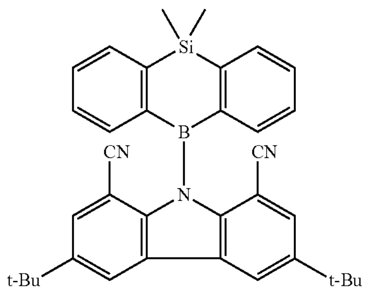

-continued
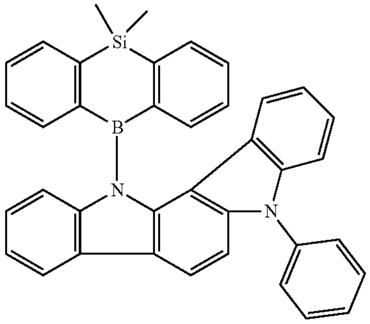
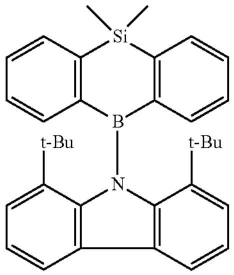
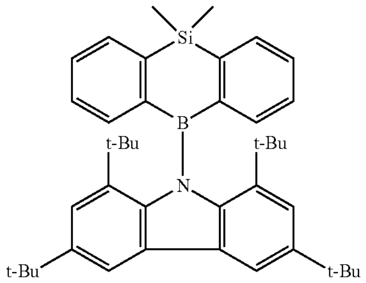
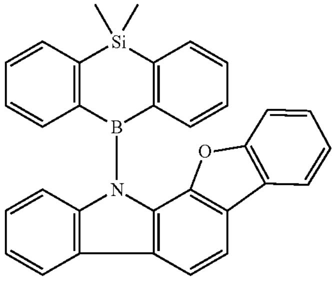
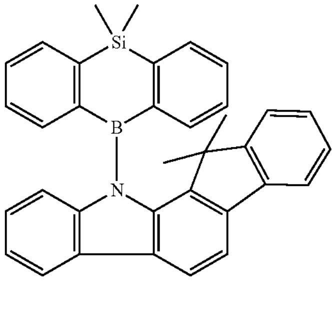
-continued
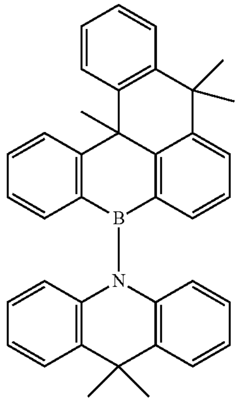
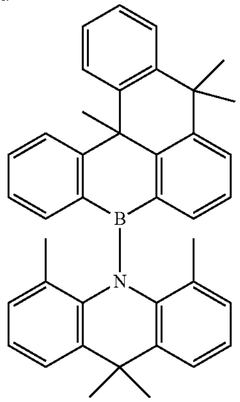
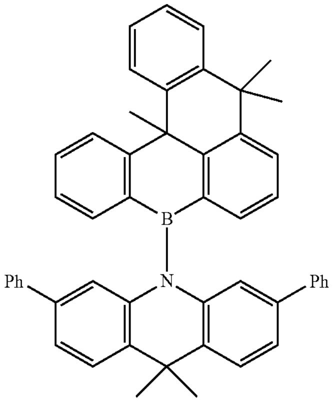
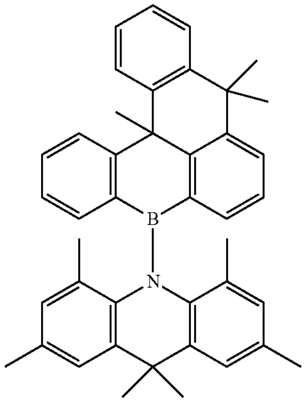
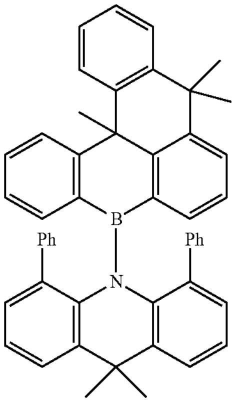

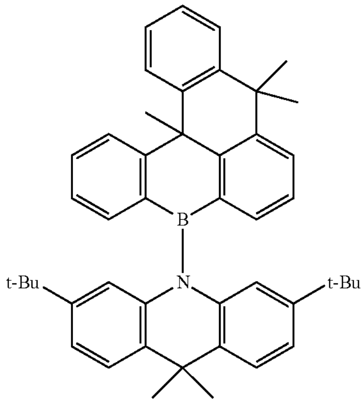
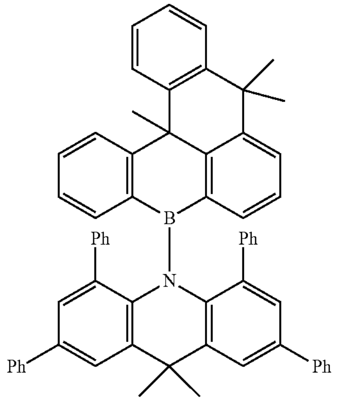
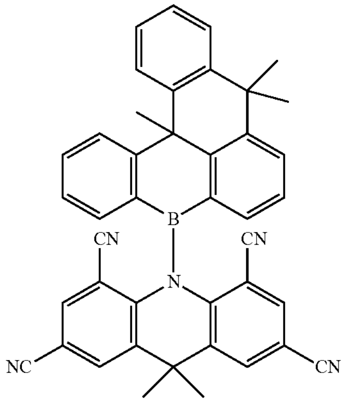
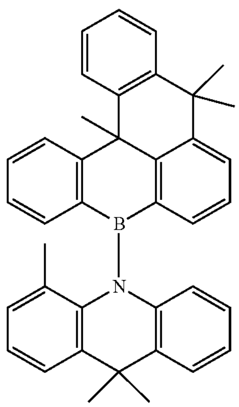
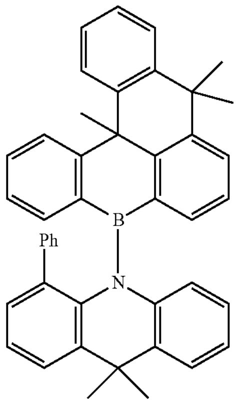
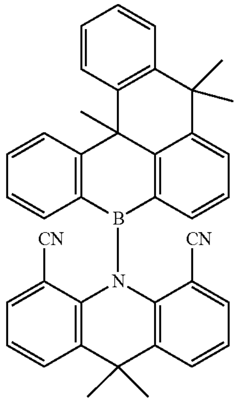
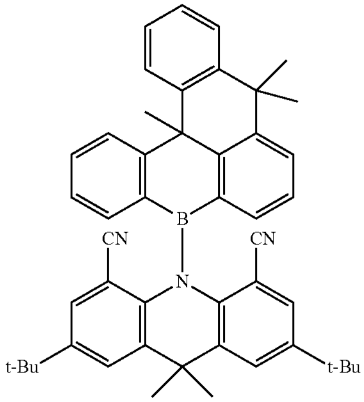
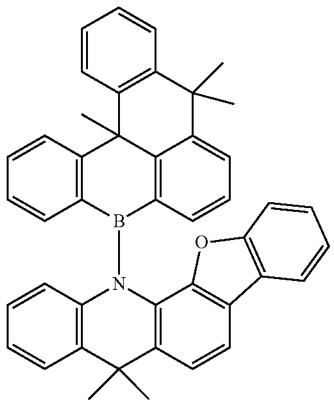

-continued
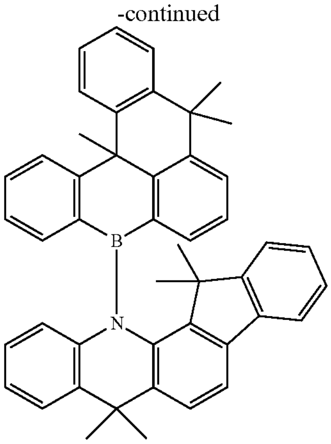
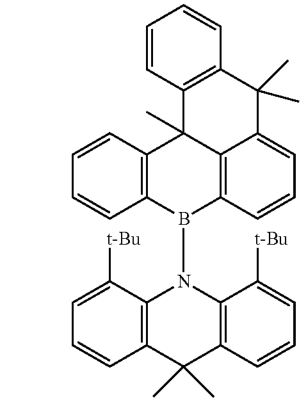
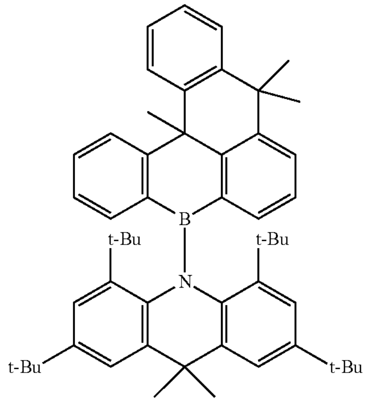
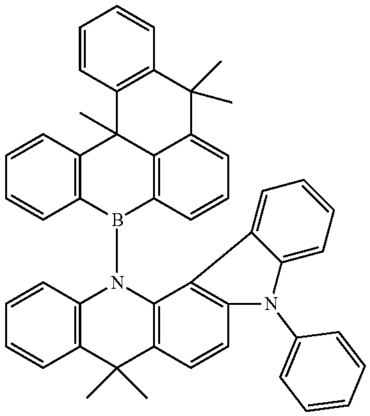
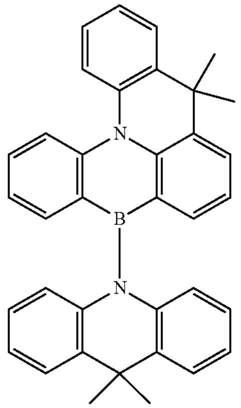
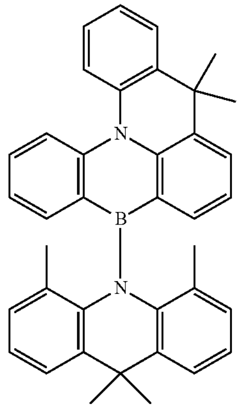
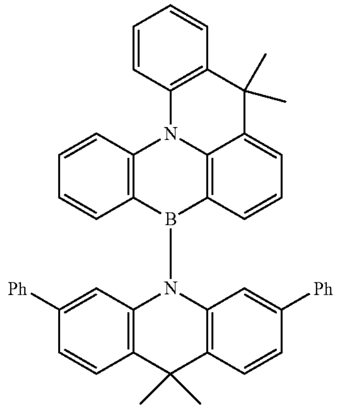
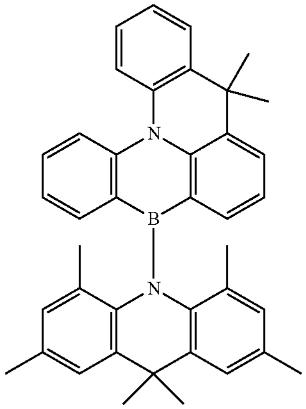
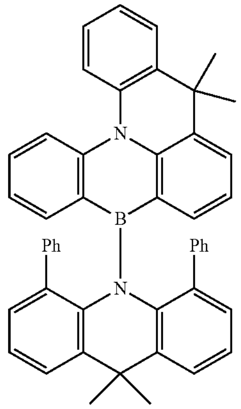
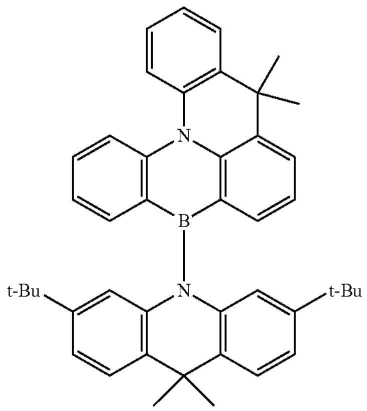

-continued
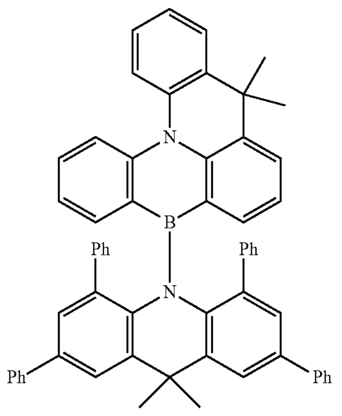
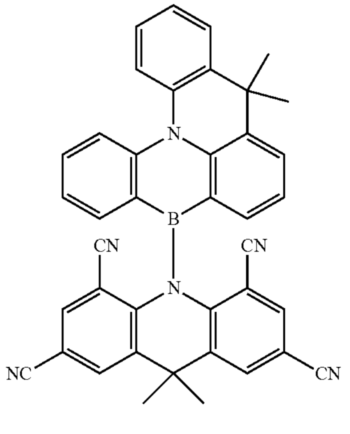
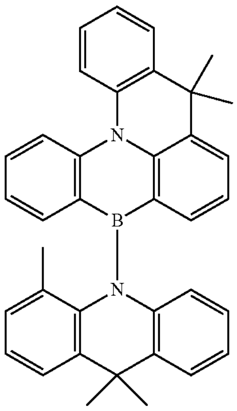
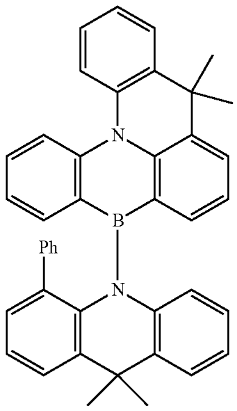
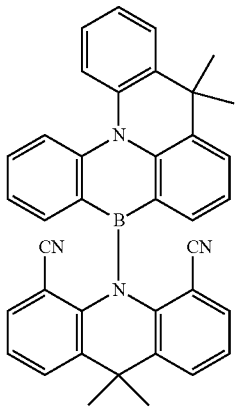
-continued
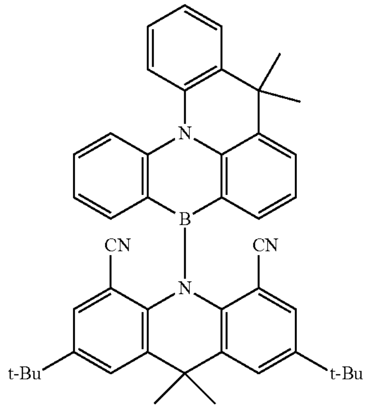
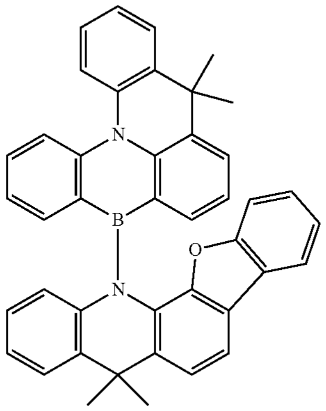
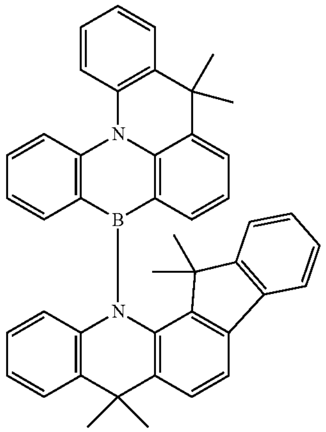
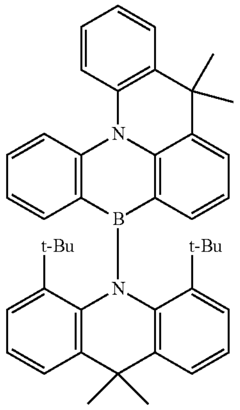

-continued
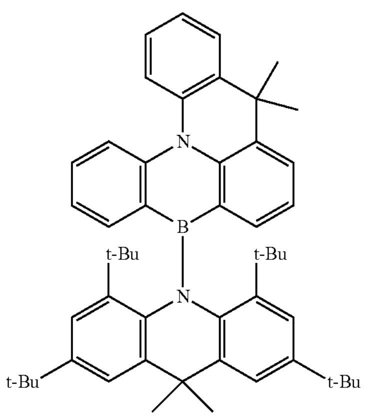
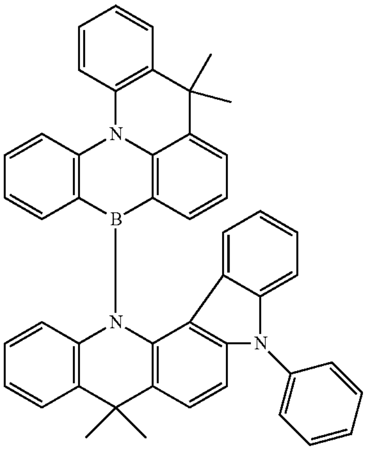
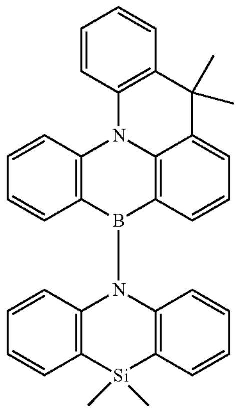
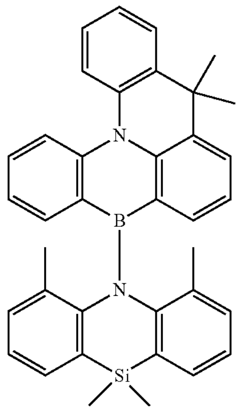
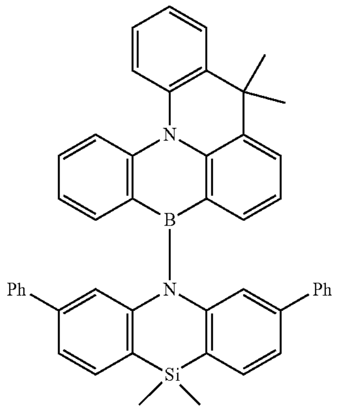
-continued
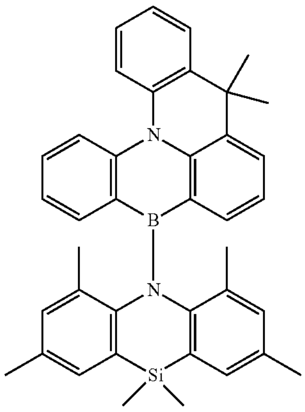
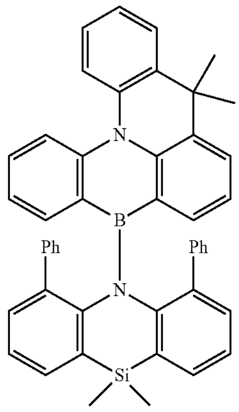
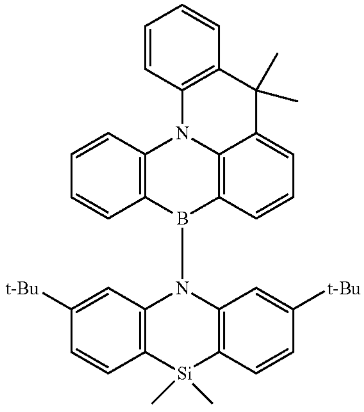
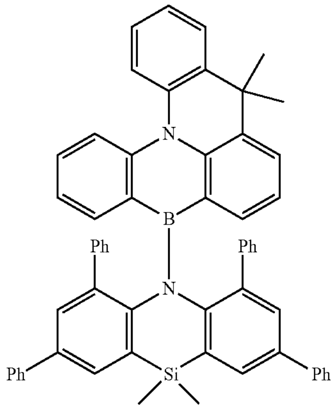
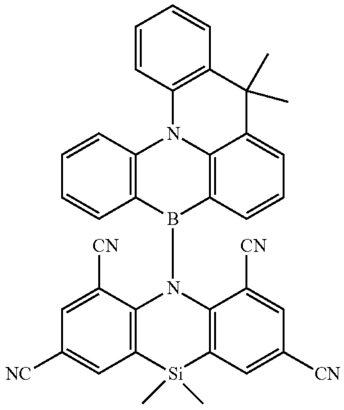

-continued
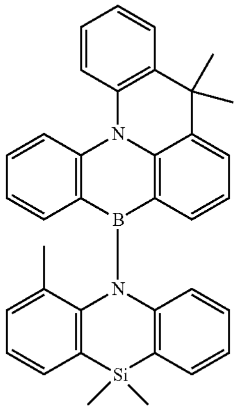
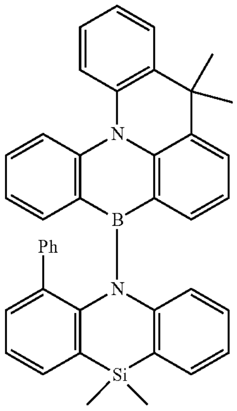
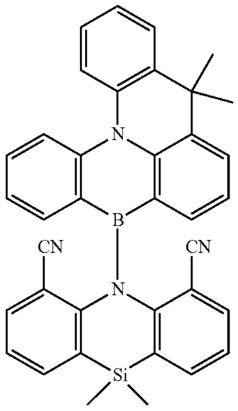
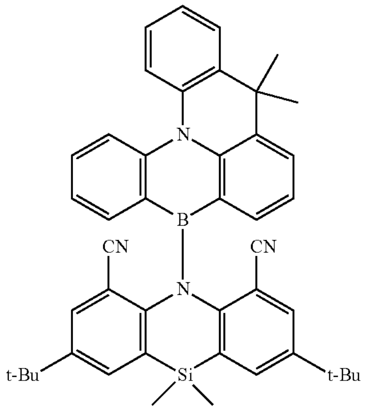
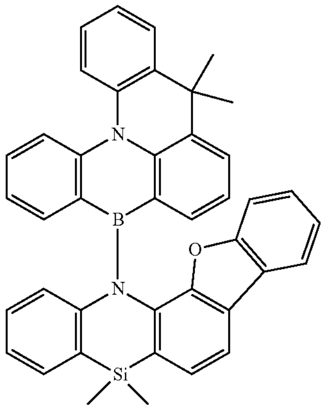
-continued
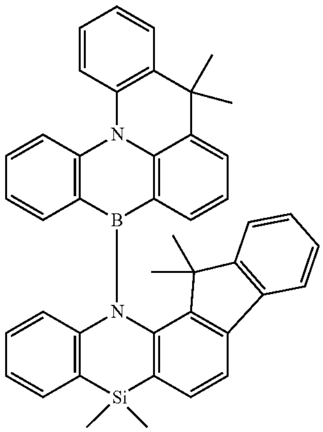
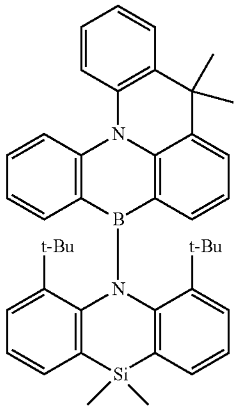
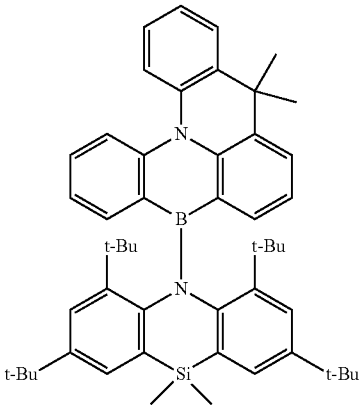
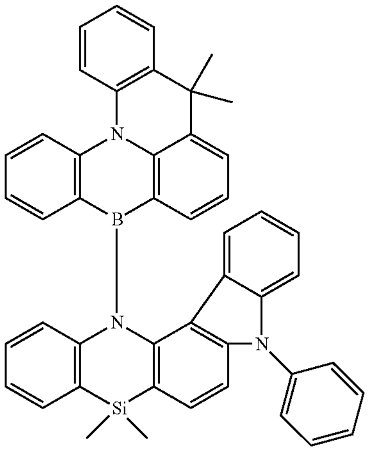

-continued
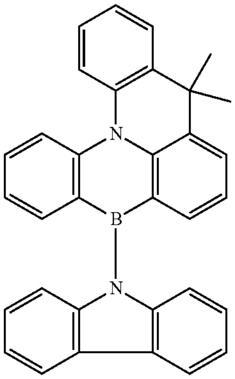
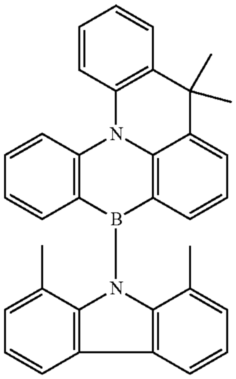
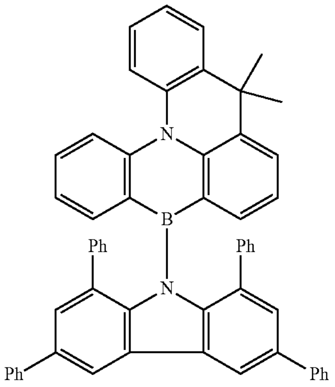
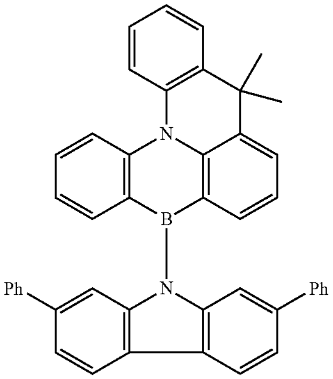
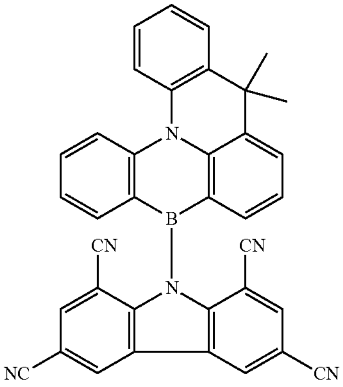
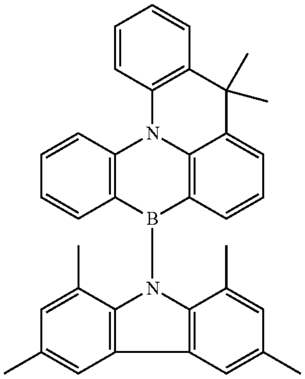
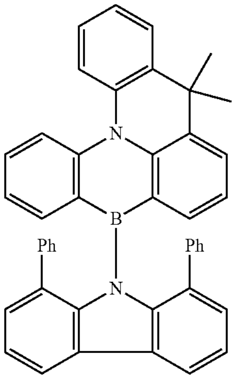
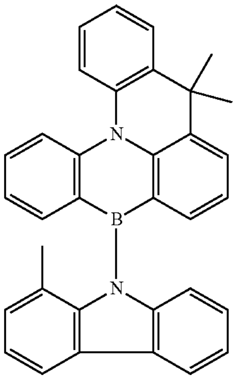
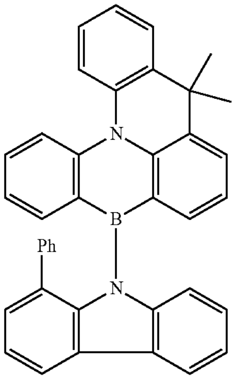
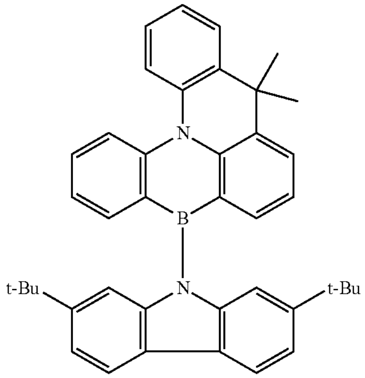
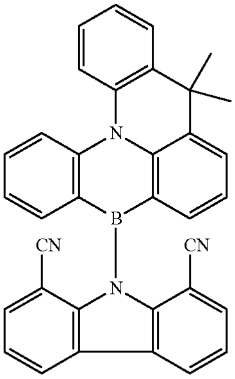

-continued
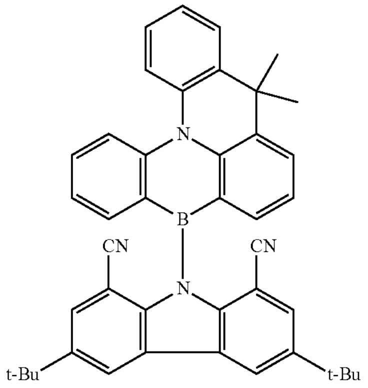
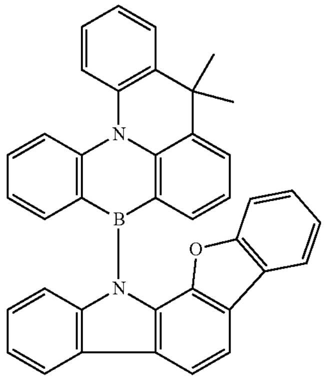
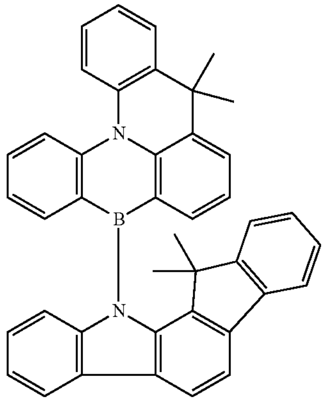
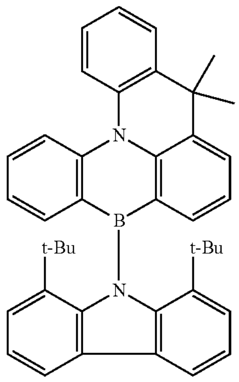
-continued
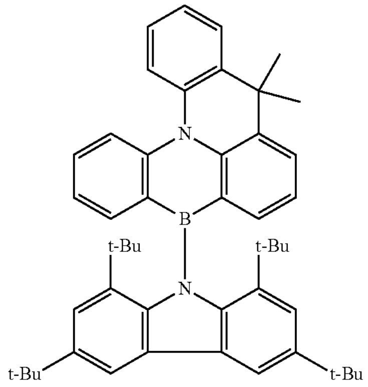
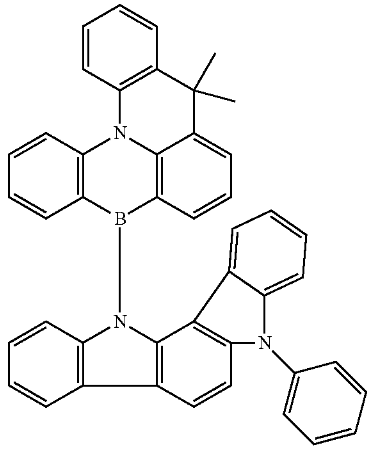
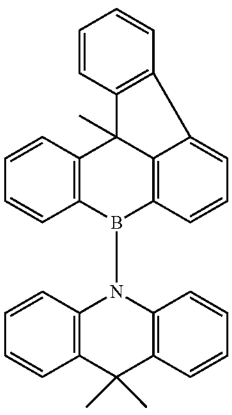
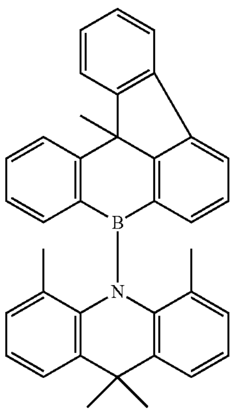
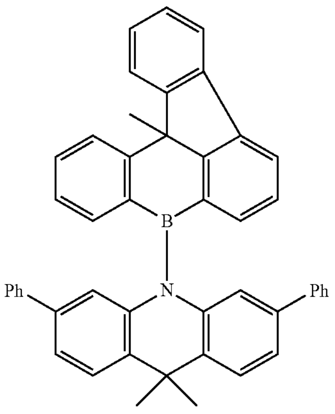

-continued
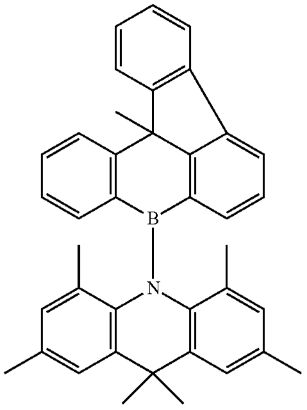
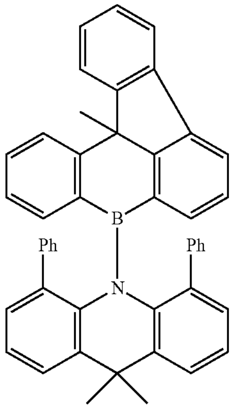
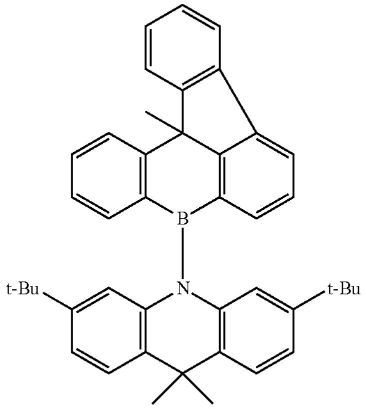
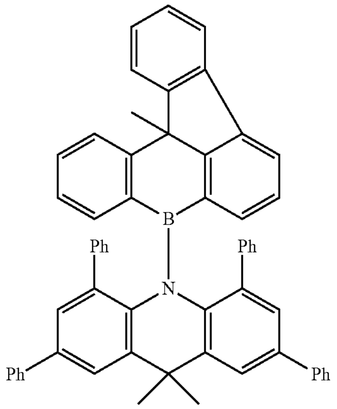
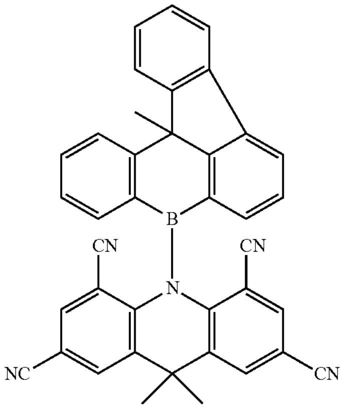
-continued
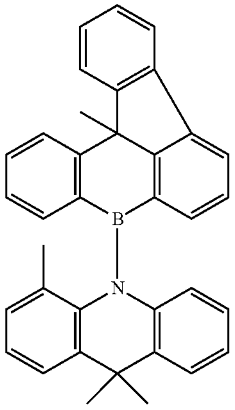
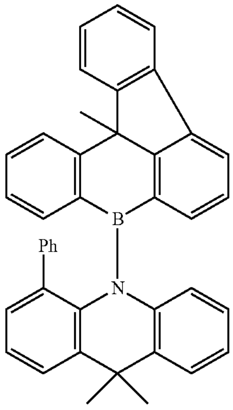
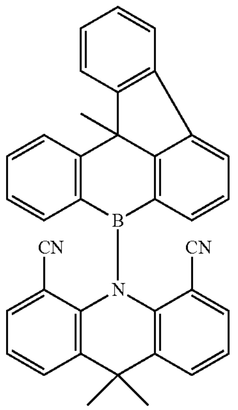
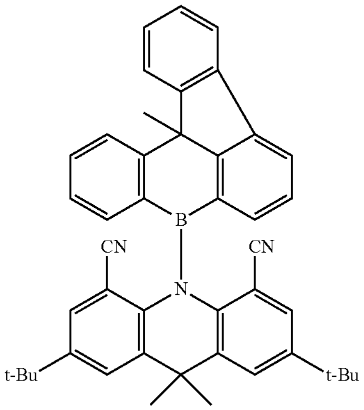
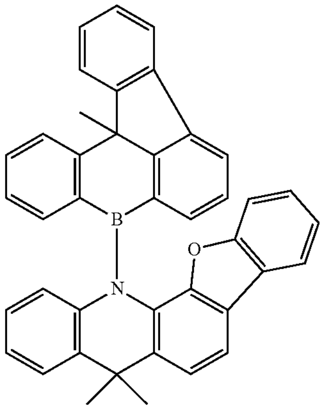

-continued
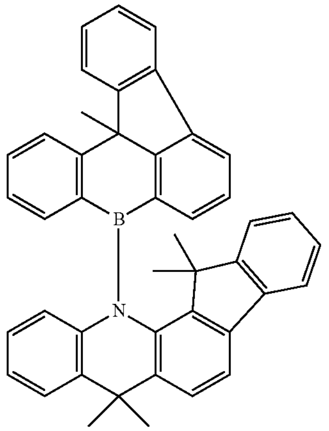
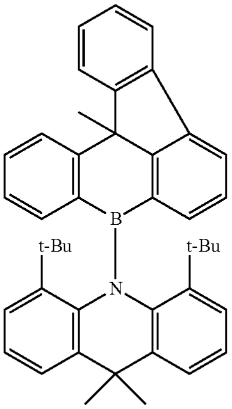
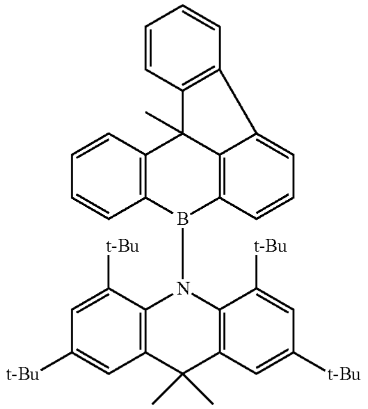
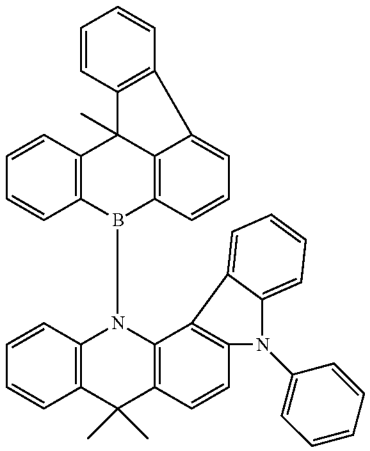
-continued
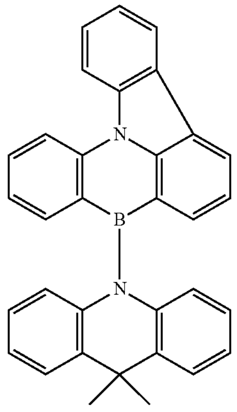
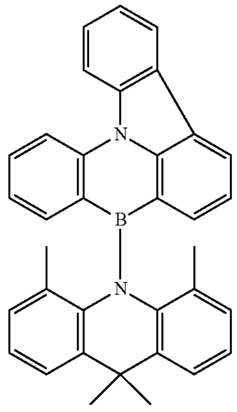
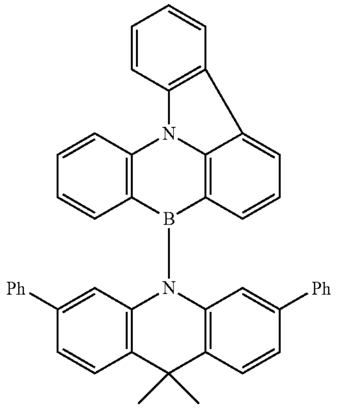
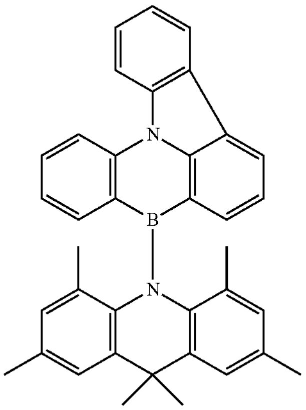
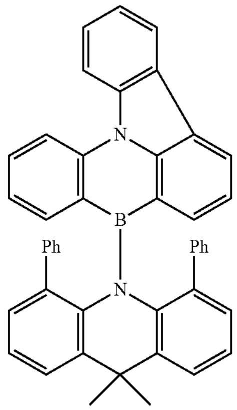
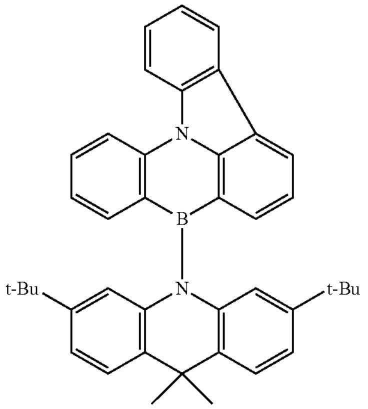

-continued
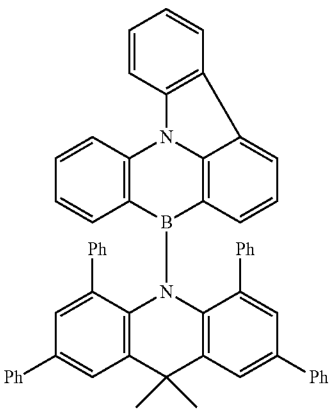
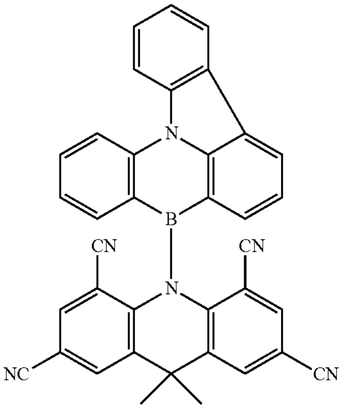
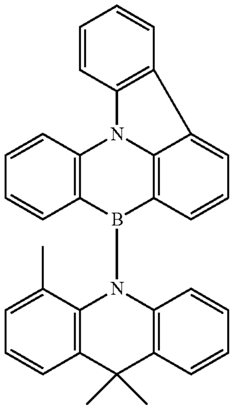
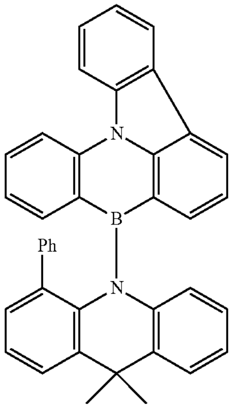
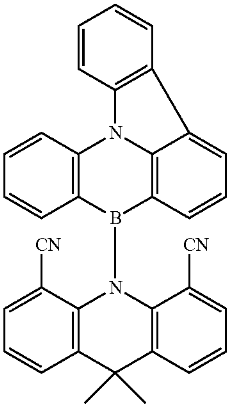
-continued
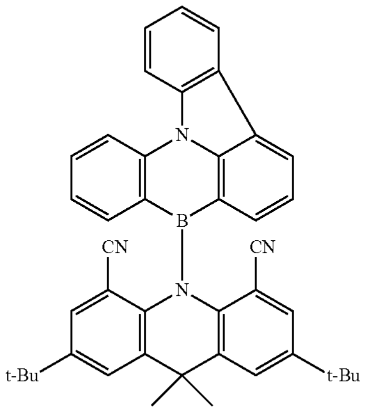
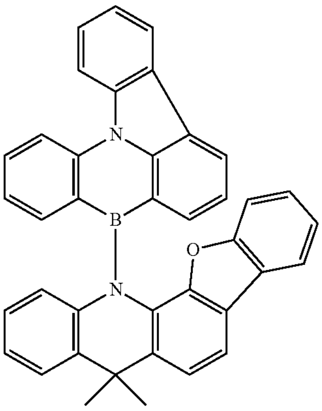
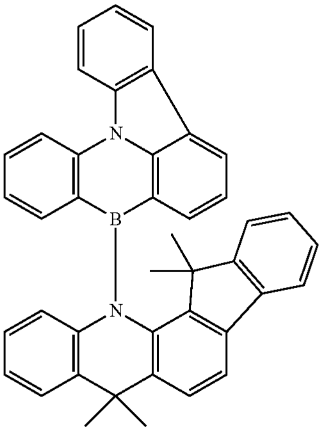
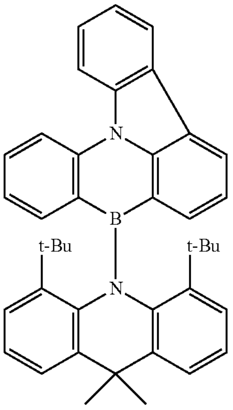

-continued
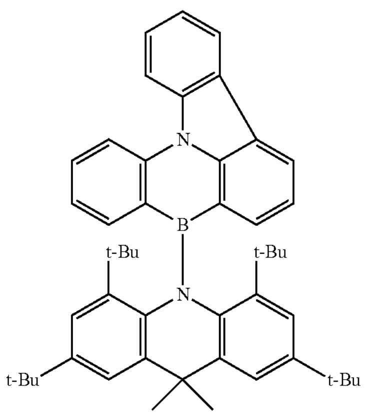
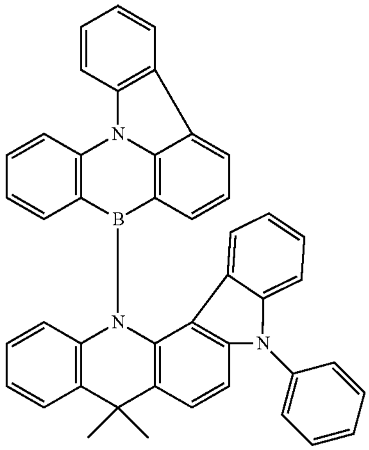
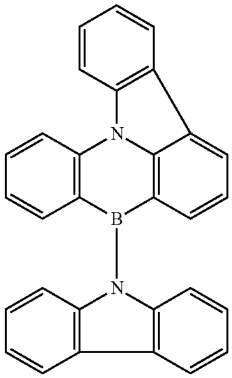
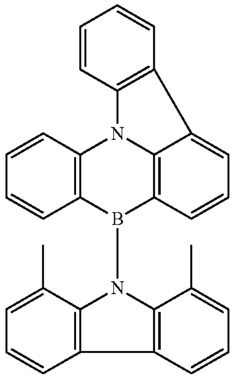
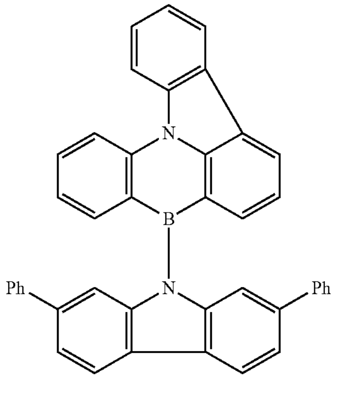
-continued
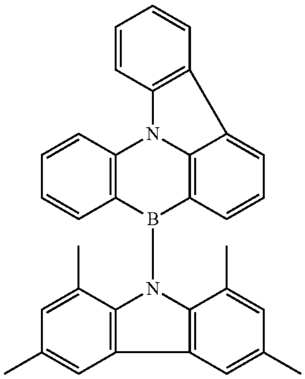
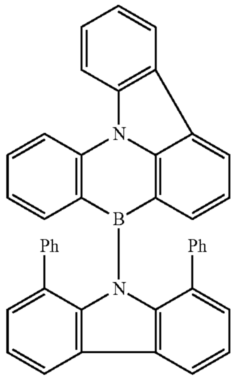
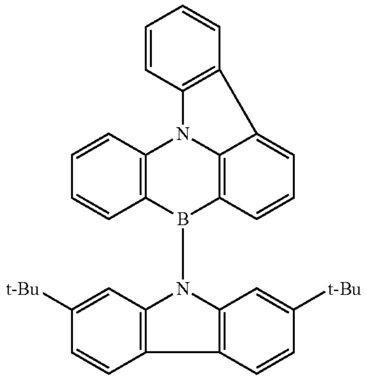
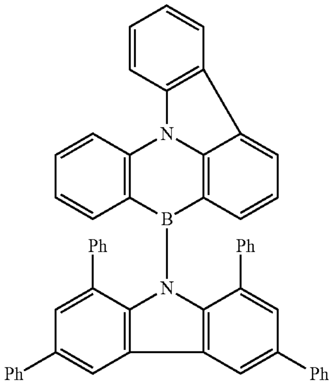
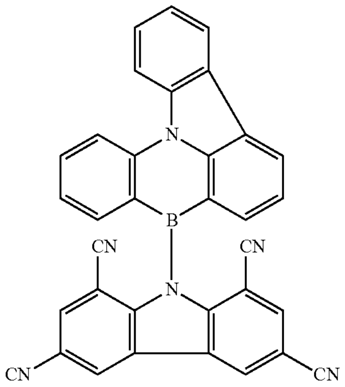

-continued
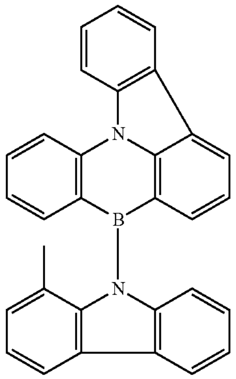
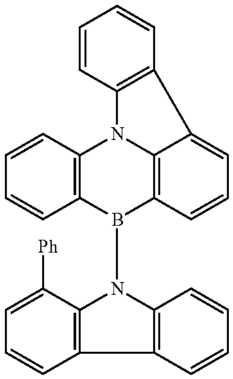
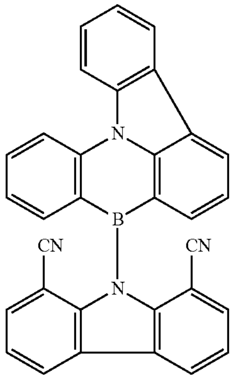
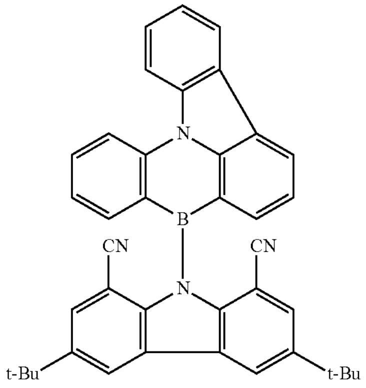
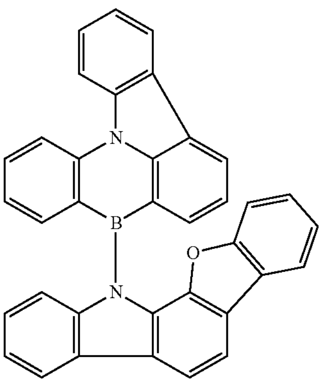
-continued
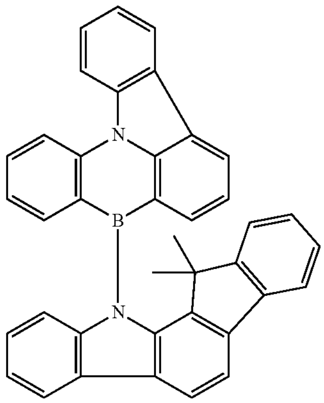
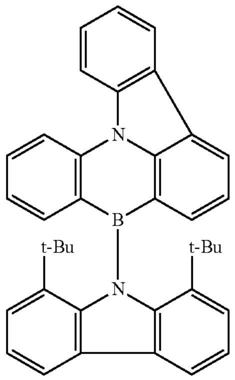
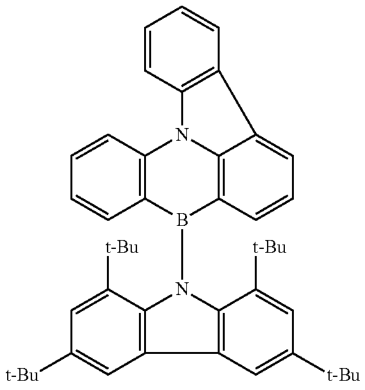
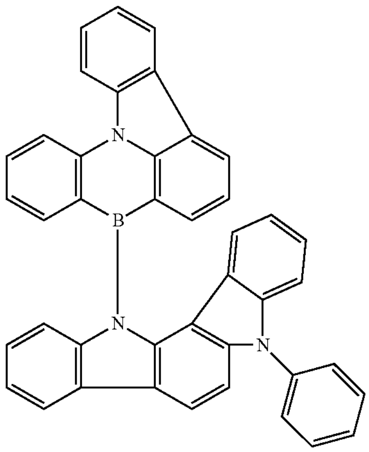

-continued
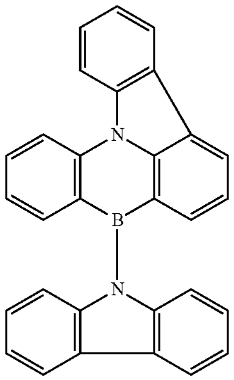
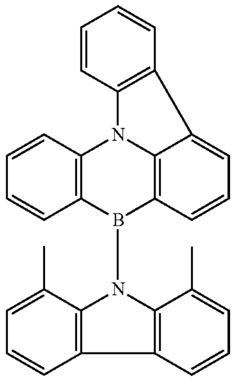
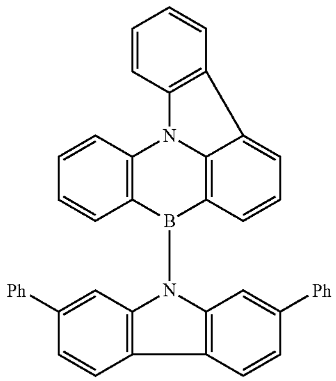
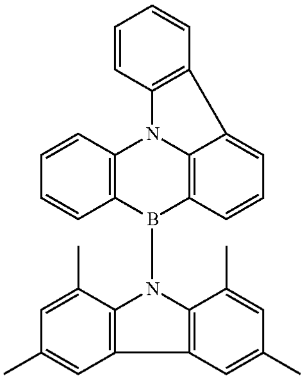
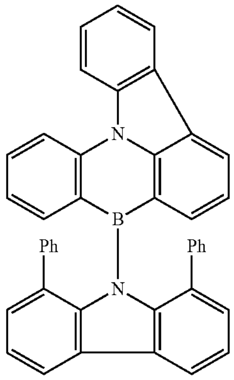
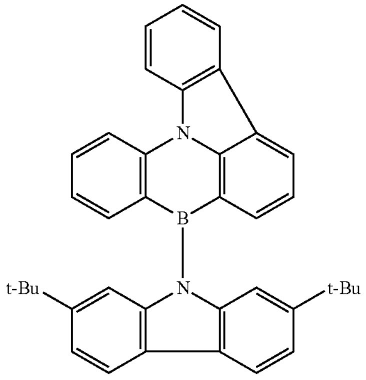
-continued
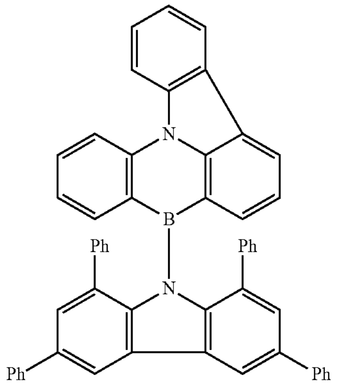
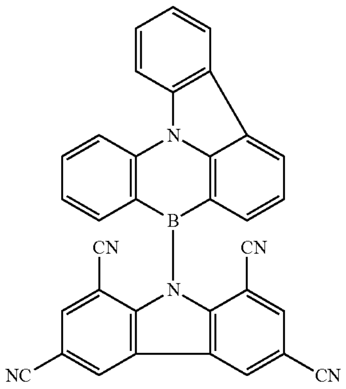
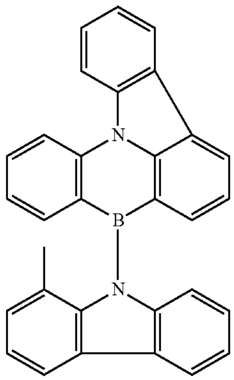
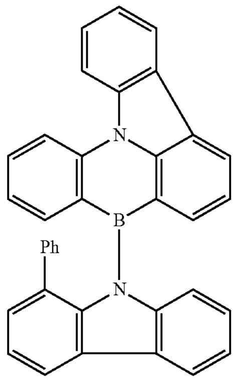
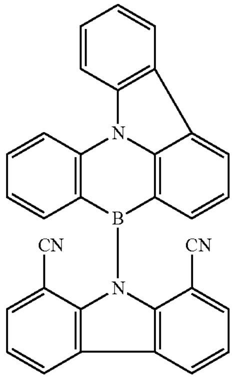

-continued
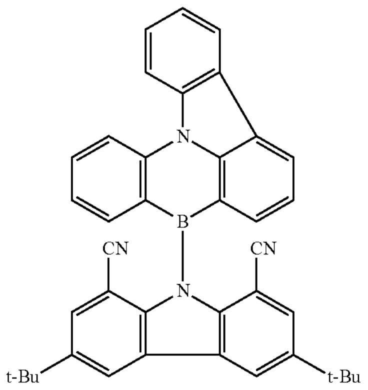
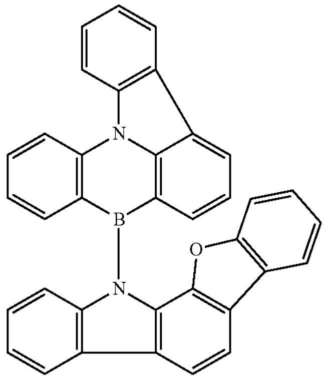
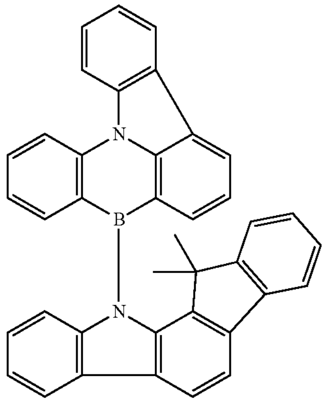
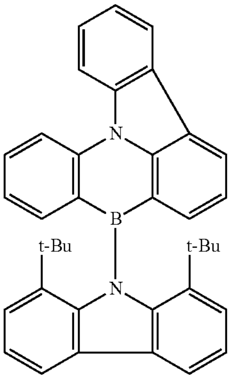
-continued
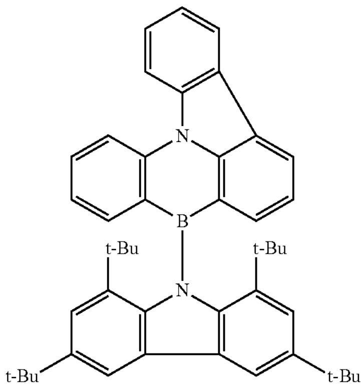
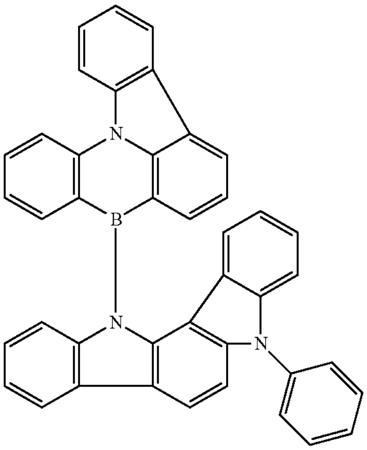
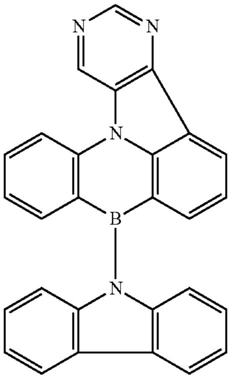
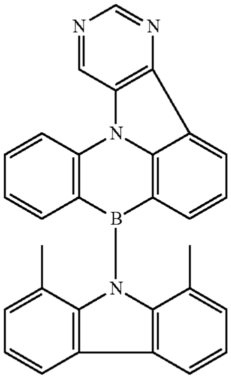
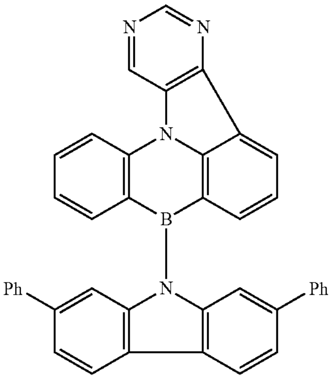

-continued
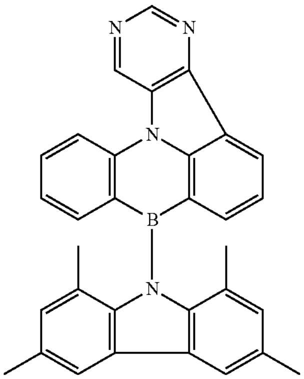
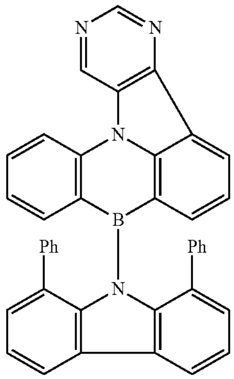
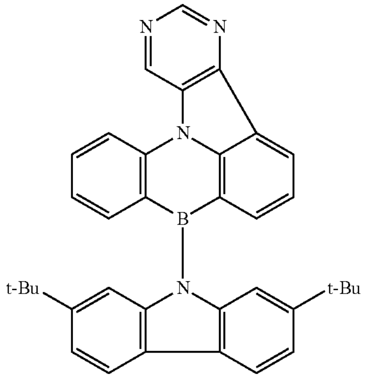
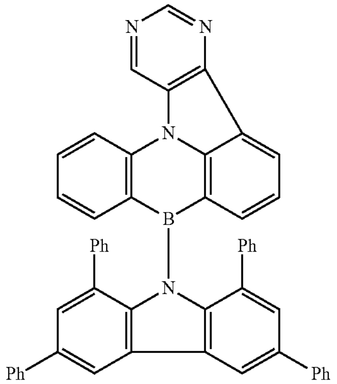
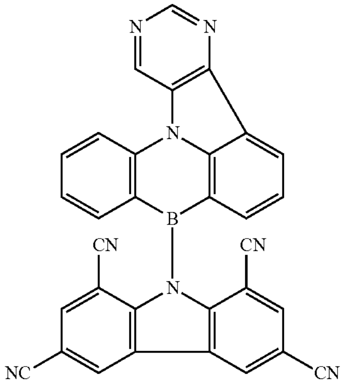
-continued
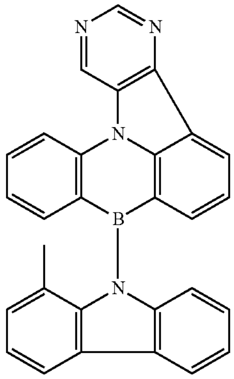
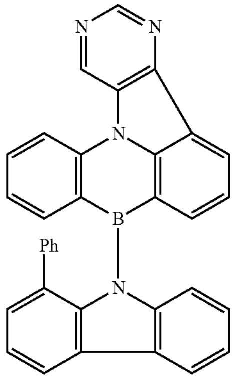
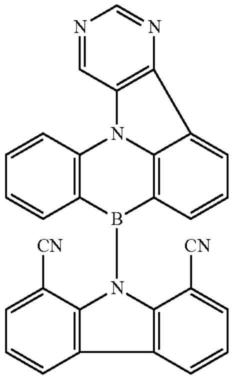
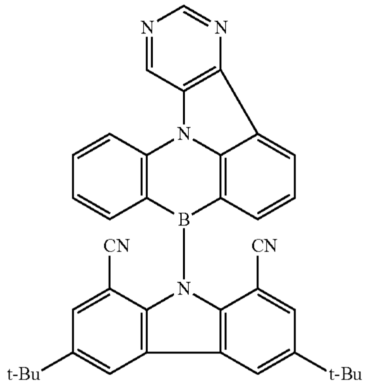
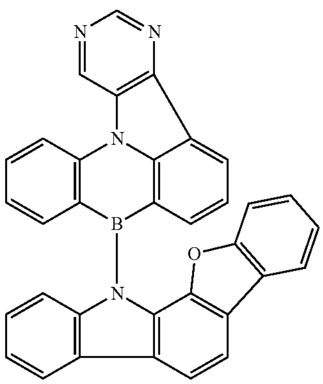

-continued
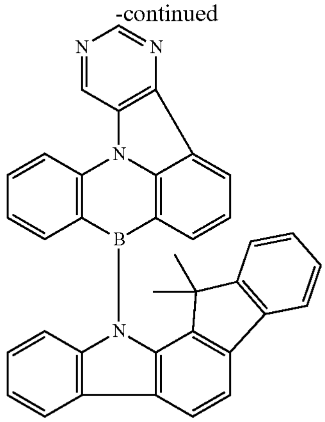
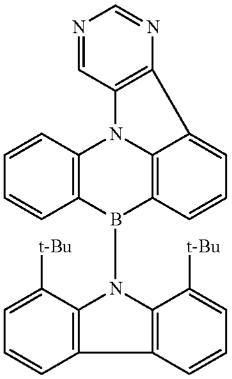
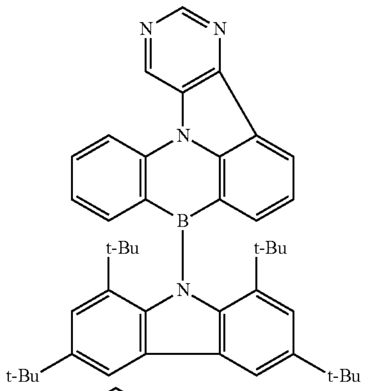
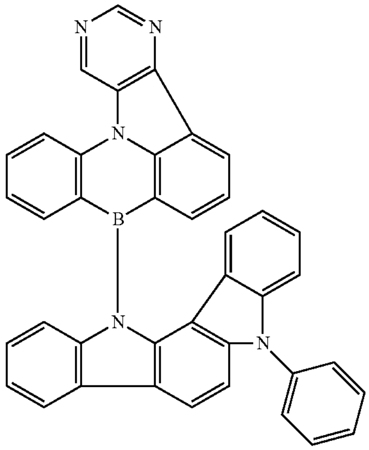
-continued
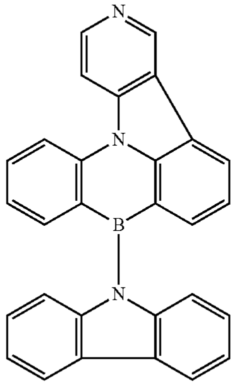
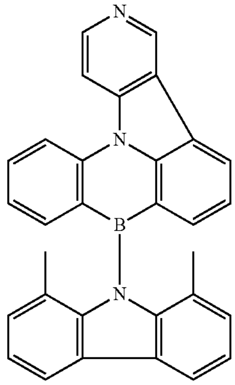
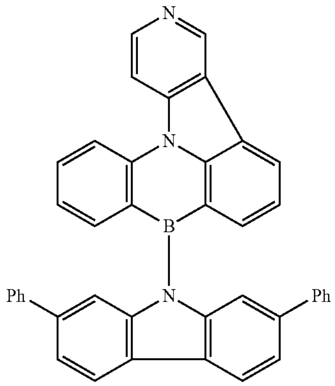
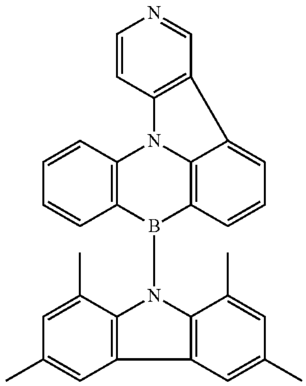
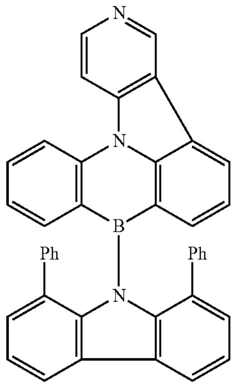
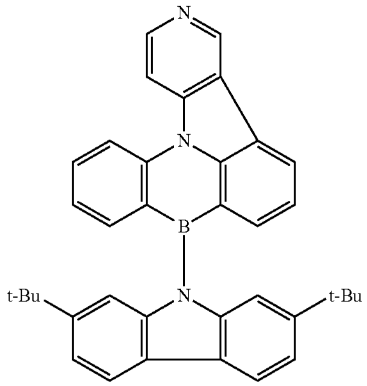

-continued
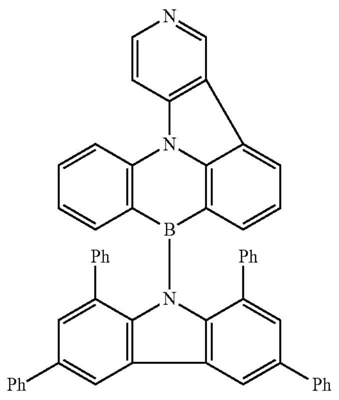
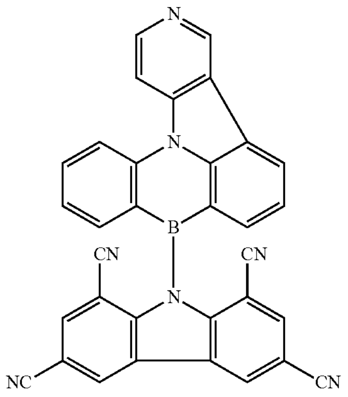
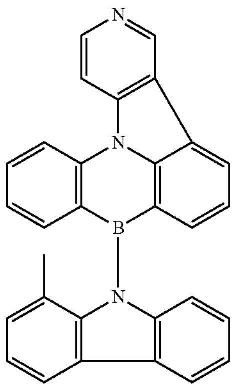
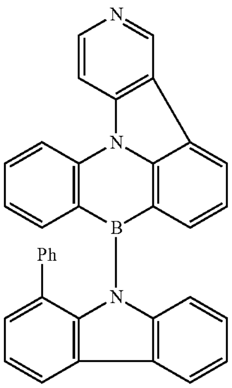
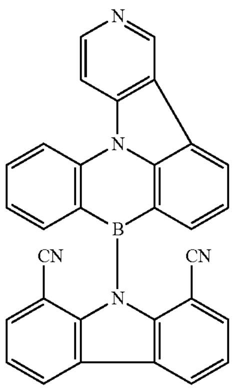
-continued
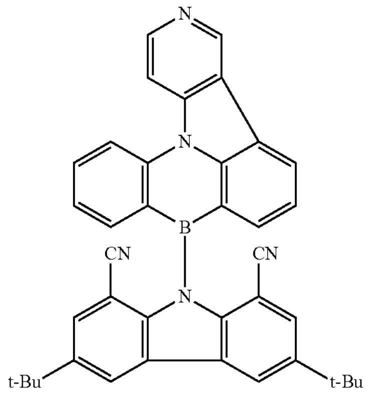
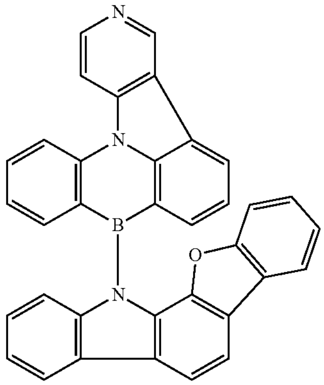
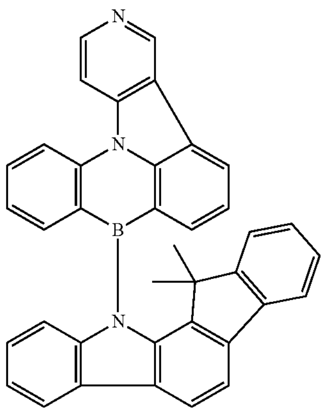
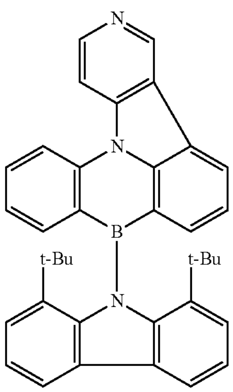

-continued
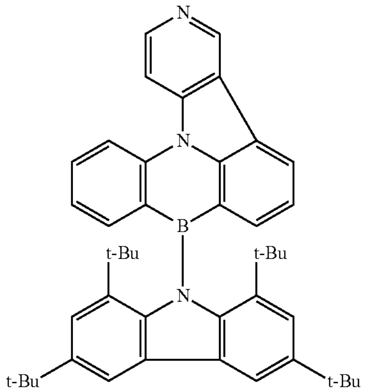
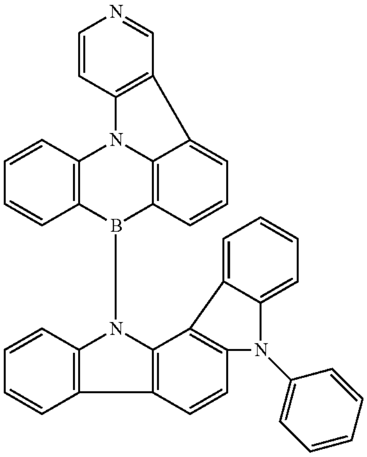
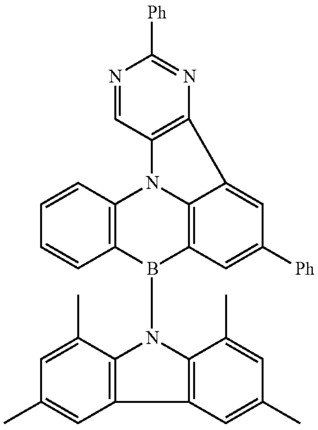
-continued
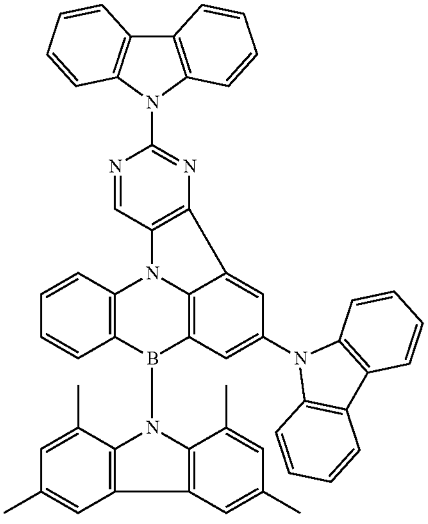
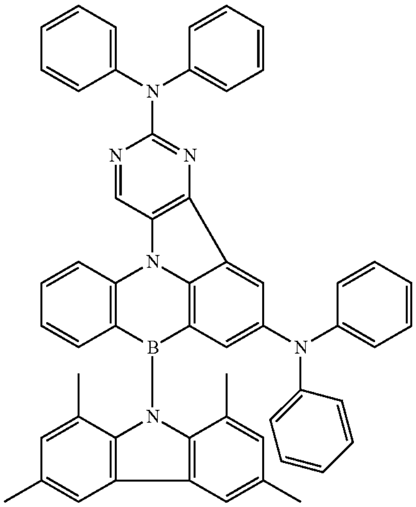
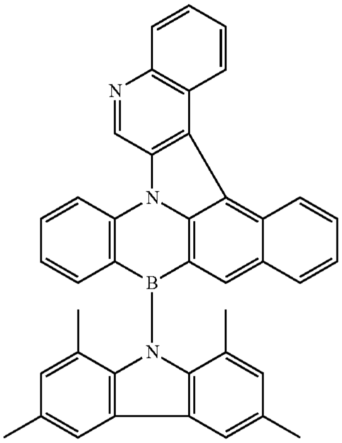

-continued
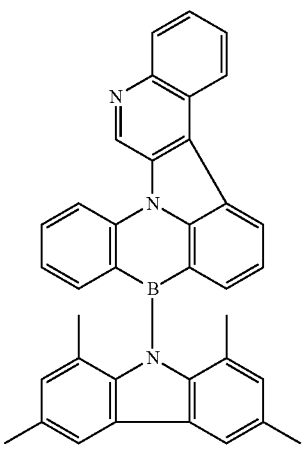
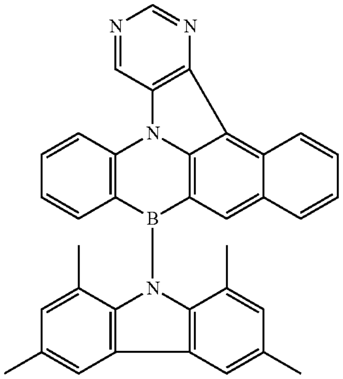
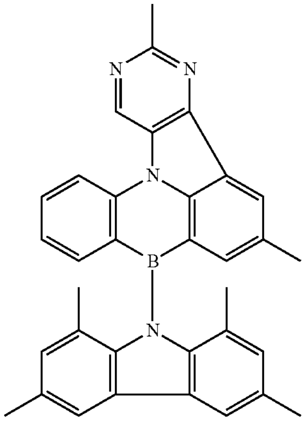
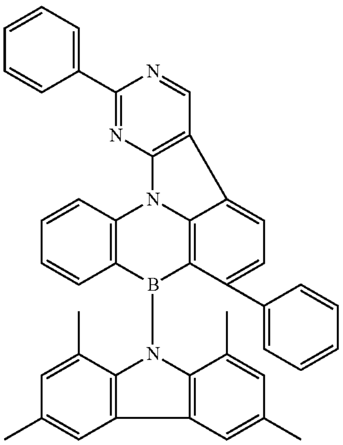
-continued
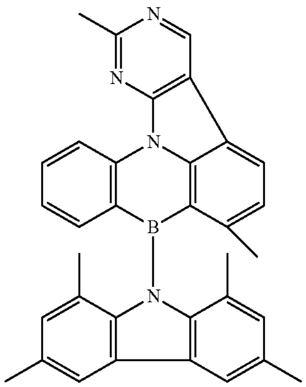
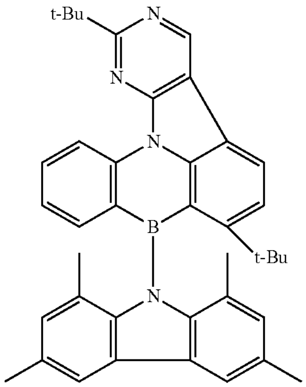
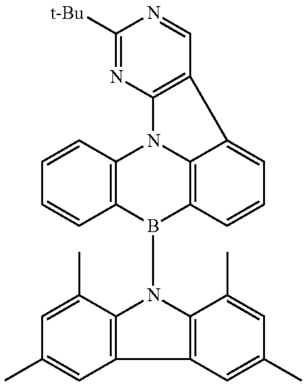
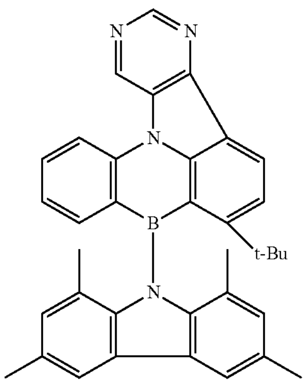

-continued
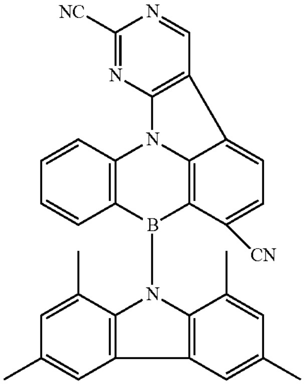
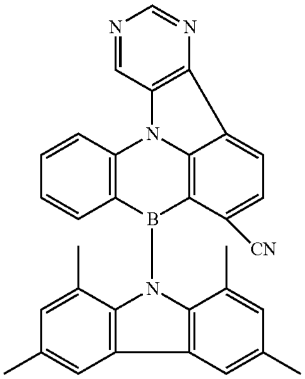
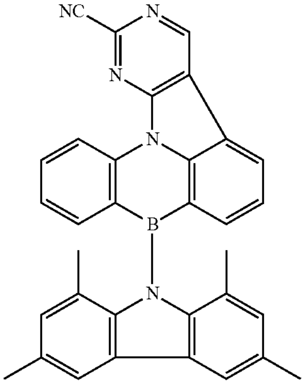
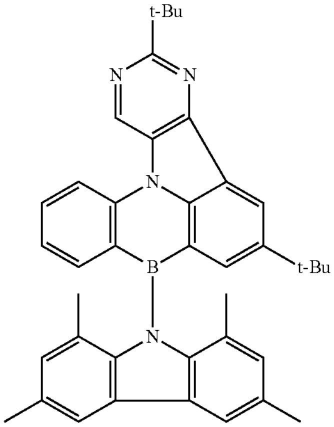
-continued
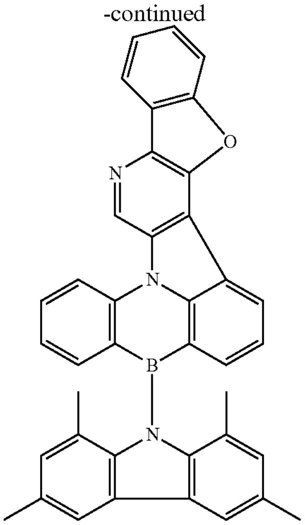
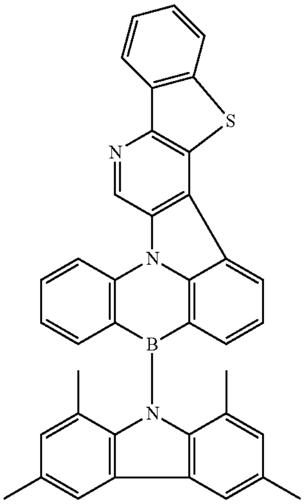
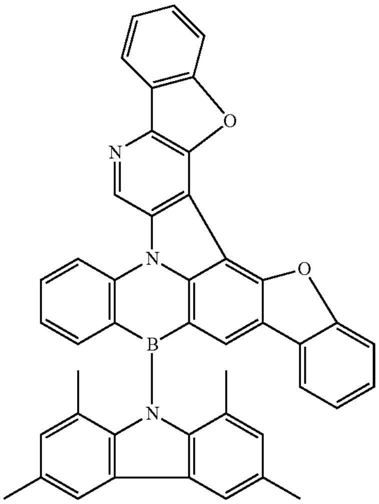

-continued
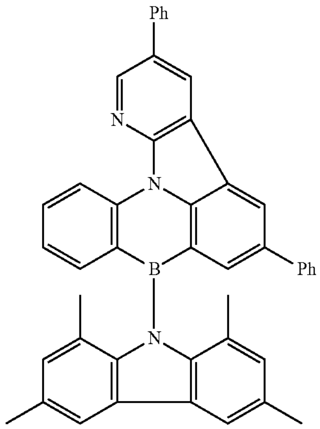
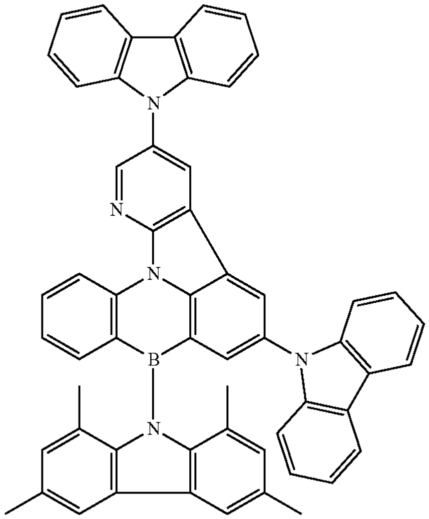
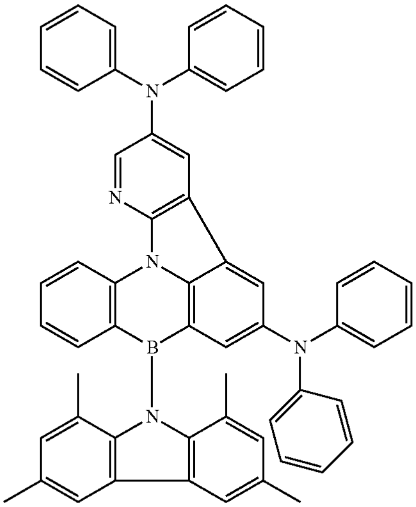
-continued
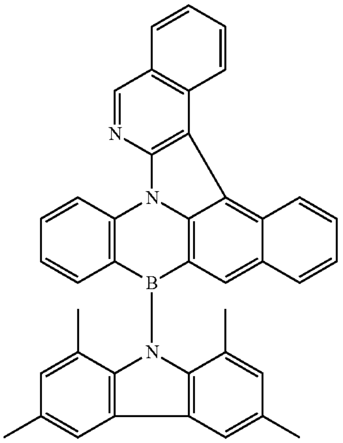
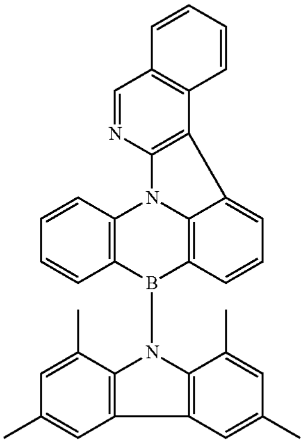
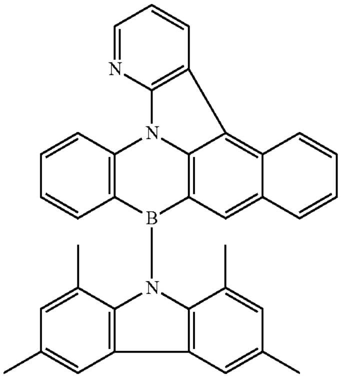
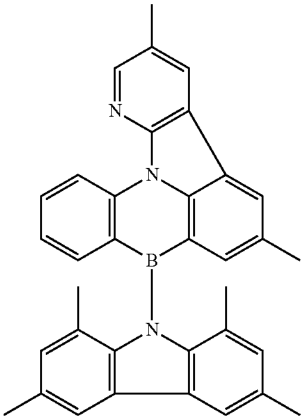

-continued
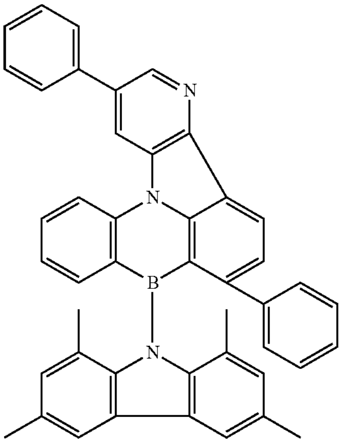
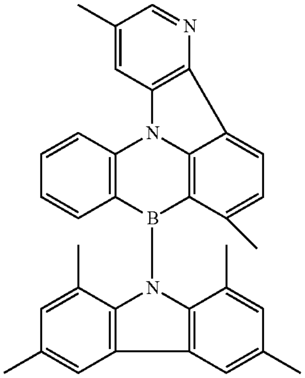
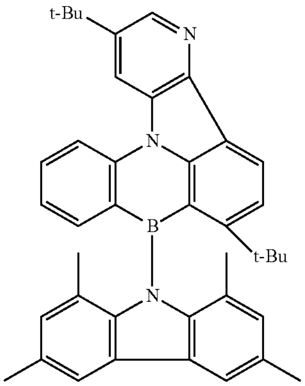
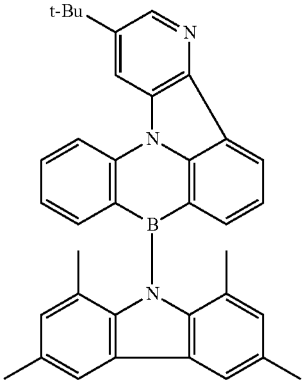
-continued
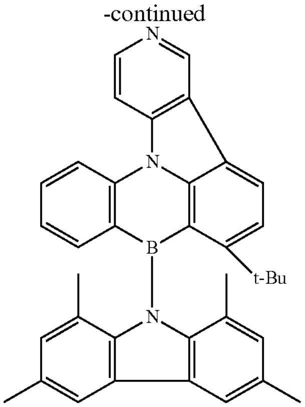
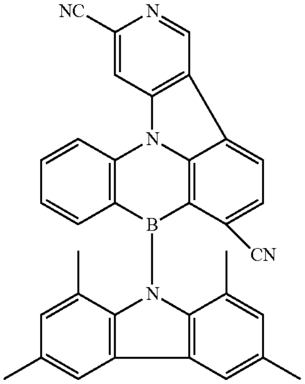
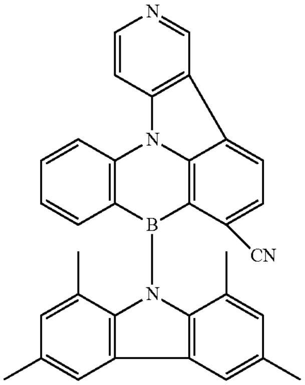
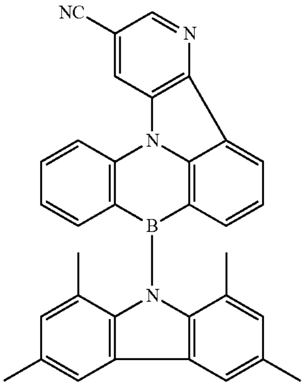

-continued
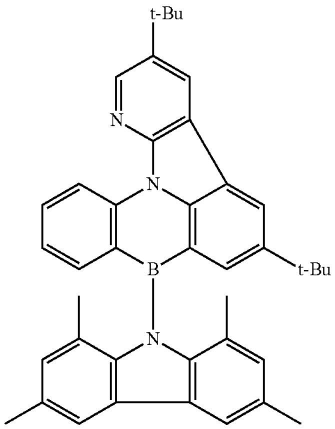
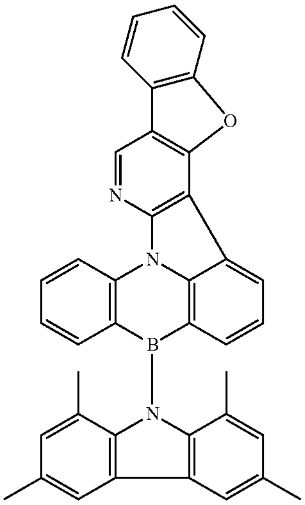
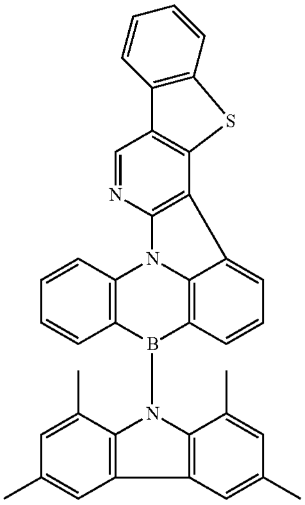
-continued
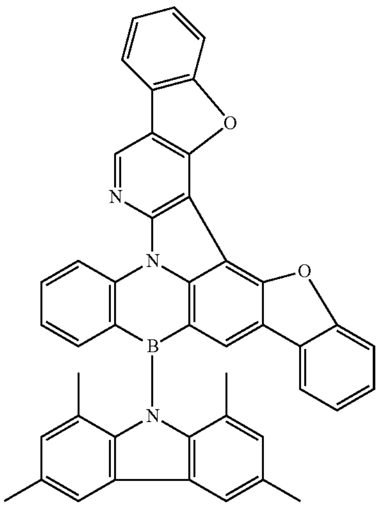
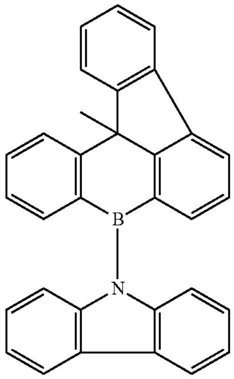
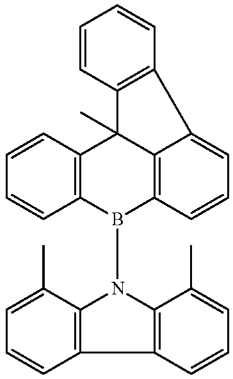
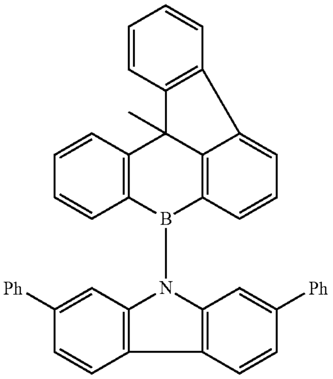
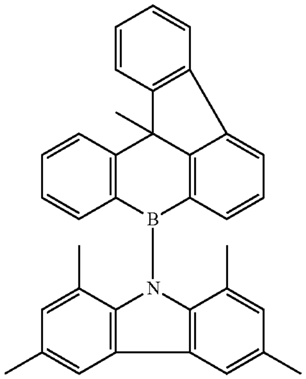

-continued
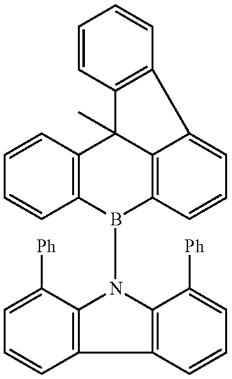
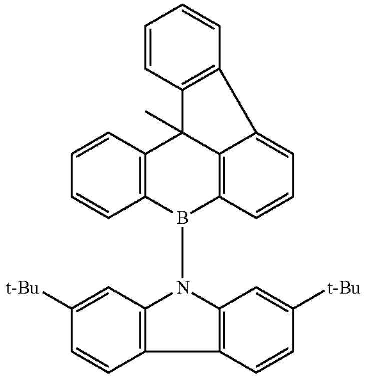
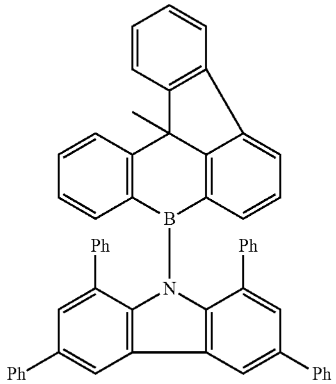
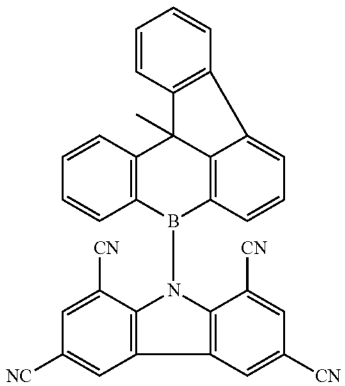
-continued
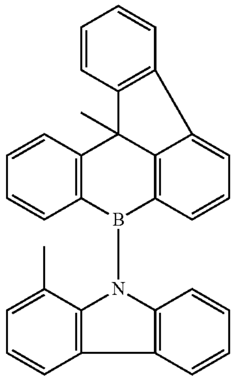
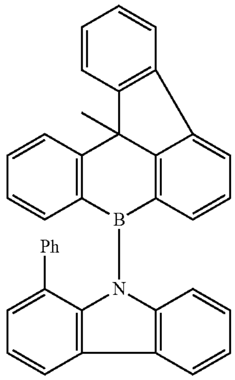
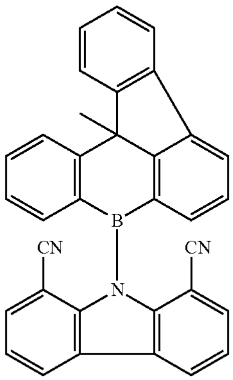
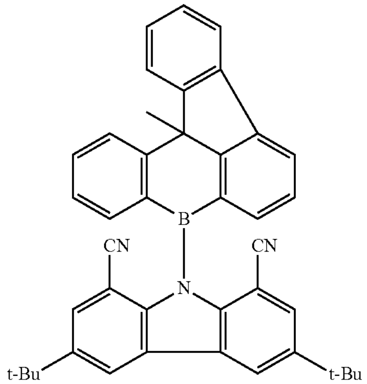
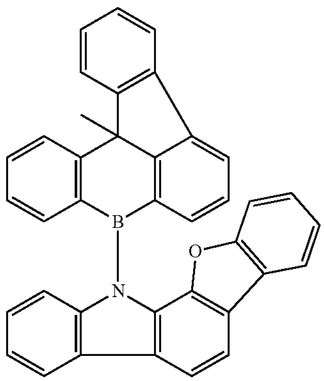

-continued
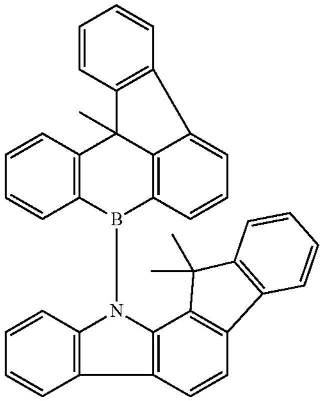
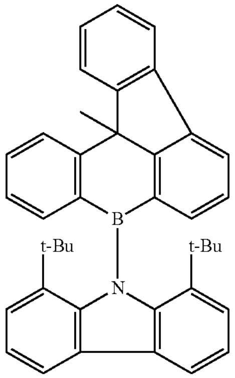
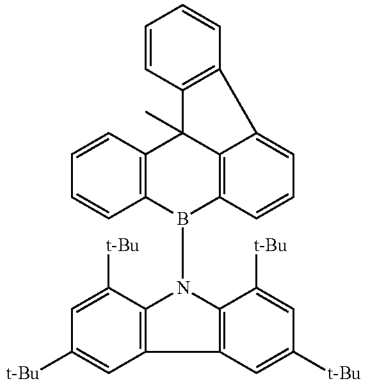
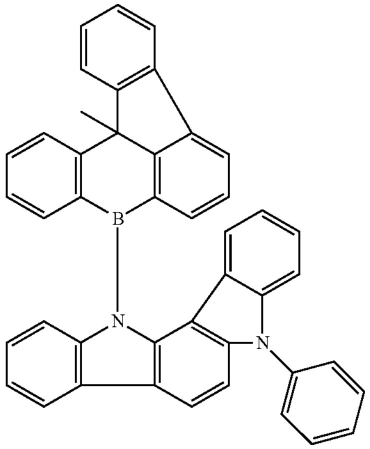
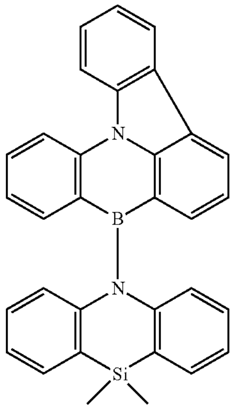
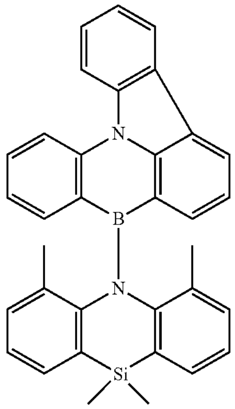
-continued
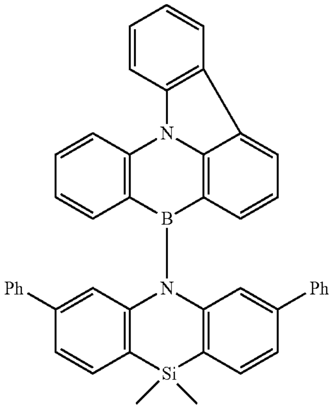
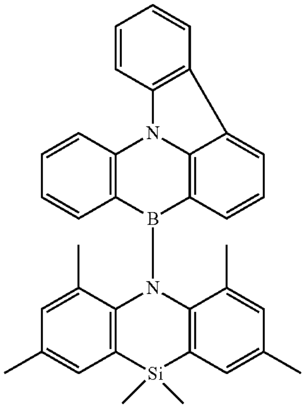
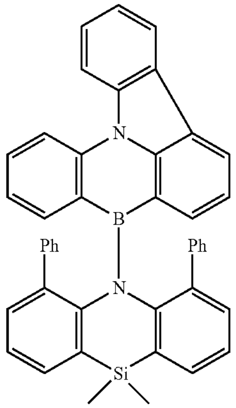
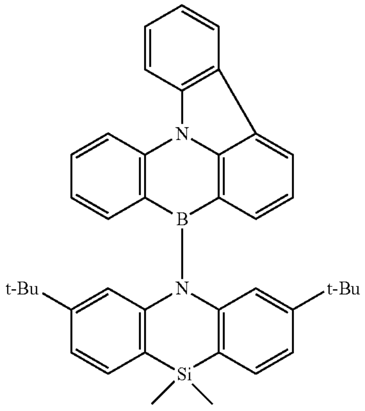
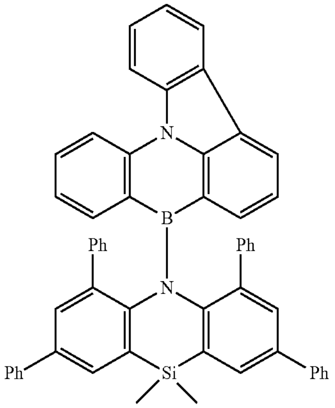

-continued
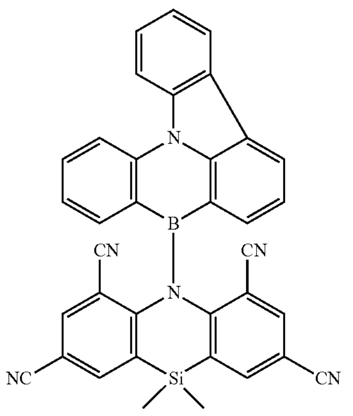
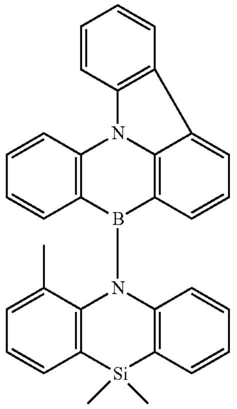
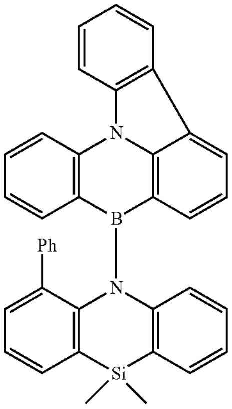
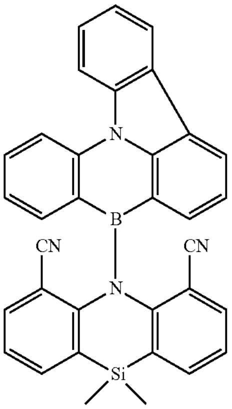
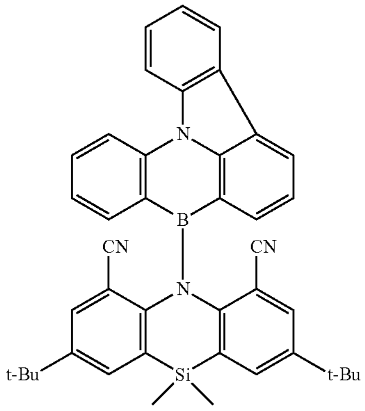
-continued
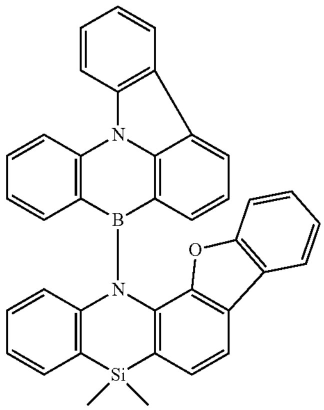
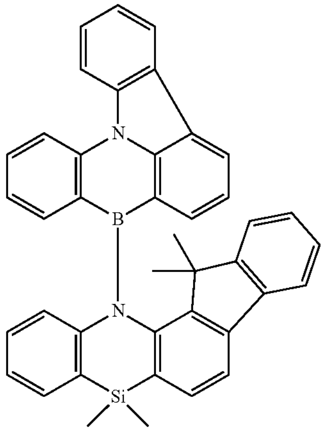
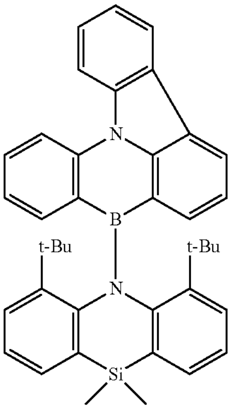
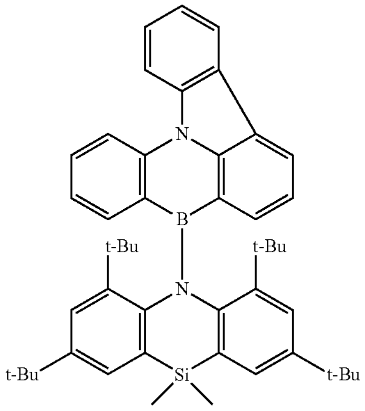

-continued
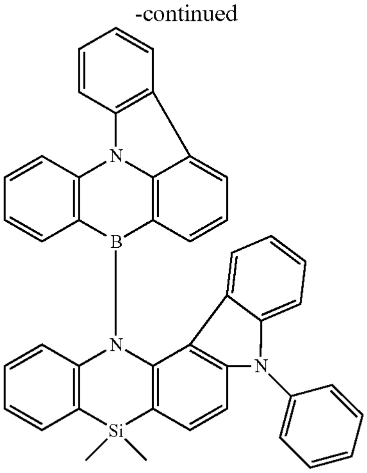
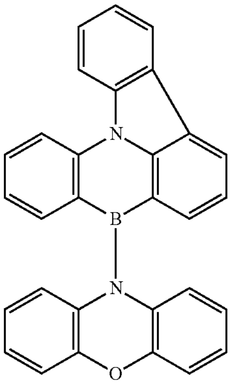
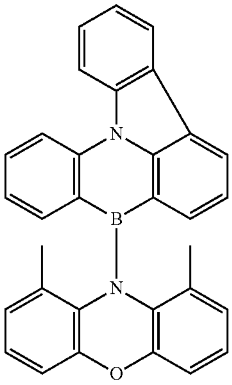
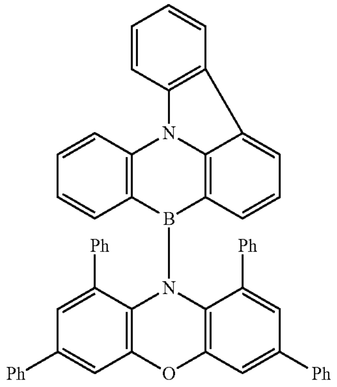
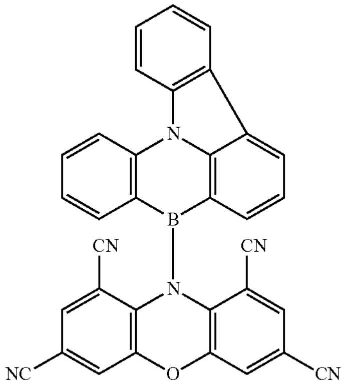
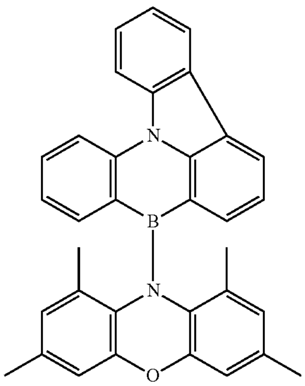
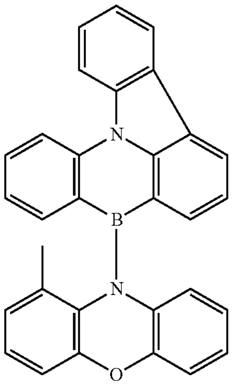
-continued
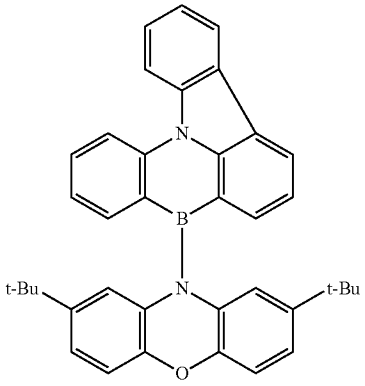
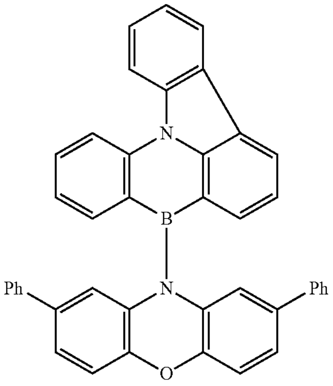
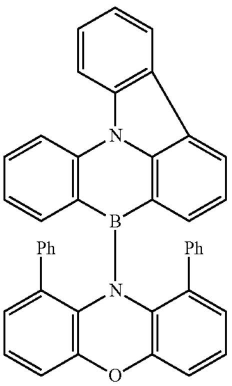
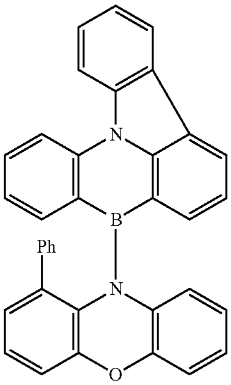

-continued
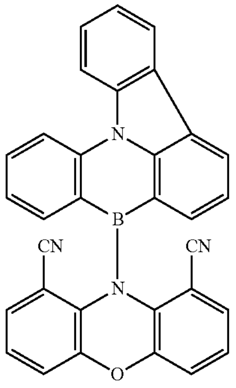
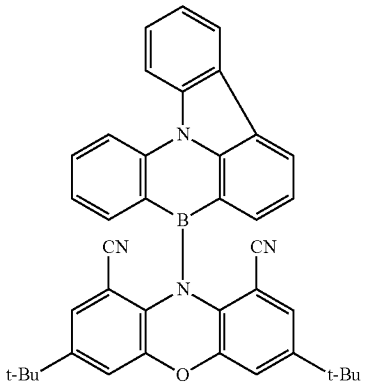
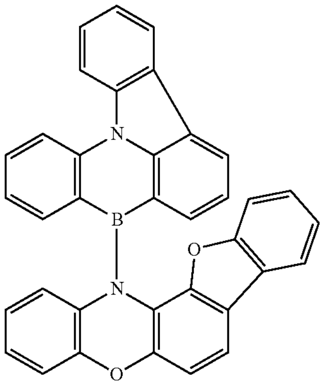
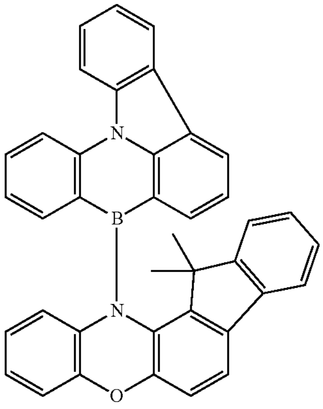
-continued
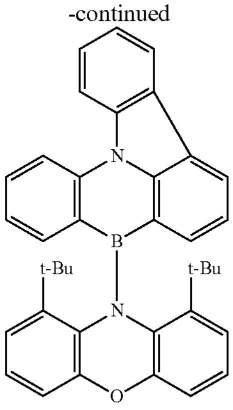
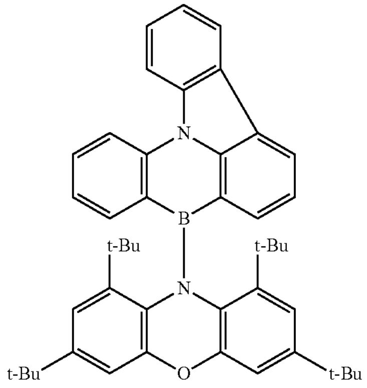
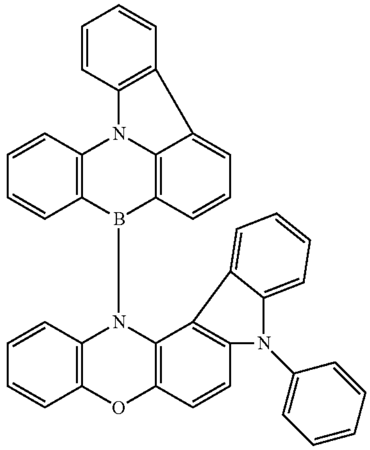
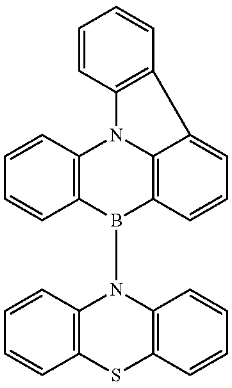
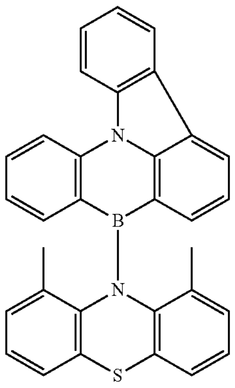

-continued
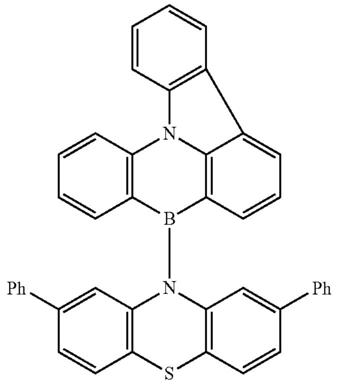
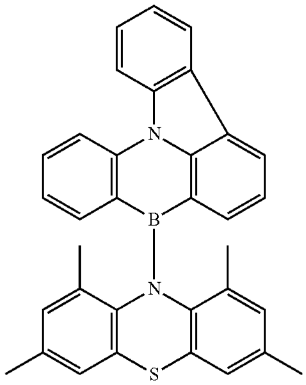
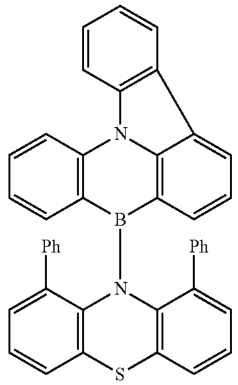
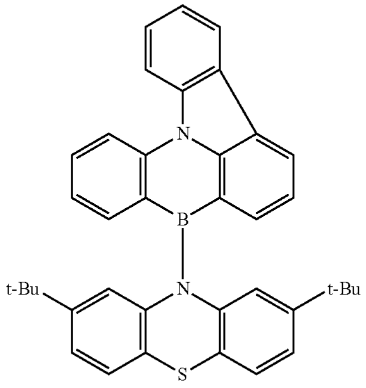
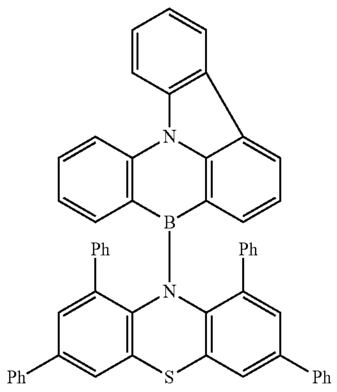
-continued
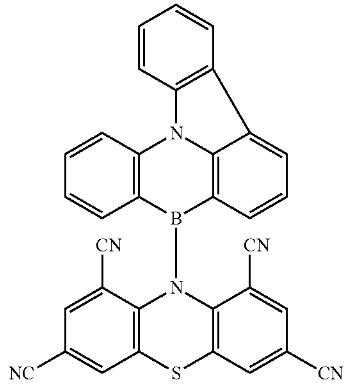
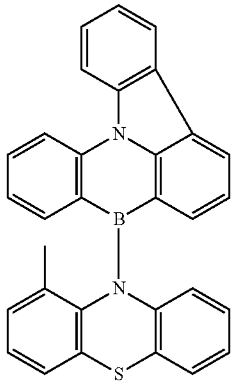
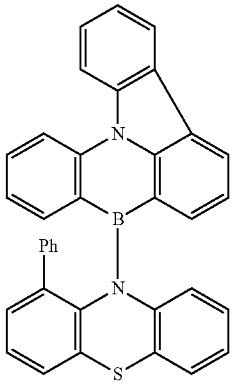
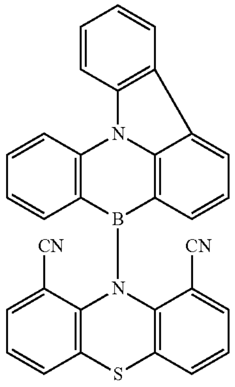
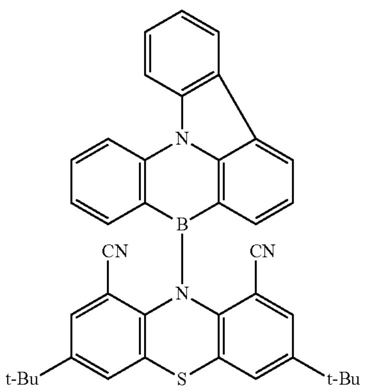

-continued
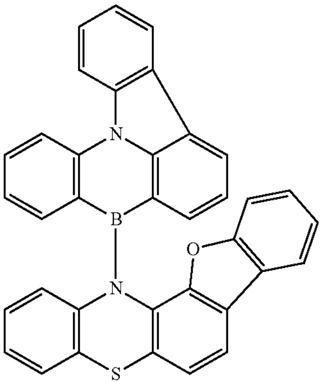
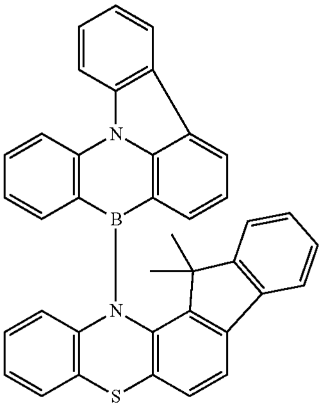
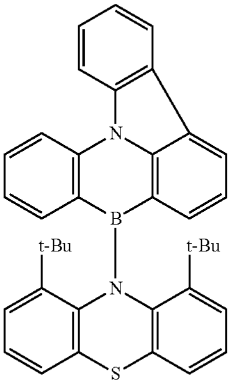
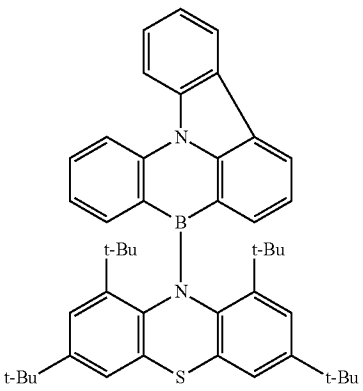
-continued
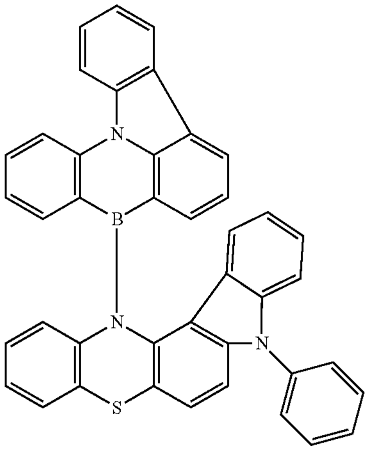
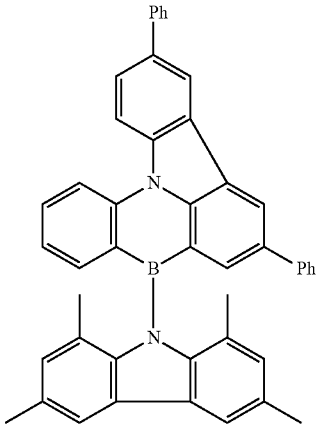
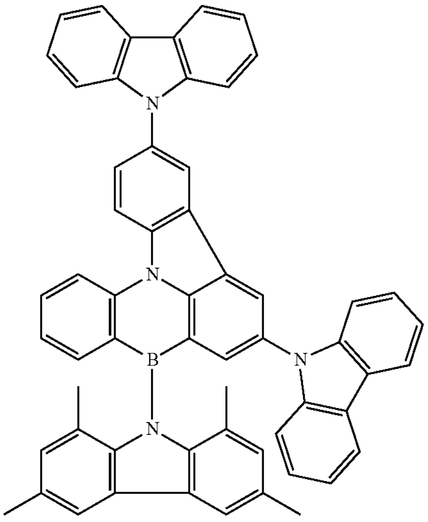

-continued
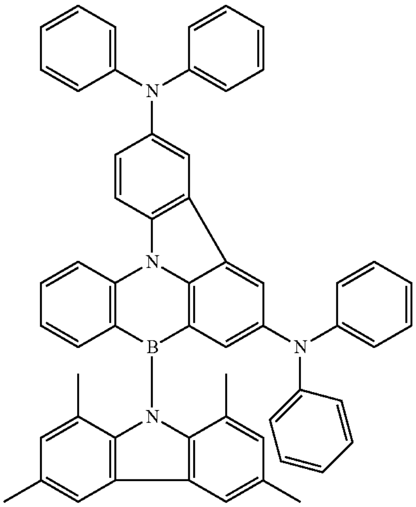
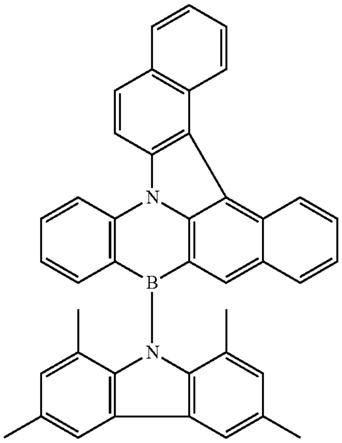
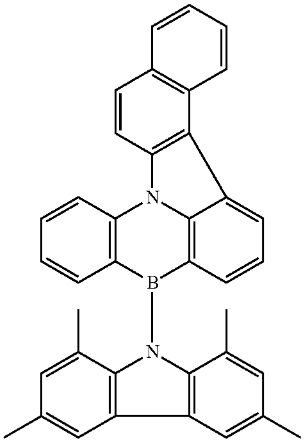
-continued
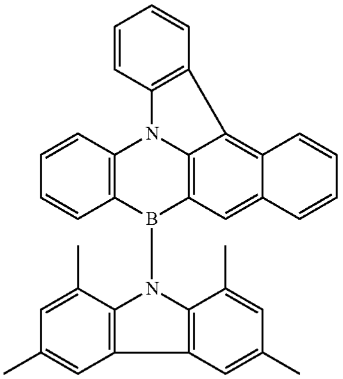
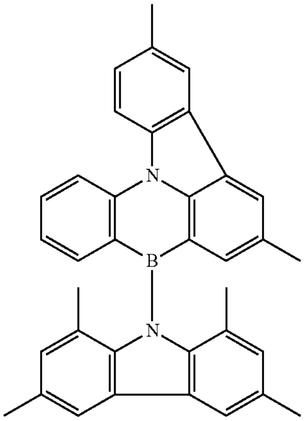
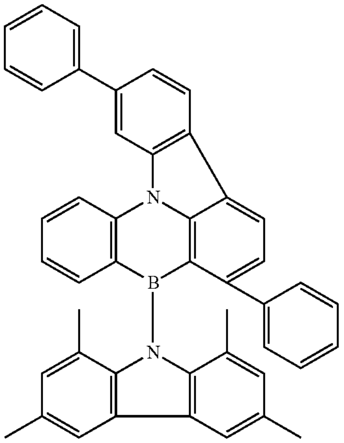
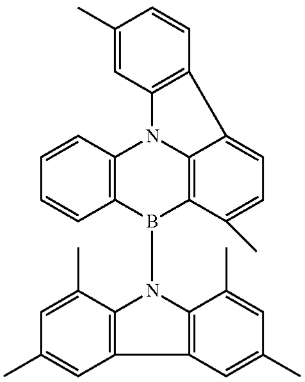

-continued
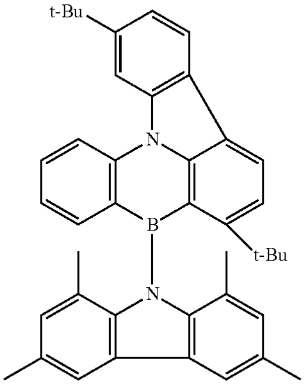
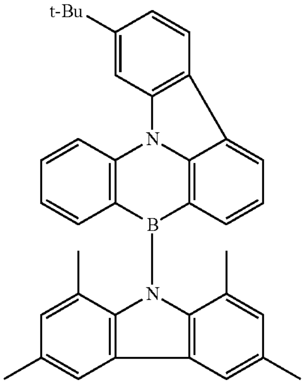
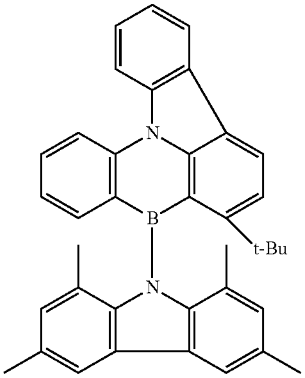
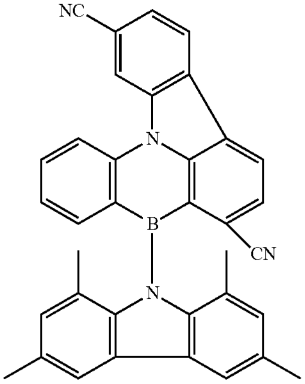
-continued
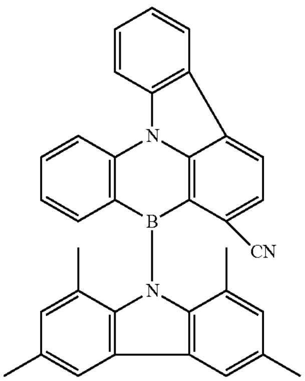
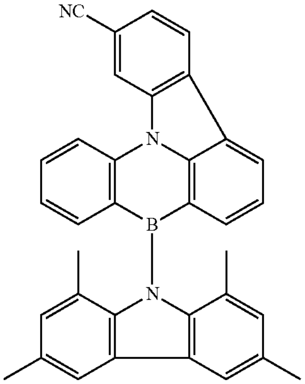
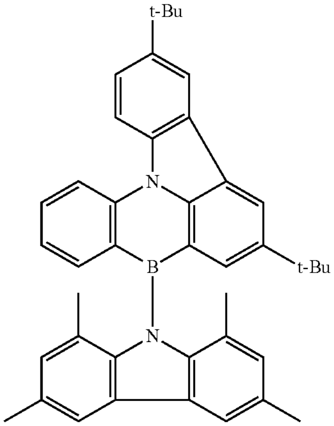
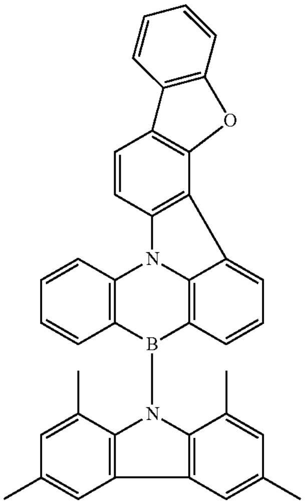

-continued
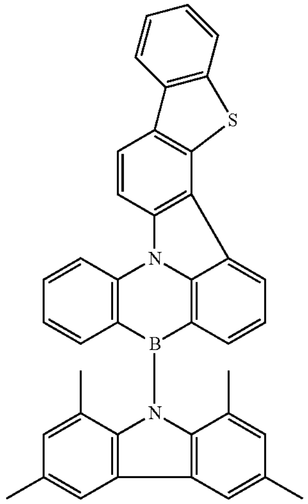
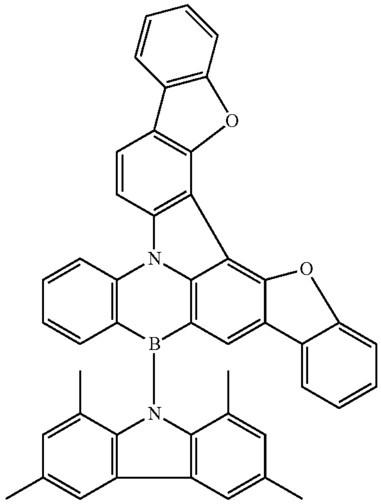
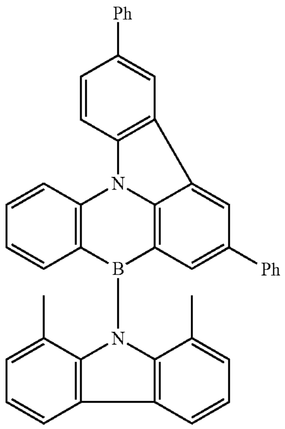
-continued
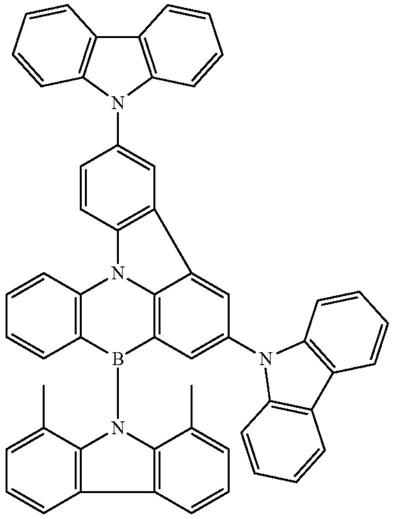
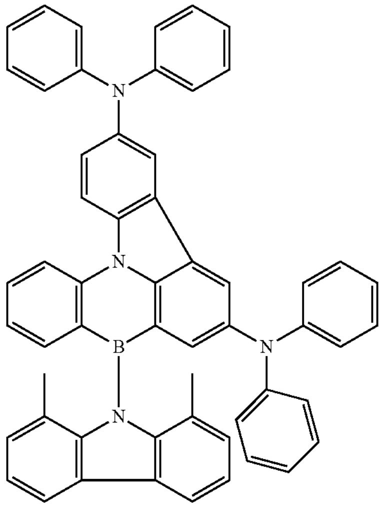
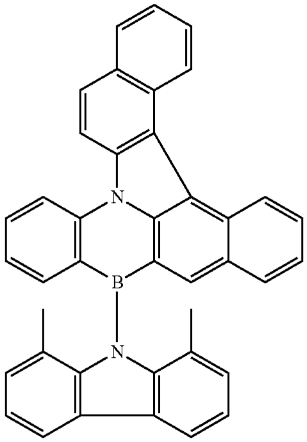

-continued
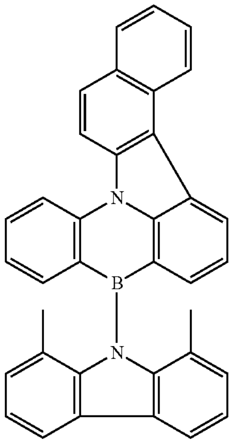
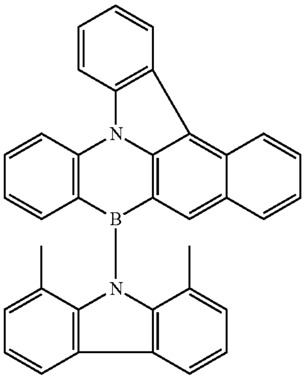
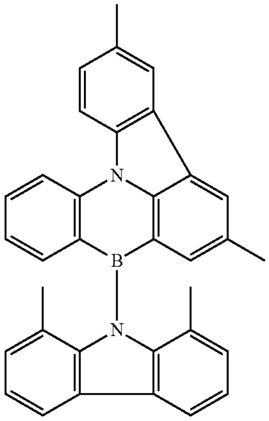
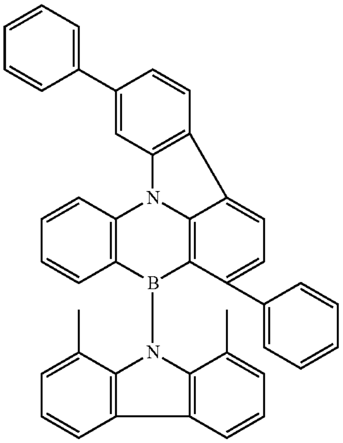
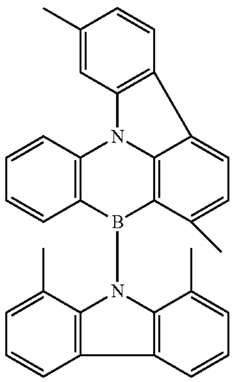
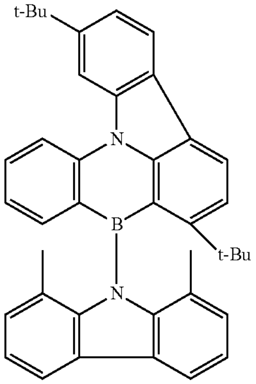
-continued
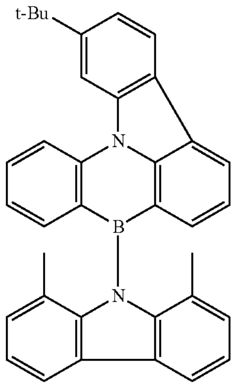
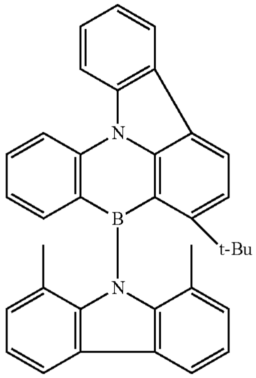
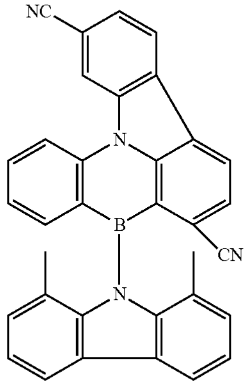
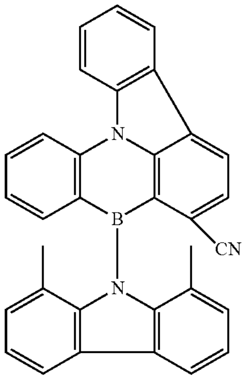
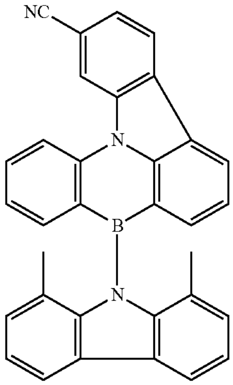
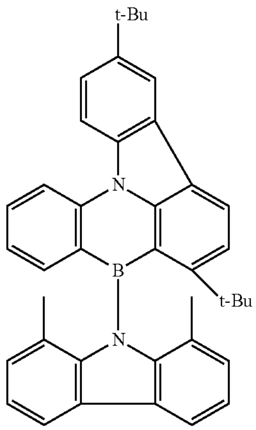
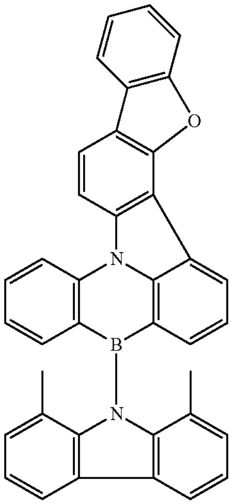
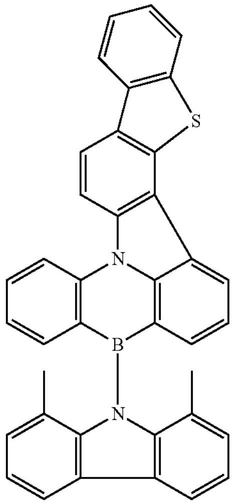

-continued
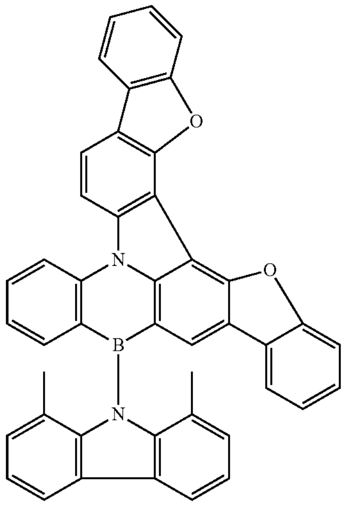
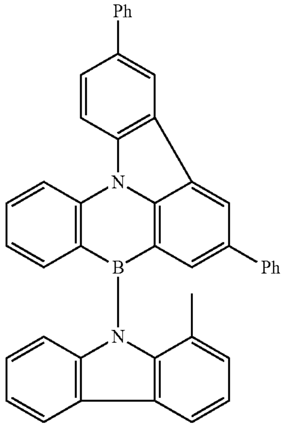
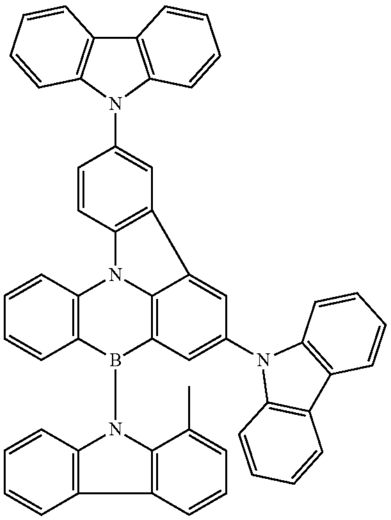
-continued
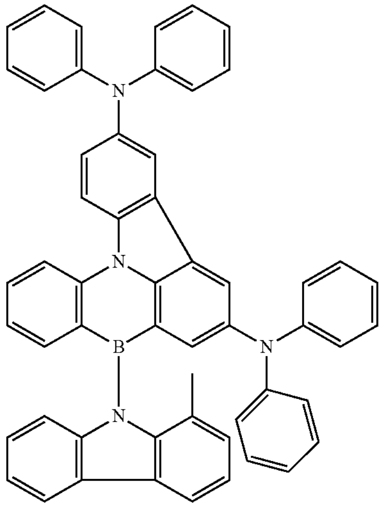
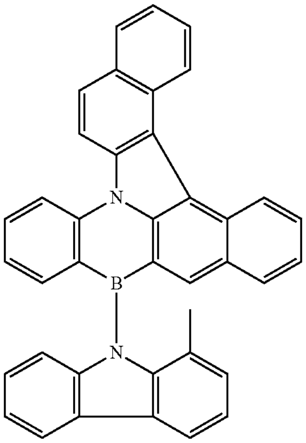
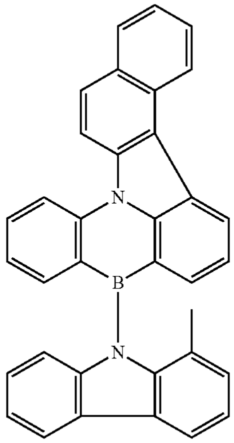
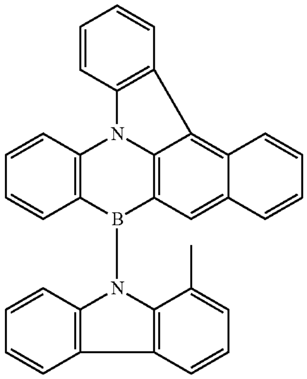

-continued
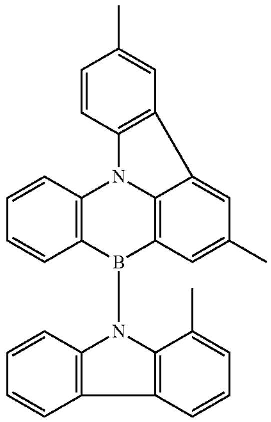
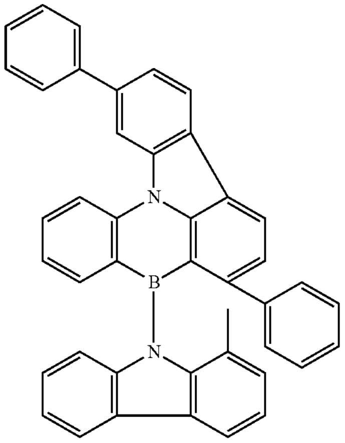
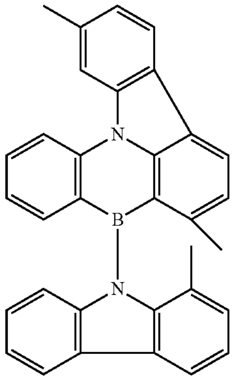
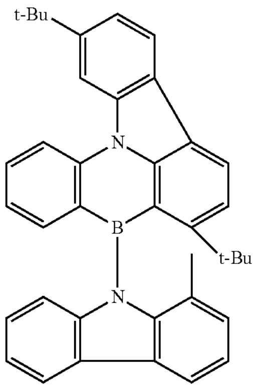
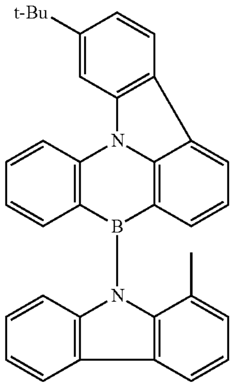
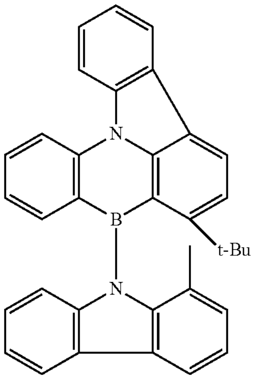
-continued
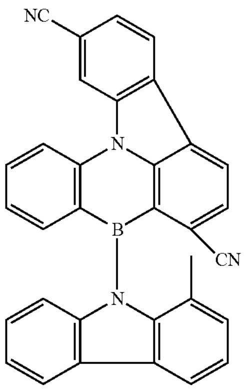
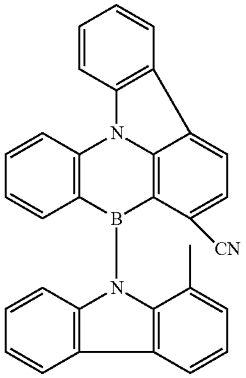
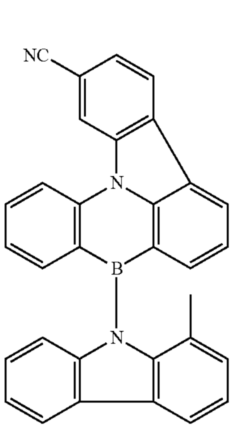
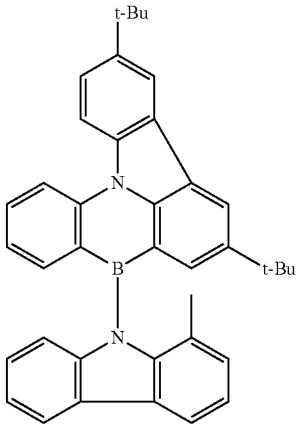
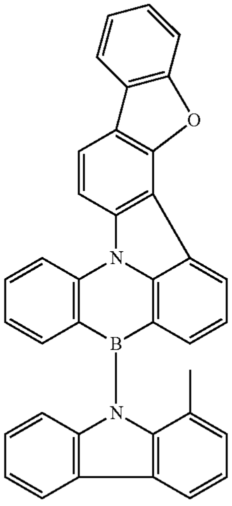
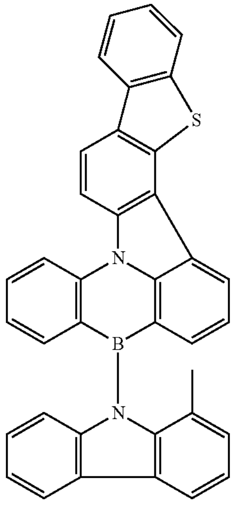

-continued
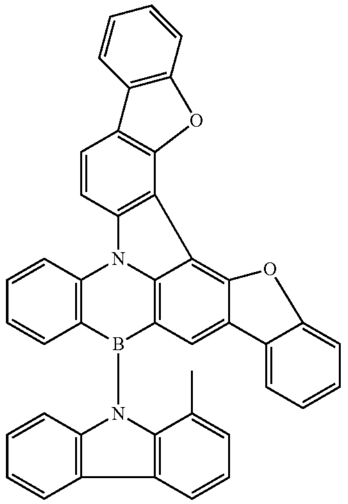
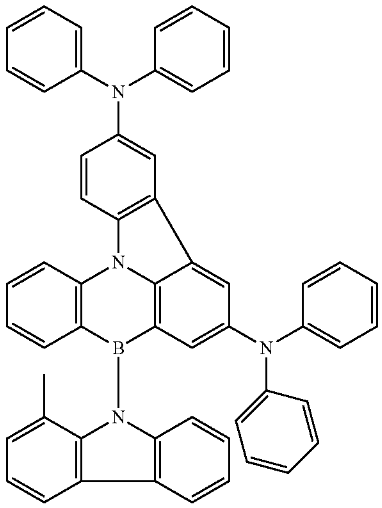
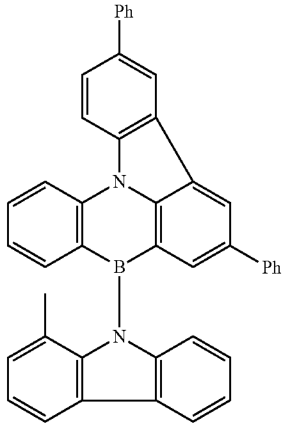
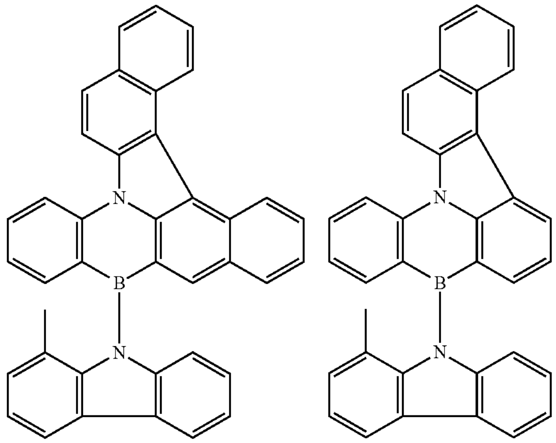
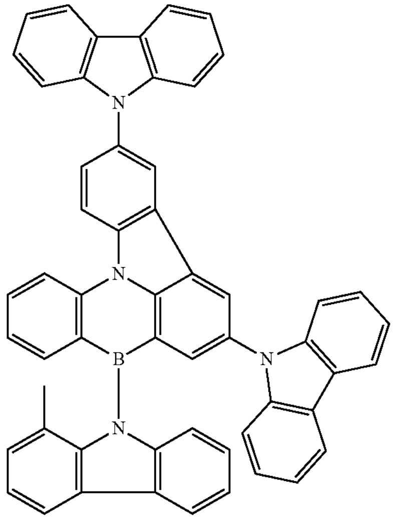
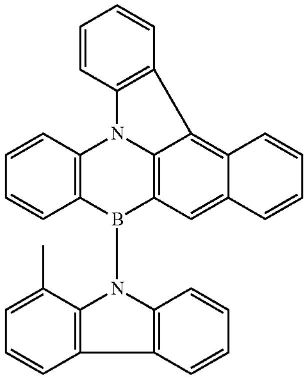

-continued
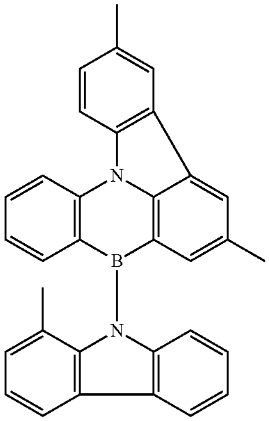
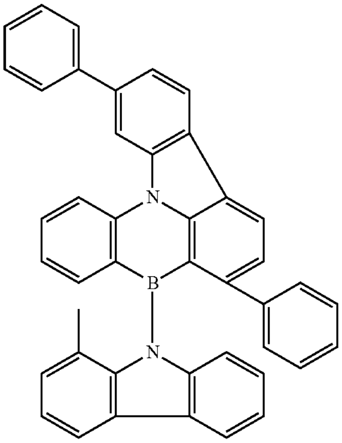
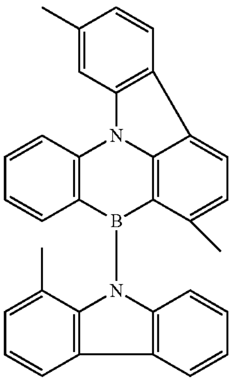
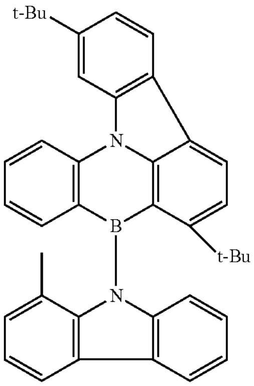
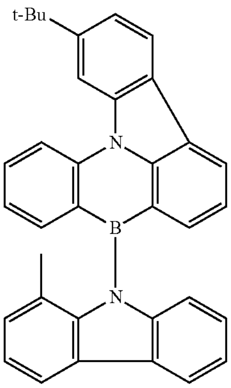
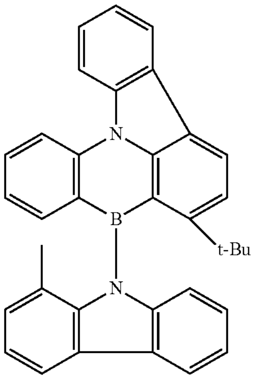
-continued
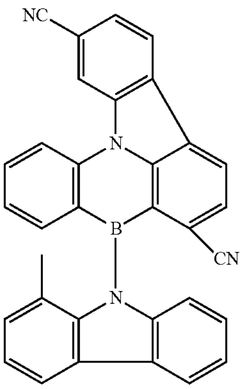
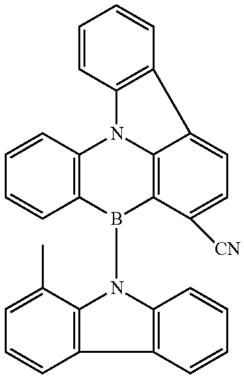
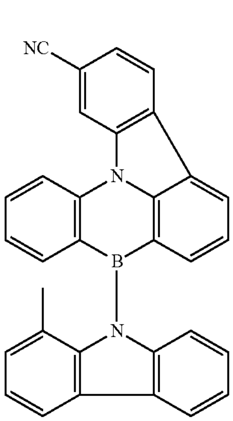
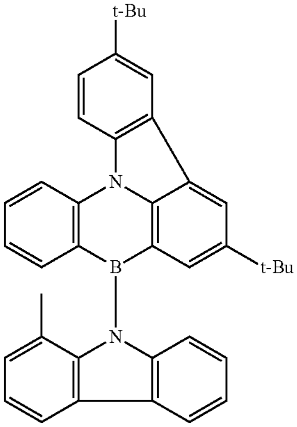
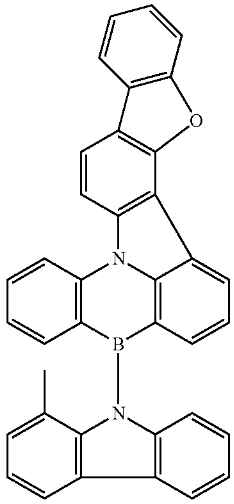
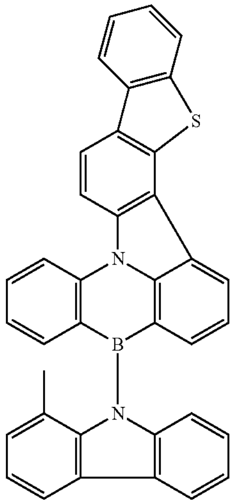

-continued
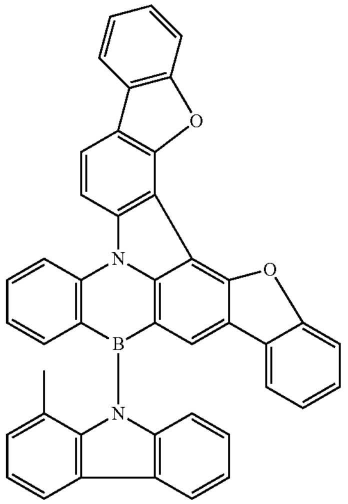
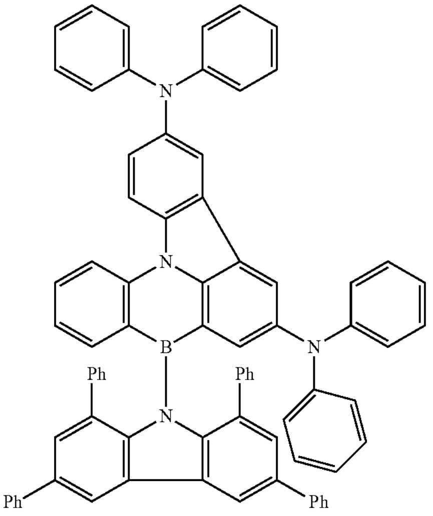
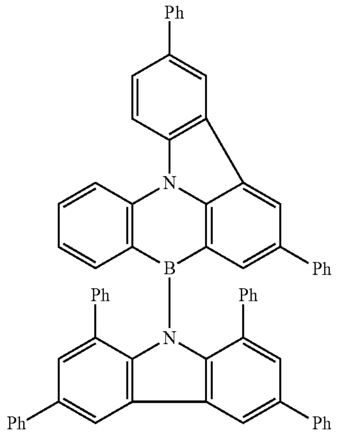
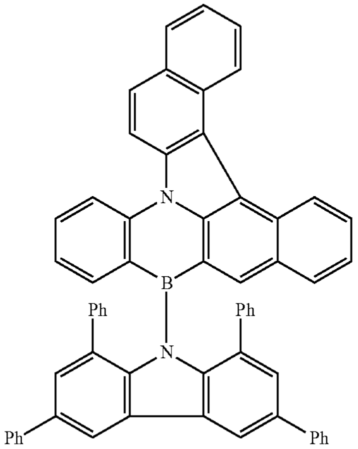
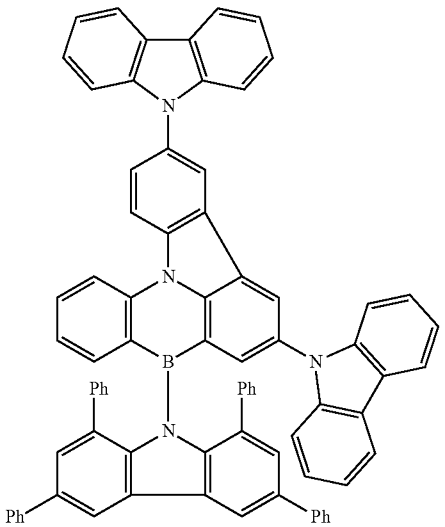
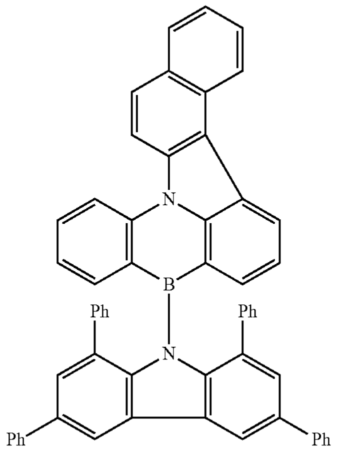
-continued -continued
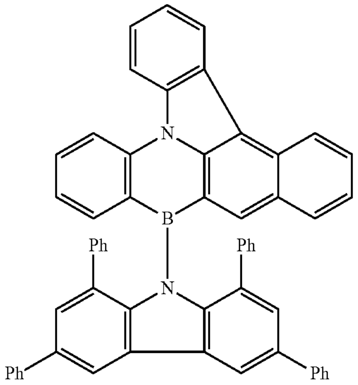
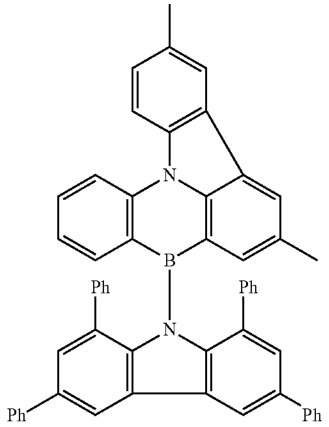
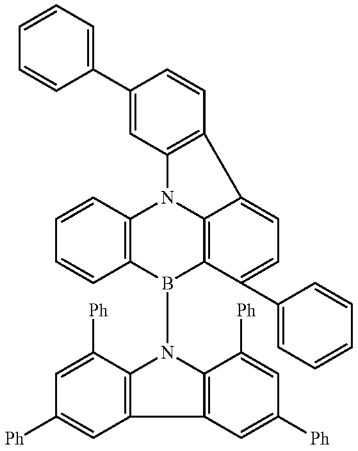
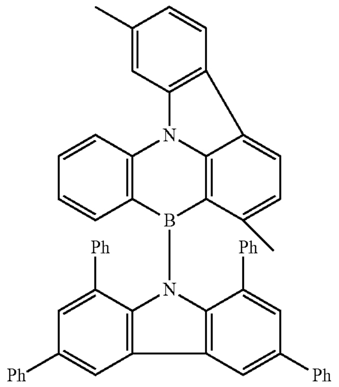
-continued
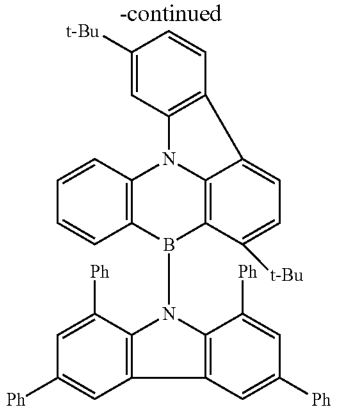
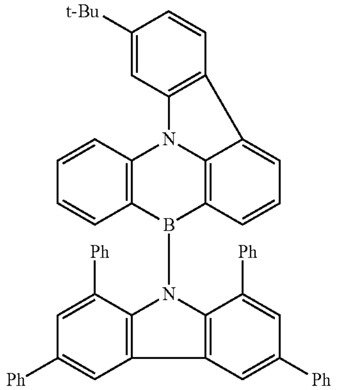
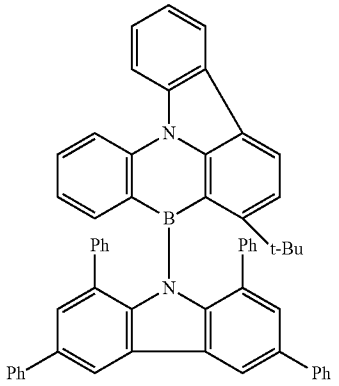
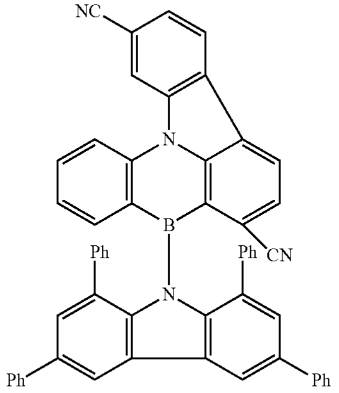

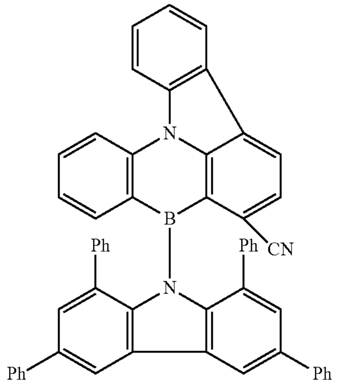
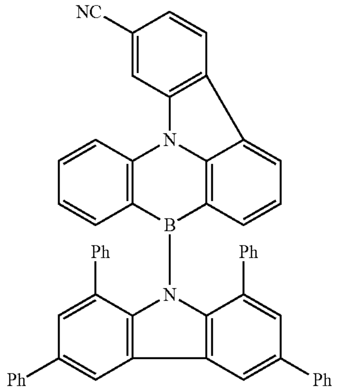
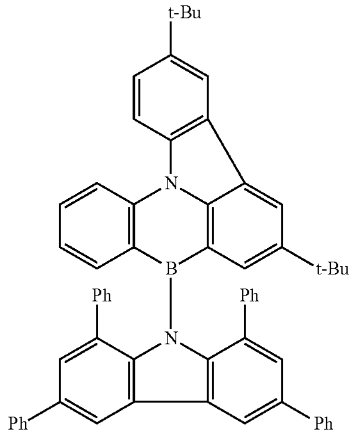
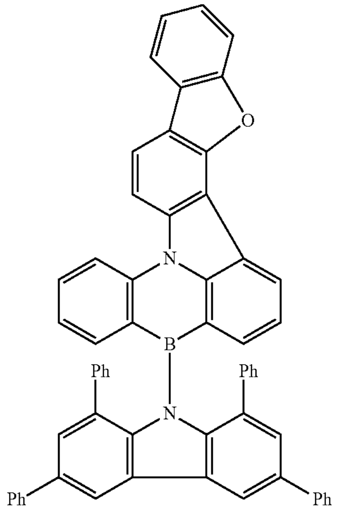
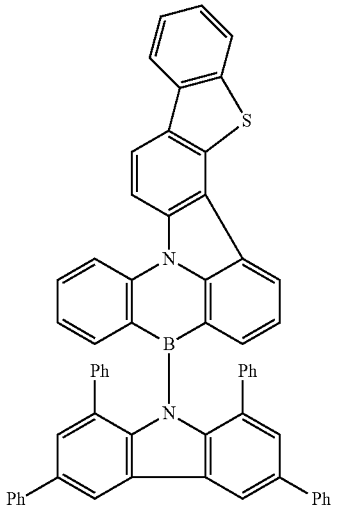
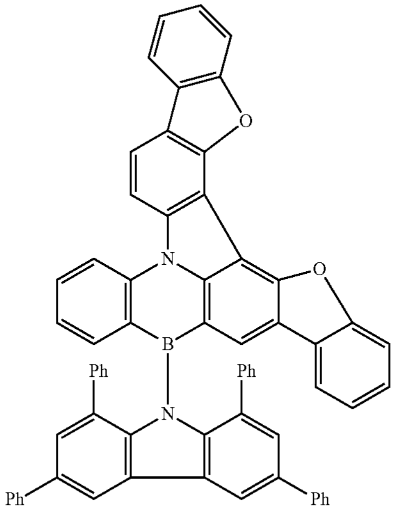
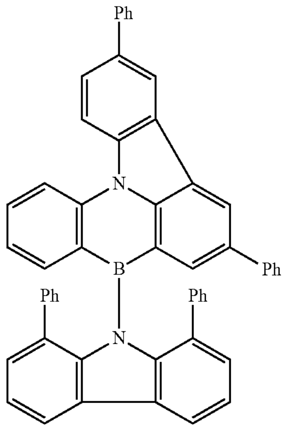

-continued
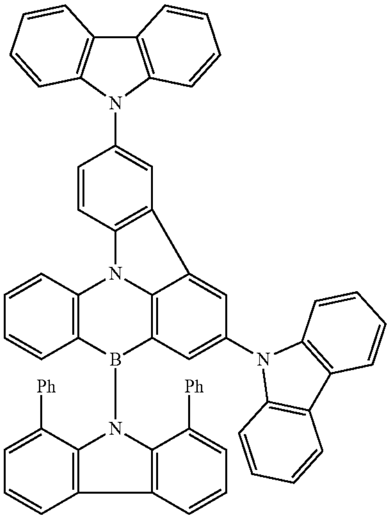
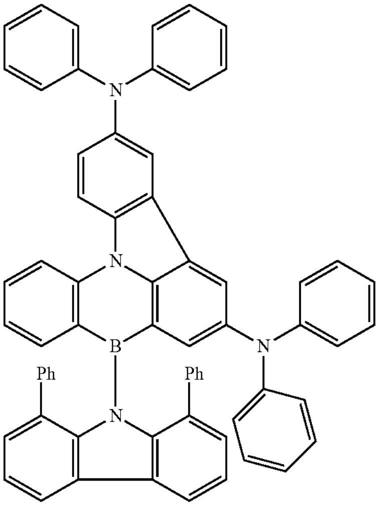
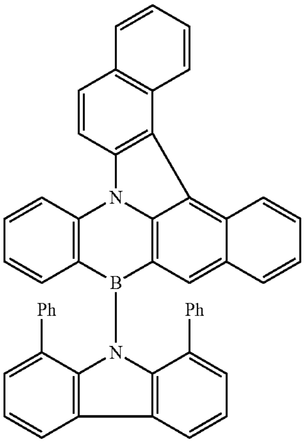
-continued
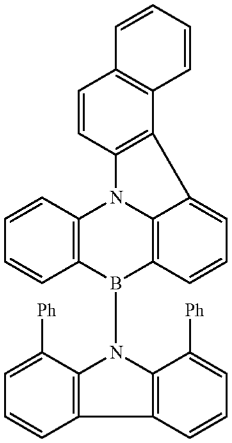
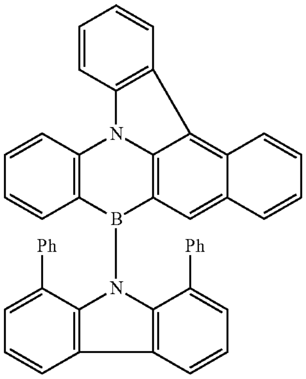
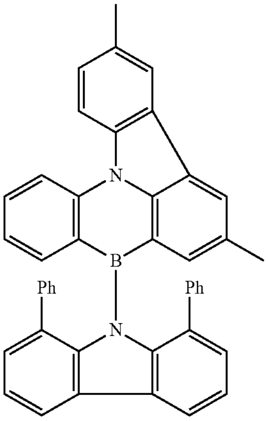
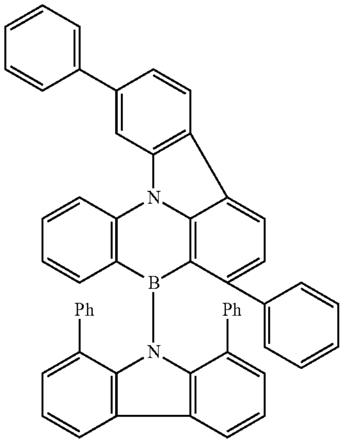

-continued
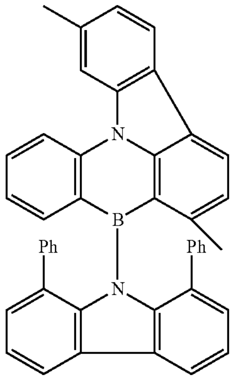
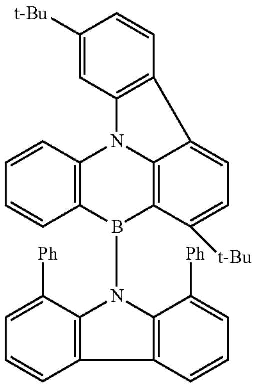
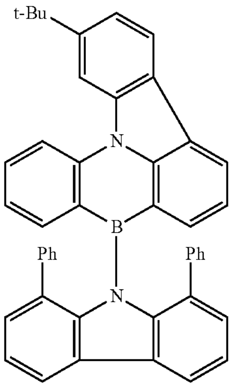
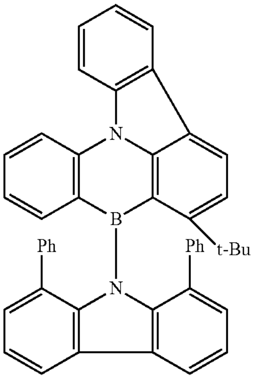
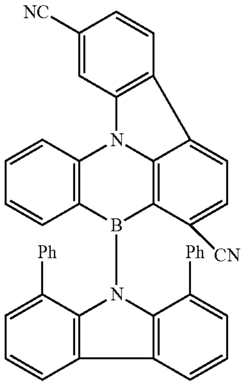
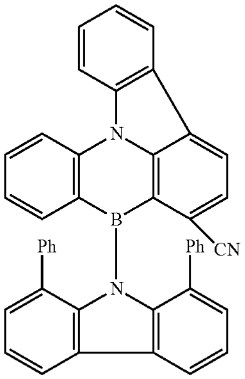
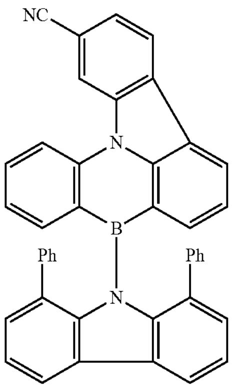
-continued
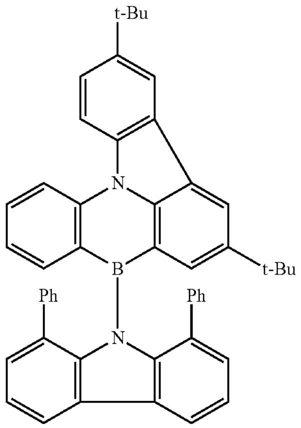
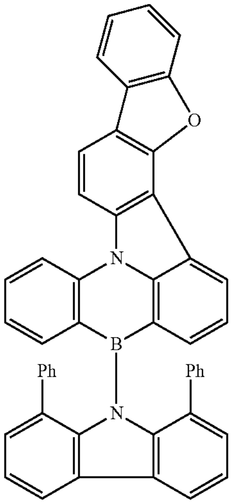
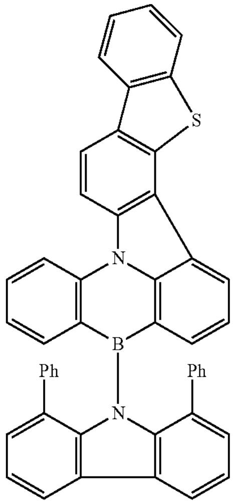
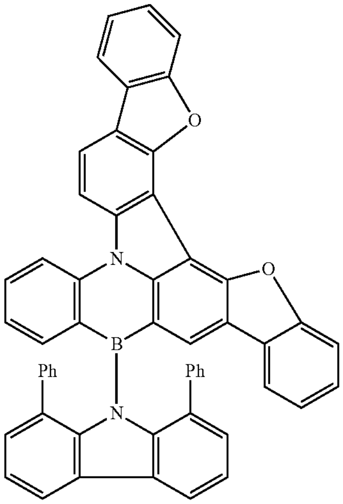

-continued
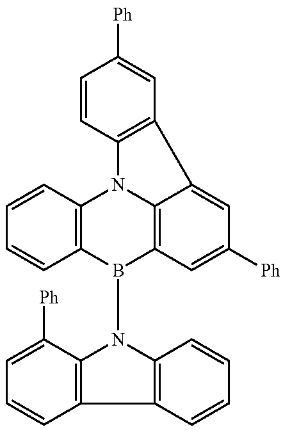
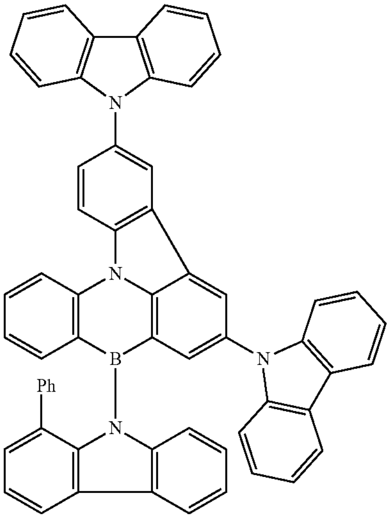
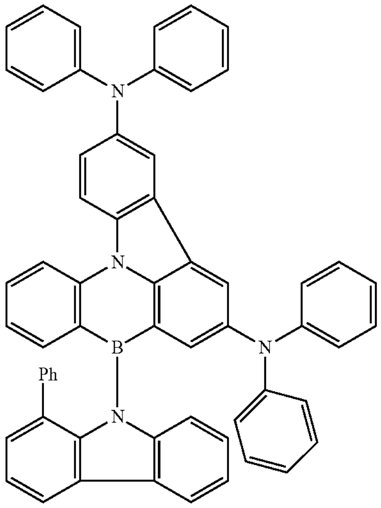
-continued
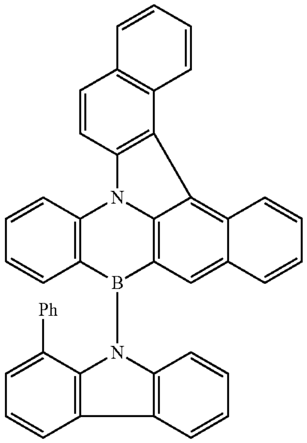
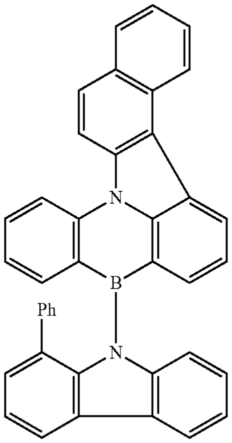
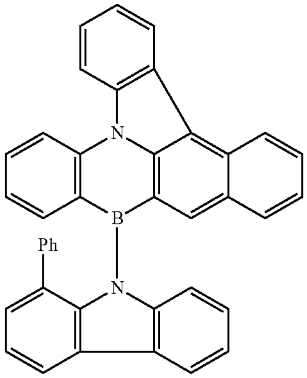
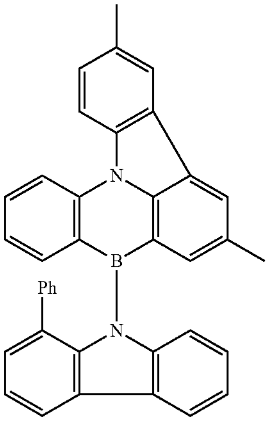
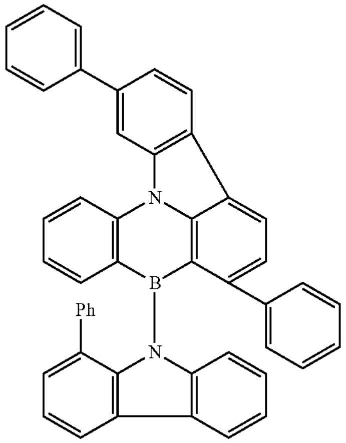

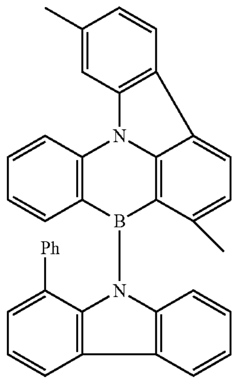
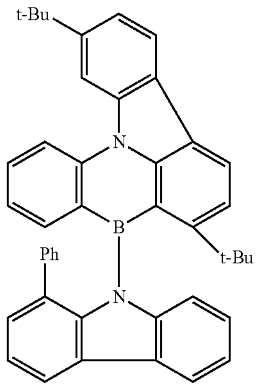
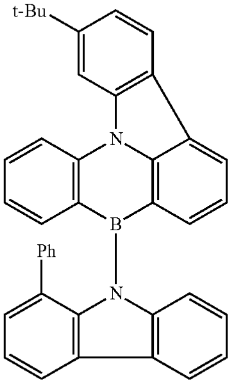
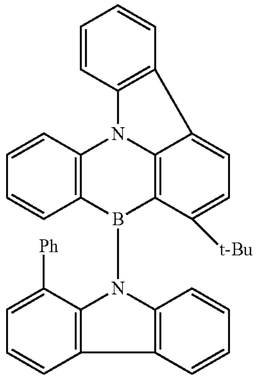
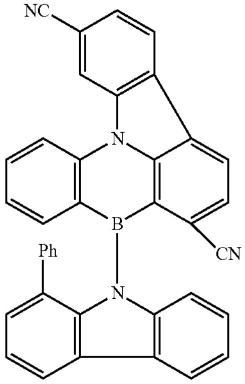
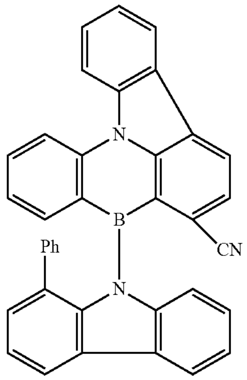
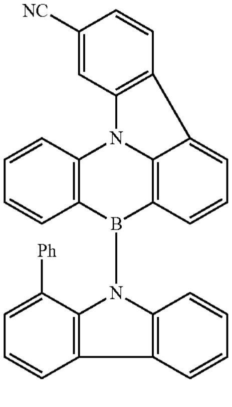
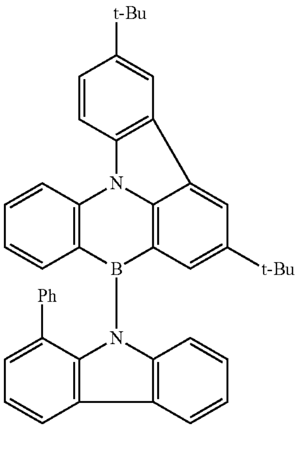
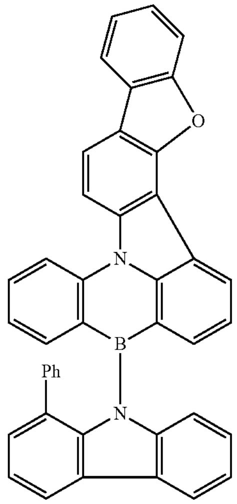
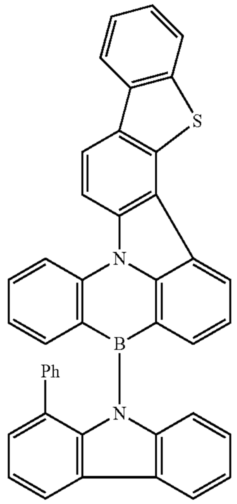
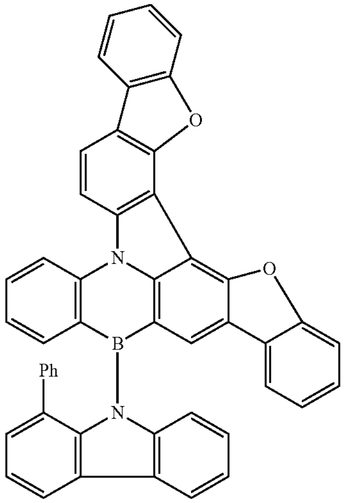
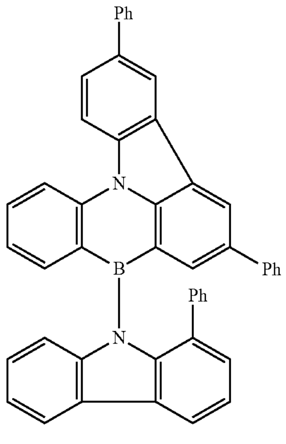

-continued
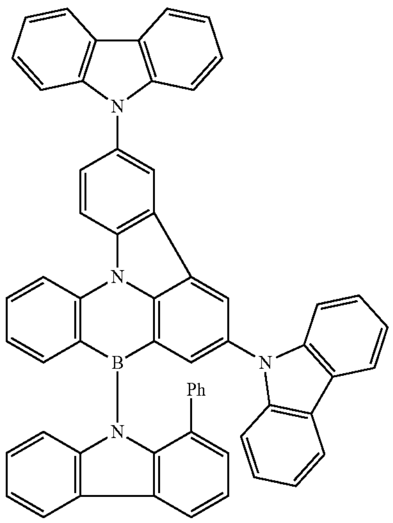
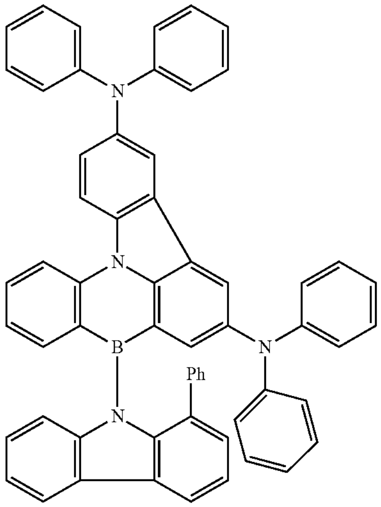
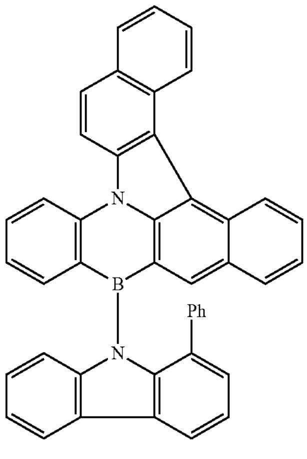
-continued
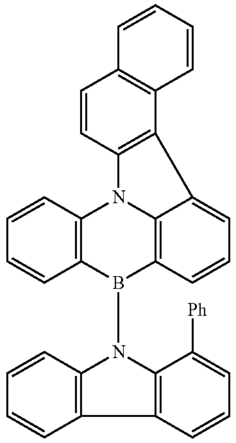
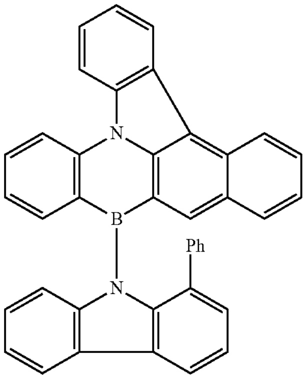
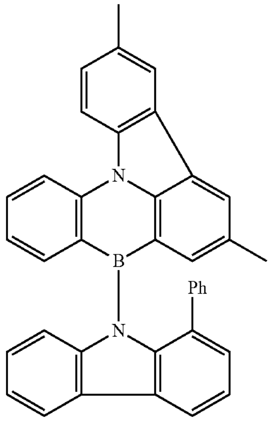
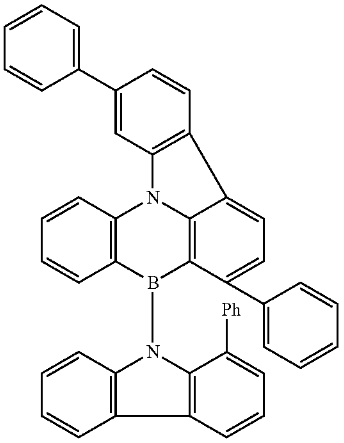
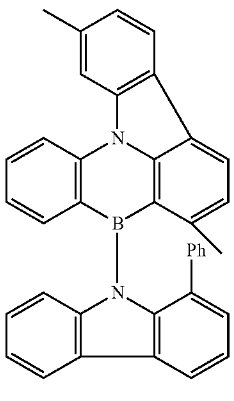
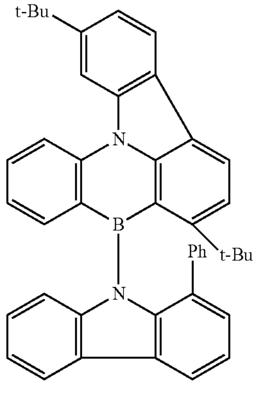

-continued
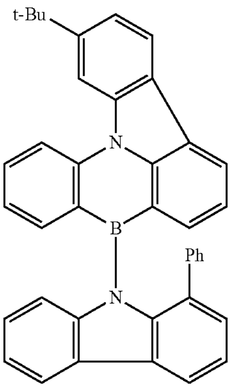
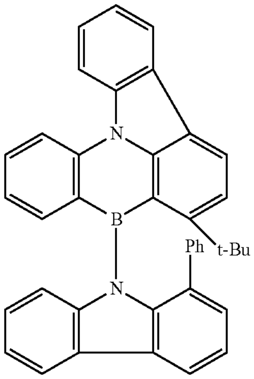
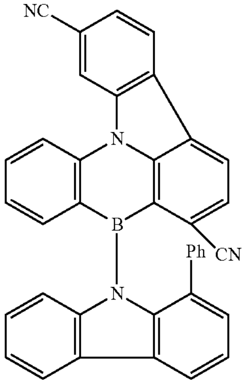
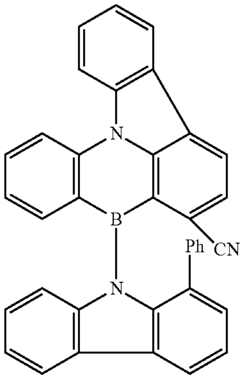
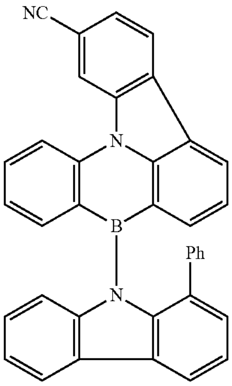
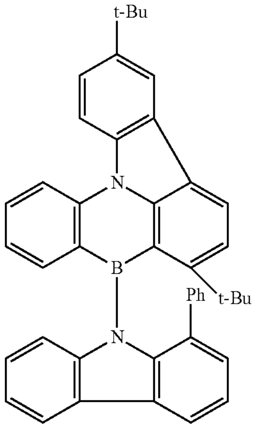
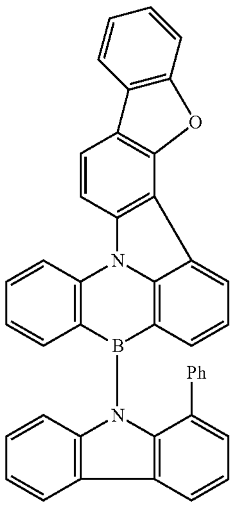
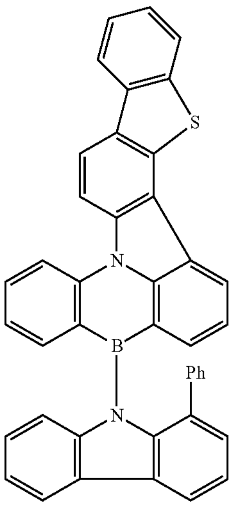
-continued
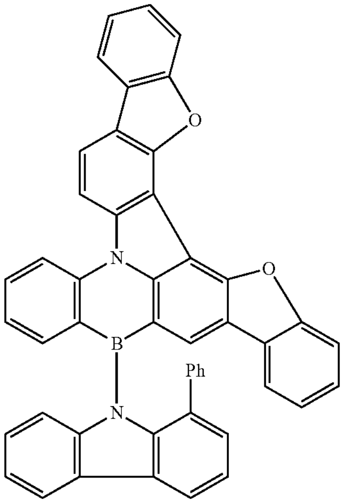
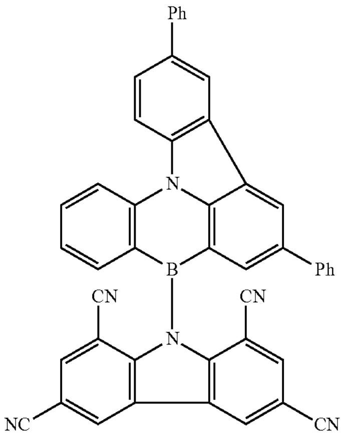
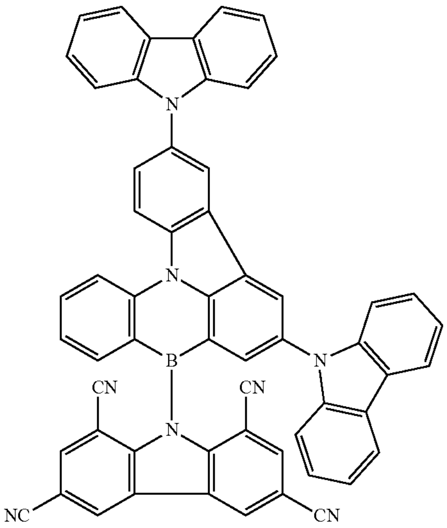

-continued
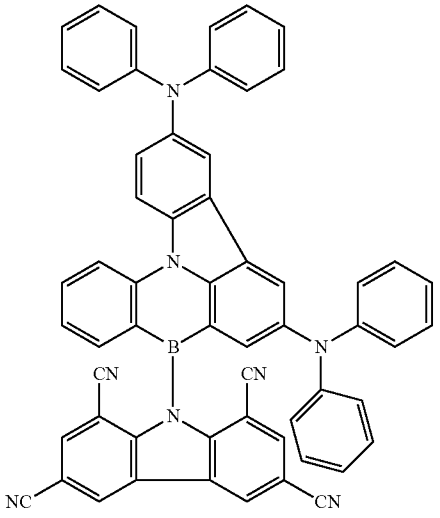
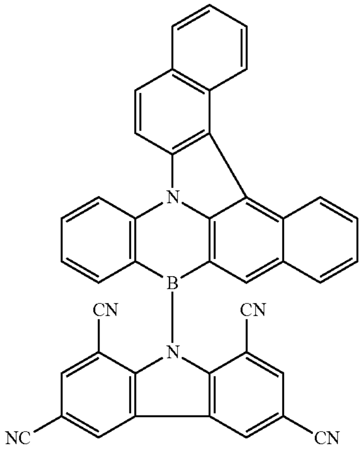
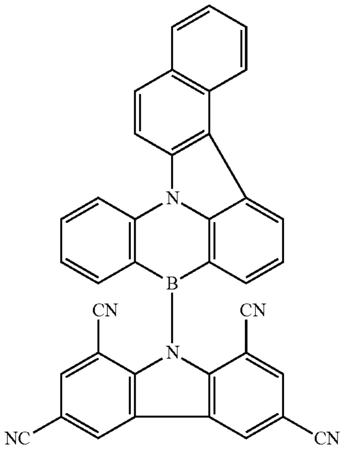
-continued
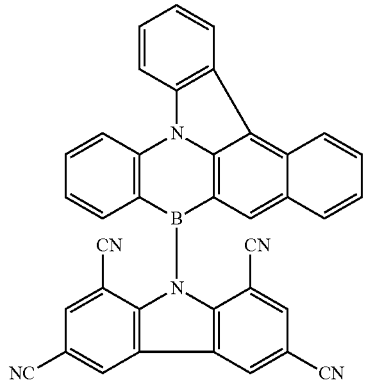
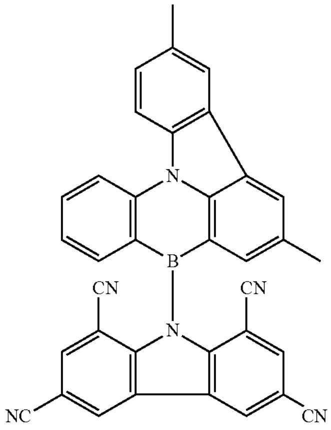
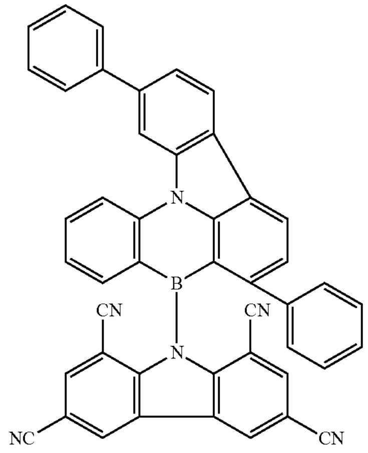
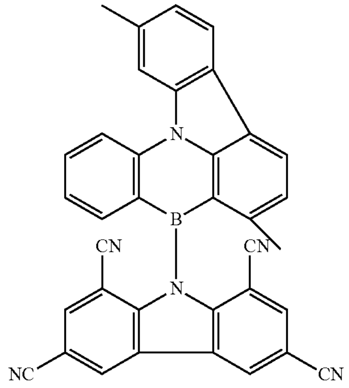

-continued
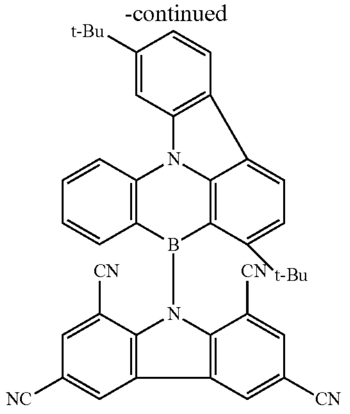
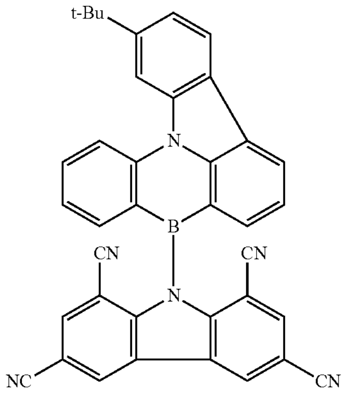
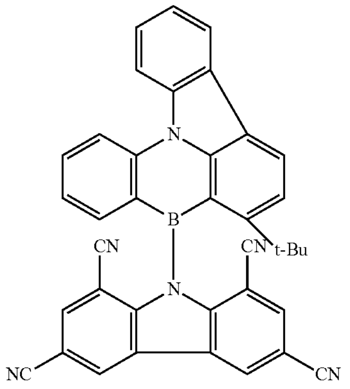
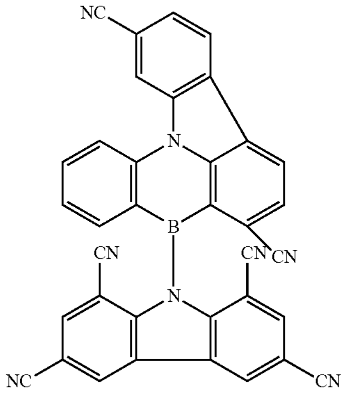
-continued
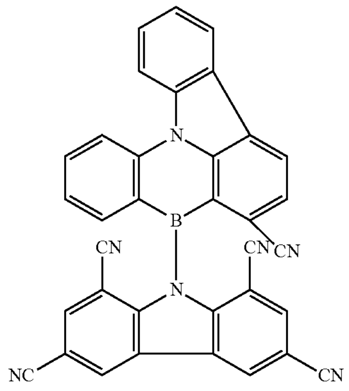
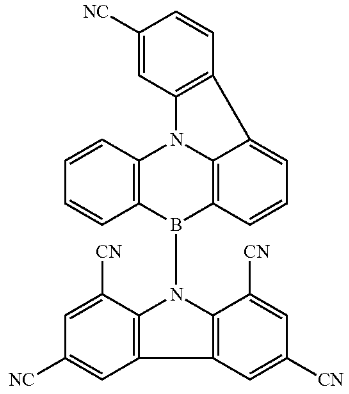
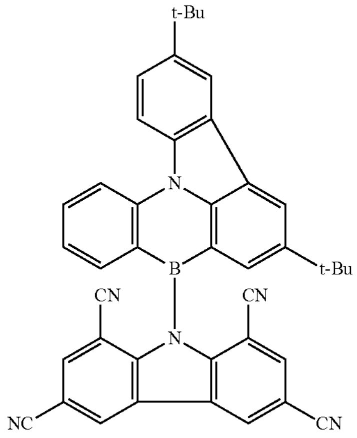
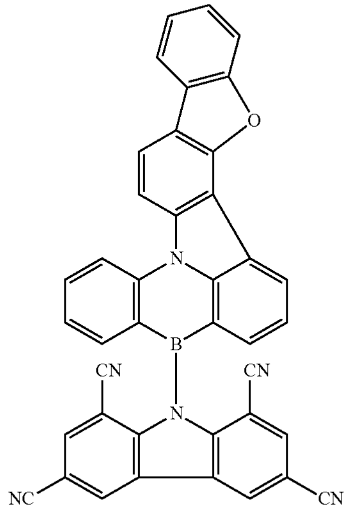

-continued
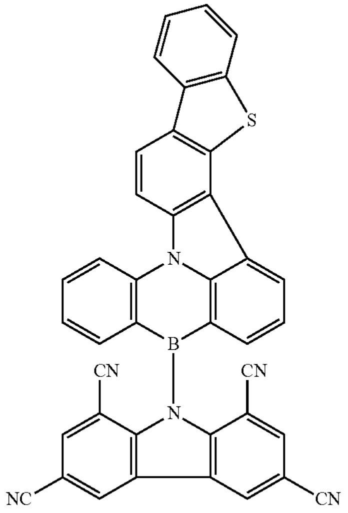
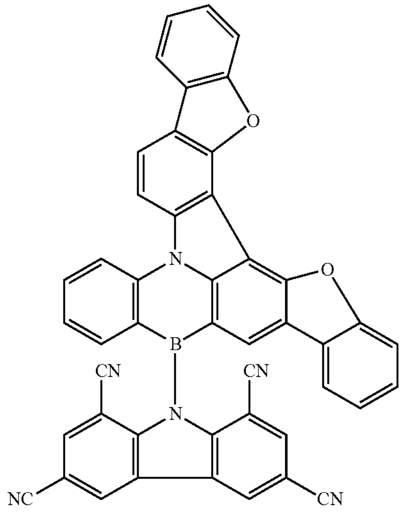
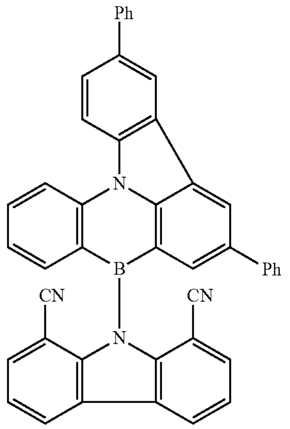
-continued
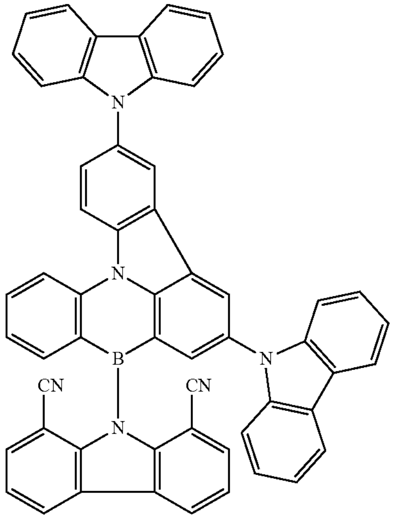
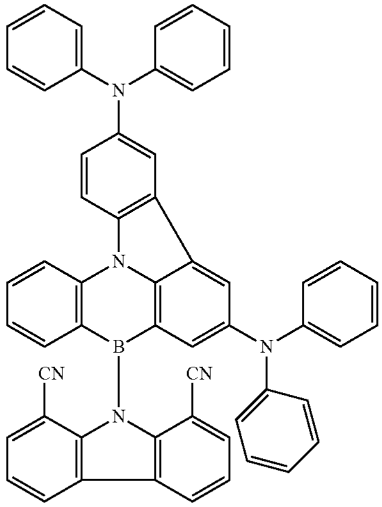
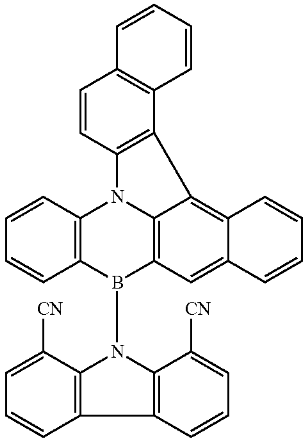

-continued
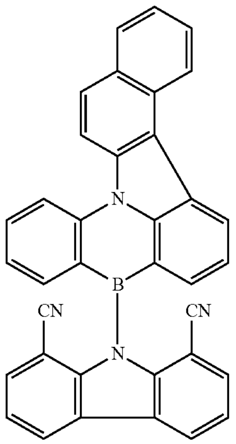
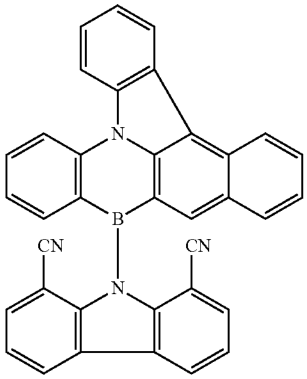
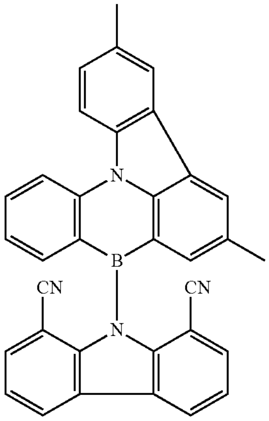
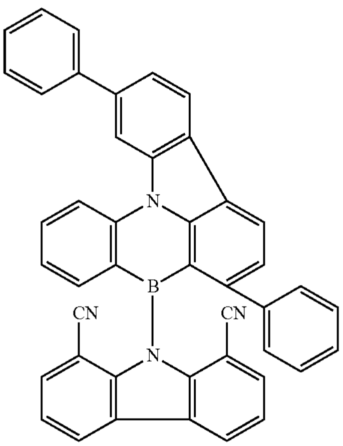
-continued
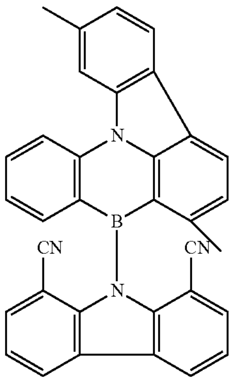
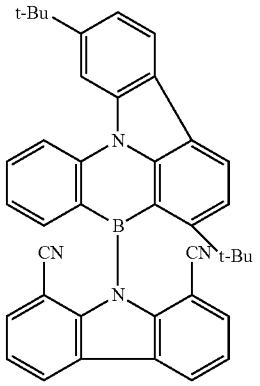
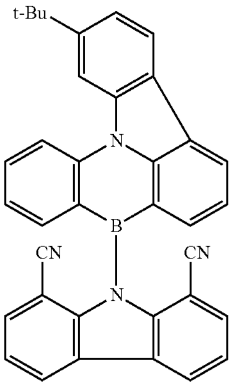
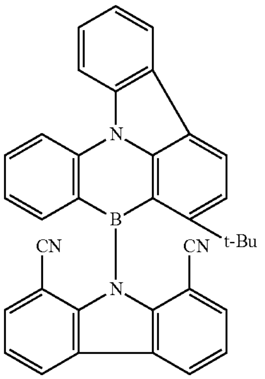
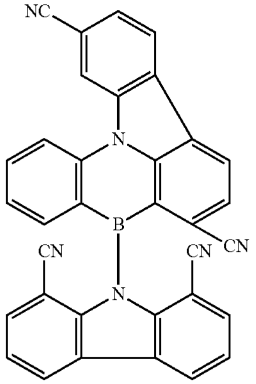
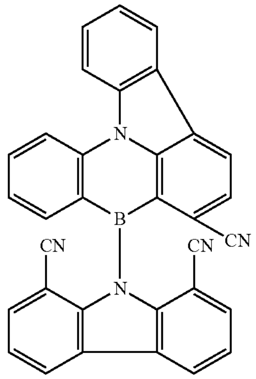
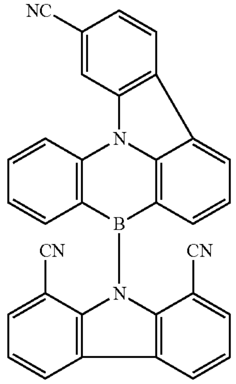

-continued
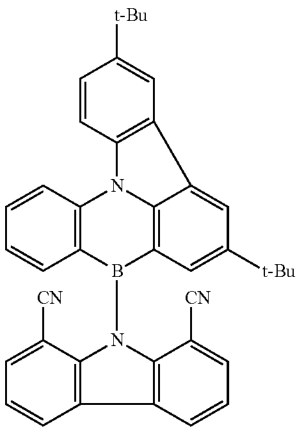
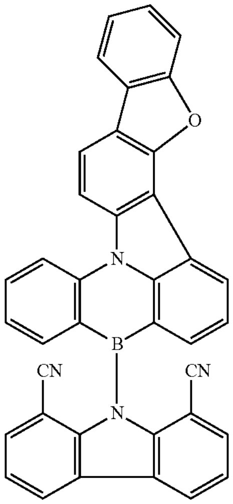
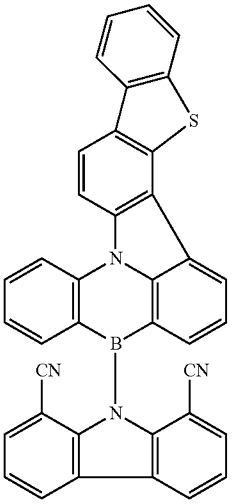
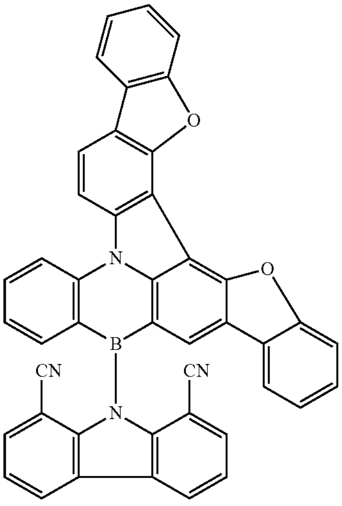
-continued
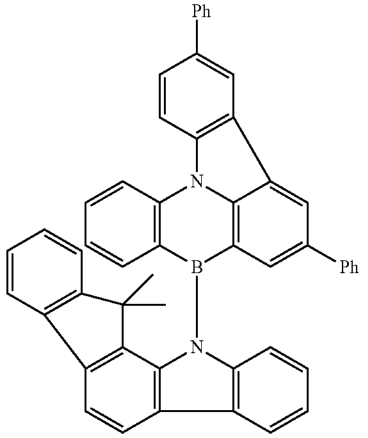
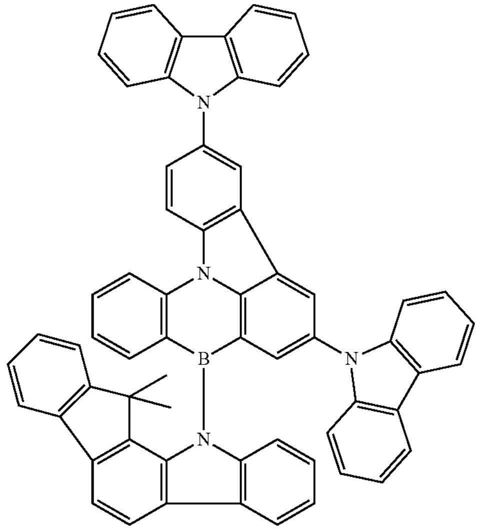
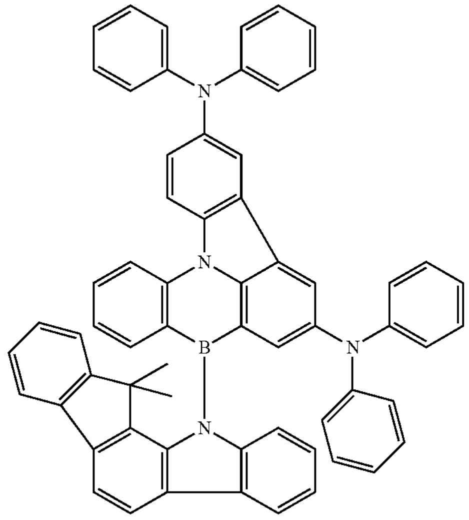

-continued
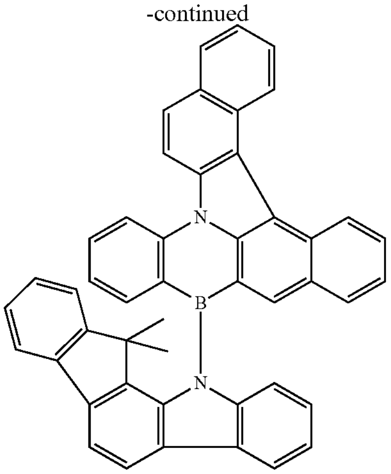
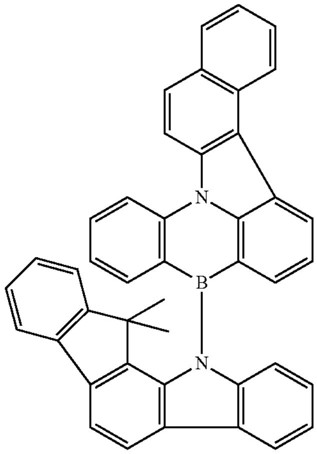
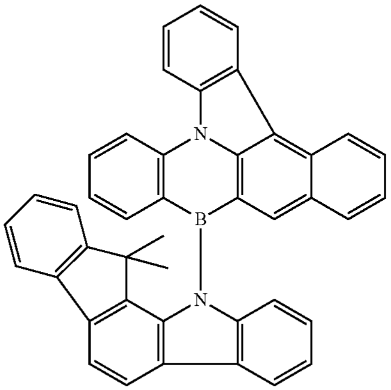
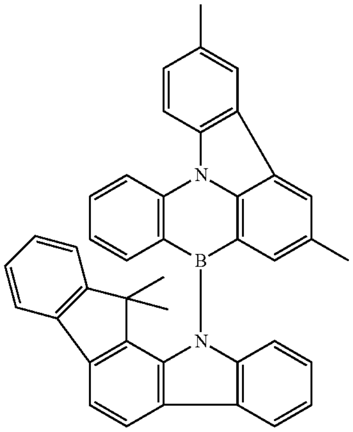
-continued
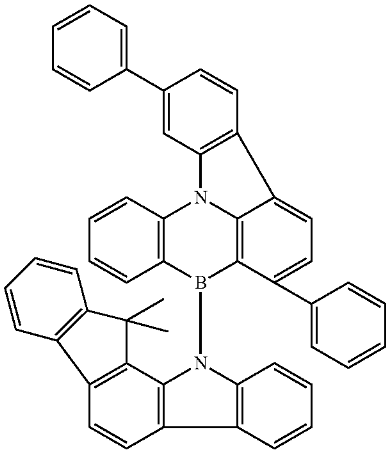
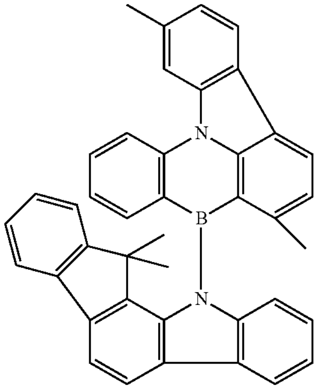
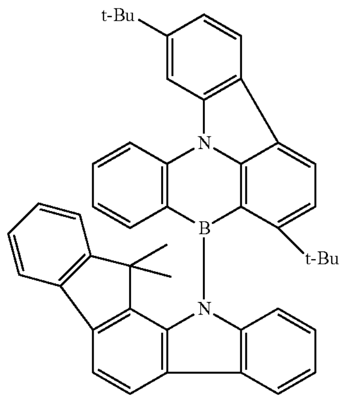
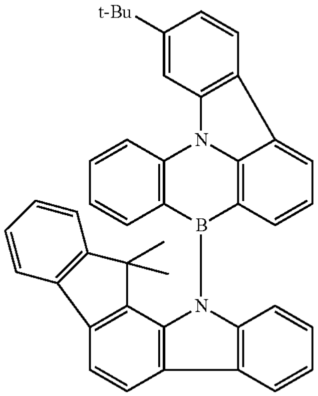

-continued
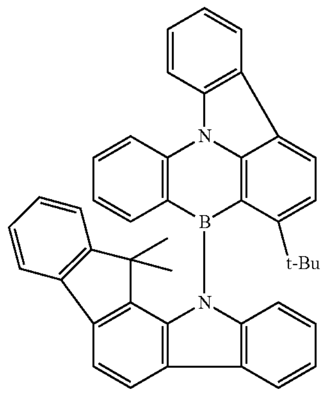
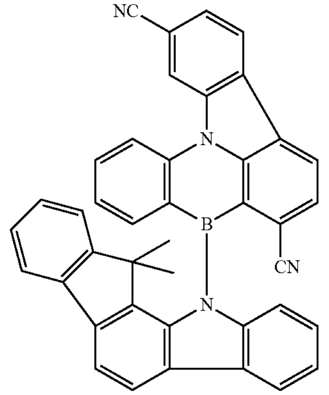
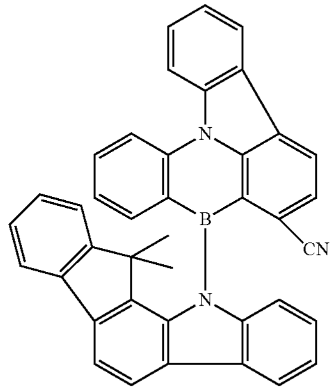
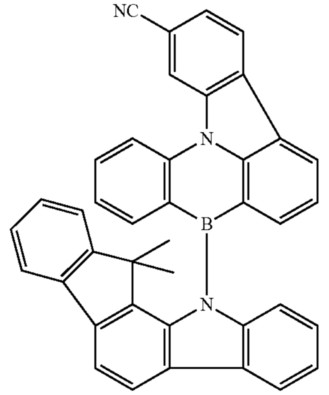
-continued
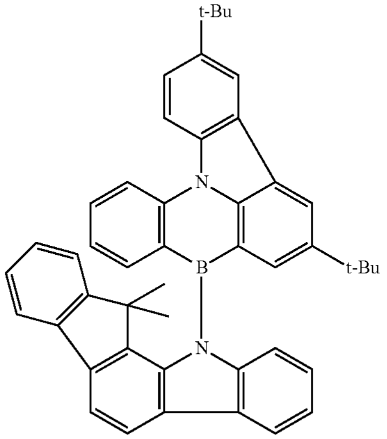
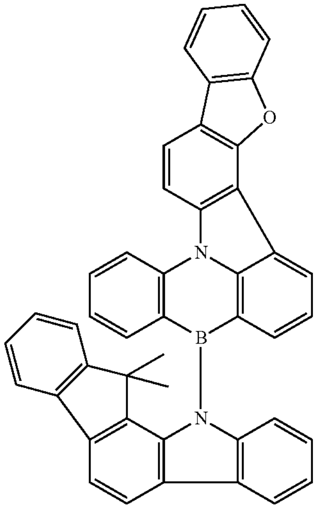
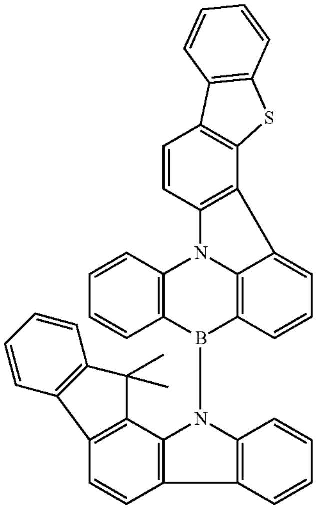

-continued
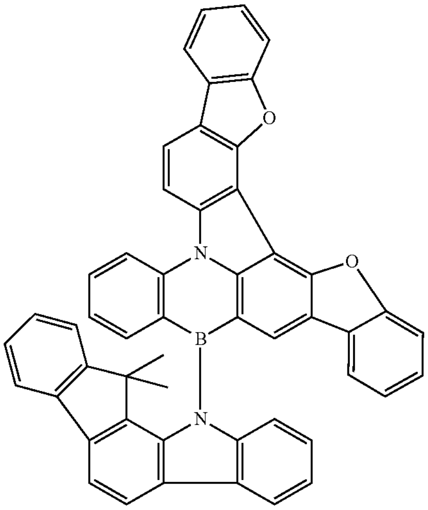
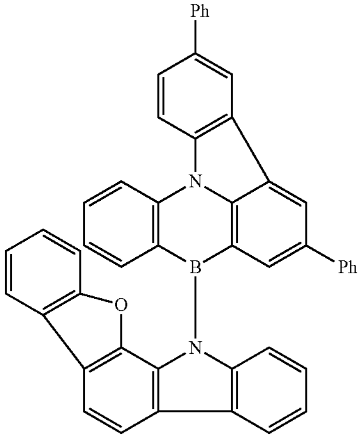
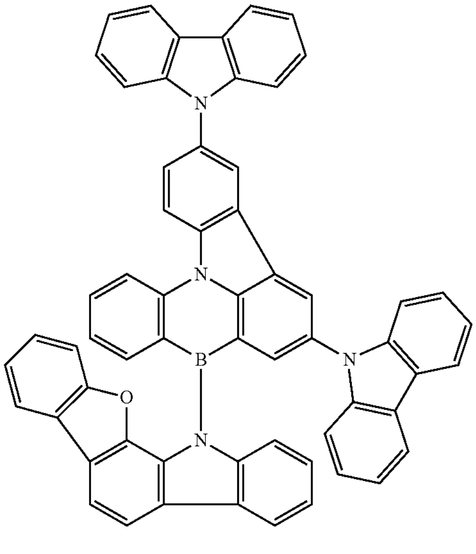
-continued
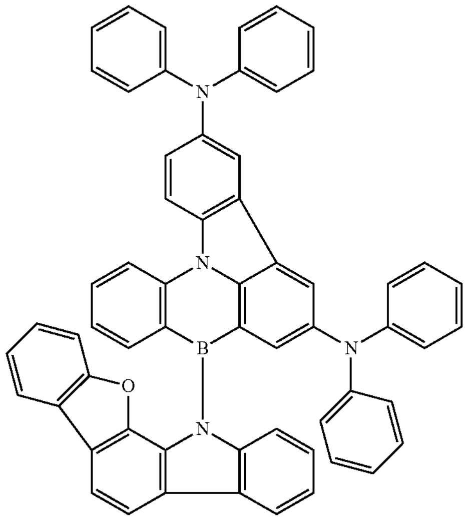
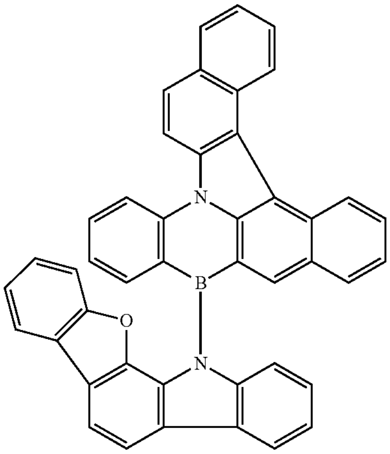
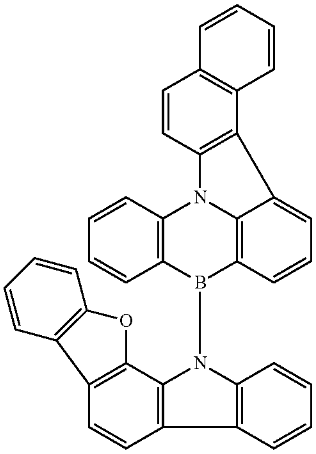

-continued
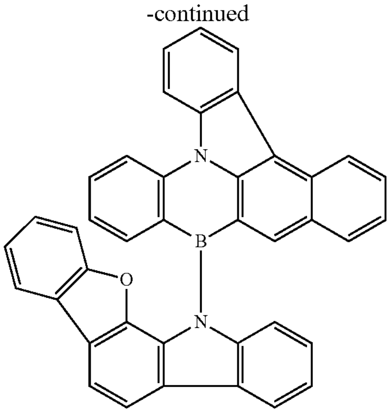
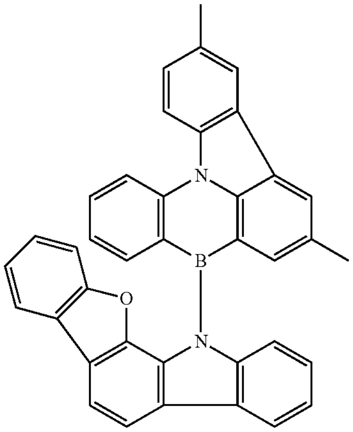
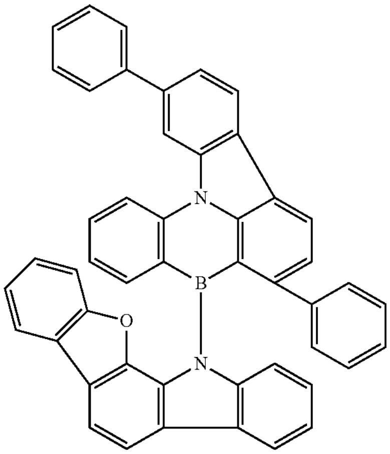
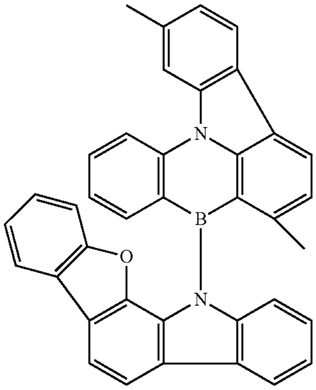
-continued
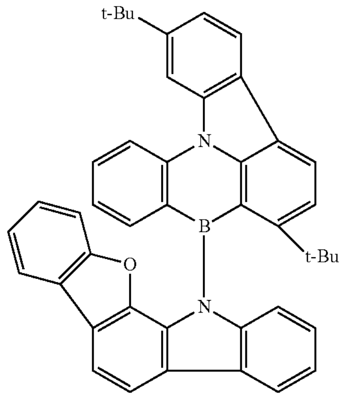
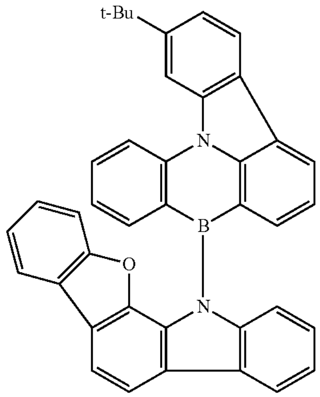
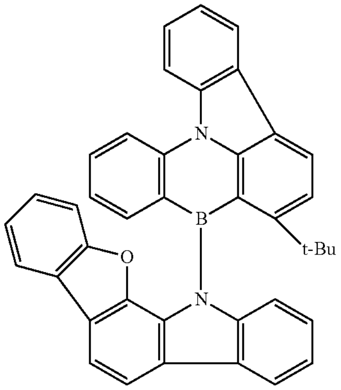
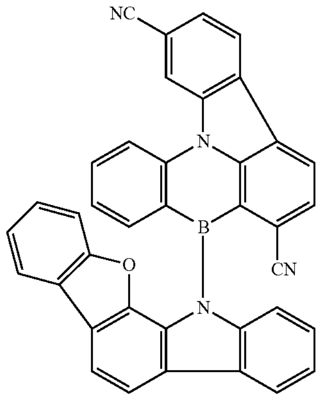

-continued
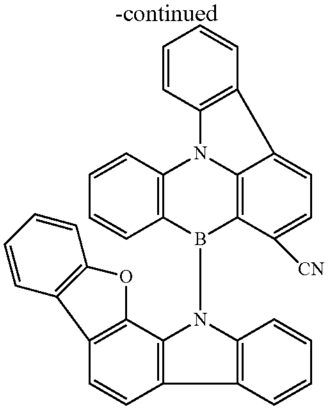
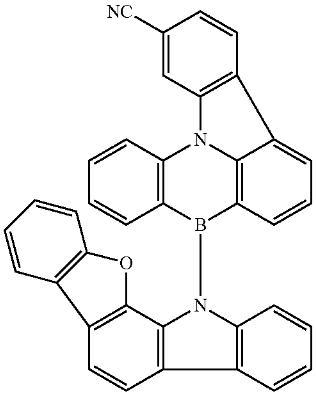
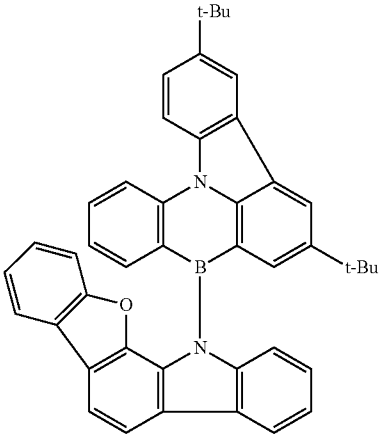
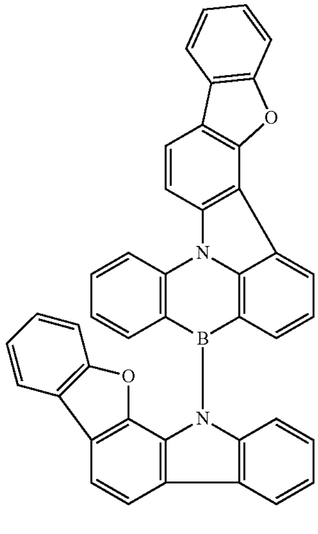
-continued
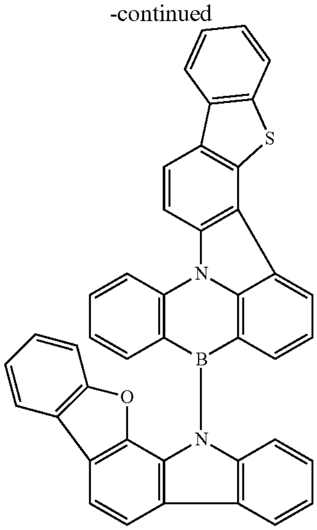
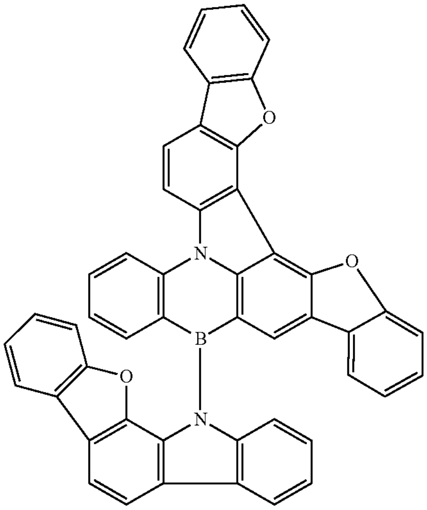
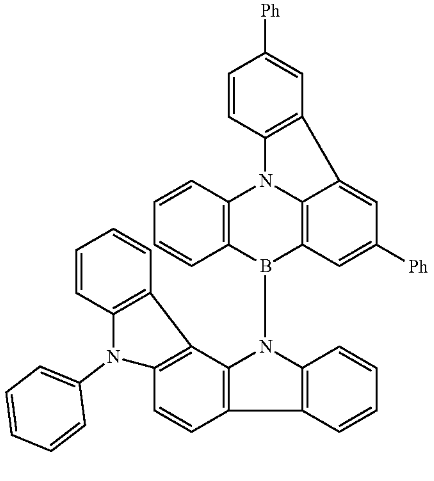

-continued
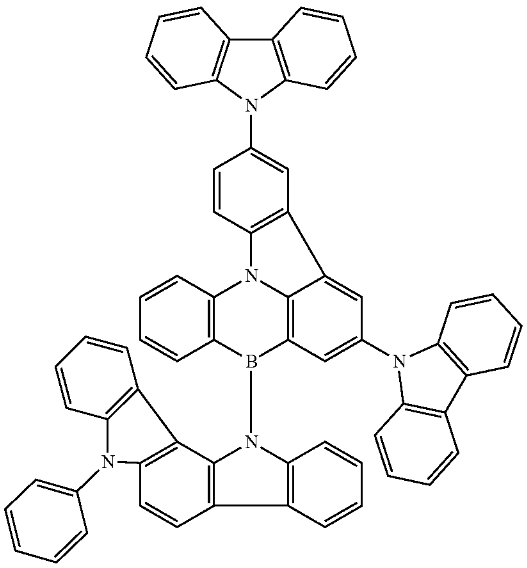
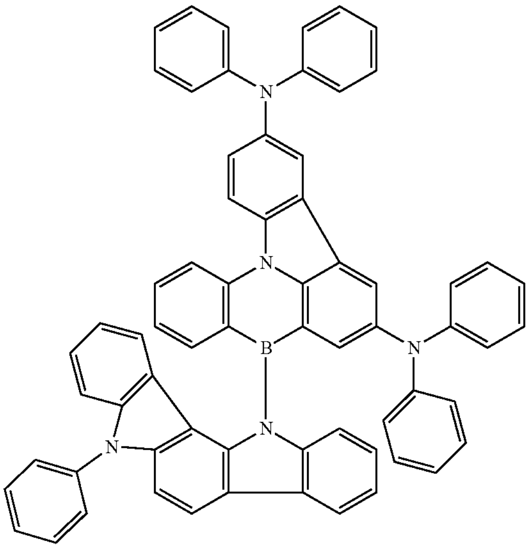
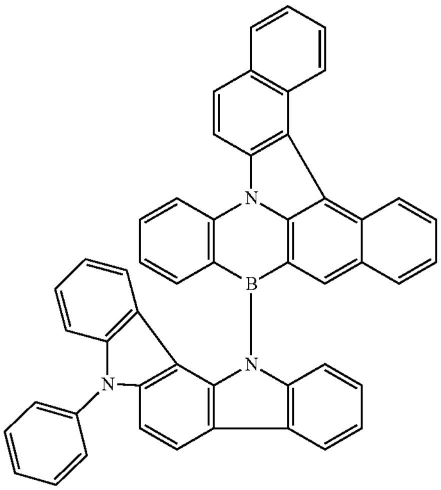
-continued
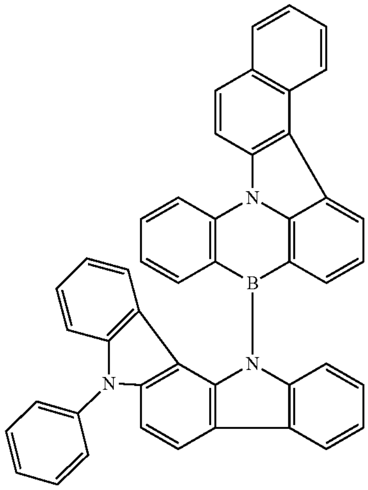
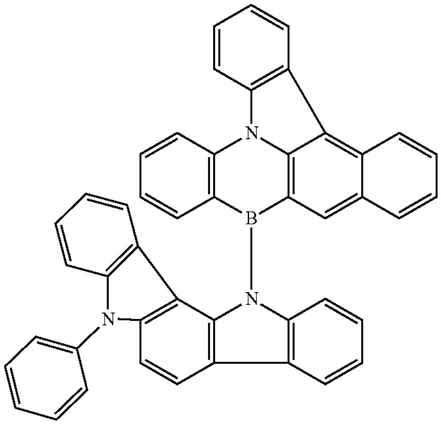
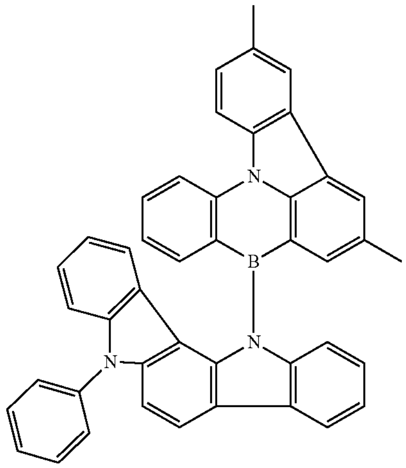

-continued
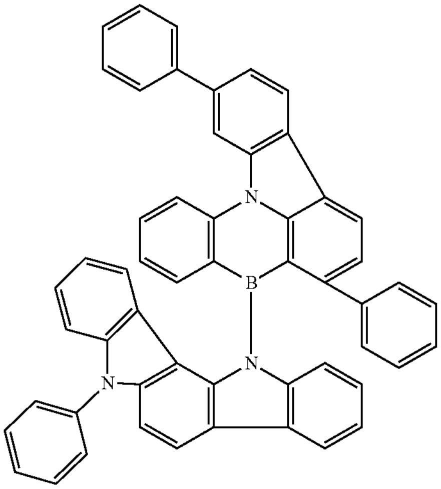
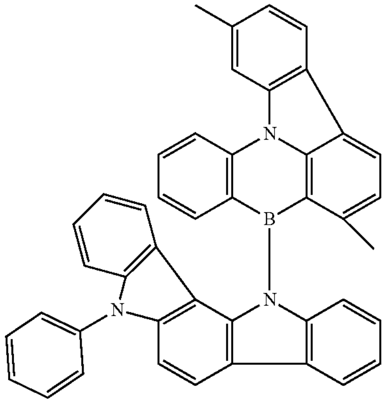
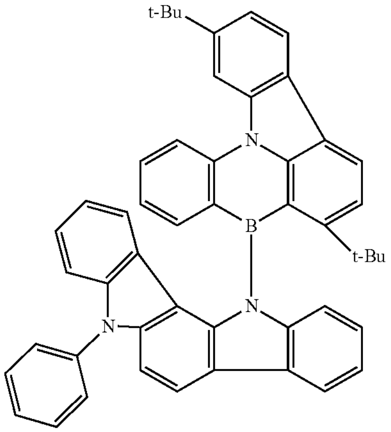
-continued
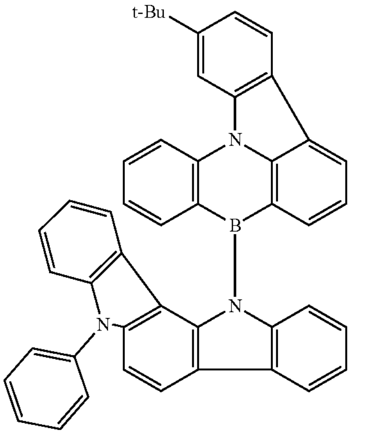
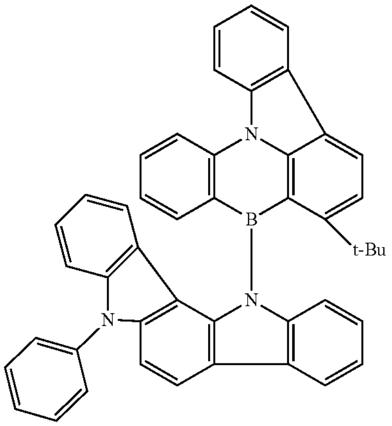
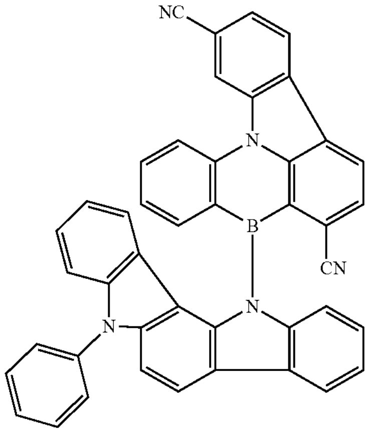
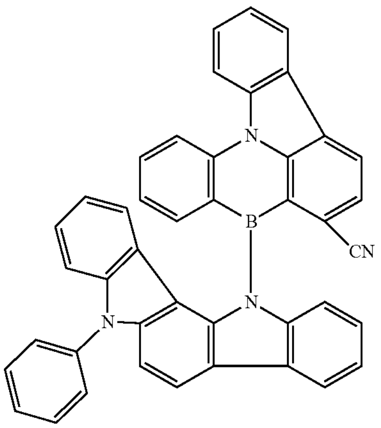

-continued
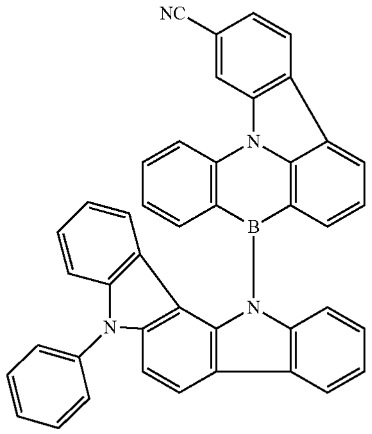
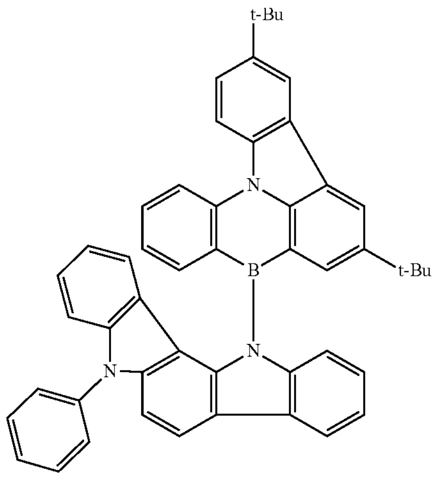
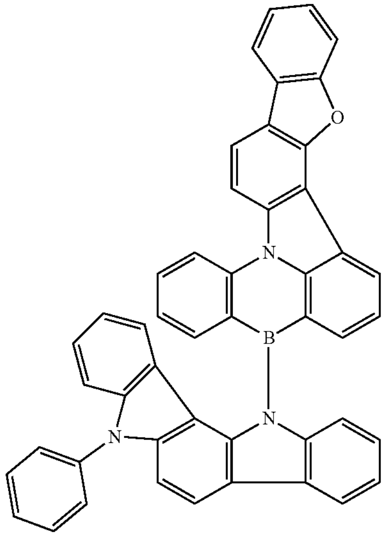
-continued
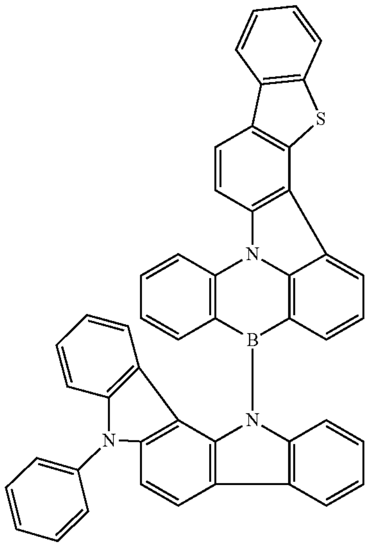
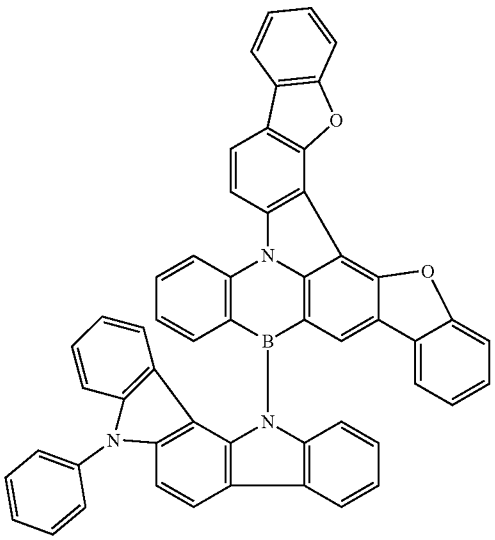
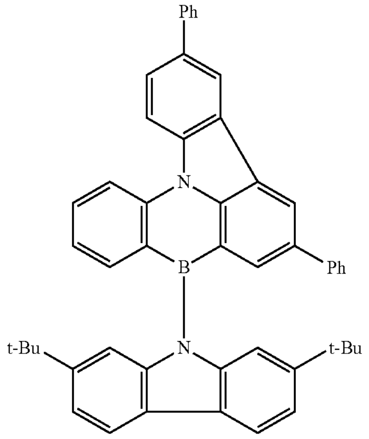

-continued
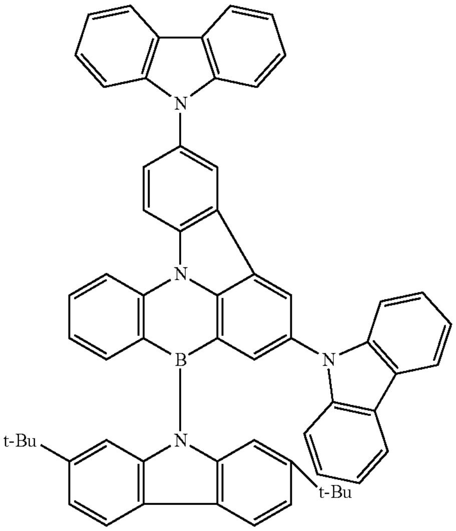
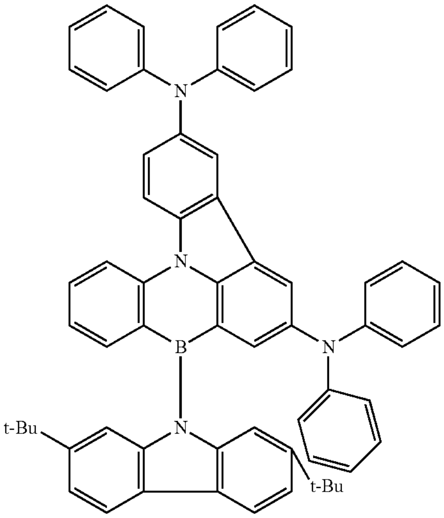
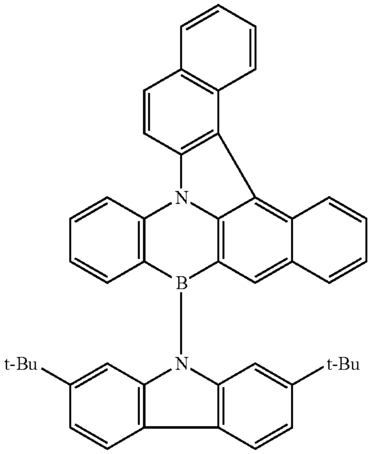
-continued
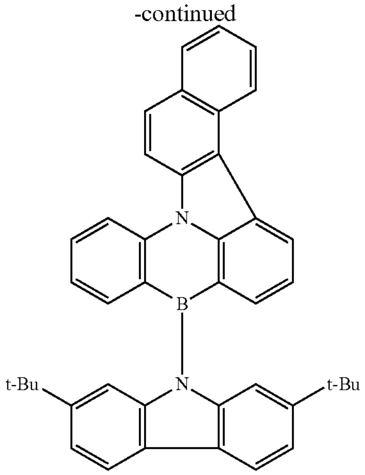
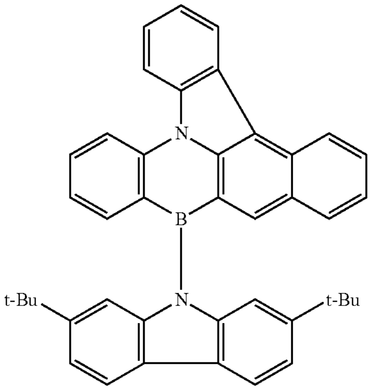
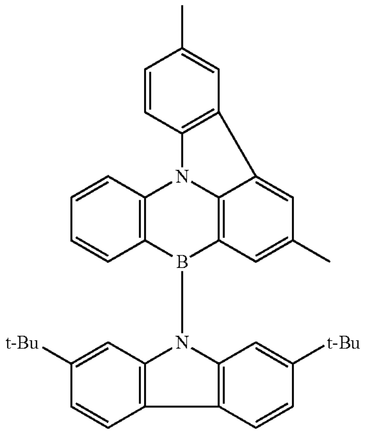
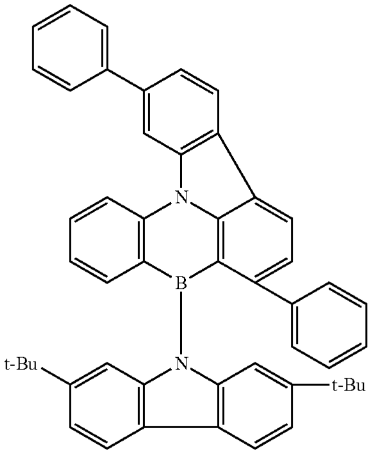

-continued
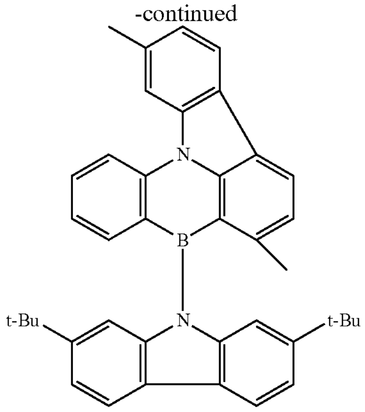
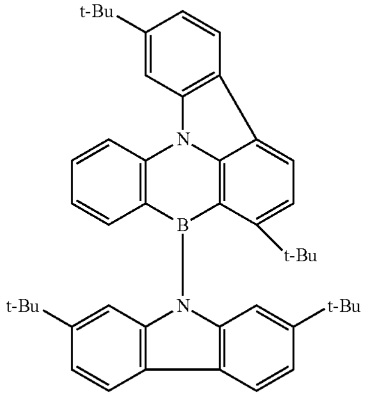
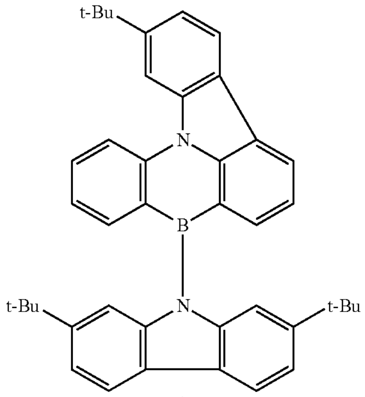
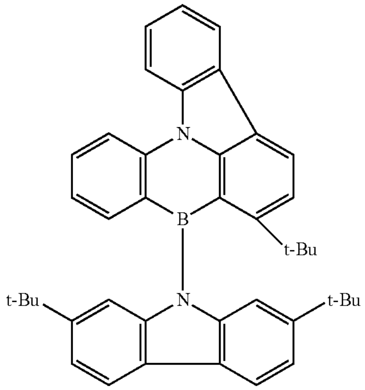
-continued
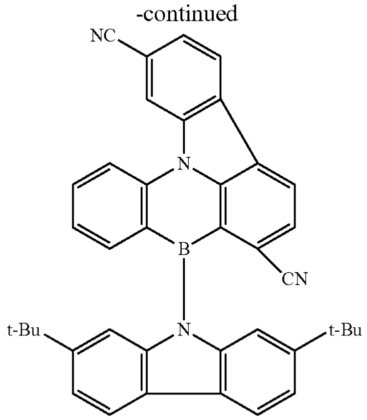
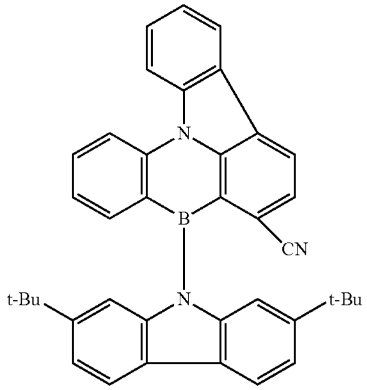
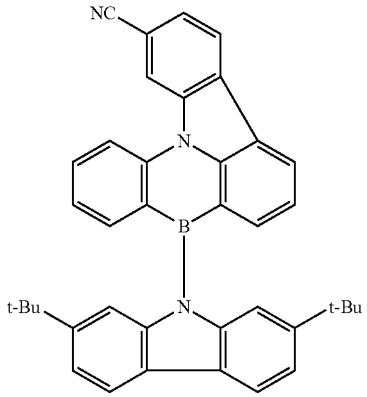
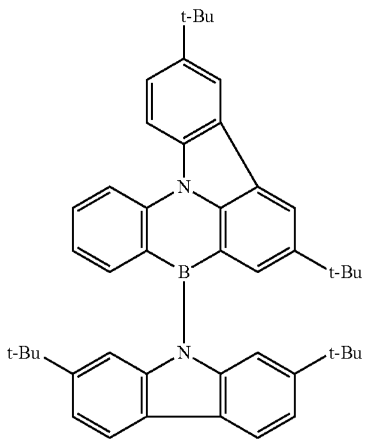

-continued
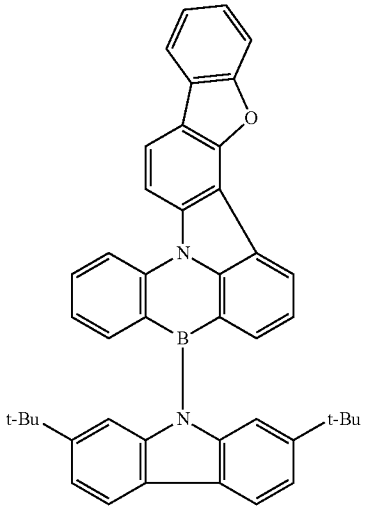
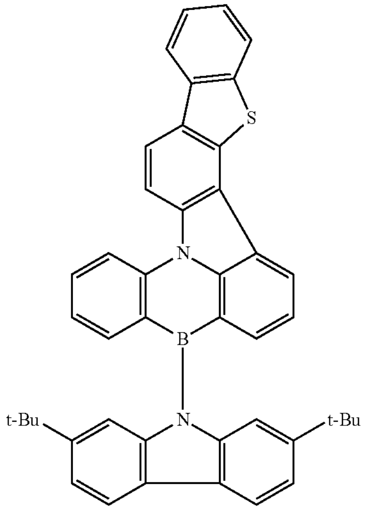
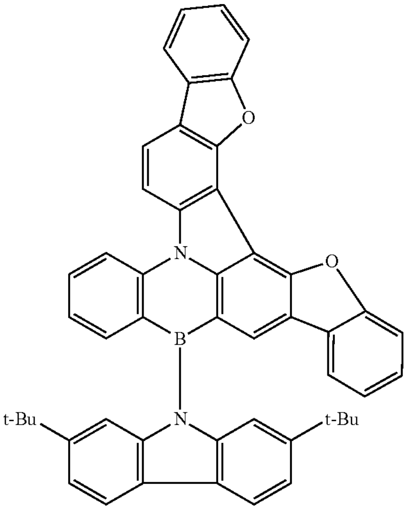
-continued
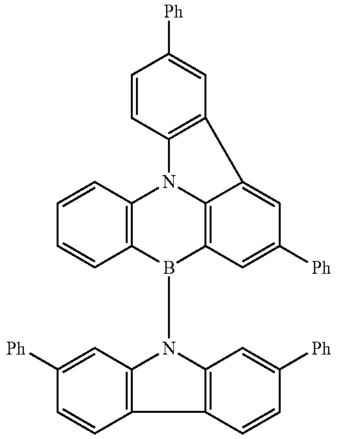
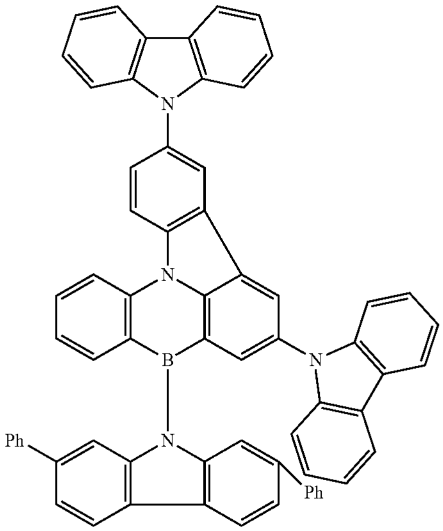
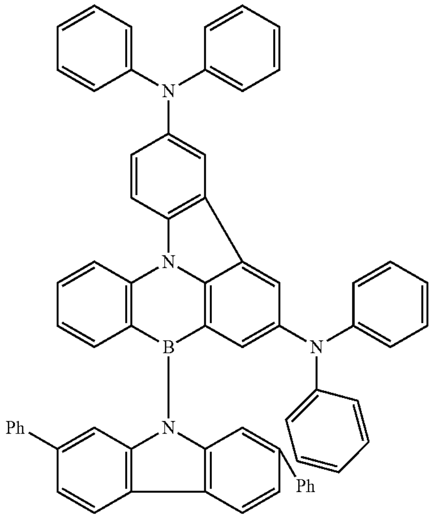

-continued
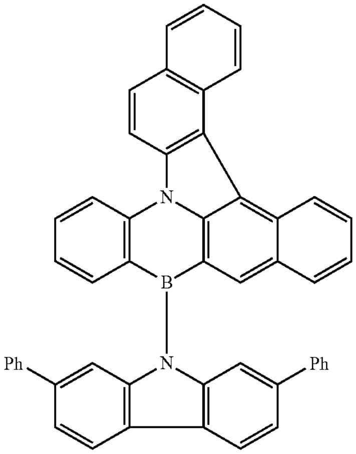
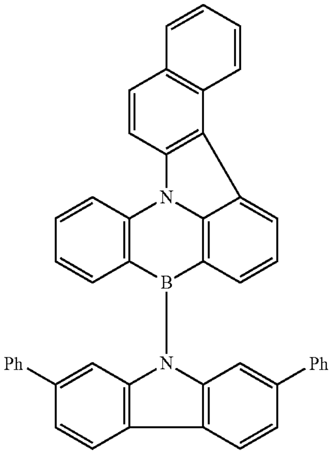
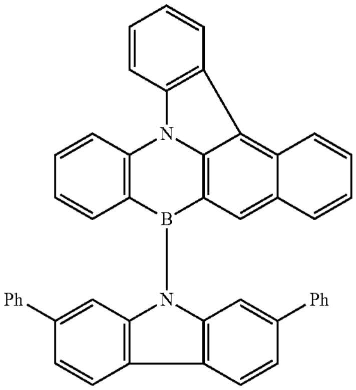
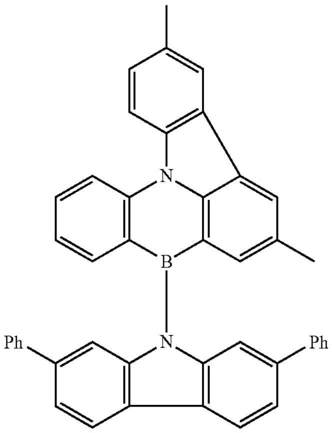
-continued
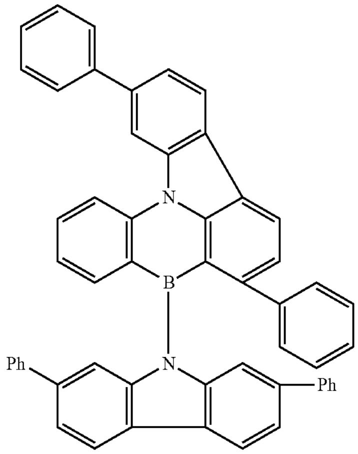
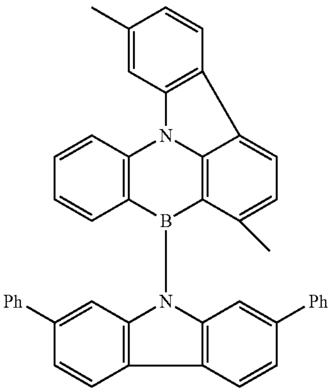
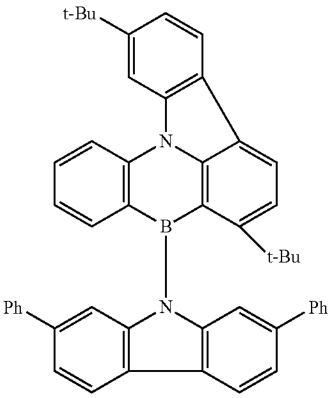
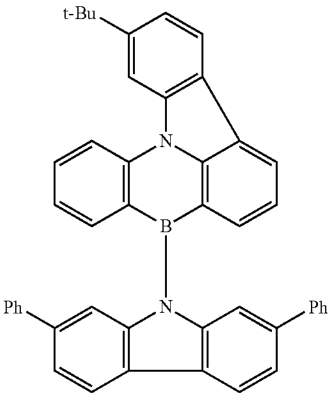

-continued
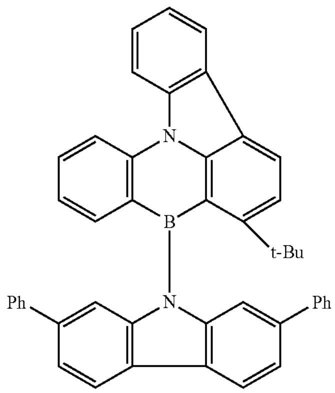
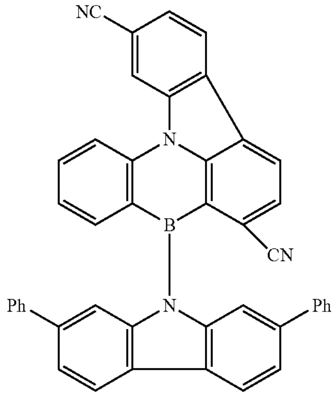
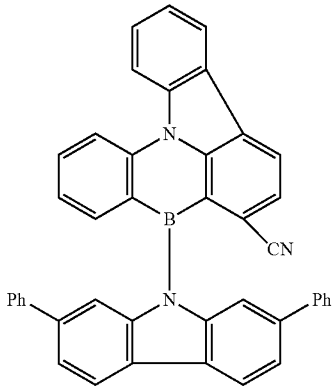
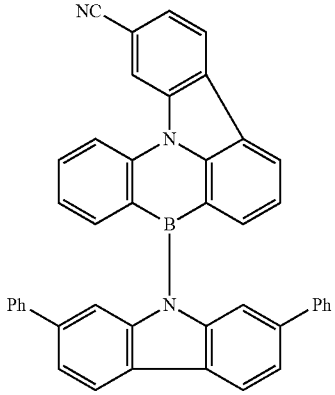
-continued
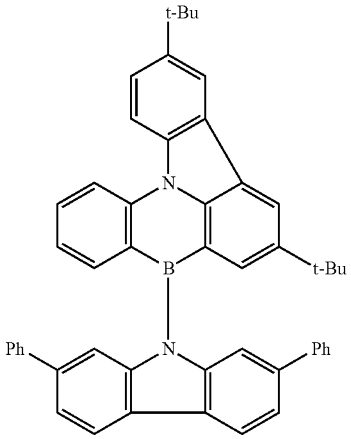
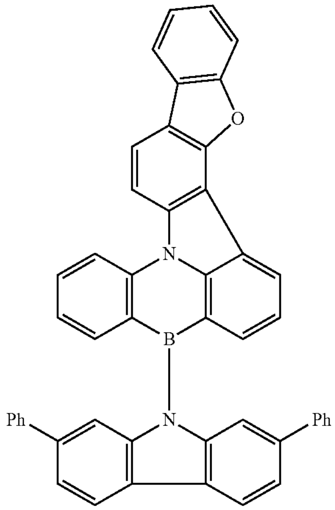
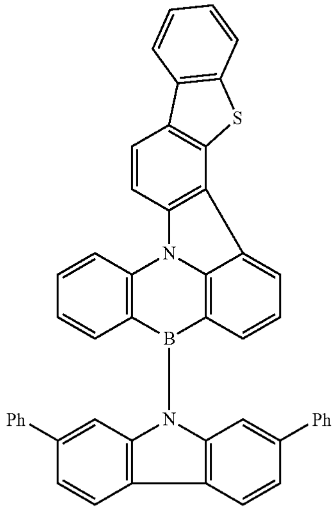

-continued

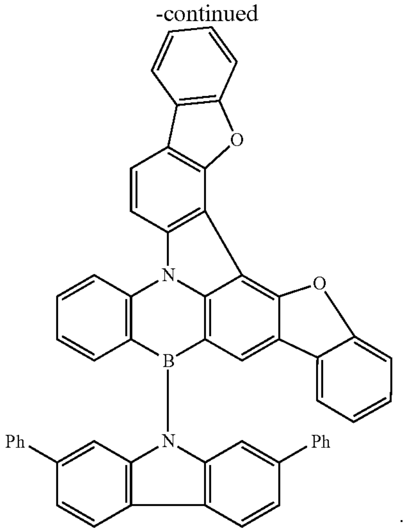

What is claimed is:

1. An organic molecule, comprising a structure represented by Formula I:

Formula I

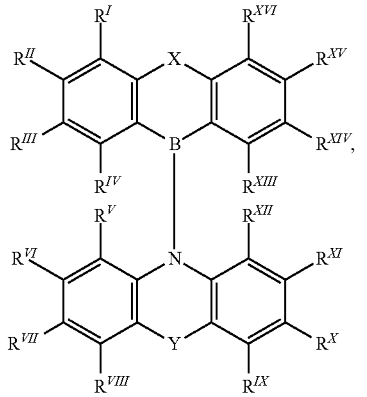

wherein in Formula I,

X is selected from the group consisting of a direct bond, $NR^1$, O, S, $SiR^1R^2$ and $CR^1R^2$;

Y is selected from the group consisting of a direct bond, $NR^3$, O, S, $SiR^3R^4$ and $CR^3R^4$;

$R^1$, $R^2$, $R^3$, and $R^4$ are at each occurrence independently selected from the group consisting of:

hydrogen, deuterium, $N(R')_2$, $OR^5$, $SR^5$, $Si(R^5)_3$, $B(OR^5)_2$, $OSO_2R^5$, $CF_3$,

CN, halogen, $C_1$-$C_{40}$-alkyl, which is optionally substituted with one or more substituents $R^5$ and wherein one or more non-adjacent $CH_2$-groups are optionally substituted by $R^5C{=}CR^5$, C≡C, $Si(R^5)_2$, $Ge(R^5)_2$, $Sn(R^5)_2$, C═O, C═S, C═Se, $C{=}NR^5$, $P({=}O)(R^5)$, SO, $SO_2$, $NR^5$, O, S or $CONR^5$, $C_1$-$C_{40}$-alkoxy, which is optionally substituted with one or more substituents $R^5$ and wherein one or more non-adjacent $CH_2$-groups are optionally substituted by $R^5C{=}CR^5$, C≡C, $Si(R^5)_2$, $Ge(R^5)_2$, $Sn(R^5)_2$, C═O, C═S, C═Se, $C{=}NR^5$, $P({=}O)(R^5)$, SO, $SO_2$, $NR^5$, O, S or $CONR^5$, $C_1$-$C_{40}$-thioalkoxy, which is optionally substituted with one or more substituents $R^5$ and wherein one or more non-adjacent $CH_2$-groups are optionally substituted by $R^5C{=}CR^5$, C≡C, $Si(R^5)_2$, $Ge(R^5)_2$, $Sn(R^5)_2$, C═O, C═S, C═Se, $C{=}NR^5$, $P({=}O)(R^5)$, SO, $SO_2$, $NR^5$, O, S or $CONR^5$, $C_2$-$C_{40}$-alkenyl, which is optionally substituted with one or more substituents $R^5$ and wherein one or more non-adjacent $CH_2$-groups are optionally substituted by $R^5C{=}CR^5$, C≡C, $Si(R^5)_2$, $Ge(R^5)_2$, $Sn(R^5)_2$, C═O, C═S, C═Se, $C{=}NR^5$, $P({=}O)(R^5)$, SO, $SO_2$, $NR^5$, O, S or $CONR^5$, $C_2$-$C_{40}$-alkynyl, which is optionally substituted with one or more substituents $R^5$ and wherein one or more non-adjacent $CH_2$-groups are optionally substituted by $R^5C{=}CR^5$, C≡C, $Si(R^5)_2$, $Ge(R^5)_2$, $Sn(R^5)_2$, C═O, C═S, C═Se, $C{=}NR^5$, $P({=}O)(R^5)$, SO, $SO_2$, $NR^5$, O, S or $CONR^5$, $C_6$-$C_{60}$-aryl, which is optionally substituted with one or more substituents $R^5$, and $C_3$-$C_{57}$-heteroaryl, which is optionally substituted with one or more substituents $R^5$, wherein adjacent groups $R^5$ are optionally bonded to each other to form an aryl or heteroaryl ring, which is optionally substituted with one or more $C_1$-$C_5$-alkyl substituents, deuterium, halogen, CN or $CF_3$;

wherein X and Y do not both represent a direct bond;

$R^5$ is at each occurrence independently from one another selected from the group consisting of:

hydrogen, deuterium, $N(R^6)_2$, $OR^6$, $SR^6$, $Si(R^6)_3$, $B(OR^6)_2$, $OSO_2R^6$, $CF_3$,

CN, halogen, $C_1$-$C_{40}$-alkyl, which is optionally substituted with one or more substituents $R^6$ and wherein one or more non-adjacent $CH_2$-groups are optionally substituted by $R^6C{=}CR^6$, C≡C, $Si(R^6)_2$, $Ge(R^6)_2$, $Sn(R^6)_2$, C═O, C═S, C═Se, $C{=}NR^6$, $P({=}O)(R^6)$, SO, $SO_2$, $NR^6$, O, S or $CONR^6$, $C_1$-$C_{40}$-alkoxy, which is optionally substituted with one or more substituents $R^6$ and wherein one or more non-adjacent $CH_2$-groups are optionally substituted by $R^6C{=}CR^6$, C≡C, $Si(R^6)_2$, $Ge(R^6)_2$, $Sn(R^6)_2$, C═O, C═S, C═Se, $C{=}NR^6$, $P({=}O)(R^6)$, SO, $SO_2$, $NR^6$, O, S or $CONR^6$, $C_1$-$C_{40}$-thioalkoxy, which is optionally substituted with one or more substituents $R^6$ and wherein one or more non-adjacent $CH_2$-groups are optionally substituted by $R^6C{=}CR^6$, C≡C, $Si(R^6)_2$, $Ge(R^6)_2$, $Sn(R^6)_2$, C═O, C═S, C═Se, $C{=}NR^6$, $P({=}O)(R^6)$, SO, $SO_2$, $NR^6$, O, S or $CONR^6$, $C_2$-$C_{40}$-alkenyl, which is optionally substituted with one or more substituents $R^6$ and wherein one or more non-adjacent $CH_2$-groups are optionally substituted by $R^6C{=}CR^6$, C≡C, $Si(R^6)_2$, $Ge(R^6)_2$, $Sn(R^6)_2$, C=O, C=S, C=Se, C=$NR^6$, P(=O)($R^6$), SO, $SO_2$, $NR^6$, O, S or $CONR^6$, $C_2$-$C_{40}$-alkynyl, which is optionally substituted with one or more substituents $R^6$ and wherein one or more non-adjacent $CH_2$-groups are optionally substituted by $R^6C{=}CR^6$, C≡C, $Si(R^6)_2$, $Ge(R^6)_2$, $Sn(R^6)_2$, C=O, C=S, C=Se, C=$NR^6$, P(=O)($R^6$), SO, $SO_2$, $NR^6$, O, S or $CONR^6$, $C_6$-$C_{60}$-aryl, which is optionally substituted with one or more substituents $R^6$, and $C_3$-$C_{57}$-heteroaryl, which is optionally substituted with one or more substituents $R^6$;

wherein adjacent groups $R^6$ are optionally bonded to each other and form an aryl or heteroaryl ring, which is optionally substituted with one or more $C_1$-$C_5$-alkyl substituents, deuterium, halogen, CN or $CF_3$;

$R^6$ is at each occurrence independently from one another selected from the group consisting of:

hydrogen, deuterium, halogen, OPh, SPh, $CF_3$, CN, $Si(C_1$-$C_5$-alkyl$)_3$, $Si(Ph)_3$, $C_1$-$C_5$-alkyl, wherein optionally one or more hydrogen atoms are each independently substituted by deuterium, halogen, CN, or $CF_3$, $C_1$-$C_5$-alkoxy, wherein optionally one or more hydrogen atoms are each independently substituted by deuterium, halogen, CN, or $CF_3$, $C_1$-$C_5$-thioalkoxy, wherein optionally one or more hydrogen atoms are each independently substituted by deuterium, halogen, CN, or $CF_3$, $C_2$-$C_5$-alkenyl, wherein optionally one or more hydrogen atoms are each independently substituted by deuterium, halogen, CN, or $CF_3$, $C_2$-$C_5$-alkynyl, wherein optionally one or more hydrogen atoms are each independently substituted by deuterium, halogen, CN, or $CF_3$, $C_6$-$C_{18}$-aryl, which is optionally substituted with one or more $C_1$-$C_5$-alkyl substituents, $C_3$-$C_{17}$-heteroaryl, which is optionally substituted with one or more $C_1$-$C_5$-alkyl substituents, $N(C_6$-$C_{18}$-aryl$)_2$, $N(C_3$-$C_{17}$-heteroaryl$)_2$, and $N(C_3$-$C_{17}$-heteroaryl$)(C_6$-$C_{18}$-aryl), $R^I$, $R^{II}$, $R^{III}$, $R^{IV}$, $R^V$, $R^{VI}$, $R^{VII}$, $R^{VIII}$, $R^{IX}$, $R^X$, $R^{XI}$, $R^{XII}$, $R^{XIII}$, $R^{XIV}$, $R^{XV}$, and $R^{XVI}$ are each independently selected from the group consisting of:

hydrogen, deuterium, $N(R^7)_2$, $OR^7$, $SR^7$, $Si(R^7)_3$, $B(OR^7)_2$, $OSO_2R^7$, $CF_3$,

CN, halogen, $C_1$-$C_{40}$-alkyl, which is optionally substituted with one or more substituents $R^7$ and wherein one or more non-adjacent $CH_2$-groups are optionally substituted by $R^7C{=}CR^7$, C≡C, $Si(R^7)_2$, $Ge(R^7)_2$, $Sn(R^7)_2$, C=O, C=S, C=Se, C=$NR^7$, P(=O)($R^7$), SO, $SO_2$, NR', O, S or $CONR^7$, $C_1$-$C_{40}$-alkoxy, which is optionally substituted with one or more substituents $R^7$ and wherein one or more non-adjacent $CH_2$-groups are optionally substituted by $R^7C{=}CR^7$, C≡C, $Si(R^7)_2$, $Ge(R^7)_2$, $Sn(R^7)_2$, C=O, C=S, C=Se, C=$NR^7$, P(=O)($R^7$), SO, $SO_2$, NR', O, S or $CONR^7$, $C_1$-$C_{40}$-thioalkoxy, which is optionally substituted with one or more substituents $R^7$ and wherein one or more non-adjacent $CH_2$-groups are optionally substituted by $R^7C{=}CR^7$, C≡C, $Si(R^7)_2$, $Ge(R^7)_2$, $Sn(R^7)_2$, C=O, C=S, C=Se, C=$NR^7$, P(=O)($R^7$), SO, $SO_2$, $NR^7$, O, S or $CONR^7$, $C_2$-$C_{40}$-alkenyl, which is optionally substituted with one or more substituents $R^7$ and wherein one or more non-adjacent $CH_2$-groups are optionally substituted by $R^7C{=}CR^7$, C≡C, $Si(R^7)_2$, $Ge(R^7)_2$, $Sn(R^7)_2$, C=O, C=S, C=Se, C=$NR^7$, P(=O)($R^7$), SO, $SO_2$, $NR^7$, O, S or $CONR^7$, $C_2$-$C_{40}$-alkynyl, which is optionally substituted with one or more substituents $R^7$ and wherein one or more non-adjacent $CH_2$-groups are optionally substituted by $R^7C{=}CR^7$, C≡C, $Si(R^7)_2$, $Ge(R^7)_2$, $Sn(R^7)_2$, C=O, C=S, C=Se, C=$NR^7$, P(=O)($R^7$), SO, $SO_2$, NR', O, S or $CONR^7$, $C_6$-$C_{60}$-aryl, which is optionally substituted with one or more substituents $R^7$, and $C_3$-$C_{57}$-heteroaryl, which is optionally substituted with one or more substituents $R^7$ wherein adjacent groups $R^I$ to $R^{IV}$ are optionally bonded to each other and form an aryl or heteroaryl ring, which is optionally substituted with one or more $C_1$-$C_5$-alkyl substituents, deuterium, halogen, CN or $CF_3$;

wherein adjacent groups $R^V$ to $R^{VIII}$ are optionally bonded to each other and form an aryl or heteroaryl ring, which is optionally substituted with one or more $C_1$-$C_5$-alkyl substituents, deuterium, halogen, CN or $CF_3$;

wherein adjacent groups $R^{IX}$ to $R^{XIII}$ are optionally bonded to each other and form an aryl or heteroaryl ring, which is optionally substituted with one or more $C_1$-$C_5$-alkyl substituents, deuterium, halogen, CN or $CF_3$;

wherein adjacent groups $R^{XIII}$ to $R^{XVI}$ are optionally bonded to each other and form an aryl or heteroaryl ring, which is optionally substituted with one or more $C_1$-$C_5$-alkyl substituents, deuterium, halogen, CN or $CF_3$;

$R^7$ is selected from the group consisting of:

hydrogen, deuterium, $N(R^8)_2$, $OR^8$, $SR^8$, $Si(R^8)_3$, $B(OR^8)_2$, $OSO_2R^8$, $CF_3$,

CN, halogen, $C_1$-$C_{40}$-alkyl, which is optionally substituted with one or more substituents $R^8$ and wherein one or more non-adjacent $CH_2$-groups are optionally substituted by $R^8C{=}CR^8$, C≡C, $Si(R^8)_2$, $Ge(R^8)_2$, $Sn(R^8)_2$, C=O, C=S, C=Se, C=$NR^8$, P(=O)($R^8$), SO, $SO_2$, $NR^B$, O, S or $CONR^8$, $C_1$-$C_{40}$-alkoxy, which is optionally substituted with one or more substituents $R^8$ and wherein one or more non-adjacent $CH_2$-groups are optionally substituted by $R^8C{=}CR^8$, $C\equiv C$, $Si(R^8)_2$, $Ge(R^8)_2$, $Sn(R^8)_2$, $C{=}O$, $C{=}S$, $C{=}Se$, $C{=}NR^B$, $P({=}O)(R^8)$, SO, $SO_2$, $NR^B$, O, S or $CONR^8$, $C_1$-$C_{40}$-thioalkoxy, which is optionally substituted with one or more substituents $R^8$ and wherein one or more non-adjacent $CH_2$-groups are optionally substituted by $R^8C{=}CR^8$, $C\equiv C$, $Si(R^8)_2$, $Ge(R^8)_2$, $Sn(R^8)_2$, $C{=}O$, $C{=}S$, $C{=}Se$, $C{=}NR^8$, $P({=}O)(R^8)$, SO, $SO_2$, $NR^8$, O, S or $CONR^8$, $C_2$-$C_{40}$-alkenyl, which is optionally substituted with one or more substituents $R^8$ and wherein one or more non-adjacent $CH_2$-groups are optionally substituted by $R^8C{=}CR^8$, $C\equiv C$, $Si(R^8)_2$, $Ge(R^8)_2$, $Sn(R^8)_2$, $C{=}O$, $C{=}S$, $C{=}Se$, $C{=}NR^8$, $P({=}O)(R^8)$, SO, $SO_2$, $NR^8$, O, S or $CONR^8$, $C_2$-$C_{40}$-alkynyl, which is optionally substituted with one or more substituents $R^8$ and wherein one or more non-adjacent $CH_2$-groups are optionally substituted by $R^8C{=}CR^8$, $C\equiv C$, $Si(R^8)_2$, $Ge(R^8)_2$, $Sn(R^8)_2$, $C{=}O$, $C{=}S$, $C{=}Se$, $C{=}NR^8$, $P({=}O)(R^8)$, SO, $SO_2$, $NR^8$, O, S or $CONR^8$, $C_6$-$C_{60}$-aryl, which is optionally substituted with one or more substituents $R^8$; and $C_3$-$C_{57}$-heteroaryl, which is optionally substituted with one or more substituents $R^8$;

$R^8$ is at each occurrence independently selected from the group consisting of:

hydrogen, deuterium, halogen, OPh, SPh, $CF_3$, CN, $Si(C_1$-$C_5$-alkyl$)_3$, $Si(Ph)_3$, $C_1$-$C_5$-alkyl, wherein optionally one or more hydrogen atoms thereof are each independently substituted by deuterium, halogen, CN, or $CF_3$, $C_1$-$C_5$-alkoxy, wherein optionally one or more hydrogen atoms thereof are each independently substituted by deuterium, halogen, CN, or $CF_3$, $C_1$-$C_5$-thioalkoxy, wherein optionally one or more hydrogen atoms thereof are each independently substituted by deuterium, halogen, CN or $CF_3$, $C_2$-$C_5$-alkenyl, wherein optionally one or more hydrogen atoms thereof are each independently substituted by deuterium, halogen, CN, or $CF_3$, $C_2$-$C_5$-alkynyl, wherein optionally one or more hydrogen atoms thereof are each independently substituted by deuterium, halogen, CN, or $CF_3$, $C_6$-$C_{18}$-aryl, which is optionally substituted with one or more $C_1$-$C_5$-alkyl substituents, $C_3$-$C_{17}$-heteroaryl, which is optionally substituted with one or more $C_1$-$C_5$-alkyl substituents, $N(C_6$-$C_{18}$-aryl$)_2$, $N(C_3$-$C_{17}$-heteroaryl$)_2$, and $N(C_3$-$C_{17}$-heteroaryl$)(C_6$-$C_{18}$-aryl);

wherein the substituents $R^1$, $R^2$, $R^{XIII}$, $R^{XIV}$, $R^{XV}$, or $R^{XVI}$ independently from each other optionally form a mono- or polycyclic, aliphatic, aromatic and/or benzo-fused ring system with one or more substituents selected from the group consisting of $R^1$, $R^2$, $R^{XIII}$, $R^{XIV}$, $R^{XV}$, and $R^{XVI}$; and wherein the substituents $R^3$, $R^4$, $R^{IX}$, $R^X$, $R^{XI}$, or $R^{XII}$ independently from each other optionally form a mono- or polycyclic, aliphatic, aromatic and/or benzo-fused ring system with one or more substituents selected from the group consisting of $R^3$, $R^4$, $R^{IX}$, $R^X$, $R^{XI}$, and $R^{XII}$, provided that when Y is $CR^3R^4$, $R^3$ and $R^4$ do not combine with each other to form a mono- or polycyclic, aliphatic, aromatic and/or benzo-fused ring system.

2. An organic molecule, comprising a structure represented by Formula Ia:

Formula Ia

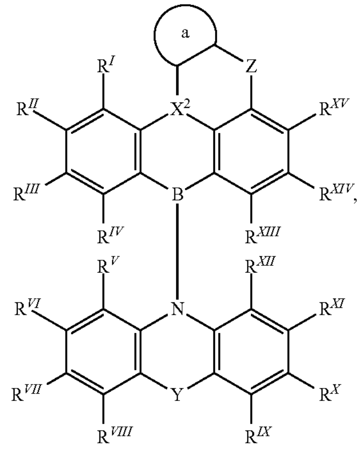

wherein in Formula Ia, $X^2$ is selected from the group consisting of N, $SiR^2$ and $C{-}R^2$;

ring a represents:

a $C_6$-$C_{18}$-aryl ring, wherein optionally one or more hydrogen atoms thereof are each independently substituted by $R^5$; or a $C_3$-$C_7$-heteroaryl ring, wherein optionally one or more hydrogen atoms thereof are each independently substituted by $R^5$, and Z is selected from the group consisting of a direct bond, $NR^7$, O, S, $Si(R^7)_2$ and $C(R^7)_2$, Y is selected from the group consisting of a direct bond, $NR^3$, O, S, $SiR^3R^4$ and $CR^3R^4$;

$R^2$, $R^3$, and $R^4$ are at each occurrence independently selected from the group consisting of:

hydrogen, deuterium, $N(R^5)_2$, $OR^5$, $SR^5$, $Si(R^5)_3$, $B(OR^5)_2$, $OSO_2R^5$, $CF_3$,

CN, halogen, $C_1$-$C_{40}$-alkyl, which is optionally substituted with one or more substituents $R^5$ and wherein one or more non-adjacent $CH_2$-groups are optionally substituted by $R^5C{=}CR^5$, $C\equiv C$, $Si(R^5)_2$, $Ge(R^5)_2$, $Sn(R^5)_2$, $C{=}O$, $C{=}S$, $C{=}Se$, $C{=}NR^5$, $P({=}O)(R^5)$, SO, $SO_2$, $NR^5$, O, S or $CONR^5$, $C_1$-$C_{40}$-alkoxy, which is optionally substituted with one or more substituents $R^5$ and wherein one or more non-adjacent $CH_2$-groups are optionally substituted by $R^5C{=}CR^5$, $C\equiv C$, $Si(R^5)_2$, $Ge(R^5)_2$, $Sn(R^5)_2$, $C{=}O$, $C{=}S$, $C{=}Se$, $C{=}NR^5$, $P({=}O)(R^5)$, SO, $SO_2$, $NR^5$, O, S or $CONR^5$, $C_1$-$C_{40}$-thioalkoxy, which is optionally substituted with one or more substituents $R^5$ and wherein one or more non-adjacent $CH_2$-groups are optionally substituted by $R^5C{=}CR^5$, $C\equiv C$, $Si(R^5)_2$, $Ge(R^5)_2$, $Sn(R^5)_2$, $C{=}O$, $C{=}S$, $C{=}Se$, $C{=}NR^5$, $P({=}O)(R^5)$, SO, $SO_2$, NR, O, S or $CONR^5$, $C_2$-$C_{40}$-alkenyl, which is optionally substituted with one or more substituents $R^5$ and wherein one or more non-adjacent $CH_2$-groups are optionally substituted by $R^5C{=}CR^5$, C≡C, $Si(R^5)_2$, $Ge(R^5)_2$, $Sn(R^5)_2$, C=O, C=S, C=Se, $C{=}NR^5$, $P({=}O)(R^5)$, SO, $SO_2$, $NR^5$, O, S or $CONR^5$, $C_2$-$C_{40}$-alkynyl, which is optionally substituted with one or more substituents $R^5$ and wherein one or more non-adjacent $CH_2$-groups are optionally substituted by $R^5C{=}CR^5$, C≡C, $Si(R^5)_2$, $Ge(R^5)_2$, $Sn(R^5)_2$, C=O, C=S, C=Se, $C{=}NR^5$, $P({=}O)(R^5)$, SO, $SO_2$, $NR^5$, O, S or $CONR^5$, $C_6$-$C_{60}$-aryl, which is optionally substituted with one or more substituents $R^5$, and $C_3$-$C_{57}$-heteroaryl, which is optionally substituted with one or more substituents $R^5$;

wherein adjacent groups $R^5$ are optionally bonded to each other to form an aryl or heteroaryl ring, which is optionally substituted with one or more $C_1$-$C_5$-alkyl substituents, deuterium, halogen, CN or $CF_3$;

$R^5$ is at each occurrence independently from one another selected from the group consisting of:

hydrogen, deuterium, $N(R^6)_2$, $OR^6$, $SR^6$, $Si(R^6)_3$, $B(OR^6)_2$, $OSO_2R^6$, $CF_3$,

CN, halogen, $C_1$-$C_{40}$-alkyl, which is optionally substituted with one or more substituents $R^6$ and wherein one or more non-adjacent $CH_2$-groups are optionally substituted by $R^6C{=}CR^6$, C≡C, $Si(R^6)_2$, $Ge(R^6)_2$, $Sn(R^6)_2$, C=O, C=S, C=Se, $C{=}NR^6$, $P({=}O)(R^6)$, SO, $SO_2$, $NR^6$, O, S or $CONR^6$, $C_1$-$C_{40}$-alkoxy, which is optionally substituted with one or more substituents $R^6$ and wherein one or more non-adjacent $CH_2$-groups are optionally substituted by $R^6C{=}CR^6$, C≡C, $Si(R^6)_2$, $Ge(R^6)_2$, $Sn(R^6)_2$, C=O, C=S, C=Se, $C{=}NR^6$, $P({=}O)(R^6)$, SO, $SO_2$, $NR^6$, O, S or $CONR^6$, $C_1$-$C_{40}$-thioalkoxy, which is optionally substituted with one or more substituents $R^6$ and wherein one or more non-adjacent $CH_2$-groups are optionally substituted by $R^6C{=}CR^6$, C≡C, $Si(R^6)_2$, $Ge(R^6)_2$, $Sn(R^6)_2$, C=O, C=S, C=Se, $C{=}NR^6$, $P({=}O)(R^6)$, SO, $SO_2$, $NR^6$, O, S or $CONR^6$, $C_2$-$C_{40}$-alkenyl, which is optionally substituted with one or more substituents $R^6$ and wherein one or more non-adjacent $CH_2$-groups are optionally substituted by $R^6C{=}CR^6$, C≡C, $Si(R^6)_2$, $Ge(R^6)_2$, $Sn(R^6)_2$, C=O, C=S, C=Se, $C{=}NR^6$, $P({=}O)(R^6)$, SO, $SO_2$, $NR^6$, O, S or $CONR^6$, $C_2$-$C_{40}$-alkynyl, which is optionally substituted with one or more substituents $R^6$ and wherein one or more non-adjacent $CH_2$-groups are optionally substituted by $R^6C{=}CR^6$, C≡C, $Si(R^6)_2$, $Ge(R^6)_2$, $Sn(R^6)_2$, C=O, C=S, C=Se, $C{=}NR^6$, $P({=}O)(R^6)$, SO, $SO_2$, $NR^6$, O, S or $CONR^6$, $C_6$-$C_{60}$-aryl, which is optionally substituted with one or more substituents $R^6$, and $C_3$-$C_{57}$-heteroaryl, which is optionally substituted with one or more substituents $R^6$;

wherein adjacent groups $R^6$ are optionally bonded to each other and form an aryl or heteroaryl ring, which is optionally substituted with one or more $C_1$-$C_5$-alkyl substituents, deuterium, halogen, CN or $CF_3$;

$R^6$ is at each occurrence independently from one another selected from the group consisting of:

hydrogen, deuterium, halogen, OPh, SPh, $CF_3$, CN, $Si(C_1$-$C_5$-alkyl$)_3$, $Si(Ph)_3$, $C_1$-$C_5$-alkyl, wherein optionally one or more hydrogen atoms are each independently substituted by deuterium, halogen, CN, or $CF_3$, $C_1$-$C_5$-alkoxy, wherein optionally one or more hydrogen atoms are each independently substituted by deuterium, halogen, CN, or $CF_3$, $C_1$-$C_5$-thioalkoxy, wherein optionally one or more hydrogen atoms are each independently substituted by deuterium, halogen, CN, or $CF_3$, $C_2$-$C_5$-alkenyl, wherein optionally one or more hydrogen atoms are each independently substituted by deuterium, halogen, CN, or $CF_3$, $C_2$-$C_5$-alkynyl, wherein optionally one or more hydrogen atoms are each independently substituted by deuterium, halogen, CN, or $CF_3$, $C_6$-$C_{18}$-aryl, which is optionally substituted with one or more $C_1$-$C_5$-alkyl substituents, $C_3$-$C_{17}$-heteroaryl, which is optionally substituted with one or more $C_1$-$C_5$-alkyl substituents, $N(C_6$-$C_{18}$-aryl$)_2$, $N(C_3$-$C_{17}$-heteroaryl$)_2$, and $N(C_3$-$C_{17}$-heteroaryl$)(C_6$-$C_{18}$-aryl);

$R^I$, $R^{II}$, $R^{III}$, $R^{IV}$, $R^V$, $R^{VI}$, $R^{VII}$, $R^{VII}$, $R^{IX}$, $R^X$, $R^{XI}$, $R^{XII}$, $R^{XIII}$, $R^{XIV}$, and $R^{XV}$ are each independently selected from the group consisting of:

hydrogen, deuterium, $N(R^7)_2$, $OR^7$, $SR^7$, $Si(R^7)_3$, $B(OR^7)_2$, $OSO_2R^7$, $CF_3$,

CN, halogen, $C_1$-$C_{40}$-alkyl, which is optionally substituted with one or more substituents $R^7$ and wherein one or more non-adjacent $CH_2$-groups are optionally substituted by $R^7C{=}CR^7$, C≡C, $Si(R^7)_2$, $Ge(R^7)_2$, $Sn(R^7)_2$, C=O, C=S, C=Se, $C{=}NR^7$, $P({=}O)(R^7)$, SO, $SO_2$, $NR^7$, O, S or $CONR^7$, $C_1$-$C_{40}$-alkoxy, which is optionally substituted with one or more substituents $R^7$ and wherein one or more non-adjacent $CH_2$-groups are optionally substituted by $R^7C{=}CR^7$, C≡C, $Si(R^7)_2$, $Ge(R^7)_2$, $Sn(R^7)_2$, C=O, C=S, C=Se, $C{=}NR^7$, $P({=}O)(R^7)$, SO, $SO_2$, $NR^7$, O, S or $CONR^7$, $C_1$-$C_{40}$-thioalkoxy, which is optionally substituted with one or more substituents $R^7$ and wherein one or more non-adjacent $CH_2$-groups are optionally substituted by $R^7C{=}CR^7$, C≡C, $Si(R^7)_2$, $Ge(R^7)_2$, $Sn(R^7)_2$, C=O, C=S, C=Se, $C{=}NR^7$, $P({=}O)(R^7)$, SO, $SO_2$, $NR^7$, O, S or $CONR^7$, $C_2$-$C_{40}$-alkenyl, which is optionally substituted with one or more substituents $R^7$ and wherein one or more non-adjacent $CH_2$-groups are optionally substituted by $R^7C{=}CR^7$, C≡C, $Si(R^7)_2$, $Ge(R^7)_2$, $Sn(R^7)_2$, C=O, C=S, C=Se, $C{=}NR^7$, $P({=}O)(R^7)$, SO, $SO_2$, $NR^7$, O, S or $CONR^7$, $C_2$-$C_{40}$-alkynyl, which is optionally substituted with one or more substituents $R^7$ and wherein one or more non-adjacent $CH_2$-groups are optionally substituted by $R^7C{=}CR^7$, C≡C, $Si(R^7)_2$, $Ge(R^7)_2$, $Sn(R^7)_2$, C=O, C=S, C=Se, $C{=}NR^7$, $P({=}O)(R^7)$, SO, $SO_2$, $NR^7$, O, S or $CONR^7$, $C_6$-$C_{60}$-aryl, which is optionally substituted with one or more substituents $R^7$, and $C_3$-$C_{57}$-heteroaryl, which is optionally substituted with one or more substituents $R^7$;

wherein adjacent groups $R^I$ to $R^{IV}$ are optionally bonded to each other and form an aryl or heteroaryl ring, which is optionally substituted with one or more $C_1$-$C_5$-alkyl substituents, deuterium, halogen, CN or $CF_3$;

wherein adjacent groups $R^V$ to $R^{VIII}$ are optionally bonded to each other and form an aryl or heteroaryl ring, which is optionally substituted with one or more $C_1$-$C_5$-alkyl substituents, deuterium, halogen, CN or $CF_3$;

wherein adjacent groups $R^{IX}$ to $R^{XII}$ are optionally bonded to each other and form an aryl or heteroaryl ring, which is optionally substituted with one or more $C_1$-$C_5$-alkyl substituents, deuterium, halogen, CN or $CF_3$;

wherein adjacent groups $R^{XIII}$ to $R^{XV}$ are optionally bonded to each other and form an aryl or heteroaryl ring, which is optionally substituted with one or more $C_1$-$C_5$-alkyl substituents, deuterium, halogen, CN or $CF_3$;

$R^7$ is selected from the group consisting of:

hydrogen, deuterium, $N(R^8)_2$, $OR^8$, $SR^8$, $Si(R^8)_3$, $B(OR^8)_2$, $OSO_2R^8$, $CF_3$,

CN, halogen, $C_1$-$C_{40}$-alkyl, which is optionally substituted with one or more substituents $R^8$ and wherein one or more non-adjacent $CH_2$-groups are optionally substituted by $R^8C{=}CR^8$, C≡C, $Si(R^8)_2$, $Ge(R^8)_2$, $Sn(R^8)_2S$, C=S C=S, C=Se, $C{=}NR^8$, $P({=}O)(R^8)$, SO, $SO_2$, $NR^8$, O, S or $CONR^8$, $C_1$-$C_{40}$-alkoxy, which is optionally substituted with one or more substituents $R^8$ and wherein one or more non-adjacent $CH_2$-groups are optionally substituted by $R^8C{=}CR^8$, C≡C, $Si(R^8)_2$, $Ge(R^8)_2$, $Sn(R^8)_2$, C=O, C=S, C=Se, $C{=}NR^8$, $P({=}O)(R^8)$, SO, $SO_2$, $NR^8$, O, S or $CONR^8$, $C_1$-$C_{40}$-thioalkoxy, which is optionally substituted with one or more substituents $R^8$ and wherein one or more non-adjacent $CH_2$-groups are optionally substituted by $R^8C{=}CR^8$, C≡C, $Si(R^8)_2$, $Ge(R^8)_2$, $Sn(R^8)_2$, C=O, C=S, C=Se, $C{=}NR^8$, $P({=}O)(R^8)$, SO, $SO_2$, NR, O, S or $CONR^8$, $C_2$-$C_{40}$-alkenyl, which is optionally substituted with one or more substituents $R^8$ and wherein one or more non-adjacent $CH_2$-groups are optionally substituted by $R^8C{=}CR^8$, C≡C, $Si(R^8)_2$, $Ge(R^8)_2$, $Sn(R^8)_2$, C=O, C=S, C=Se, $C{=}NR^8$, $P({=}O)(R^8)$, SO, $SO_2$, $NR^8$, O, S or $CONR^B$, $C_2$-$C_{40}$-alkynyl, which is optionally substituted with one or more substituents $R^8$ and wherein one or more non-adjacent $CH_2$-groups are optionally substituted by $R^8C{=}CR^8$, C≡C, $Si(R^8)_2$, $Ge(R^8)_2$, $Sn(R^8)_2$, C=O, C=S, C=Se, $C{=}NR^8$, $P({=}O)(R^8)$, SO, $SO_2$, $NR^8$, O, S or $CONR^8$, $C_6$-$C_{60}$-aryl, which is optionally substituted with one or more substituents $R^8$; and $C_3$-$C_{57}$-heteroaryl, which is optionally substituted with one or more substituents $R^8$;

$R^8$ is at each occurrence independently selected from the group consisting of:

hydrogen, deuterium, halogen, OPh, SPh, $CF_3$, CN, $Si(C_1$-$C_5$-alkyl$)_3$, $Si(Ph)_3$, $C_1$-$C_5$-alkyl, wherein optionally one or more hydrogen atoms thereof are each independently substituted by deuterium, halogen, CN, or $CF_3$, $C_1$-$C_5$-alkoxy, wherein optionally one or more hydrogen atoms thereof are each independently substituted by deuterium, halogen, CN, or $CF_3$, $C_1$-$C_5$-thioalkoxy, wherein optionally one or more hydrogen atoms thereof are each independently substituted by deuterium, halogen, CN or $CF_3$, $C_2$-$C_5$-alkenyl, wherein optionally one or more hydrogen atoms thereof are each independently substituted by deuterium, halogen, CN, or $CF_3$, $C_2$-$C_5$-alkynyl, wherein optionally one or more hydrogen atoms thereof are each independently substituted by deuterium, halogen, CN, or $CF_3$, $C_6$-$C_{18}$-aryl, which is optionally substituted with one or more $C_1$-$C_5$-alkyl substituents, $C_3$-$C_{17}$-heteroaryl, which is optionally substituted with one or more $C_1$-$C_5$-alkyl substituents, $N(C_6$-$C_{18}$-aryl$)_2$, $N(C_3$-$C_{17}$-heteroaryl$)_2$, and $N(C_3$-$C_{17}$-heteroaryl$)(C_6$-$C_{18}$-aryl);

wherein the substituents $R^2$, $R^{XIII}$, $R^{XIV}$, or $R^{XV}$ independently from each other optionally form a mono- or polycyclic, aliphatic, aromatic and/or benzo-fused ring system with one or more substituents selected from the group consisting of $R^2$, $R^{XIII}$, $R^{XIV}$, and $R^{XV}$; and wherein the substituents $R^3$, $R^4$, $R^{IX}$, $R^X$, $R^{XI}$, or $R^{XII}$ independently from each other optionally form a mono- or polycyclic, aliphatic, aromatic and/or benzo-fused ring system with one or more substituents selected from the group consisting of $R^3$, $R^4$, $R^{IX}$, $R^X$, $R^{XI}$, and $R^{XIII}$.

3. The organic molecule according to claim 2, wherein the molecule comprises a structure represented by Formula Ib:

Formula Ib

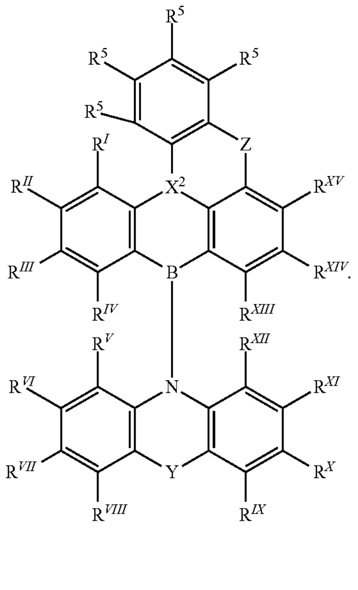

4. The organic molecule according to claim 1, wherein $R^V$ and $R^{XII}$ do not both represent hydrogen.

5. The organic molecule according to claim 2, wherein at least one of Y and Z is a direct bond.

6. The organic molecule according to claim 1, wherein $R^V$, $R^{VI}$, $R^{VII}$, $R^{VIII}$, $R^{IX}$, $R^X$, $R^{XI}$ and $R^{XII}$ are each independently selected from the group consisting of:

hydrogen, deuterium, halogen, Me, $^i$Pr, $^t$Bu, CN, $CF_3$, $SiMe_3$, $SiPh_3$, OPh, $CMe_2Ph$, $N(Ph)_2$, and Ph, which is optionally substituted with one or more substituents each independently selected from the group consisting of Me, $^i$Pr, $^t$Bu, CN, $CF_3$, and Ph, wherein the Ph in $N(Ph)_2$, OPh and $CMe_2Ph$ is optionally bonded to at least one group selected from groups $R^V$ to $R^{XII}$ positioned adjacent thereto to form an aryl or heteroaryl ring.

7. The organic molecule according to claim 1, wherein $R^V$=$R^{XII}$ and/or $R^X$=$R^{VII}$.

8. The organic molecule according to claim 2, wherein $X^2$=N.

9. A composition, comprising:

(a) an organic molecule according to claim 1, as an emitter and/or a host, and (b) an other emitter and/or an other host material, which differs from the organic molecule, and (c) optionally, a dye and/or a solvent.

10. An optoelectronic device, comprising an organic molecule according to claim 1.

11. The optoelectronic device according to claim 10, wherein the optoelectronic device is selected from the group consisting of organic light-emitting diode (OLED), light-emitting electrochemical cell, OLED-sensor, organic diode, organic solar cell, organic transistor, organic field-effect transistor, organic laser, and down-conversion element.

12. The optoelectronic device according to claim 10, comprising:

a substrate, an anode, and a cathode, wherein the anode or the cathode is disposed on the substrate, and a light-emitting layer, which is arranged between the anode and the cathode and which comprises the organic molecule.

13. A method for producing an optoelectronic device, the method comprising depositing the organic molecule according to claim 1 by a vacuum evaporation method or from a solution.

14. An optoelectronic device, comprising the composition according to claim 9.

15. The optoelectronic device according to claim 14, wherein the optoelectronic device is selected from the group consisting of organic light-emitting diode (OLED), light-emitting electrochemical cell, OLED-sensor, organic diode, organic solar cell, organic transistor, organic field-effect transistor, organic laser, and down-conversion element.

16. The optoelectronic device according to claim 14, comprising:

a substrate, an anode, and a cathode, wherein the anode or the cathode is disposed on the substrate, and a light-emitting layer, which is arranged between the anode and the cathode and which comprises the composition.

17. A method for producing an optoelectronic device, the method comprising depositing the composition according to claim 9 by a vacuum evaporation method or from a solution.

* * * * *